US012457896B2

(12) United States Patent
Lee et al.

(10) Patent No.: US 12,457,896 B2
(45) Date of Patent: Oct. 28, 2025

(54) ORGANIC LIGHT EMITTING DIODE INCLUDING NOVEL ANTHRACENE COMPOUNDS

(71) Applicant: SFC CO., LTD., Cheongju-si (KR)

(72) Inventors: Se-Jin Lee, Cheongju-si (KR); Si-In Kim, Cheongju-si (KR); Seok-Bae Park, Cheongju-si (KR); Hee-Dae Kim, Cheongju-si (KR); Yeong-Tae Choi, Cheongju-si (KR); Seung-Soo Lee, Cheongju-si (KR); Ji-Yung Kim, Cheongju-si (KR); Kyeong-Hyeon Kim, Cheongju-si (KR); Kyungtae Kim, Cheongju-si (KR); Myeong-Jun Kim, Cheongju-si (KR); Tae Gyun Lee, Cheongju-si (KR); Joon-Ho Kim, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 911 days.

(21) Appl. No.: 17/576,354

(22) Filed: Jan. 14, 2022

(65) Prior Publication Data

US 2022/0255021 A1 Aug. 11, 2022

(30) Foreign Application Priority Data

Jan. 15, 2021 (KR) ........................ 10-2021-0006207

(51) Int. Cl.

| | |
|---|---|
| ***H01L 51/50*** | (2006.01) |
| ***H10K 85/30*** | (2023.01) |
| ***H10K 85/60*** | (2023.01) |
| *H10K 50/15* | (2023.01) |
| *H10K 50/16* | (2023.01) |
| *H10K 50/17* | (2023.01) |

(52) U.S. Cl.

CPC ......... *H10K 85/615* (2023.02); *H10K 85/322* (2023.02); *H10K 85/626* (2023.02); *H10K 85/6574* (2023.02); *H10K 85/658* (2023.02); *H10K 50/15* (2023.02); *H10K 50/16* (2023.02); *H10K 50/171* (2023.02)

(58) Field of Classification Search

None

See application file for complete search history.

(56) References Cited

U.S. PATENT DOCUMENTS

2004/0217934 A1* 11/2004 Yang .................... G09G 3/3283 345/100

FOREIGN PATENT DOCUMENTS

| | | | | |
|---|---|---|---|---|
| KR | 101068224 B1 | 9/2011 | | |
| KR | 101111406 B1 | 4/2012 | | |
| KR | 102191018 B1 | 12/2020 | | |
| WO | WO2020054676 A1 | 3/2020 | | |
| WO | VVO2020251049 A1 | 12/2020 | | |
| WO | WO 2020054676 * | 3/2021 | ............. | H01L 51/50 |

* cited by examiner

*Primary Examiner* — Gregory D Clark

(74) *Attorney, Agent, or Firm* — STIP Law Group, LLC

(57) ABSTRACT

Disclosed herein is an organic light emitting diode including a novel anthracene compound. More particularly, an organic light emitting diode including an anthracene compound represented by Chemical Formula A; and a compound represented by Chemical Formula B-1 or B-2 is provided. Chemical Formulas A, B-1, and B-2 are as defined in the description.

16 Claims, 1 Drawing Sheet

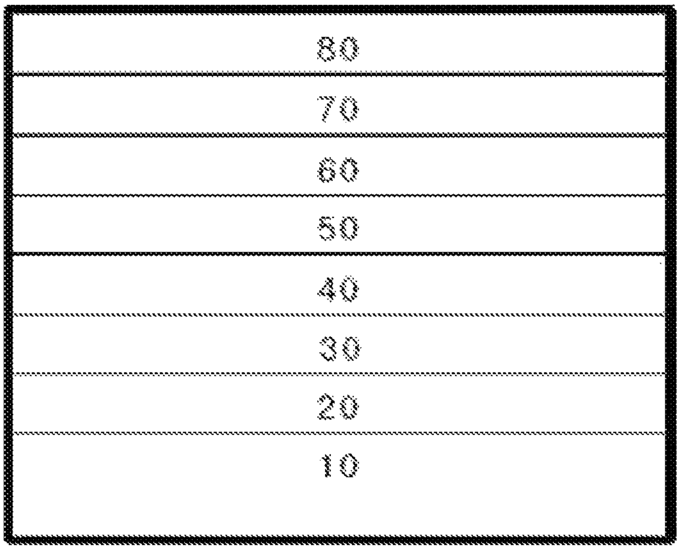
80
70
60
50
40
30
20
10

ORGANIC LIGHT EMITTING DIODE INCLUDING NOVEL ANTHRACENE COMPOUNDS

CROSS-REFERENCE TO RELATED APPLICATIONS

This application claims the priority of the Korean Patent Applications NO 10-2021-0006207 filed on Jan. 15, 2021, in the Korean Intellectual Property Office, the disclosure of which is incorporated herein by reference.

BACKGROUND OF THE INVENTION

1. Field of the Invention

The present disclosure relates to an organic light emitting diode including a novel anthracene compound and, more specifically, to an organic light emitting diode that employs specific host and dopant materials, thereby exhibiting diode characteristics including high efficiency and high longevity.

2. Description of the Related Art

Organic light-emitting diodes (OLEDs), which are self-emitting devices, enjoy advantages including a wide viewing angle, high contrast, fast response time, high luminance, a low driving voltage, a high response speed, and polychromatic properties.

A typical organic light emitting diode includes an anode and a cathode, which face each other, with an organic emission layer for light emission disposed therebetween.

In detail, the organic light-emitting diode may have a structure in which a hole transport layer, a light-emitting layer, an electron transport layer, and a cathode are sequentially formed on an anode. Here, the hole transport layer, the light-emitting layer, and the electron transport layer are each an organic thin film composed of an organic compound.

Having such a structure, the organic light-emitting diode operates according to the following principle. When a voltage is applied between the anode and the cathode, a hole injected from the anode moves toward the light-emitting layer through the hole transport layer while an electron injected from the cathode moves toward the light-emitting layer through the electron transport layer. In the light-emitting layer zone, the carriers such as a hole and an electron recombine to produce an exciton. The exciton returns to the ground state from the excited state, emitting light.

Materials used as organic layers in organic light-emitting diodes may be divided according to functions into luminescent materials and charge transport materials, for example, a hole injection material, a hole transport material, an electron transport material, and an electron injection material. The light-emitting mechanism forms the basis of classification of luminescent materials as fluorescent and phosphorescent materials, which use excitons in singlet and triplet states, respectively.

When a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer. This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

Meanwhile, studies have been made to introduce a deuterium-substituted compound as a material in the light emitting layer in order to improve the longevity and stability of the organic light emitting diode.

Compounds substituted with deuterium are known to exhibit differences in thermodynamic behavior from those bonded with hydrogen because the atomic mass of deuterium is twice as great as that of hydrogen, which results in lower zero point energy and lower vibration energy level.

In addition, physicochemical properties involving deuterium, such as chemical bond lengths, etc., appear to be different from those involving hydrogen. In particular, the van der Waals radius of deuterium is smaller than that of hydrogen because of the smaller stretching amplitude of the C-D bond compared to the C—H bond. Generally, the C-D bond is shorter and stronger than the C—H bond. Upon deuterium substitution, the ground state energy is lowered and a short bond length is formed between the carbon atom and the deuterium atom. Accordingly, the molecular hardcore volume becomes smaller, thereby reducing the electron polarizability can be reduced, and the thin film volume can be increased by weakening the intermolecular interaction.

As discussed above, deuterium substitution provides the effect of reducing the crystallinity of the thin film, that is, it makes the thin film amorphous. Generally, a compound having deuterium substitution may be advantageously used to increase the lifespan and driving characteristics of an OLED and further improve the thermal resistance.

With respect to related arts for organic light emitting compounds containing deuterium, reference may be made to Korean Patent Number 10-1111406, which discloses a low-voltage driving and long lifespan diode employing a deuterium-substituted, carbazole-containing compound or a mixture of deuterium-substituted compounds and to Korean Patent Number 10-1068224, which discloses the use of an anthracene derivative bearing a deuterium-substituted phenyl group as a host.

In spite of various efforts, including the techniques of the cited documents, made to fabricate organic light emitting diodes exhibiting longevity characteristics, there is a still continuing need for development of an organic light-emitting diode that has improved long lifespan characteristics.

RELATED ART DOCUMENT

Patent Literature (Patent literature 0001) Korean Patent Number 10-1111406 (Apr. 12, 2012)

(Patent literature 0002) Korean Patent Number 10-1068224 (Sep. 28, 2011)

SUMMARY OF THE INVENTION

In order to solve problems encountered in the conventional techniques, an aspect of the present disclosure is to provide an organic light emitting diode (OLED) which employs an anthracene compound having a special structural characteristic as a host and a boron compound having a special structure as a dopant therein, whereby more enhanced long lifespan characteristics can be imparted to the organic light emitting diode.

The present disclosure provides an organic light-emitting diode comprising: a first electrode; a second electrode facing the first electrode; and an organic layer between the first electrode and the second electrode, wherein the organic layer includes a light emission layer containing a host and a dopant, the host comprising at least one of anthracene compounds represented by Chemical Formula A and the dopant comprising at least one of compounds represented by Chemical Formula B-1 or Chemical Formula B-2:

[Chemical Formula A]

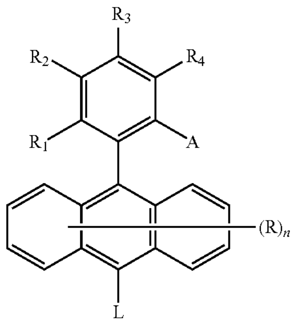

[Structural Formula 1]

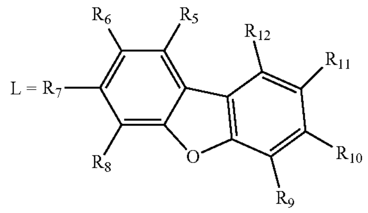

wherein,

A is any one selected from among a substituted or unsubstituted aryl of 6 to 50 carbon atoms, a substituted or unsubstituted heteroaryl of 2 to 50 carbon atoms, and a substituted or unsubstituted aliphatic/aromatic composite ring of 3 to 50 carbon atoms, $R_1$ is a hydrogen atom or a deuterium atom, R, and $R_2$ to $R_{12}$, which may be same or different, are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 3 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 50 carbon atoms, a substituted or unsubstituted akylthioxy of 1 to 30 carbon atoms, a substituted or unsubstituted arylthioxy of 6 to 50 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 50 carbon atoms, a cyano, a nitro, and a halogen, wherein a linkage may be made between adjacent two of the substituents R and $R_2$ to $R_{12}$ to form an additional mono- or polycyclic aliphatic or aromatic ring, n is an integer of 1 to 8, wherein when n is 2 or greater, the R's are same or different, one of $R_5$ to $R_{12}$ in Structural Formula 1 is a single bond to a carbon member of the anthracene moiety of Chemical Formula A, and at least one substituent in Chemical Formula A is substituted by or bears a deuterium atom; and

[Chemical Formula B-1]

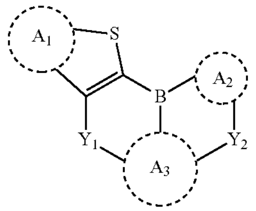

[Chemical Formula B-2]

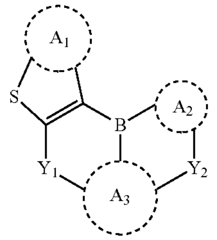

wherein, $A_1$ to $A_3$, which may be same or different, are each independently any one selected from among a substituted or unsubstituted aromatic hydrocarbon ring of 6 to 50 carbon atoms, a substituted or unsubstituted heteroaromatic ring of 2 to 50 carbon atoms, a substituted or unsubstituted aliphatic ring of 3 to 30 carbon atoms, and a substituted or unsubstituted aliphatic/aromatic composite ring of 3 to 30 carbon atoms, wherein a linkage may be formed between adjacent two of substituents on the rings $A_1$ to $A_3$ to form an additional mono- or polycyclic aliphatic or aromatic ring, $Y_1$ and $Y_2$, which may be same or different, are each independently any one selected from among $NR_{21}$, $CR_{22}R_{23}$, O, S, Se, and $SiR_{24}R_{25}$, $R_{21}$ to $R_{25}$, which may be same or different, are each independently any one selected from among a hydrogen atom, a deuterium atom, substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 6 to 30 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 30 carbon atoms, a nitro, a cyano, and a halogen, $R_{21}$ to $R_{25}$ may each be connected to at least one selected from among the rings $A_1$ to $A_3$ to form an additional mono- or polycyclic aliphatic or aromatic ring, and a bond may be made between $R_{22}$ and $R_{23}$ and between $R_{24}$ and $R_{25}$ to form additional respective mono- or polycyclic aliphatic or aromatic rings, wherein the term "substituted" in the expression "substituted or unsubstituted" used for compounds of Chemical Formulas A, B-1, and B-2 means having at least one substituent selected from the group consisting of a deuterium atom, a cyano, a halogen, a hydroxy, a nitro, an alkyl of 1 to 24 carbon atoms, an halogenated alkyl of 1 to 24 carbon atoms, a cycloalkyl of 3 to 30 carbon atoms, an alkenyl of 2 to 24 carbon atoms, an alkynyl of 2 to 24 carbon atoms, a heteroalkyl of 1 to 24 carbon atoms, an aryl of 6 to 30 carbon atoms, an arylalkyl of 7 to 30 carbon atoms, an alkylaryl of 7 to 30 carbon atoms, a heteroaryl of 2 to 30 carbon atoms, a heteroarylalkyl of 2 to 30 carbon atoms, an amine of 0 to 24 carbon atoms, a silyl of 0 to 24 carbon atoms, an aryloxy of 6 to 30 carbon atoms, and an aliphatic/aromatic composite ring of 3 to 30 carbon atoms.

When employing the novel anthracene compound according to the present disclosure as a host material therein, an organic light emitting diode exhibits longevity characteristics and more improved efficiency, compared to conventional organic light emitting diodes.

BRIEF DESCRIPTION OF THE DRAWINGS

The above and other aspects, features and advantages of the present disclosure will be more apparent from the following detailed description taken in conjunction with the accompanying drawing, in which:

FIG. 1 is a schematic diagram depicting the structure of an organic light-emitting diode according to some embodiments of the present disclosure.

DETAILED DESCRIPTION OF THE EXEMPLARY EMBODIMENTS

Below, a detailed description will be given of the present disclosure with reference to the accompanying drawing so as for a person skilled in the art to implement the present disclosure.

In the drawing of the present disclosure, sizes or scales of components may be enlarged or reduced than their actual sizes or scales for better illustration, and known components are not depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between", may be used herein for ease of description to refer to the relative positioning.

Throughout the specification, when a portion may "include" a certain constituent element, unless explicitly described to the contrary, it may not be construed to exclude another constituent element but may be construed to further include other constituent elements. Further, throughout the specification, the word "on" means positioning on or below the object portion, but does not essentially mean positioning on the lower side of the object portion based on a gravity direction.

The present disclosure provides an organic light emitting diode (OLED) which employs a deuterated anthracene compound having a special structural characteristic and as a host and a boron compound having a special structure as a dopant therein, whereby more enhanced long lifespan characteristics can be imparted to the organic light emitting diode.

More specifically, the present disclosure provides an organic light-emitting diode comprising: a first electrode; a second electrode facing the first electrode; and an organic layer between the first electrode and the second electrode, wherein the organic layer includes a light emission layer containing a host and a dopant, the host comprising at least one of anthracene compounds represented by Chemical Formula A and the dopant comprising at least one of compounds represented by Chemical Formula B-1 or Chemical Formula B-2:

[Chemical Formula A]

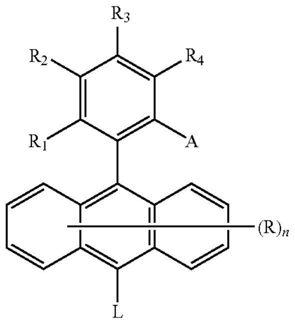

[Structural Formula 1]

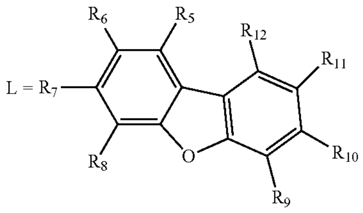

wherein,

A is any one selected from among a substituted or unsubstituted aryl of 6 to 50 carbon atoms, a substituted or unsubstituted heteroaryl of 2 to 50 carbon atoms, and a substituted or unsubstituted aliphatic/aromatic composite ring of 3 to 50 carbon atoms, $R_1$ is a hydrogen atom or a deuterium atom, R, and $R_2$ to $R_{12}$, which may be same or different, are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 3 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 50 carbon atoms, a substituted or unsubstituted akylthioxy of 1 to 30 carbon atoms, a substituted or unsubstituted arylthioxy of 6 to 50 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 50 carbon atoms, a cyano, a nitro, and a halogen, wherein a linkage may be made between adjacent two of the substituents R and $R_2$ to $R_{12}$ to form an additional mono- or polycyclic aliphatic or aromatic ring, n is an integer of 1 to 8, wherein when n is 2 or greater, the R's are same or different, one of $R_5$ to $R_{12}$ in Structural Formula 1 is a single bond to a carbon member of the anthracene moiety of Chemical Formula A, and at least one substituent in Chemical Formula A is substituted by or bears a deuterium atom; and

[Chemical Formula B-1]

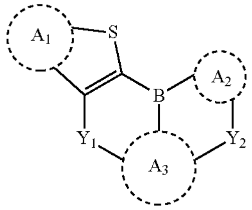

[Chemical Formula B-2]

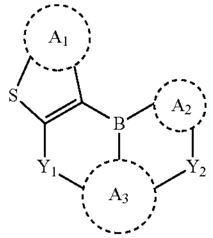

wherein, $A_1$ to $A_3$, which may be same or different, are each independently any one selected from among a substituted or unsubstituted aromatic hydrocarbon ring of 6 to 50 carbon atoms, a substituted or unsubstituted heteroaromatic ring of 2 to 50 carbon atoms, a substituted or unsubstituted aliphatic ring of 3 to 30 carbon atoms, and a substituted or unsubstituted aliphatic/aromatic composite ring of 3 to 30 carbon atoms, wherein a linkage may be formed between adjacent two of substituents on the rings $A_1$ to $A_3$ to form an additional mono- or polycyclic aliphatic or aromatic ring, $Y_1$ and $Y_2$, which may be same or different, are each independently any one selected from among $NR_{21}$, $CR_{22}R_{23}$, O, S, Se, and $SiR_{24}R_{25}$, $R_{21}$ to $R_{25}$, which may be same or different, are each independently any one selected from among a hydrogen atom, a deuterium atom, substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 6 to 30 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 30 carbon atoms, a nitro, a cyano, and a halogen, $R_{21}$ to $R_{25}$ may each be connected to at least one selected from among the rings $A_1$ to $A_3$ to form an additional mono- or polycyclic aliphatic or aromatic ring, and a bond may be made between $R_{22}$ and $R_{23}$ and between $R_{24}$ and $R_{25}$ to form additional respective mono- or polycyclic aliphatic or aromatic rings, wherein the term "substituted" in the expression "substituted or unsubstituted" used for compounds of Chemical Formulas A, B-1, and B-2 means having at least one substituent selected from the group consisting of a deuterium atom, a cyano, a halogen, a hydroxy, a nitro, an alkyl of 1 to 24 carbon atoms, an halogenated alkyl of 1 to 24 carbon atoms, a cycloalkyl of 3 to 30 carbon atoms, an alkenyl of 2 to 24 carbon atoms, an alkynyl of 2 to 24 carbon atoms, a heteroalkyl of 1 to 24 carbon atoms, an aryl of 6 to 30 carbon atoms, an arylalkyl of 7 to 30 carbon atoms, an alkylarylof 7 to 30 carbon atoms, a heteroaryl of 2 to 30 carbon atoms, a heteroarylalkyl of 2 to 30 carbon atoms, an amine of 0 to 24 carbon atoms, a silyl of 0 to 24 carbon atoms, an aryloxy of 6 to 30 carbon atoms, and an aliphatic/aromatic composite ring of 3 to 30 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or a fused aromatic system, and when it comes to the latter, the aromatic system may include a fused ring that is formed by adjacent substituents on the aryl radical.

Examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl, but are not limited thereto. At least one hydrogen atom of the aryl may be substituted by a deuterium atom, a halogen atom, a hydroxy, a nitro, a cyano, a silyl, an amino ($—NH_2$, —NH(R), —N(R')(R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The term "heteroaryl" substituent used in the compounds of the present disclosure refers to a hetero aromatic radical of 2 to 24 carbon atoms bearing 1, 2, or 3 heteroatoms selected from among N, O, P, Si, S, Ge, Se, and Te. In the aromatic radical, two or more rings may be fused. One or more hydrogen atoms on the heteroaryl may be substituted by the same substituents as on the aryl.

In addition, the term "heteroaromatic ring", as used herein, refers to an aromatic hydrocarbon ring bearing as aromatic ring members 1 to 3 heteroatoms selected particularly from among N, O, P, Si, S, Ge, Se, and Te.

As used herein, the term "alkyl" refers to an alkane missing one hydrogen atom and includes linear or branched structures. Examples of the alkyl substituent useful in the present disclosure include methyl, ethyl, propyl, isopropyl, isobutyl, sec-butyl, tert-butyl, pentyl, isoamyl, hexyl, and the like. At least one hydrogen atom of the alkyl may be substituted by the same substituent as in the aryl.

The term "cyclo" as used in substituents of the compounds of the present disclosure, such as cycloalkyl, etc., refers to a structure responsible for a mono- or polycyclic ring of saturated hydrocarbons. Concrete examples of cycloalkyl radicals include cyclopropyl, cyclobutyl, cyclopentyl, cyclohexyl, methylcyclopentyl, methylcyclohexyl, ethylcyclopentyl, ethylcyclohexyl, adamantyl, dicyclopentadienyl, decahydronaphthyl, norbornyl, bornyl, isobornyl, and so on. One or more hydrogen atoms on the cycloalkyl may be substituted by the same substituents as on the aryl.

The term "alkoxy" as used in the compounds of the present disclosure refers to an alkyl or cycloalkyl singularly bonded to oxygen. Concrete examples of the alkoxy include methoxy, ethoxy, propoxy, isobutoxy, sec-butoxy, pentoxy, iso-amyloxy, hexyloxy, cyclobutyloxy, cyclopentyloxy, adamantyloxy, dicyclopentyloxy, bornyloxy, isobornyloxy, and the like. One or more hydrogen atoms on the alkoxy may be substituted by the same substituents as on the aryl.

Concrete examples of the arylalkyl used in the compounds of the present disclosure include phenylmethyl (benzyl), phenylethyl, phenylpropyl, naphthylmethyl, naphthylethyl, and the like. One or more hydrogen atoms on the arylalkyl may be substituted by the same substituents as on the aryl.

As used herein, the term "alkenyl" refers to an unsaturated hydrocarbon group that contains a carbon-carbon double bond between two carbon atoms and the term "alkynyl" refers to an unsaturated hydrocarbon group that contains a carbon-carbon triple bond between two carbon atoms.

As used herein, the term "alkylene" refers to an organic aliphatic radical regarded as derived from a linear or branched saturated hydrocarbon alkane by removal of two hydrogen atoms from different carbon atoms. Concrete examples of the alkylene include methylene, ethylene, propylene, isopropylene, isobutylene, sec-butylene, tert-butylene, pentylene, iso-amylene, hexylene, and so on. One or more hydrogen atoms on the alkylene may be substituted by the same substituents as on the aryl.

The term "aliphatic/aromatic composite ring" or "aliphatic/aromatic composite ring radical" used in the compounds of the present disclosure refers to a cyclic moiety which has two or more rings condensed to each other, with non-aromaticity appearing on the whole molecule thereof. In addition, a polycyclic aliphatic/aromatic composite ring may bear a heteroatom selected from among N, O, P, and S in addition to C.

Furthermore, the term "amine", as used herein, is indented to encompass $-NH_2$, alkylamine, arylamine, alkylarylamine, arylheteroarylamine, heteroarylamine, etc. Here, arylamine refers to an amine resulting from substitution of aryl for one or two hydrogen atoms of $-NH_2$; alkylamine refers to an amine resulting from substitution of alkyl for one or two hydrogen atoms of $-NH_2$; alkylarylamine refers to an amine resulting from substitution of alkyl and aryl for the two hydrogen atoms of $-NH_2$, respectively; arylheteroarylamine refers to an amine resulting from substitution of aryl and heteroaryl for the two hydrogen atoms of $-NH_2$; and heteroarylamine refers to an amine resulting from substitution of heteroaryl for one or two hydrogen atoms of $-NH_2$. Examples of the arylamine include a substituted or unsubstituted monoarylamine and a substituted or unsubstituted diarylamine, and the same application may be made to alkylamine and heteroarylamine.

Here, the aryl in each of arylamine, heteroarylamine, and arylheteroarylamine may be monocyclic aryl or polycyclic aryl. The heteroaryl in each of arylamine, heteroarylamine, and arylheteroarylamine may be monocyclic heteroaryl or polycyclic heteroaryl.

The term "silyl" used in the compounds of the present disclosure is intended to encompass $-SiH_3$, alkylsilyl, arylsilyl, arylsilyl, alkylarylsilyl, arylheteroarylsilyl, heteroarylsilyl, and the like. Here, arylsilyl refers to a silyl resulting from substitution of aryl for one, two, or three hydrogen atoms of $-SiH_3$; alkylsilyl refers to a silyl resulting from substitution of alkyl for one, two, or three hydrogen atoms of $-SiH_3$; alkylarylsilyl refers to a silyl resulting from substitution of alkyl for one or two hydrogen atoms of $-SiH_3$ and aryl for one or two hydrogen atoms of $-SiH_3$; arylheteroarylsilyl refers to a silyl resulting from substitution of aryl for one or two hydrogen atoms of $-SiH_3$ and heteroaryl for one or two hydrogen atoms of $-SiH_3$;

heteroarylsilyl refers to a silyl resulting from substitution of heteroaryl for one, two, or three hydrogen atoms of $-SiH_3$. Examples of the arylsilyl include a substituted or unsubstituted monoarylsilyl, a substituted or unsubstituted diarylsilyl, and a substituted or unsubstituted triarylsilyl, and the same application may be made to alkylsilyl and heteroarylsilyl.

Here, the aryl in each of arylsilyl, heteroarylsilyl, and arylheteroarylsilyl may be monocyclic aryl or polycyclic aryl. The heateroaryl in each of arylsilyl, heteroarylsilyl, and arylheteroarylsilyl may be monocyclic heteroaryl and polycyclic heteroaryl.

Concrete examples of the silyl radicals used in the compounds of the present disclosure include trimethylsilyl, triethylsilyl, triphenylsilyl, trimethoxysilyl, dimethoxyphenylsilyl, diphenylmethylsilyl, diphenylvinlysilyl, methylcyclobutylsilyl, dimethyl furylsilyl, and the like. One or more hydrogen atoms on the silyl may be substituted by the same substituents as on the aryl.

As more particular examples accounting for the term "substituted" in the expression "substituted or unsubstituted" used for compounds of Chemical Formulas A, B-1, and B-2, the compounds may be substituted by at least one substituent selected from the group consisting of a deuterium atom, a cyano, a halogen, a hydroxy, a nitro, an alkyl of 1 to 12 carbon atoms, a halogenated alkyl of 1 to 12 carbon atoms, a cycloalkyl of 3 to 12 carbon atoms, an alkenyl of 2 to 12 carbon atoms, an alkynyl of 2 to 12 carbon atoms, a heteroalkyl of 1 to 12 carbon atoms, an aryl of 6 to 18 carbon atoms, an arylalkyl of 7 to 20 carbon atoms, an alkylaryl of 7 to 20 carbon atoms, a heteroaryl of 2 to 18 carbon atoms, a heteroarylalkyl of 2 to 18 carbon atoms, an alkoxy of 1 to 12 carbon atoms, an alkylamino of 1 to 12 carbon atoms, an amine of 0 to 18 carbon atoms, a silyl of 0 to 18 carbon atoms, an aryloxy of 6 to 18 carbon atoms, an aliphatic/aromatic composite ring of 3 to 18 carbon atoms.

The anthracene compound, represented by Chemical Formula A, which is used as a host in the organic light-emitting diode according to the present disclosure, is structurally characterized by the anthracene ring moiety possessing the phenyl substituted with A and R1 to $R_4$ as a substituent on the carbon atom at position 10 thereof, wherein R1 is a hydrogen atom or a deuterium atom and A is any one selected from among a substituted or unsubstituted aryl of 6 to 50 carbon atoms, a substituted or unsubstituted heteroaryl of 2 to 50 carbon atoms, and a substituted or unsubstituted aliphatic/aromatic composite ring of 3 to 50 carbon atoms; and technically characterized by the dibenzofuran ring moiety substituted with $R_5$ to $R_{12}$, represented by Structural Formula 1, which is located on the carbon atom at position 9 of the anthracene moiety, wherein one of $R_5$ to $R_{12}$ is a single bond through which the anthracene ring moiety is linked to the dibenzofuran ring moiety, with at least one substituent in Chemical Formula A is substituted by or bears a deuterium atom.

[Chemical Formula A]

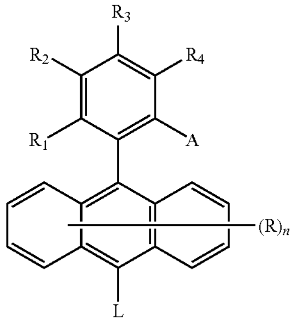

[Structural Formula 1]

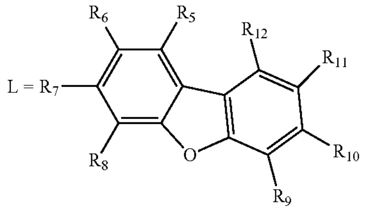

In a particular embodiment of the present disclosure, the A substituent in Chemical Formula A may be a deuterium-substituted or unsubstituted an aryl of 6 to 30 carbon atoms.

In another particular embodiment of the present disclosure, the A substituent may be any one selected from among a deuterium-substituted or unsubstituted phenyl, a deuterium-substituted or unsubstituted biphenyl, a deuterium-substituted or unsubstituted terphenyl, a deuterium-substituted or unsubstituted naphthyl, a deuterium-substituted or unsubstituted phenanthryl.

According to another particular embodiment, at least one of the R's in Chemical Formula A may be a deuterium atom, preferably two or more of R's may be deuterium atoms, more preferably four or more of R's may be deuterium atoms, and even more preferably all of R's may be deuterium atoms.

In a particular embodiment, at least one of $R_2$ to $R_4$ in Chemical Formula A may be selected from a hydrogen atom, a deuterium atom, and a substituted or unsubstituted an aryl of 6 to 30 carbon atoms. In a more particular embodiment, $R_2$ to $R_4$, which are same or different, may each be independently selected from among a deuterium atom and a substituted or unsubstituted an aryl of 6 to 30 carbon atoms.

In another particular embodiment, at least one of the substituents $R_5$ to $R_{12}$, which are not single bond in Chemical Formula A, may be a deuterium-substituted or unsubstituted aryl of 6 to 30 carbon atoms.

In a particular embodiment, the anthracene compound represented by Chemical Formula A has preferably a degree of deuteration of 20% or higher, more preferably a degree of deuteration of 30% or higher, more preferably a degree of deuteration of 35% or higher, more preferably a degree of deuteration of 40% or higher, more preferably a degree of deuteration of 45% or higher, more preferably a degree of deuteration of 50% or higher, more preferably a degree of deuteration of 55% or higher, more preferably a degree of deuteration of 60% or higher, more preferably a degree of deuteration of 65% or higher, more preferably a degree of deuteration of 70% or higher, more preferably a degree of deuteration of 75% or higher, and more preferably a degree of deuteration of 80% or higher.

With respect to the degree of deuteration used herein, the term "deuterated derivative" of compound X means a compound that is structurally identical to compound X, but has at least one deuterium (D) atom in substitution with a hydrogen atom (H) bonded to a carbon atom, a nitrogen atom, or an oxygen atom in compound X.

In this regard, the term "yy % deuterated" or "yy % deuteration" refers to yy % for the ratio of deuterium atoms to a sum of hydrogen and deuterium atoms bonded directly to carbon, nitrogen, or oxygen atoms within compound X.

Thus, when two of six hydrogen atoms in benzene, the resulting benzene compound C6H4D2 is 33% deuterated (2/(4+2)×100=33%).

Likewise, when the anthracene compound of the present disclosure is deuterated, the degree of deuteration thereof is expressed as a percentage of deuterium atoms bonded directly to carbon atoms within the anthracene compound relative to a sum of hydrogen and deuterium atoms bonded directly to carbon atoms within the anthracene compound.

For example, the anthracene compound represented by Compound 1, below, has a total of five deuterium atoms bonded to the phenyl group linked to the anthracene moiety and a total of 19 hydrogen atoms including four hydrogen atoms bonded to the phenyl group linked to the anthracene moiety, eight hydrogen atoms bonded to the anthracene moiety, and seven hydrogen atoms bonded to the 6-membered aromatic rings of the dibenzofuran, so that its degree of deuteration can be calculated as 100×5/(5+19)=20.8%:

[Compound 1]

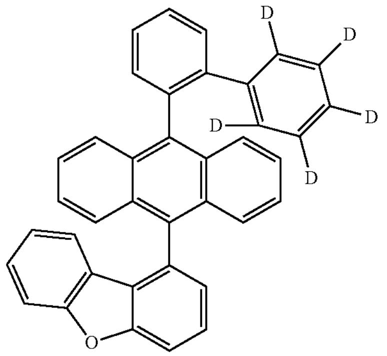

For a specific substituent, a degree of deuteration may differ from one compound molecule to another and thus is expressed as an average value.

An example is given by a partially deuterium-substituted anthracene radical. When a deuterium atom is intended to be substituted on all carbon atoms in an anthracene, the resulting anthracene compound may be deuterated fully or partially according to reaction conditions. That is, there may be a mixture including fully deuterated anthracene molecules and partially deuterated anthracene molecules. It is very difficult to separate the fully deuterated anthracene molecules and the partially deuterated anthracene molecules from each other. In this case, the degree of deuteration can be calculated according to the entire structural formula with reference to an average degree of deuteration.

According to the present disclosure, the use of the anthracene compound represented by Chemical Formula A as a host material for a light emission layer in an organic light-emitting diode can further improve the lifespan of the organic light-emitting diode.

In greater detail, the anthracene compound represented by Chemical Formula A may be any one selected from the group consisting of <Compound 1> to <Compound 60>, but is not limited thereto:

[Compound 1]

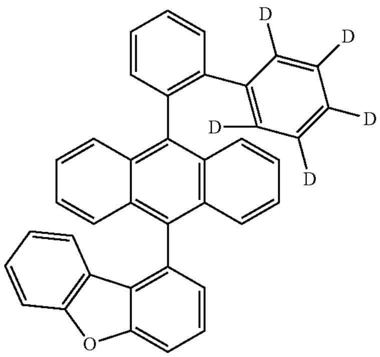

[Compound 2]

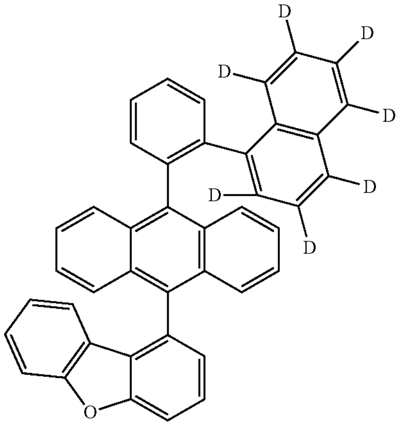

-continued

[Compound 3]

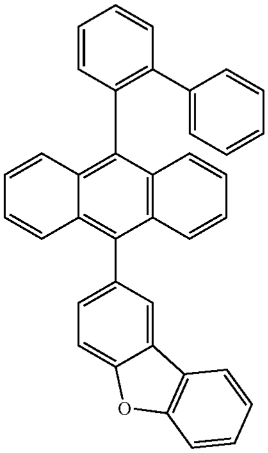

[Compound 4]

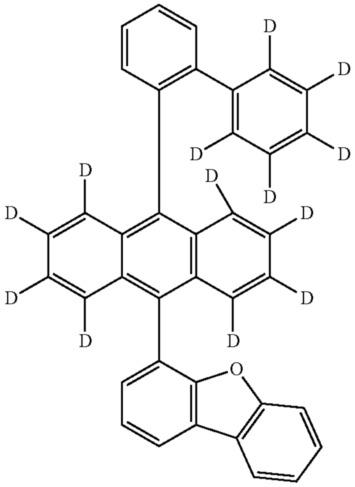

[Compound 5]

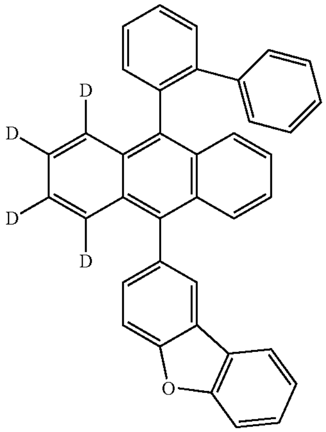

-continued
[Compound 6]
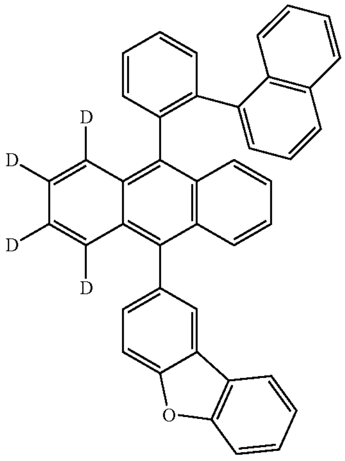
[Compound 7]
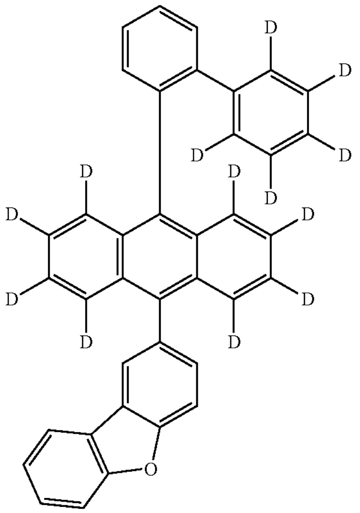
[Compound 8]
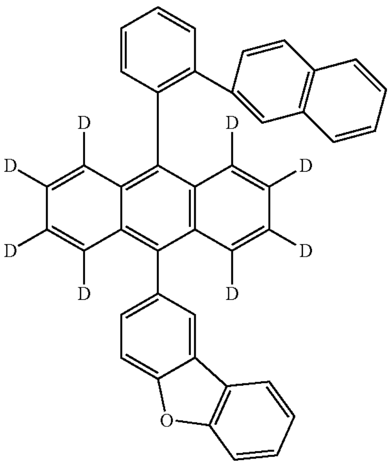
-continued
[Compound 9]
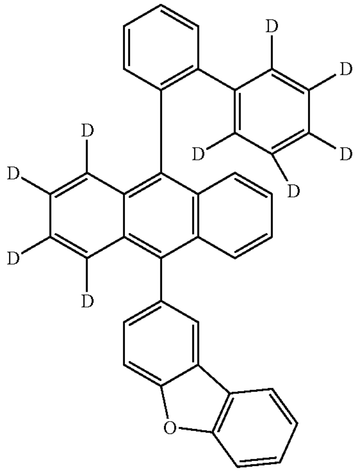
[Compound 10]
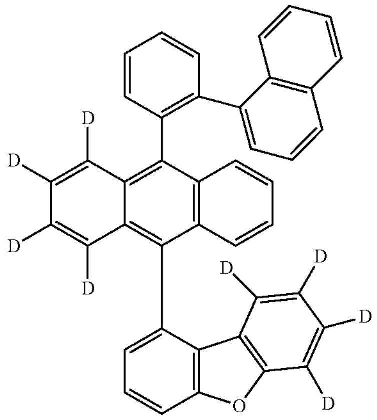
[Compound 11]
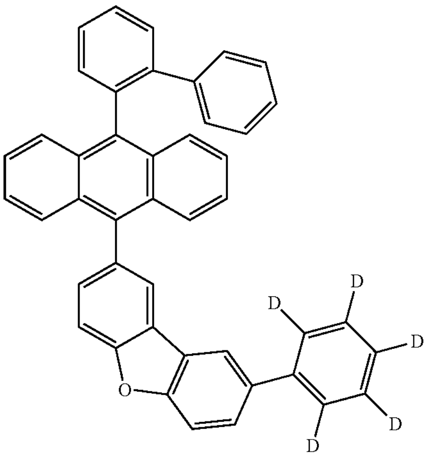

-continued
[Compound 12]
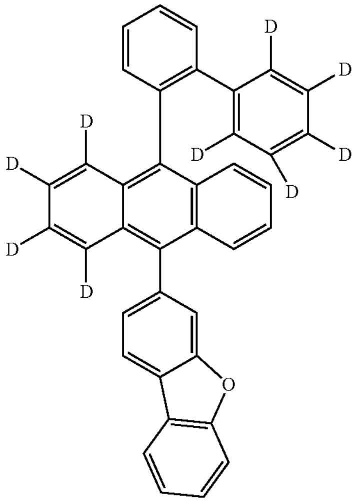
[Compound 13]
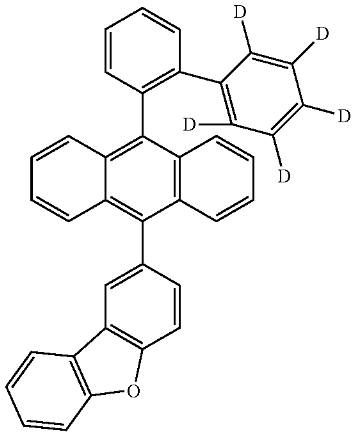
[Compound 14]
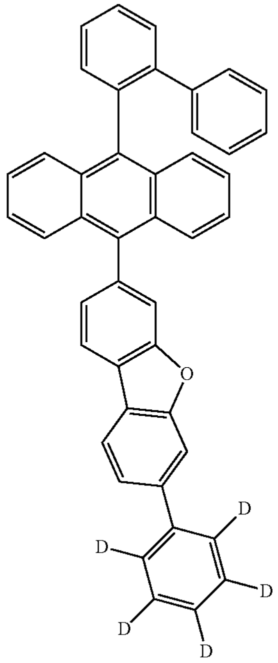
-continued
[Compound 15]
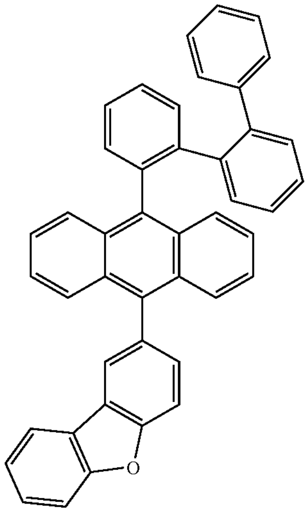
[Compound 16]
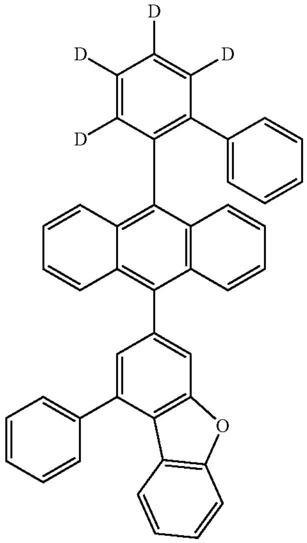

-continued
[Compound 17]
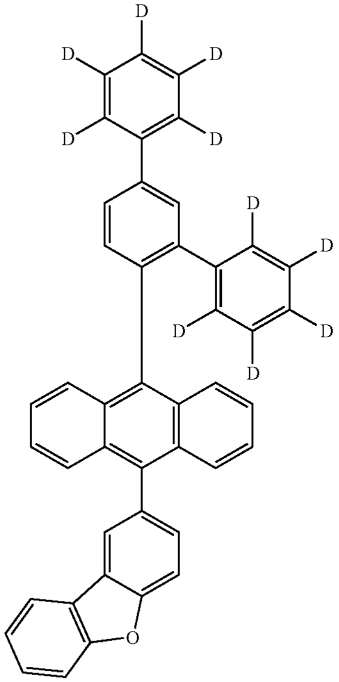
[Compound 18]
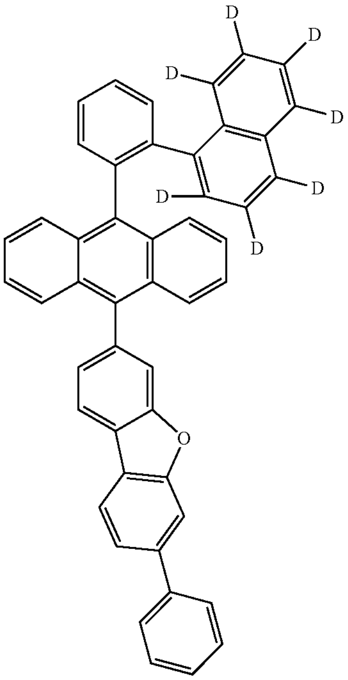
-continued
[Compound 19]
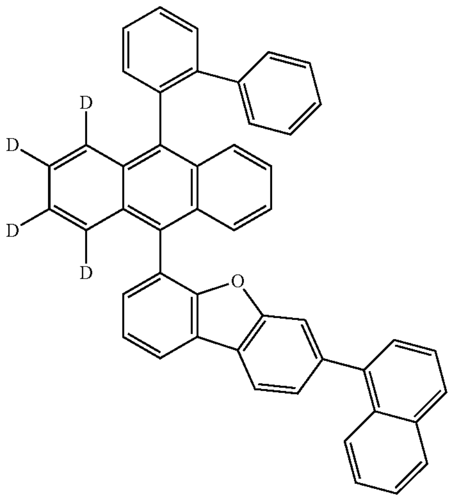
[Compound 20]
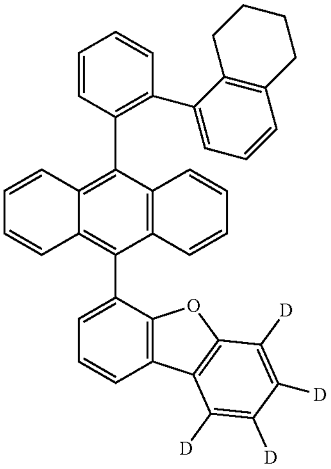
[Compound 21]
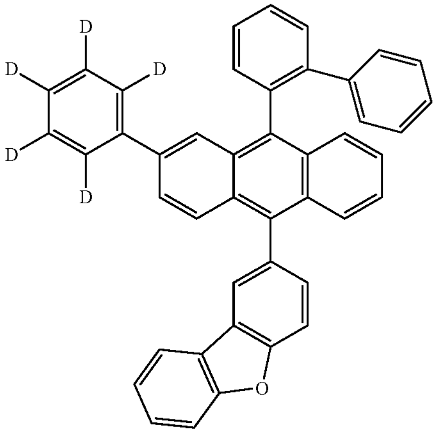

-continued
[Compound 22]
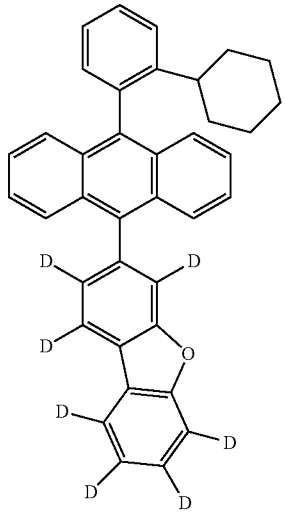
[Compound 23]
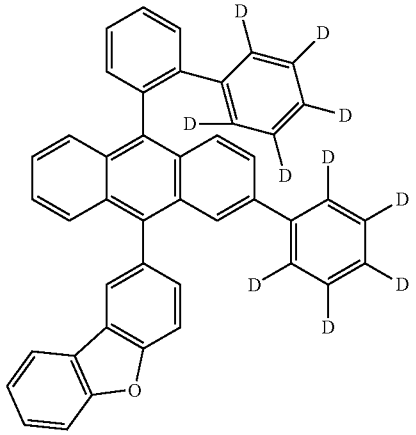
[Compound 24]
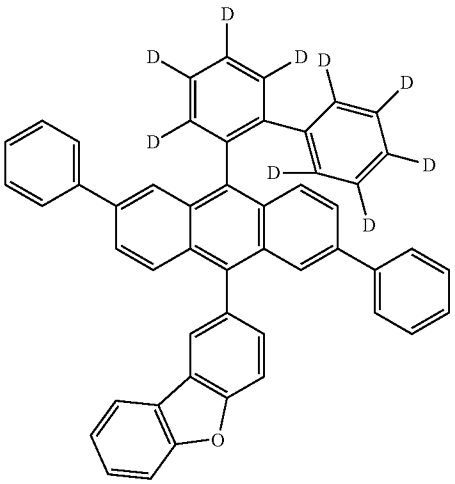
-continued
[Compound 25]
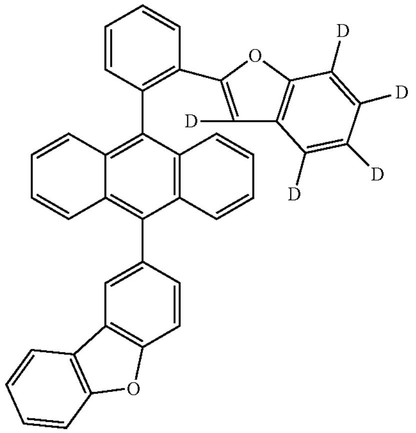
[Compound 26]
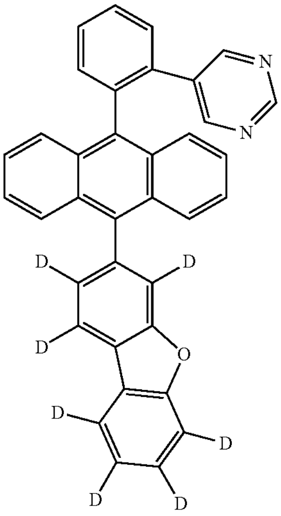
[Compound 27]
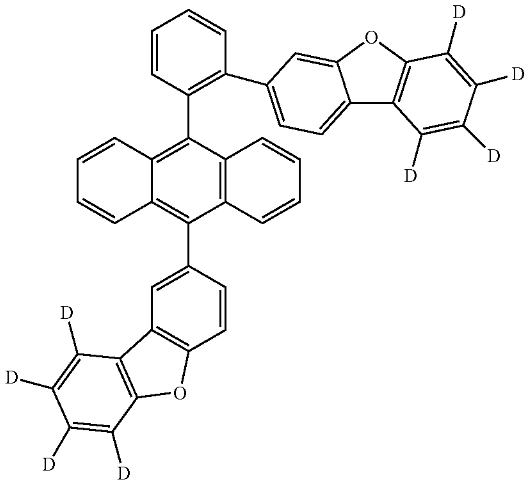

-continued
[Compound 28]
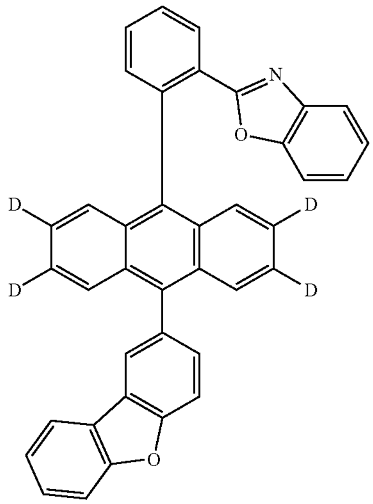
[Compound 29]
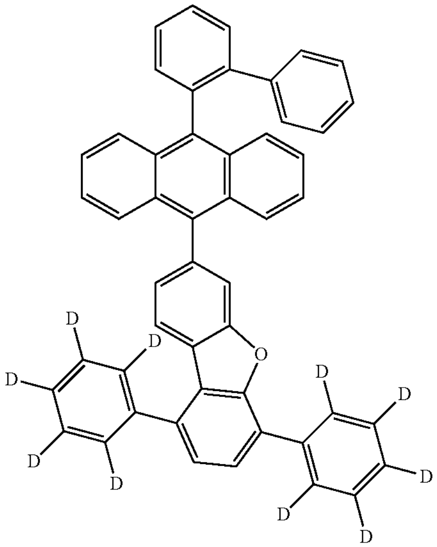
[Compuond 30]
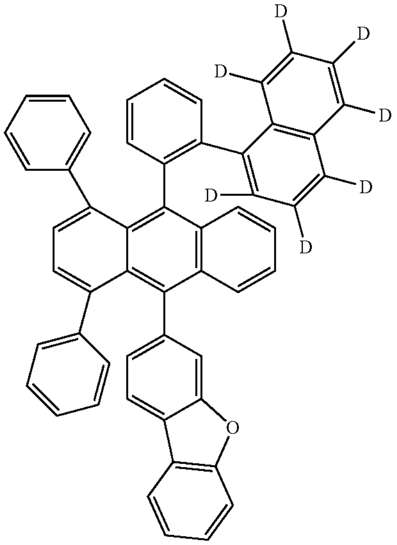
-continued
[Compound 31]
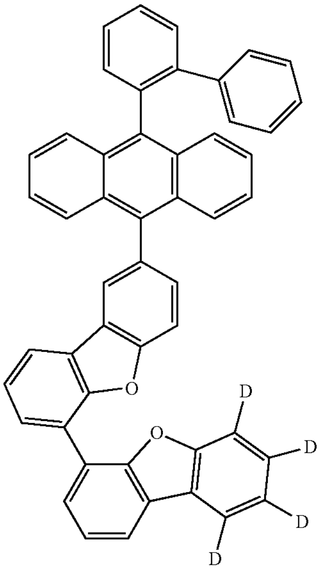
[Compound 32]
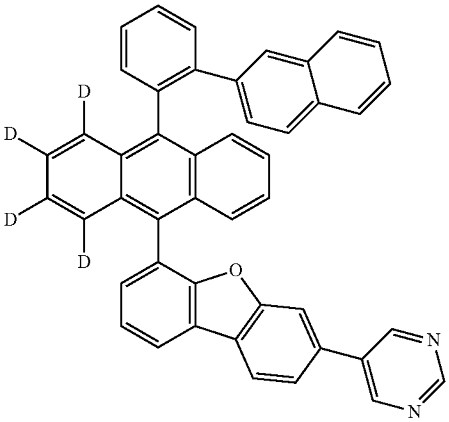
[Compound 33]
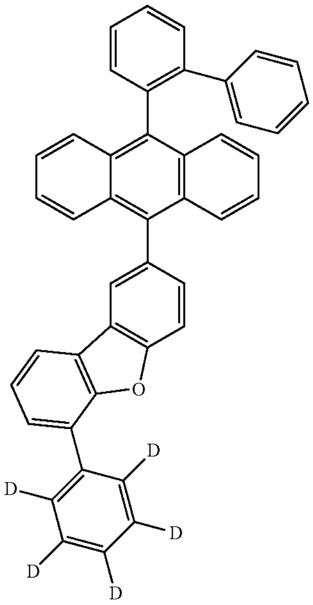

[Compound 34]
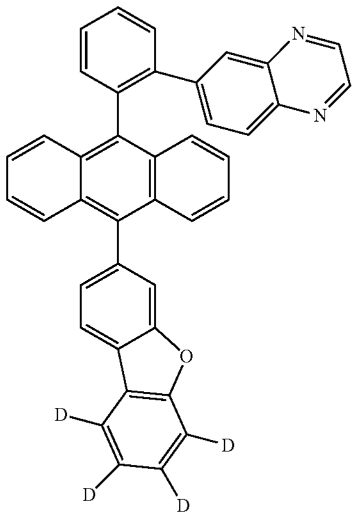
[Compound 35]
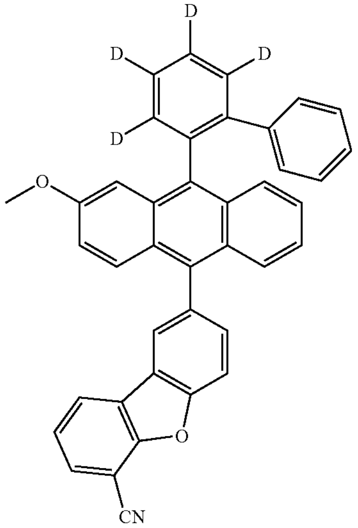
[Compound 36]
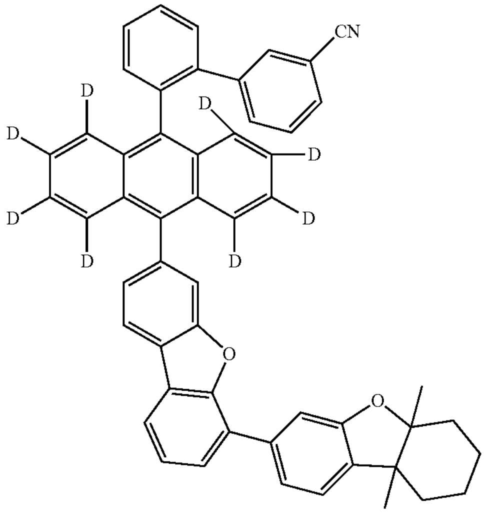
[Compound 37]
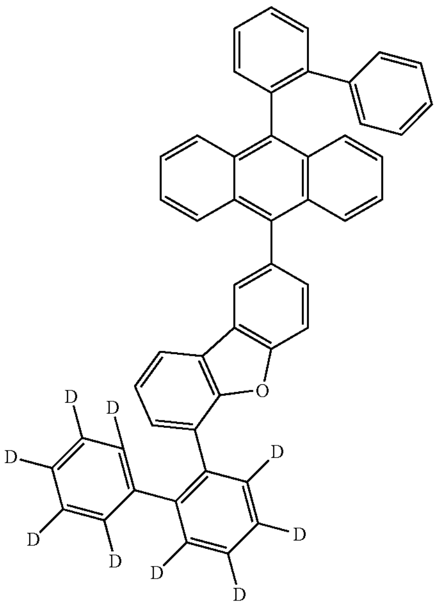
[Compound 38]
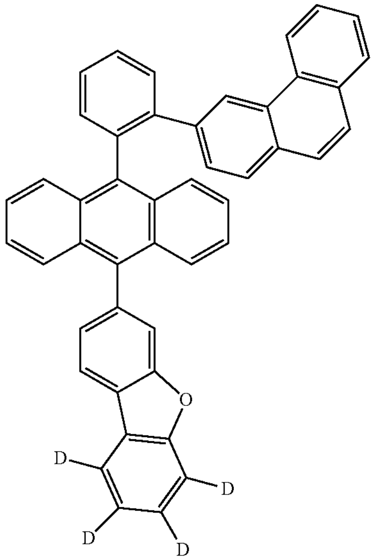

-continued
[Compound 39]
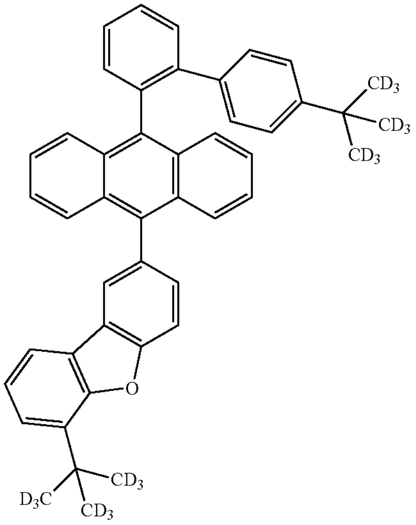
[Compound 40]
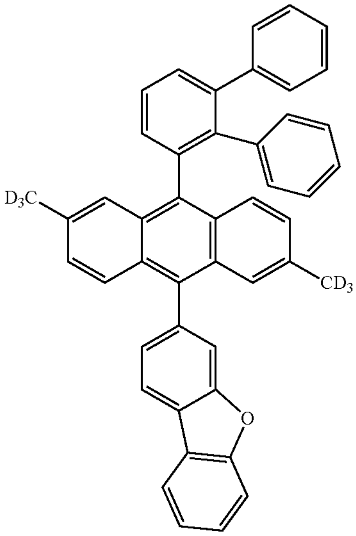
[Compound 41]
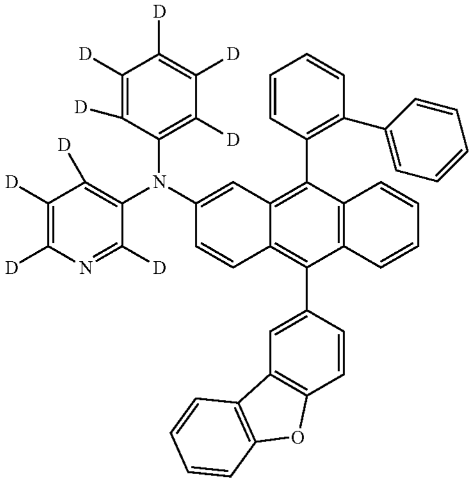
-continued
[Compound 42]
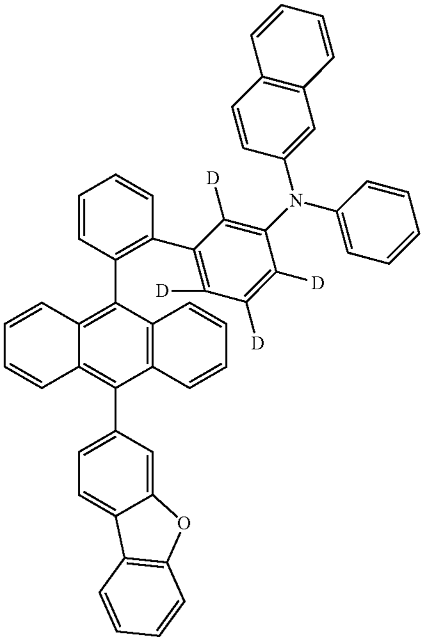
[Compound 43]
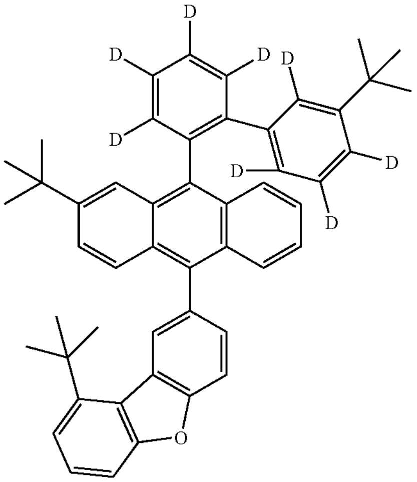
[Compound 44]
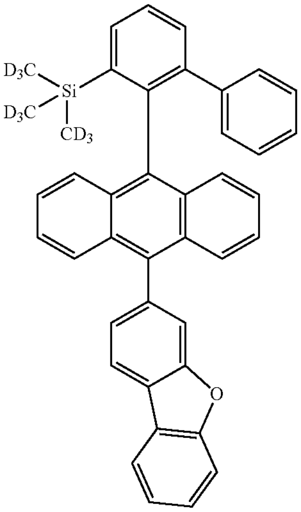

-continued
[Compound 45]
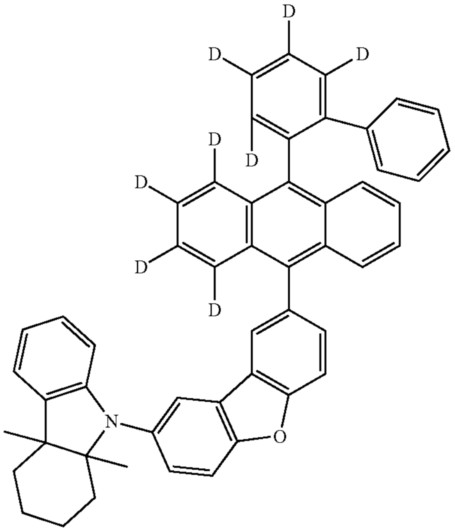
[Compound 46]
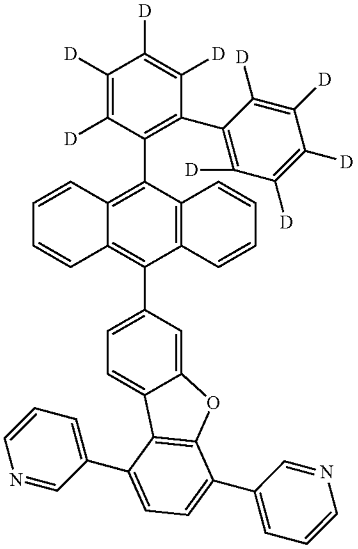
[Compound 47]
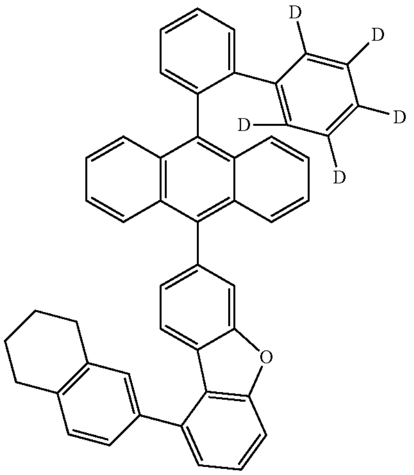
-continued
[Compound 48]
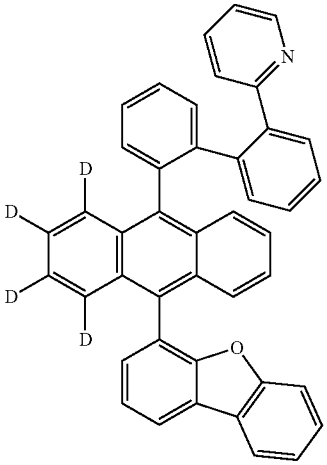
[Compound 49]
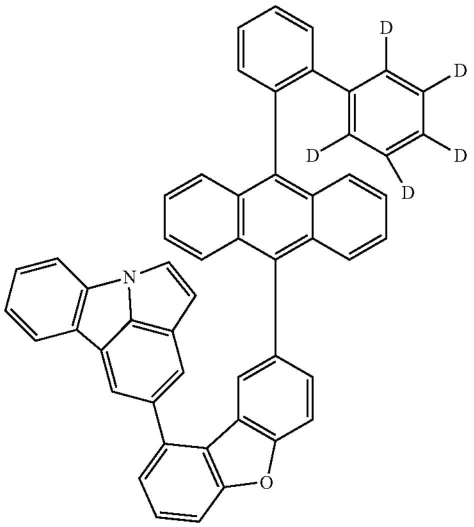
[Compound 50]
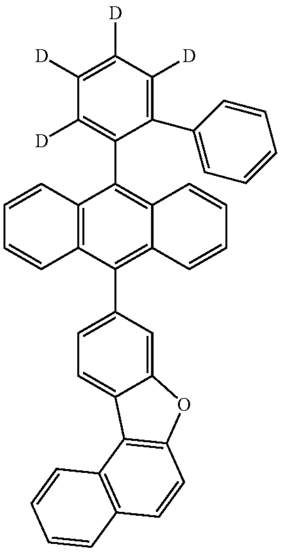

-continued
[Compound 51]
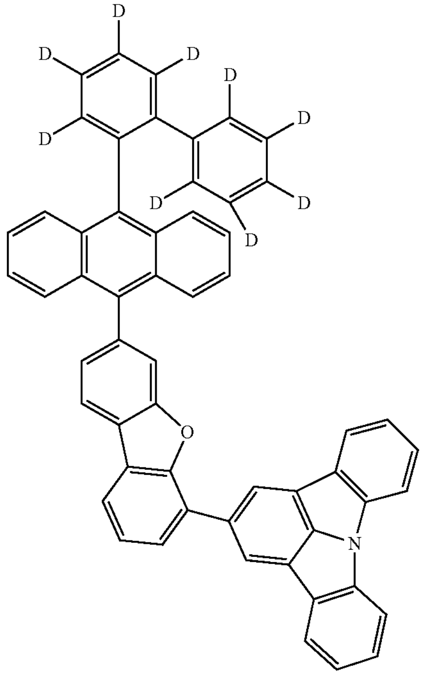
[Compound 52]
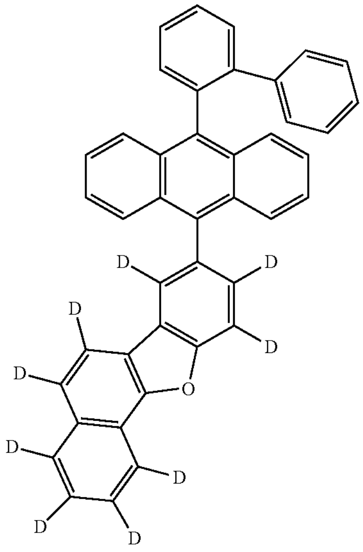
-continued
[Compound 53]
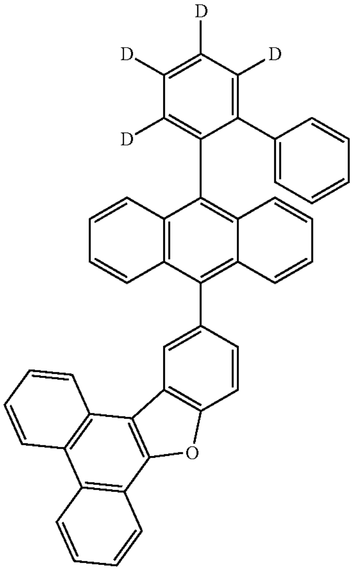
[Compound 54]
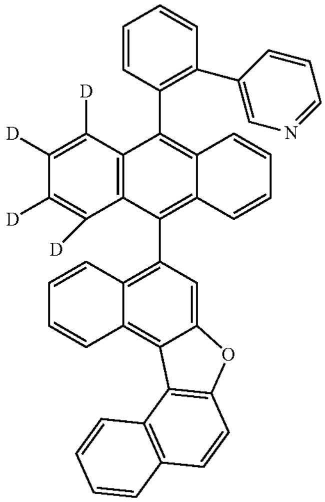
[Compound 55]
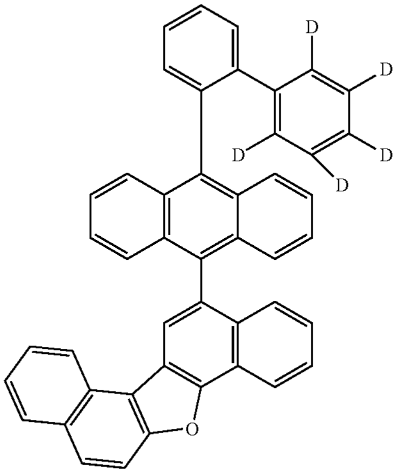

-continued
[Compound 56]
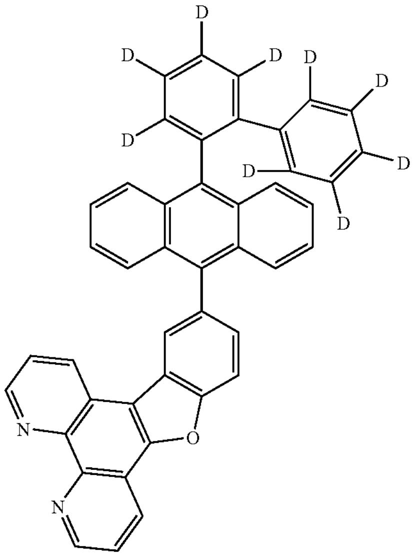
[Compound 57]
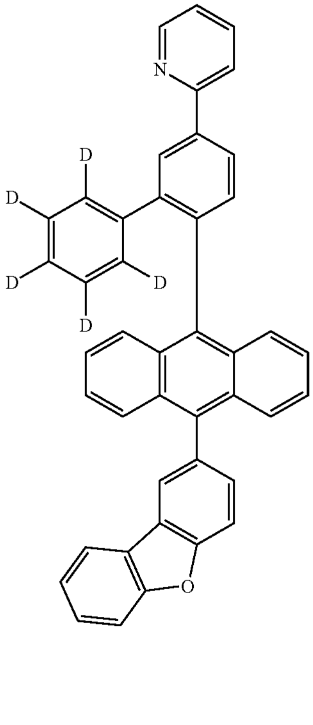
-continued
[Compound 58]
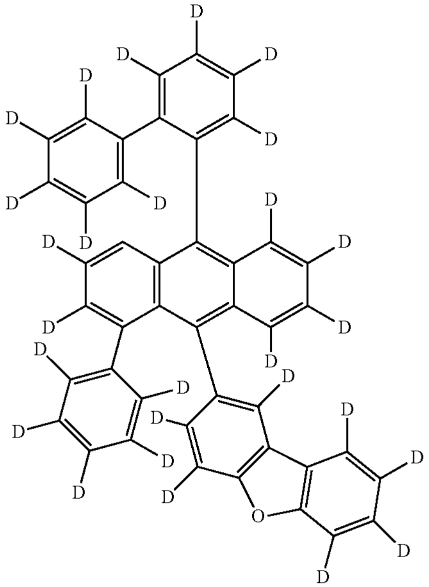
[Compound 59]
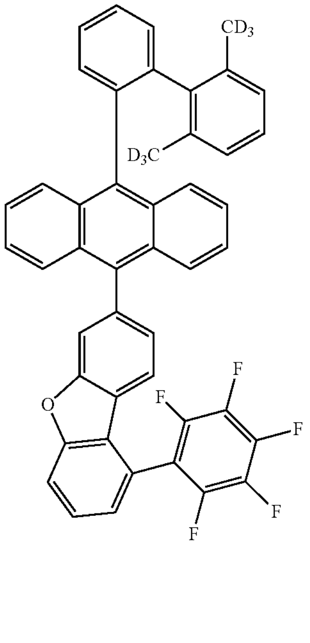

-continued

[Compound 60]

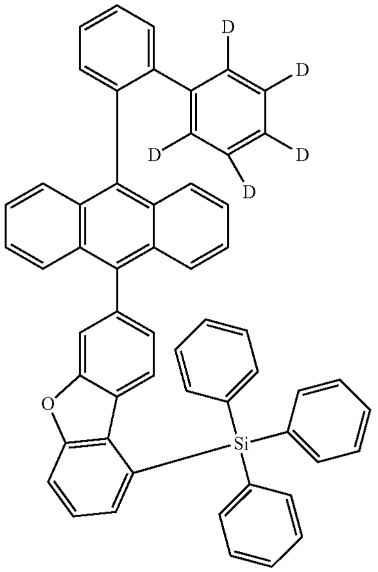

In addition, the boron compound, represented by Chemical Formula B-1 or B-2, which is used as a dopant material in the organic light-emitting diode according to the present disclosure, is characterized by the structure in which:

ring moieties $A_2$ and $A_3$ are each independently selected from among a substituted or unsubstituted aromatic hydrocarbon ring of 6 to 50 carbon atoms, a substituted or unsubstituted heteroaromatic ring of 2 to 50 carbon atoms, a substituted or unsubstituted aliphatic ring of 3 to 30 carbon atoms, and a substituted or unsubstituted aliphatic/aromatic composite ring of 3 to 30 carbon atoms and are bonded directly to a boron atom (B) and indirectly to each other via linker $Y_2$; the ring moiety $A_3$ is bonded to linker $Y_1$; linker $Y_1$ is bonded to the vinyl group linked to a sulfur atom (S) and the boron atom (B); and the sulfur (S) is bonded to the ring moiety $A_1$ to form a 5-membered ring bearing the sulfur (S).

[Chemical Formula B-1]

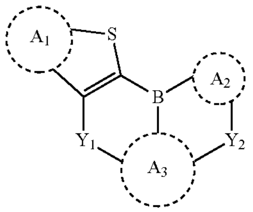

[Chemical Formula B-2]

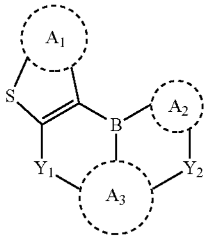

In a particular embodiment, $A_1$ to $A_3$ in the compound represented by Chemical Formula B-1 or B-2, which are same or different, may each be independently a substituted or unsubstituted aromatic hydrocarbon ring of 6 to 30 carbon atoms and may each be any one selected from among a benzene ring, a naphthalene ring, an anthracene ring, a phenanthrene ring, an indene ring, a fluorene ring, a pyrene ring, a perylene ring, a chrysene ring, a naphthacene ring, a fluoranthene ring, an acenaphthylene ring, and a pentacene ring.

In this regard, the aromatic hydrocarbon rings of $A_1$ and $A_2$ in Chemical Formula B-1 may each be any one selected from among [Structural Formula 10] to [Structural Formula 21], below, and the aromatic hydrocarbon rings of $A_1$ and $A_2$ in Chemical Formula B-2, which are same or different, may each be independently any one selected from among [Structural Formula 10] to [Structural Formula 21]m, below:

[Structural Formula 10]

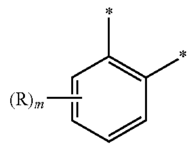

[Structural Formula 11]

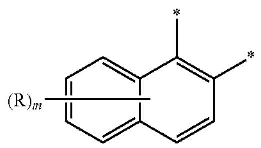

[Structural Formula 12]

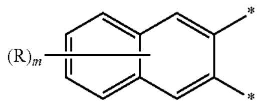

[Structural Formula 13]

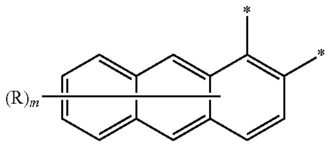

[Structural Formula 14]

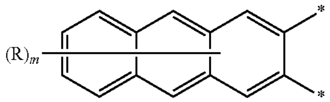

[Structural Formula 15]

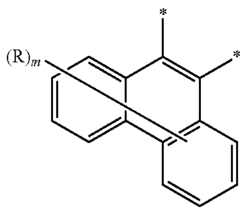

[Structural Formula 16]

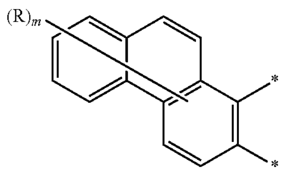

-continued

[Structural Formula 17]

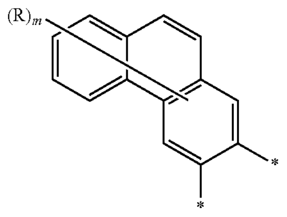

[Structural Formula 18]

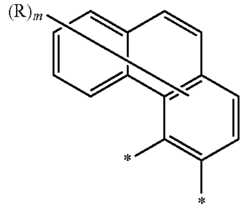

[Structural Formula 19]

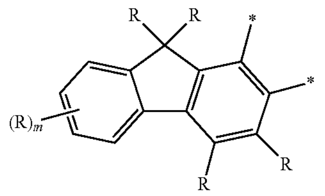

[Structural Formula 20]

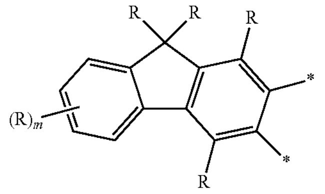

[Structural Formula 21]

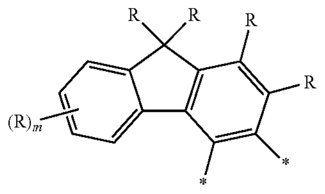

wherein, "-*" denotes: a bonding site at which the carbon ring member of $A_1$ is bonded to the sulfur atom or a carbon member of the 5-membered ring bearing the sulfur atom; or a bonding site at which the carbon ring member of $A_2$ is bonded to the boron atom (B) or linker $Y_2$ R's, which are same or different, may each be independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arythioxy of 5 to 30 carbon atoms, a substituted or unsubstituted amine of 0 to 30 carbon atoms, a substituted or unsubstituted silyl of 0 to 30 carbon atoms, a cyano, and a halogen; and m is an integer of 1 to 8 wherein when m is 2 or greater or when two or more R's exist, the individual R's may be the same or different.

In addition, when the $A_1$ to $A_3$ ring moieties, which are same or different, may each be independently a substituted or unsubstituted aromatic hydrocarbon ring of 6 to 50 carbon atoms, the aromatic hydrocarbon ring of $A_3$ in Chemical Formulas B-1 and B-2 may be a ring represented by the following Structural Formula B:

[Structural Formula B]

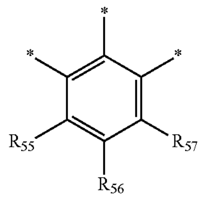

wherein "-*" denotes bonding sites at which the corresponding carbons in the aromatic ring of $A_3$ bond to linker $Y_1$, the boron atom (B), and linker $Y_2$; and $R_{55}$ to $R_{57}$, which are same or different, may each be independently any one selected from among a hydrogen atom, a deuterium atom, substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 5 to 30 carbon atoms, a substituted or unsubstituted amine of 0 to 30 carbon atoms, a substituted or unsubstituted silyl of 0 to 30 carbon atoms, a cyano, and a halogen, and any adjacent two of $R_{55}$ to $R_{57}$ may be linked to each other to form an additional mono- or polycyclic aliphatic or aromatic ring.

In a particular embodiment, at least one of $Y_1$ and $Y_2$ in the compounds represented by Chemical Formulas B-1 and B-2 may be $NR_{21}$ and preferably, $Y_1$ and $Y_2$ in the compounds represented by Chemical Formulas B-1 and B-2 are same or different and may each be independently $NR_{21}$ wherein $R_{21}$ is as defined above.

In addition, when the linker $Y_1$ and $Y_2$ in Chemical Formulas B-1 and B-2 are each $N—R_{21}$, $R_{21}$ may be preferably a substituted or unsubstituted aryl of 6 to 50 carbon atoms or a substituted or unsubstituted heteroaryl of 2 to 50 carbon atoms, and more preferably a substituted or unsubstituted an aryl of 6 to 30 carbon atoms.

In an embodiment, at least one of the linkers $Y_1$ and $Y_2$ in Chemical Formulas B-1 and B-2, which are same or different, may be represented by the following Structural Formula A:

[Structural Formula A]

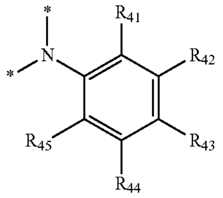

wherein,

"-*" indicates bonding sites which are linked to a carbon atom in the vinyl group of the 5-membered ring bearing the sulfur atom (S), and to an aromatic carbon atom in the $A_2$ or $A_3$ ring moiety, respectively, $R_{41}$ to $R_{45}$, which are same or different, may each be independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 5 to 30 carbon atoms, a substituted or unsubstituted amine of 0 to 30 carbon atoms, a substituted or unsubstituted silyl of 0 to 30 carbon atoms, a nitro, a cyano, and a halogen, $R_{41}$ and $R_{45}$ bonding to $A_2$ or $A_3$ rings to form an additional mono- or polycyclic aliphatic or aromatic ring.

In Chemical Formulas B-1 and B-2 of the present disclosure, the aromatic hydrocarbon ring of 6 to 50 carbon atoms or the heteroaromatic ring of 2 to 50 carbon atoms of at least one of the ring moieties $A_1$ to $A_3$ may be bonded to an aryl amino radical represented by the following Structural Formula F:

[Structural Formula F]

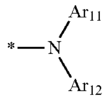

wherein,

"-*" denotes a bonding site participating in forming a bond to a carbon aromatic ring member of any one of $A_1$ to $A_3$, and $Ar_{11}$ and $Ar_{12}$, which are same or different, may each be independently a substituted or unsubstituted aryl of 6 to 12 carbon atoms or a substituted or unsubstituted heteroaryl of 3 to 18 carbon atoms, and may be linked to each other to form a ring.

In an embodiment, the boron compound represented by Chemical Formulas B-1 and B-2 may be any one selected from the following [Chemical Formula 1] to [Chemical Formula 84]:

[Chemical Formula 1]

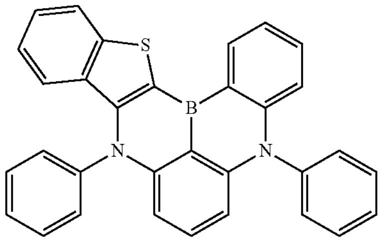

[Chemical Formula 2]

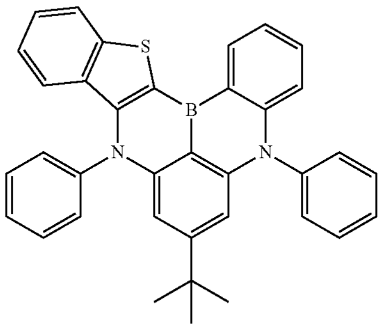

[Chemical Formula 3]

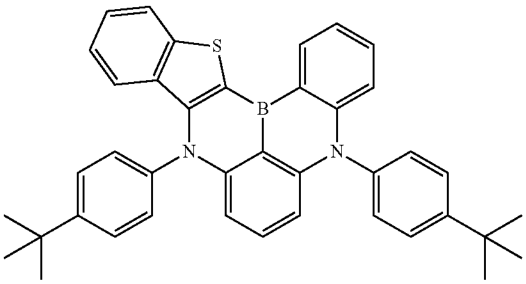

[Chemical Formula 4]

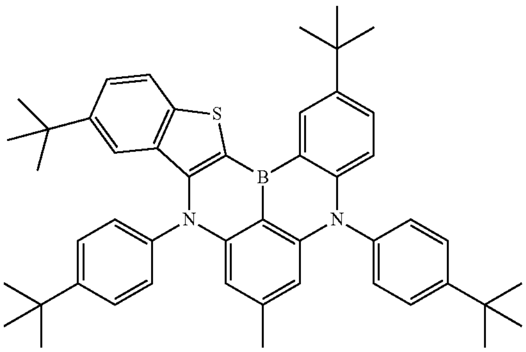

-continued
[Chemical Formula 5]
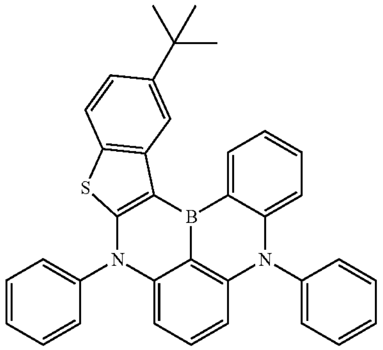
[Chemical Formula 6]
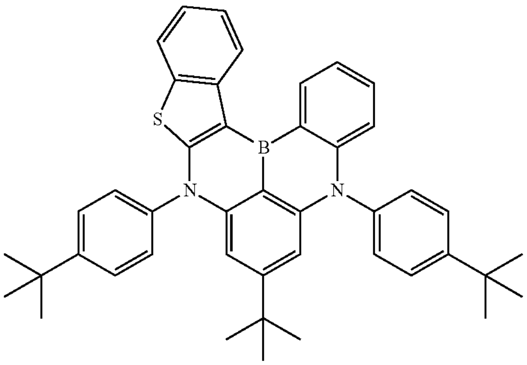
[Chemical Formula 7]
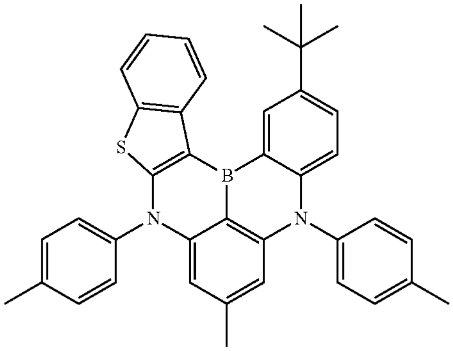
[Chemical Formula 8]
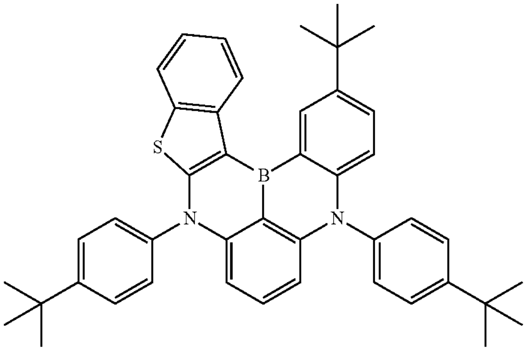
-continued
[Chemical Formula 9]
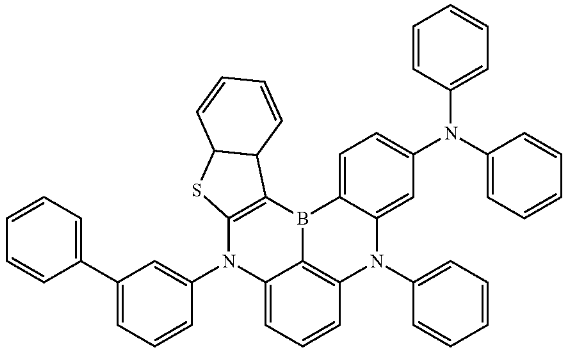
[Chemical Formula 10]
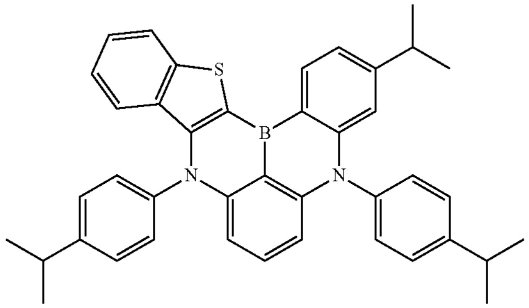
[Chemical Formula 11]
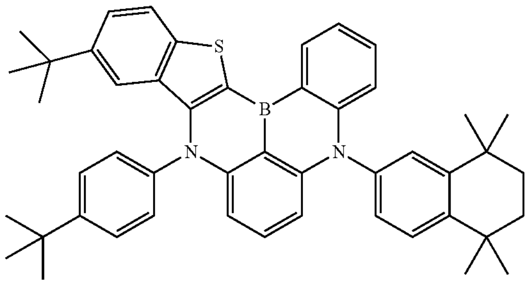
[Chemical Formula 12]
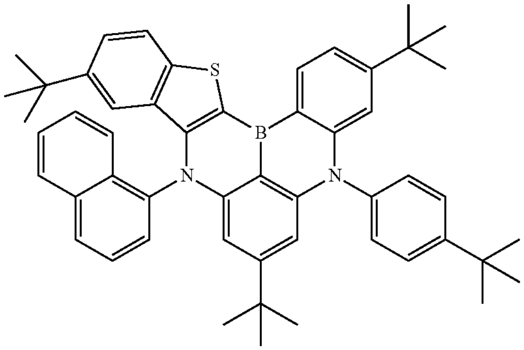

-continued
[Chemical Formula 13]
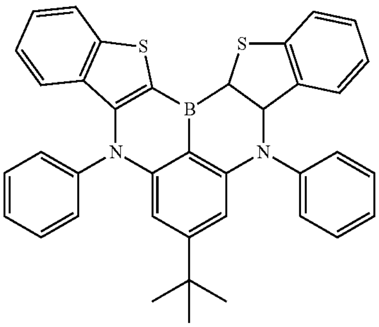
[Chemical Formula 14]
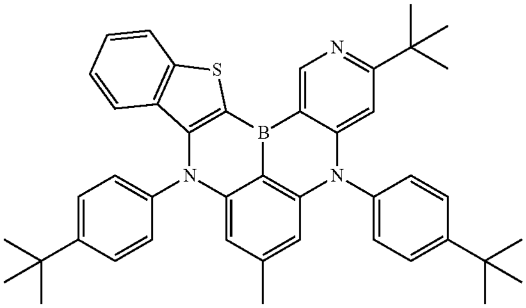
[Chemical Formula 15]
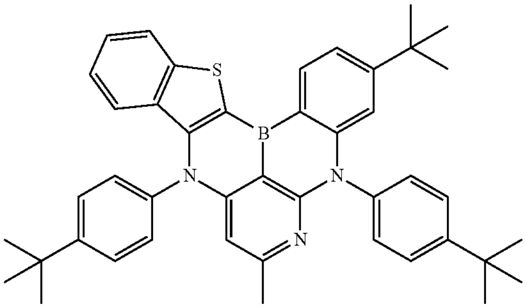
[Chemical Formula 16]
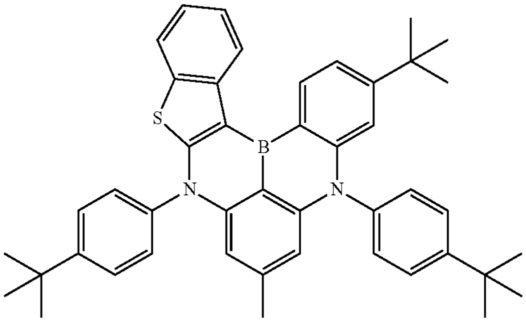
-continued
[Chemical Formula 17]
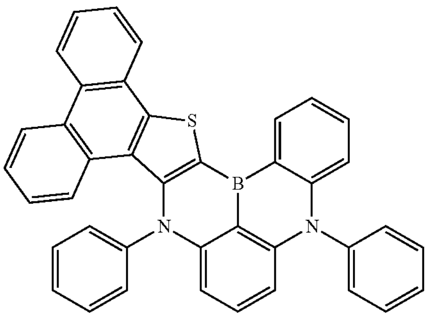
[Chemical Formula 18]
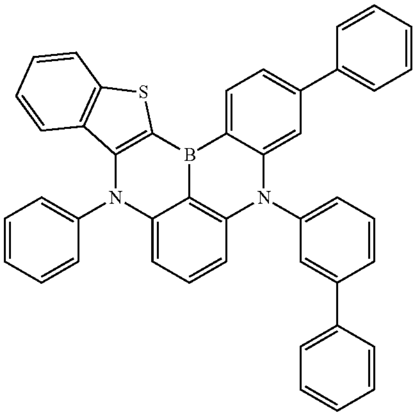
[Chemical Formula 19]
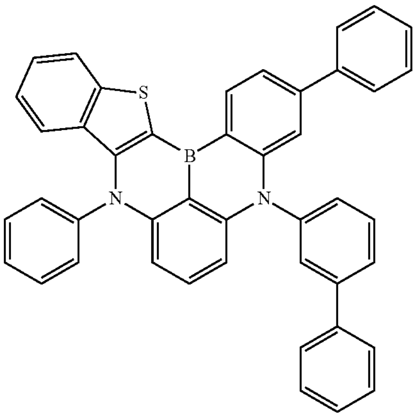

-continued
[Chemical Formula 20]
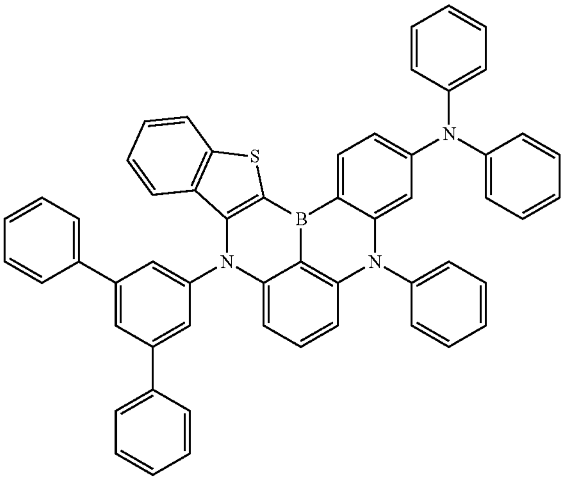
[Chemical Formula 21]
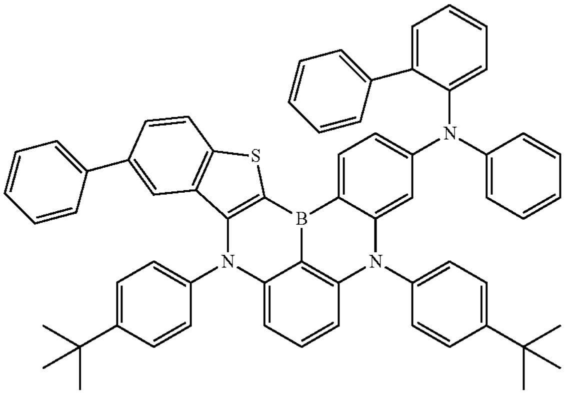
[Chemical Formula 22]
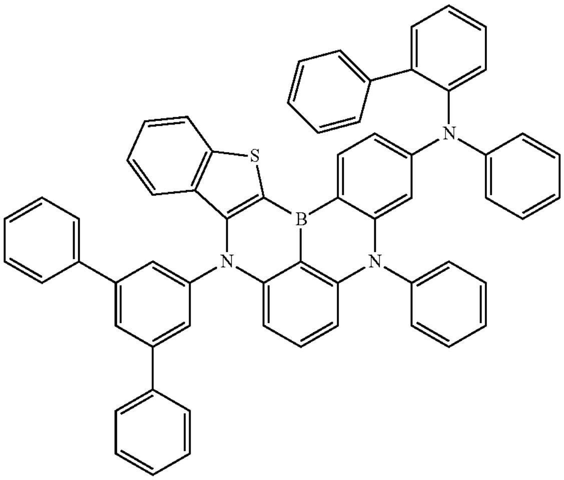
-continued
[Chemical Formula 23]
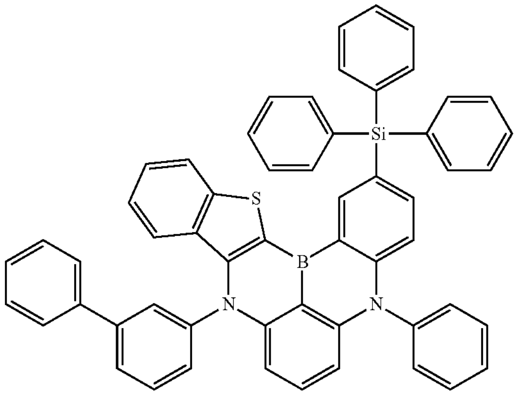
[Chemical Formula 24]
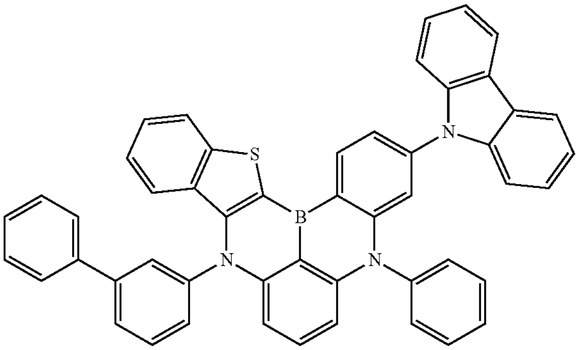
[Chemical Formula 25]
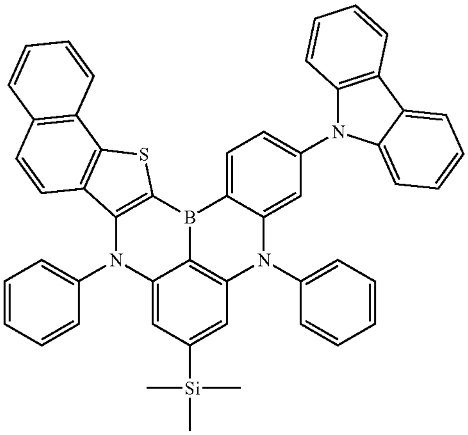

-continued
[Chemical Formula 26]
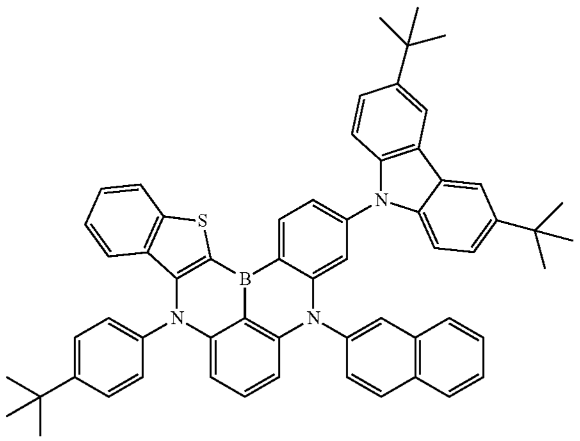
[Chemical Formula 27]
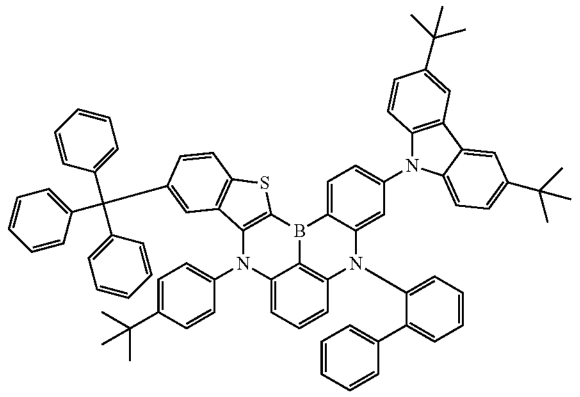
[Chemical Formula 28]
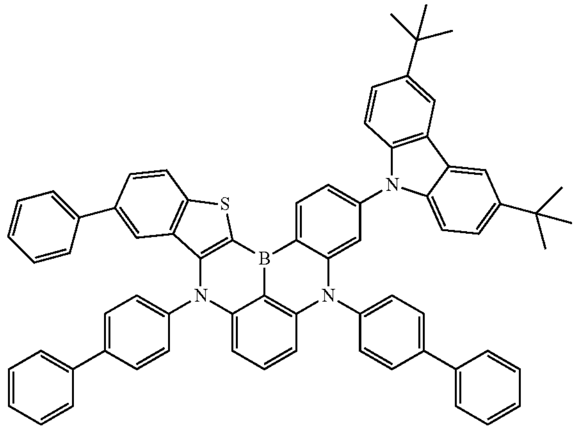
-continued
[Chemical Formula 29]
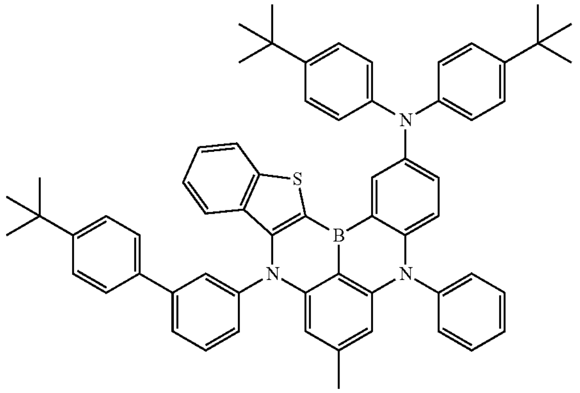
[Chemical Formula 30]
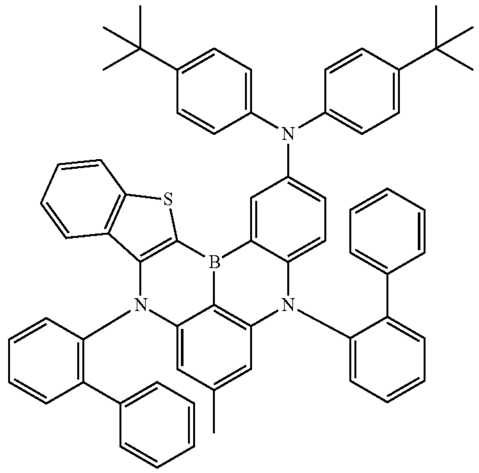
[Chemical Formula 31]
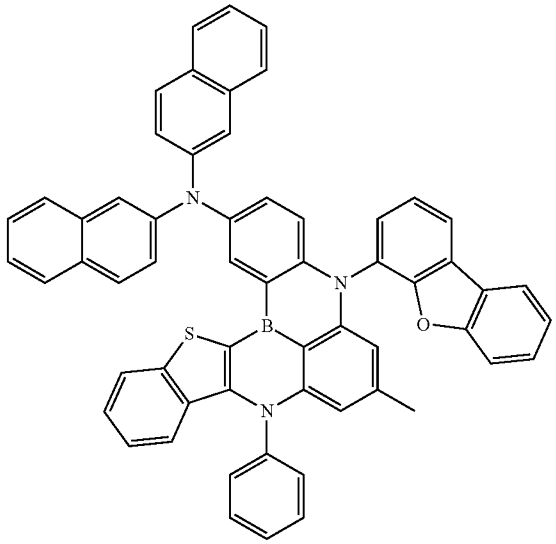

-continued
[Chemical Formula 32]
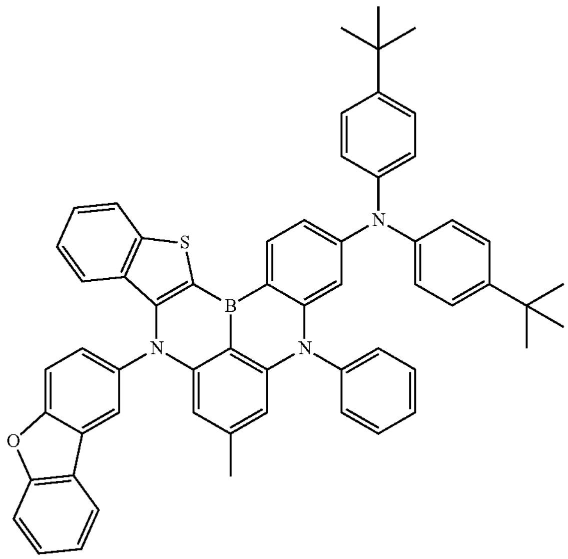
[Chemical Formula 33]
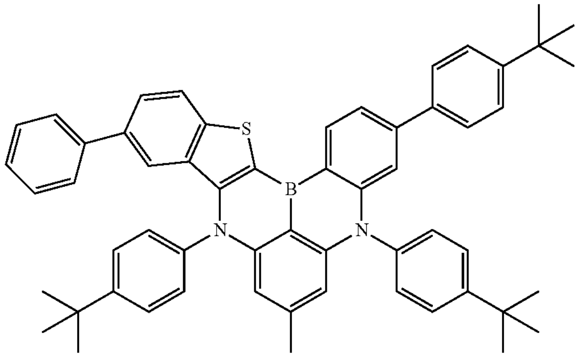
[Chemical Formula 34]
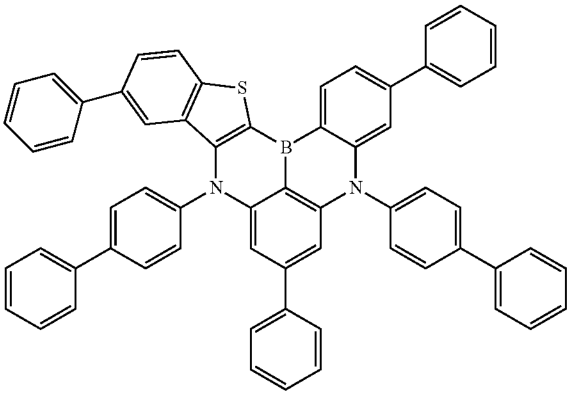
-continued
[Chemical Formula 35]
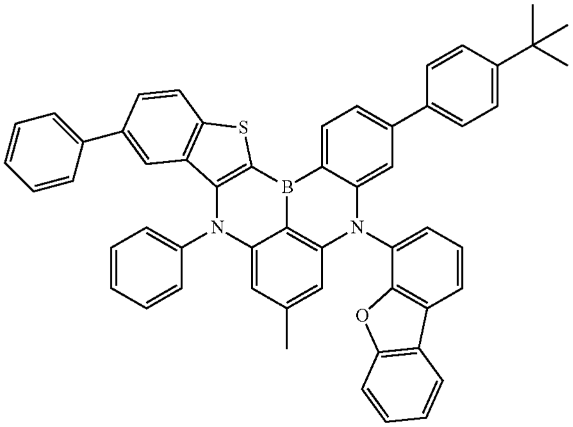
[Chemical Formula 36]
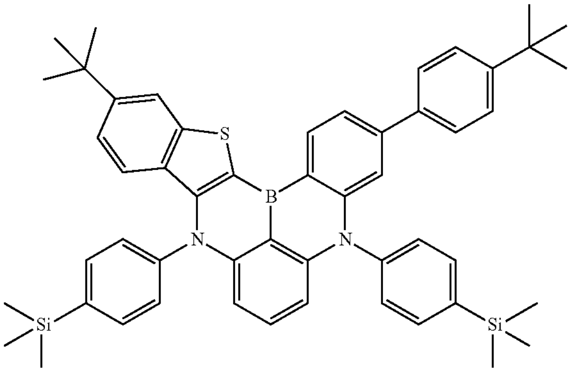
[Chemical Formula 37]
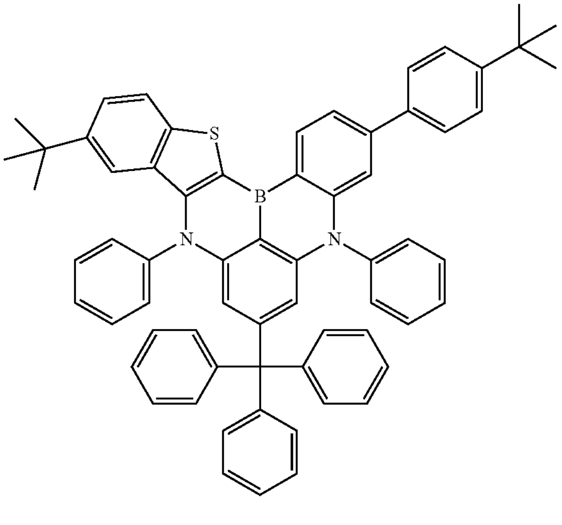

-continued
[Chemical Formula 38]
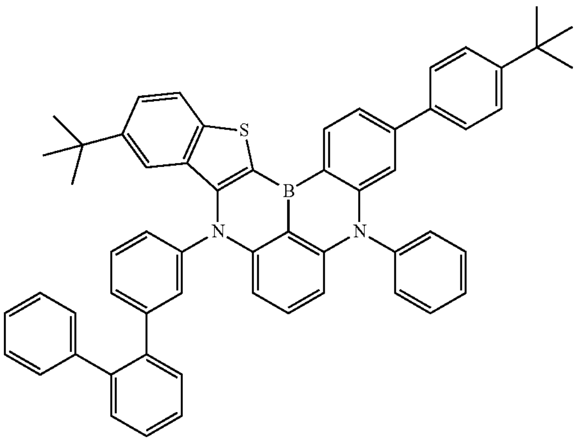
[Chemical Formula 39]
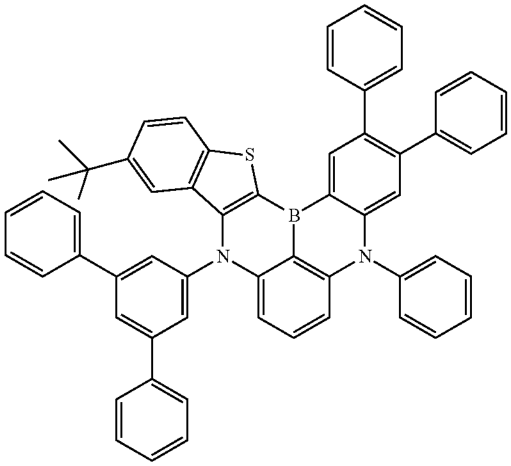
[Chemical Formula 40]
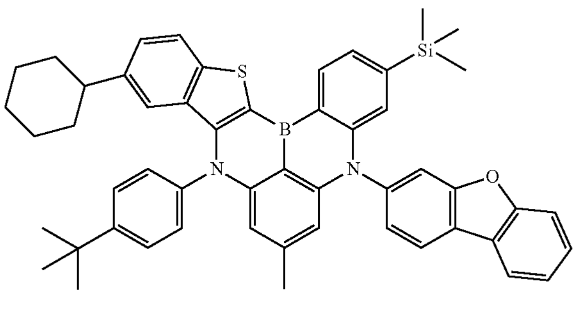
-continued
[Chemical Formula 41]
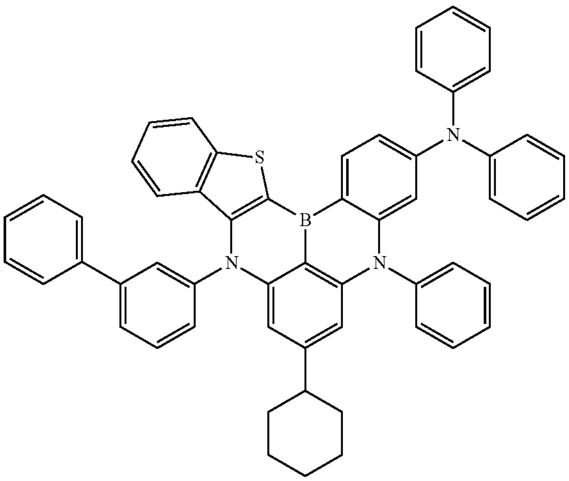
[Chemical Formula 42]
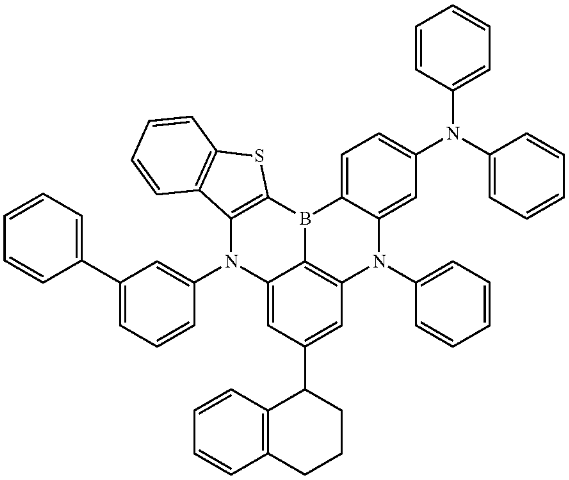
[Chemical Formula 43]
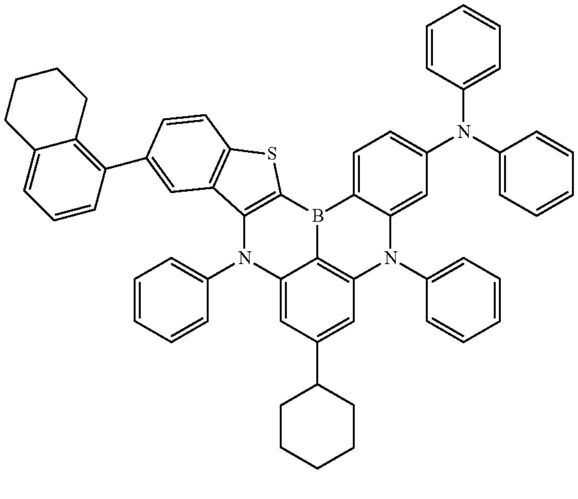

-continued
[Chemical Formula 44]
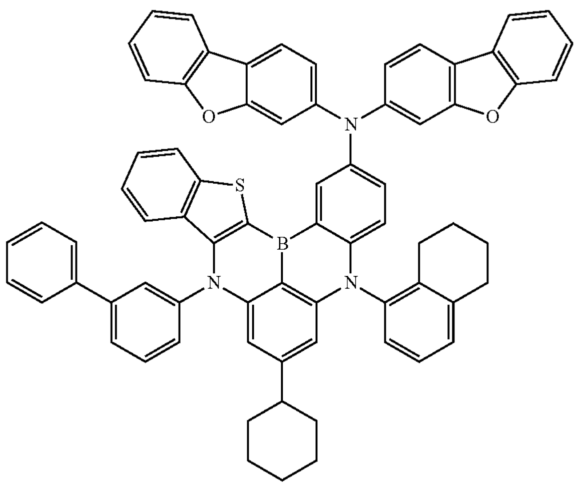
[Chemical Formula 45]
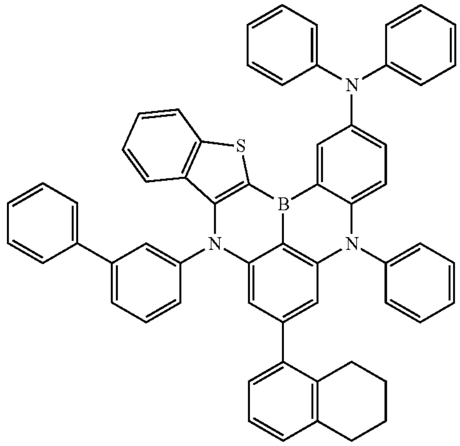
[Chemical Formula 46]
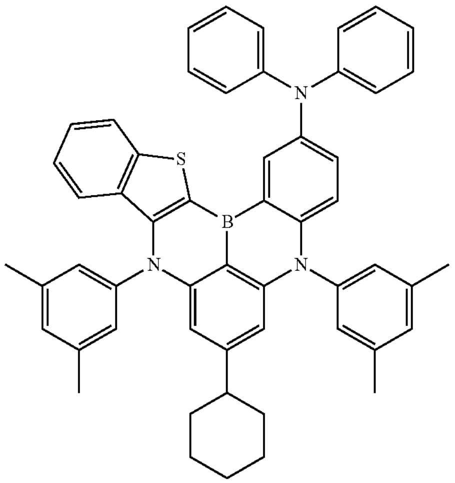
-continued
[Chemical Formula 47]
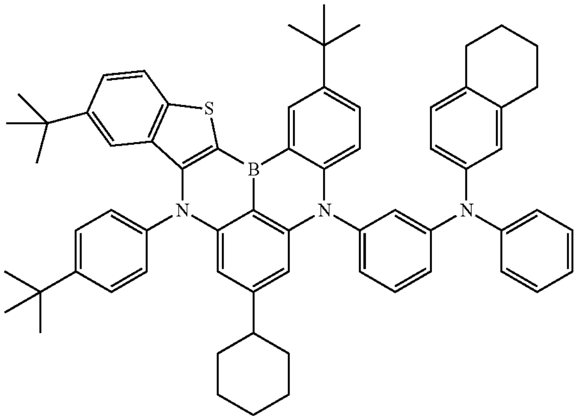
[Chemical Formula 48]
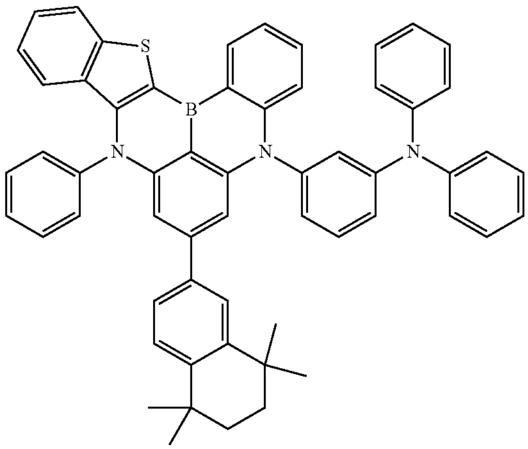
[Chemical Formula 49]
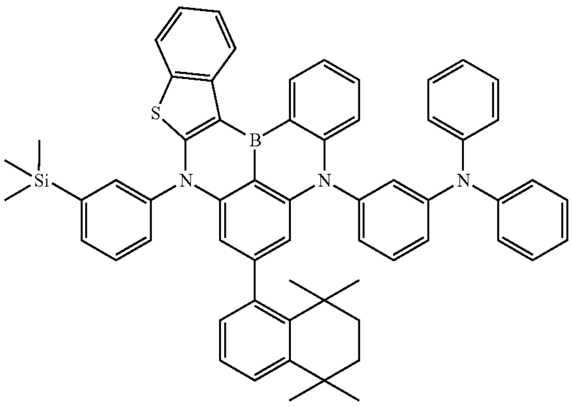
[Chemical Formula 50]
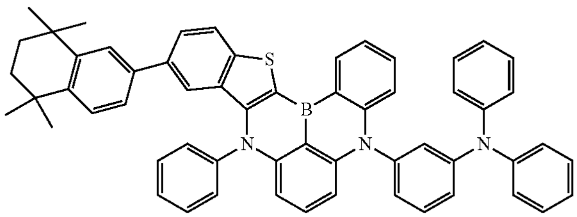

-continued
[Chemical Formula 51]
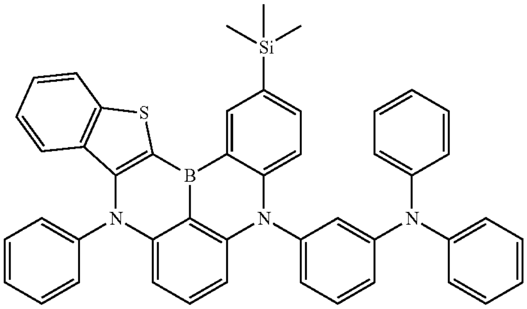
[Chemical Formula 52]
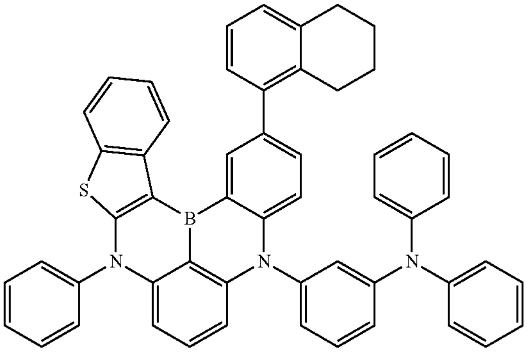
[Chemical Formula 53]
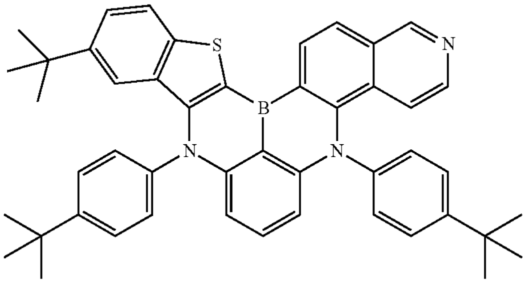
[Chemical Formula 54]
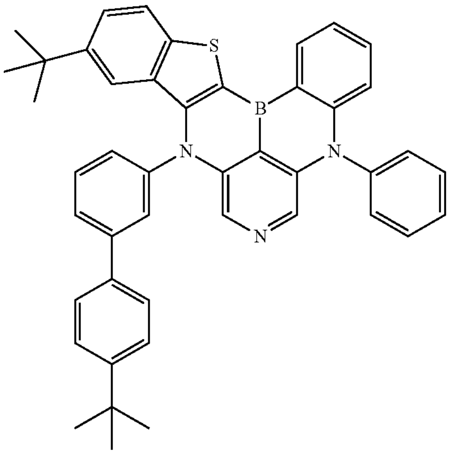
-continued
[Chemical Formula 55]
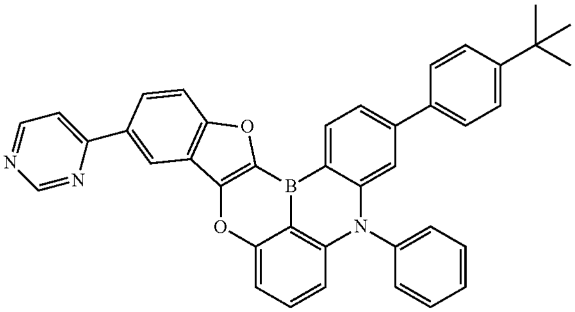
[Chemical Formula 56]
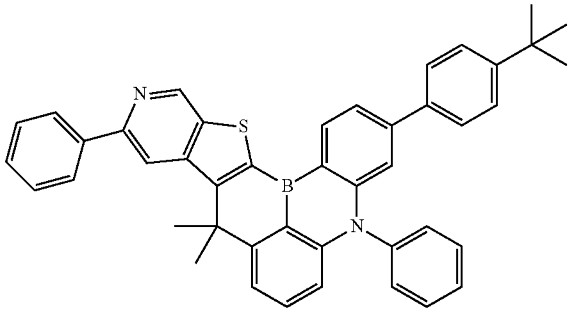
[Chemical Formula 57]
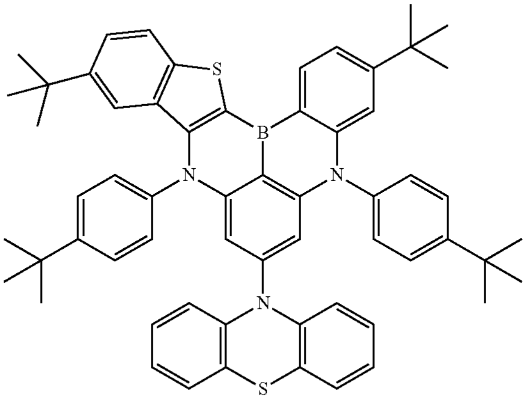
[Chemical Formula 58]
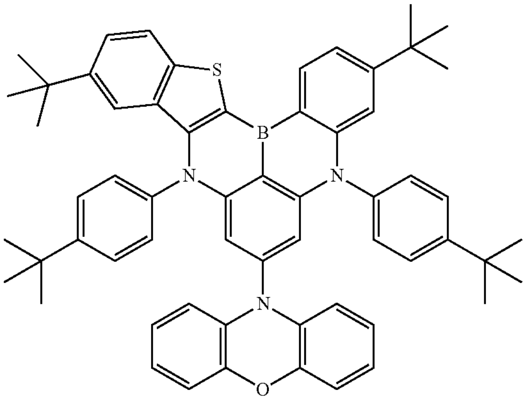

-continued
[Chemical Formula 59]
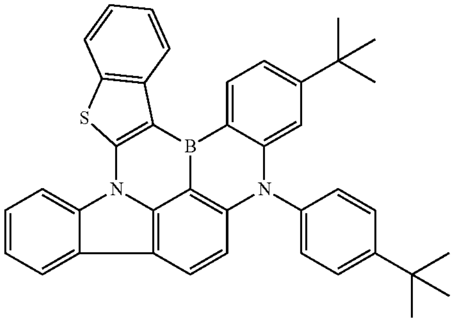
[CHemical Formula 60]
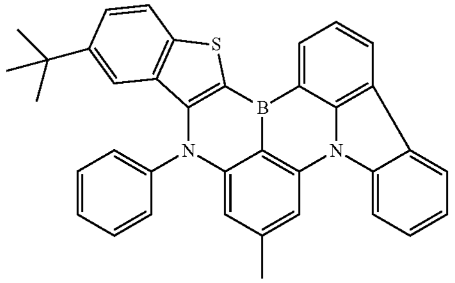
[Chemical Formula 61]
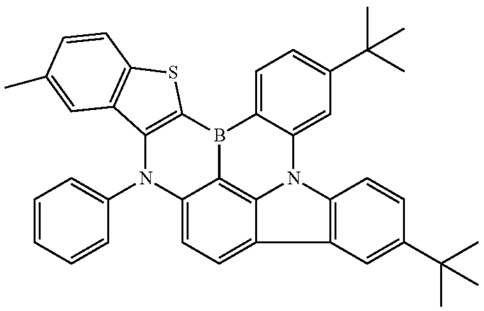
[Chemical Formula 62]
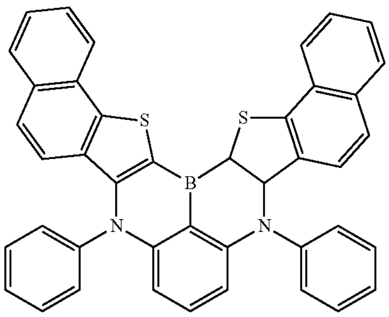
-continued
[Chemical Formula 63]
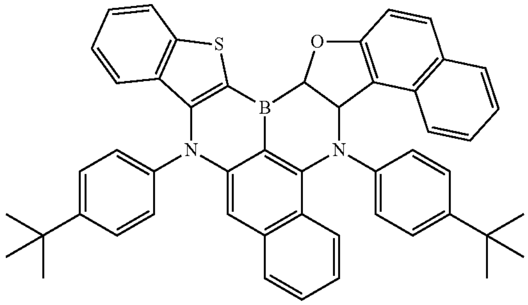
[Chemical Formula 64]
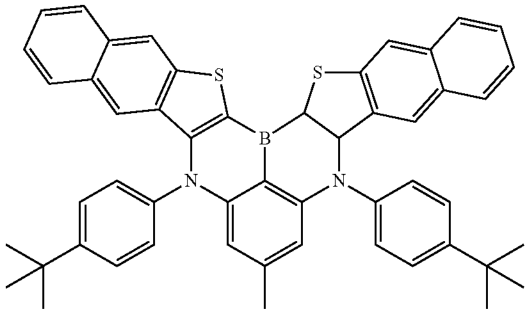
[Chemical Formula 65]
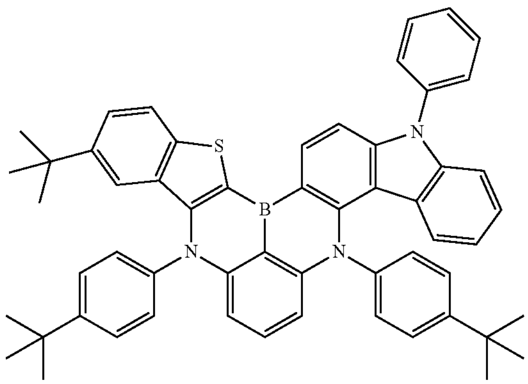
[Chemical Formula 66]
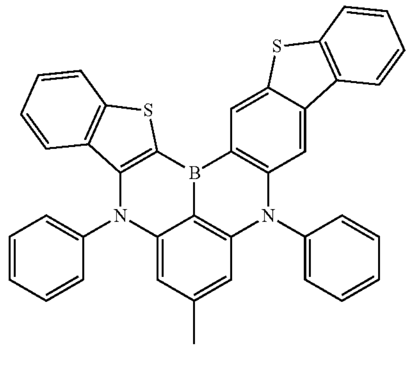

-continued
[Chemical Formula 67]
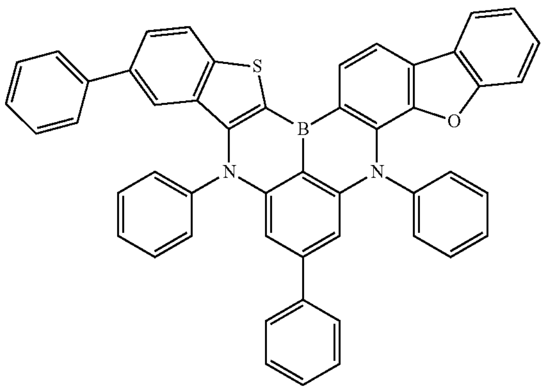
[Chemical Formula 68]
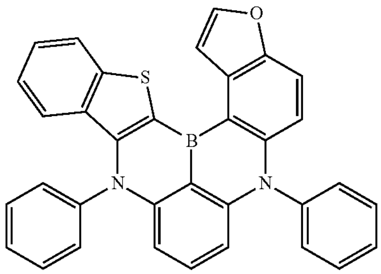
[Chemical Formula 69]
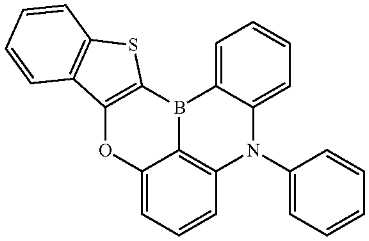
[Chemical Formula 70]
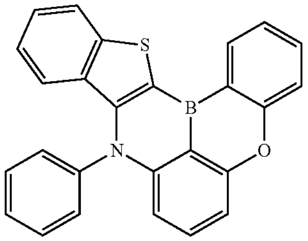
-continued
[Chemical Formula 71]
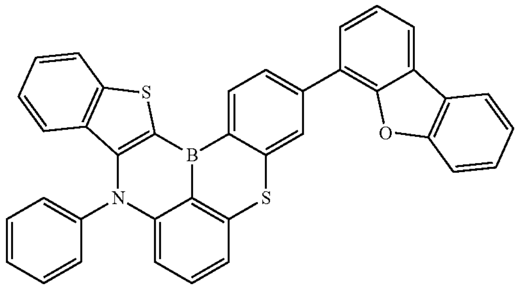
[Chemical Formula 72]
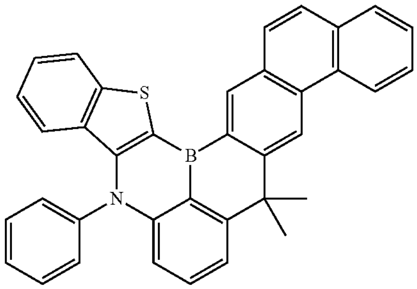
[Chemical Formula 73]
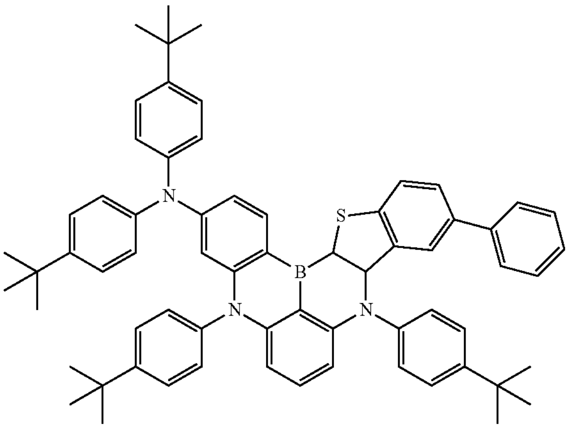
[Chemical Formula 74]
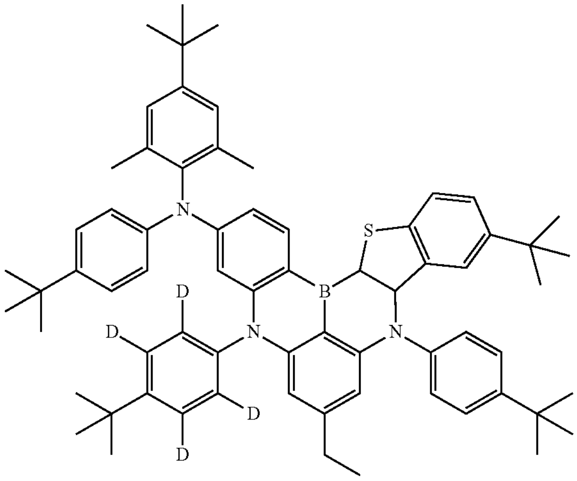

-continued
[Chemical Formula 75]
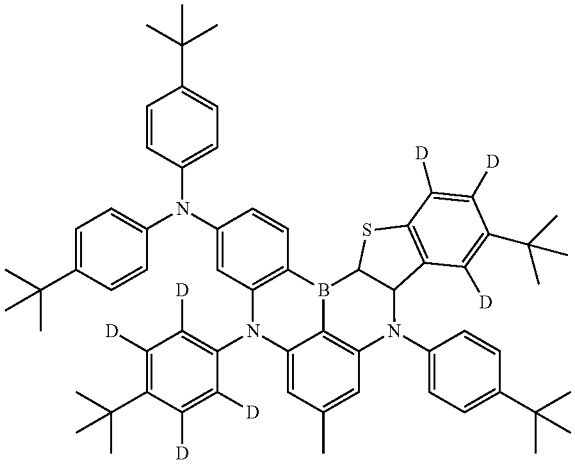
[Chemical Formula 76]
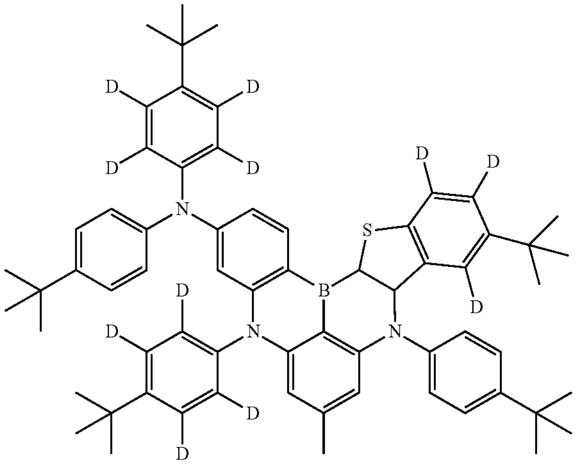
[Chemical Formula 77]
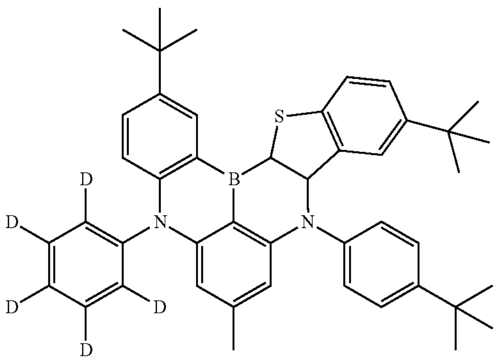
[Chemical Formula 78]
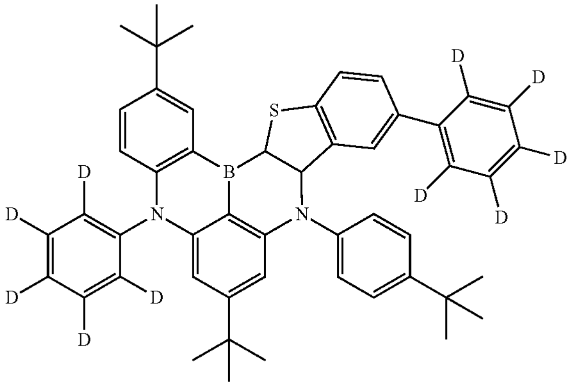
[Chemical Formula 79]
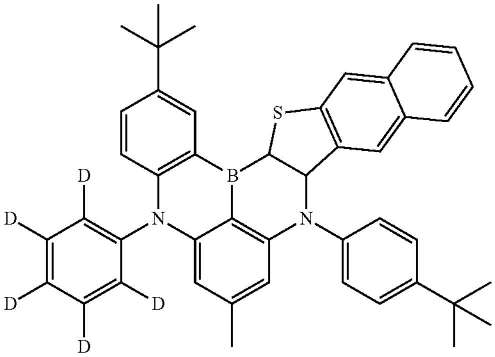
[Chemial Formula 80]
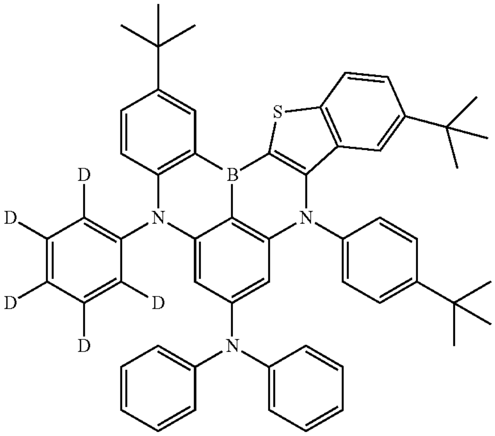

-continued

[Chemical Formula 81]

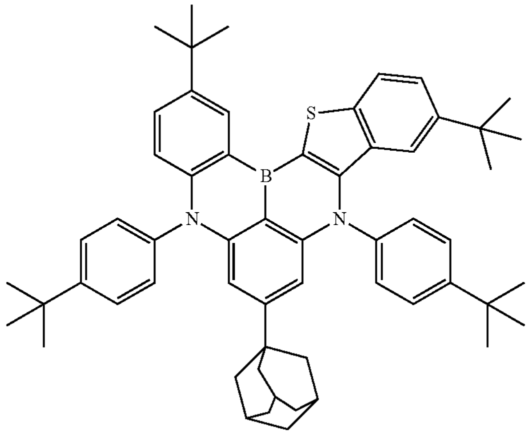

[Chemical Formula 82]

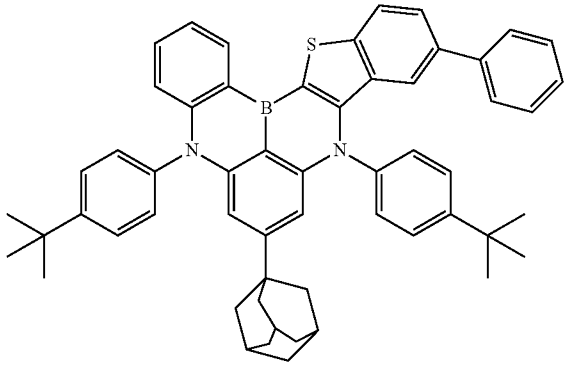

[Chemical Formula 83]

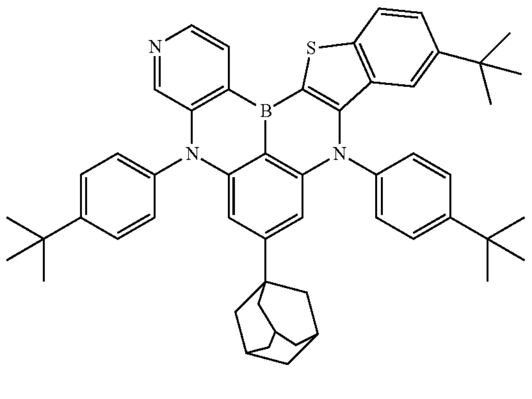

-continued

[Chemical Formula 84]

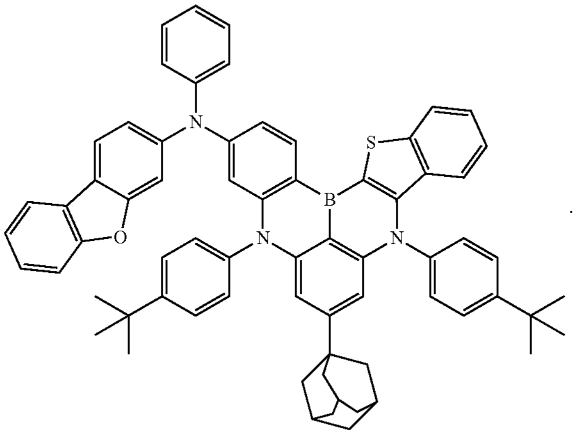

.

The organic layer within the organic light-emitting diode according to the present disclosure may include at least one of a hole injection layer, a hole transport layer, a functional layer capable of both hole injection and hole transport, an electron transport layer, and an electron injection layer, in addition to the light emission layer.

FIG. 1 is a schematic view of the structure of an organic light-emitting diode according to the present disclosure.

As shown in FIG. 1, the organic light-emitting diode according to an embodiment of the present disclosure comprises an anode 20, a hole transport layer 40, a light emission layer 50, an electron transport layer 60, and a cathode 80, and optionally a hole injection layer 30 and an electron injection layer 70. In addition, one or two intermediate layers may be further formed in the organic light-emitting diode.

Here, the anthracene compound represented by Chemical Formula A can be used as a host in the light emitting layer.

Reference is made to FIG. 1 with regard to the organic light-emitting diode of the present disclosure and the fabrication thereof. First, a substrate 10 is coated with an anodic electrode material to form an anode 20. So long as it is used in a typical organic electroluminescence device, any substrate may be used as the substrate 10. Preferable is an organic substrate or transparent plastic substrate that exhibits excellent transparency, surface smoothness, ease of handling, and waterproofness. As the anodic electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imparted to the hole injection layer material, as long as it is one that is typically used in the art. For example, mention may be made of 2-TNATA [4,4',4"-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], DNTPD [N,N'-diphenyl-N,N'-bis-[4-(phenyl-m-tolyl-amino)-phenyl]-biphenyl-4,4'-diamine], or HAT-CN [dipyrazino[2,3-f:2',3'-h]quinoxaline-2,3,6,7,10,11-hexacarbonitrile], but the present disclosure is not limited thereby.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD), and N,N'-di(naphthalen-1-yl)-N,N'-diphenylbenzidine (a-NPD).

Then, an organic light emission layer 50 containing a host and a dopant is deposited on the hole transport layer 40 by deposition in a vacuum or by spin coating. In some embodiments of the present disclosure, the light emission layer particularly ranges in thickness from 50 to 2,000 Å. Here, an electron density control layer (not shown) may be further formed on the organic light emitting layer 50, as necessary.

The light emission layer may contain a host and a dopant. The materials for the host and dopant are as described above. The content of the dopant may range from about 0.01 to 20 parts by weight, based on 100 parts by weight of the host, but is not limited thereto.

In addition, the anthracene compound represented by Chemical Formula A may be used as a host alone or in mixture with a well-known host in the light emission layer or may be deposited separately from a well-known host in the light emission layer.

In an embodiment, the anthracene compound represented by Chemical Formula A may be used in mixture with at least one different host compound in the light emission layer or may be deposited separately from at least one host compound in the light emission layer.

When the anthracene compound is used in mixture with or separately from a well-known host, the available well-known host may be at least one of the compounds represented by Chemical Formulas B and C, below:

[Chemical Formula B]

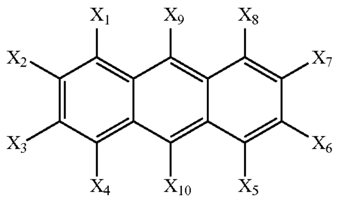

wherein, $X_1$ to $X_{10}$, which are same or different, may each be independently at least one selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 5 to 30 carbon atoms, a substituted or unsubstituted amine of 0 to 30 carbon atoms, a substituted or unsubstituted aryl of 5 to 50 carbon atoms, a substituted or unsubstituted heteroaryl of 3 to 50 carbon atoms bearing O, N, or S as a heteroatom, a substituted or unsubstituted silicone, a substituted or unsubstituted boron, a substituted or unsubstituted silyl of 0 to 30 carbon atoms, a carbonyl, a phosphoryl, an amino, a nitrile, a hydroxy, a nitro, a halogen, an amide, and an ester, wherein adjacent radicals may form an aliphatic, an aromatic, an aliphatic hetero, or an aromatic hetero fused ring.

More particularly, concrete examples of the host compound represented by Chemical Formula B include, but are not limited to, compounds of [Chemical Formula 101] to [Chemical Formula 296]:

[Chemical Formula 101]

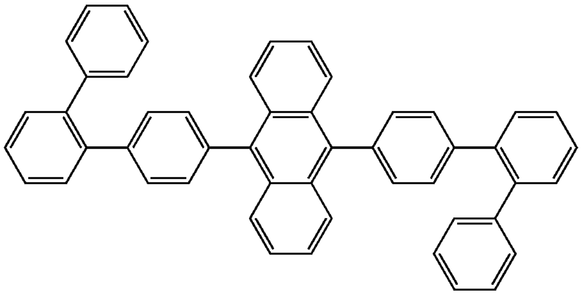

[Chemical Formula 102]

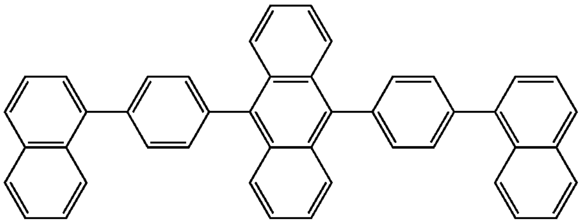

[Chemical Formula 103]

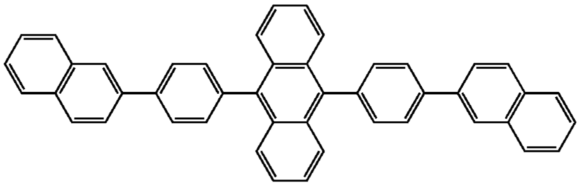

[Chemical Formula 104]

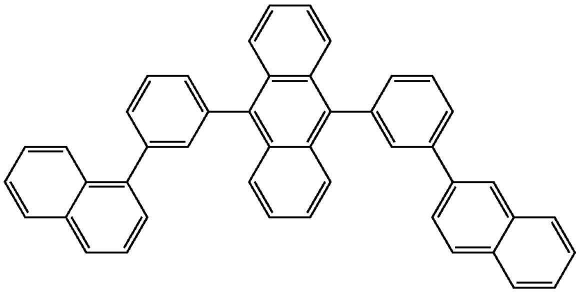

-continued
[Chemical Formula 105]
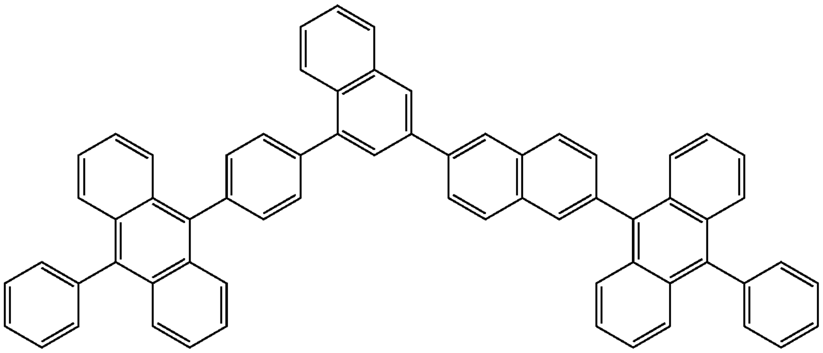
[Chemical Formula 106]
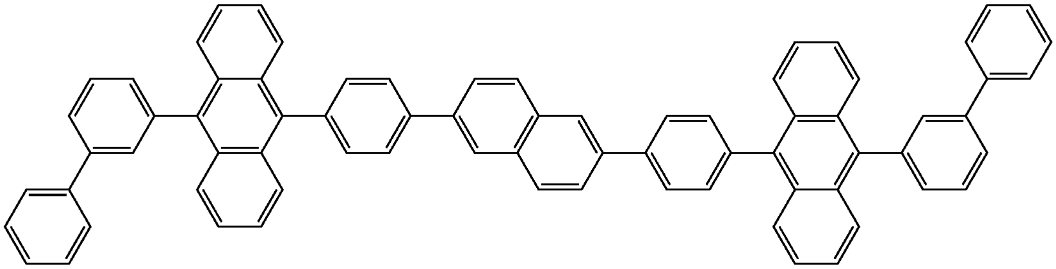
[Chemical Formula 107]
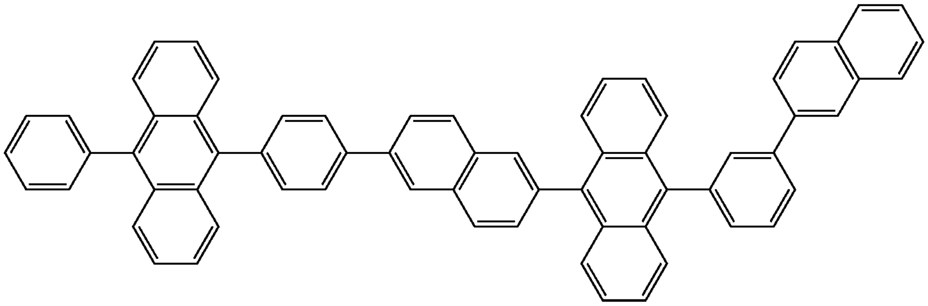
[Chemical Formula 108]
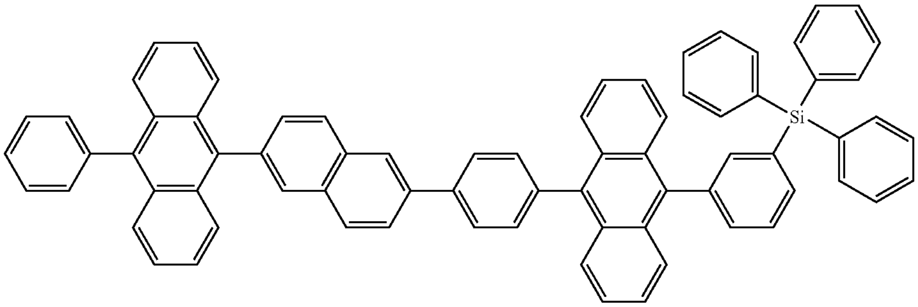
[Chemical Formula 109]
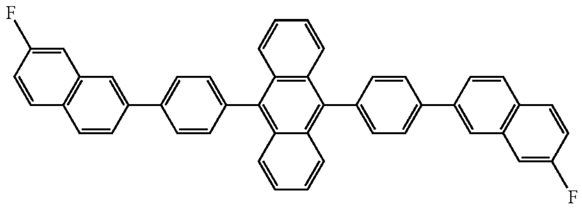
[Chemical Formula 110]
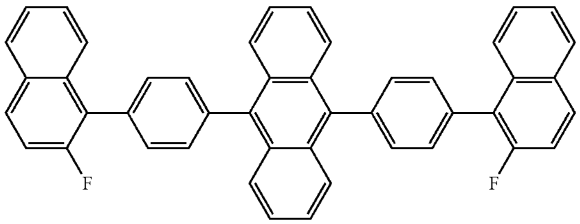

-continued
[Chemical Formula 111]
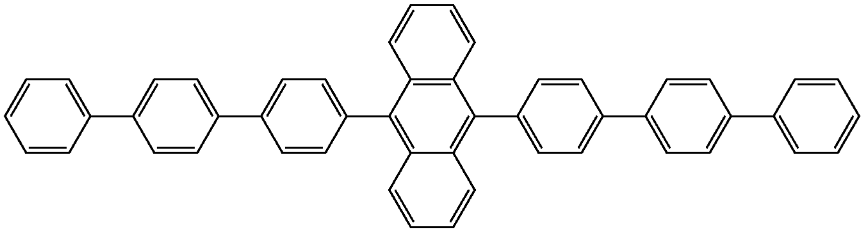
[Chemical Formula 112]
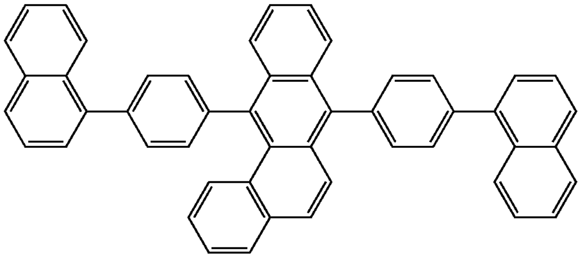
[Chemical Formula 113]
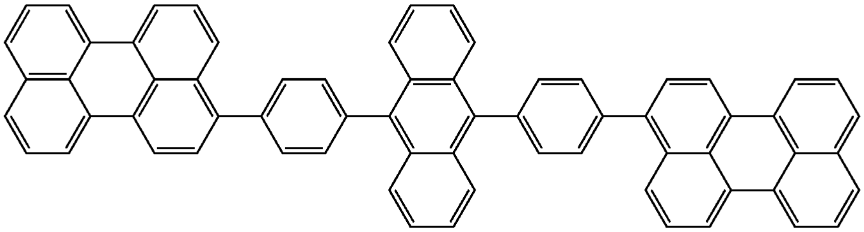
[Chemical Formula 114]
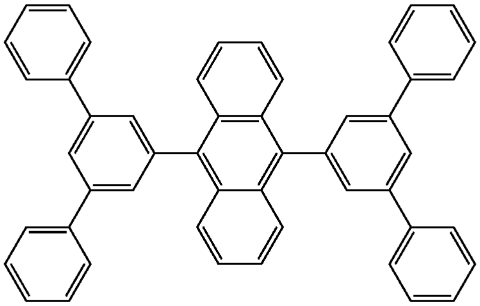
[Chemical Formula 115]
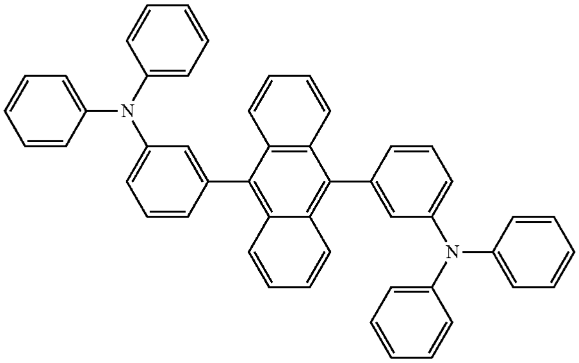
[Chemical Formula 116]
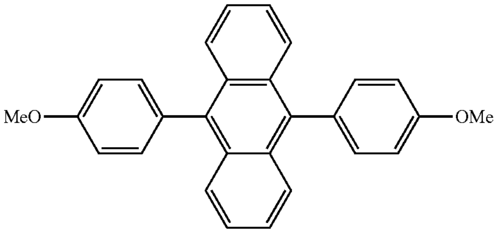
[Chemical Formula 117]
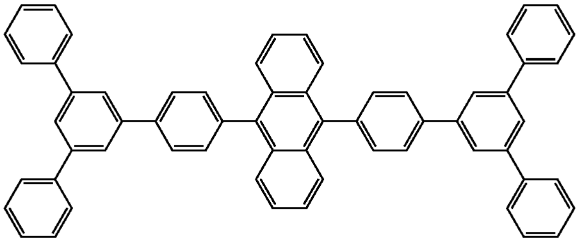

-continued
[Chemical Formula 118]
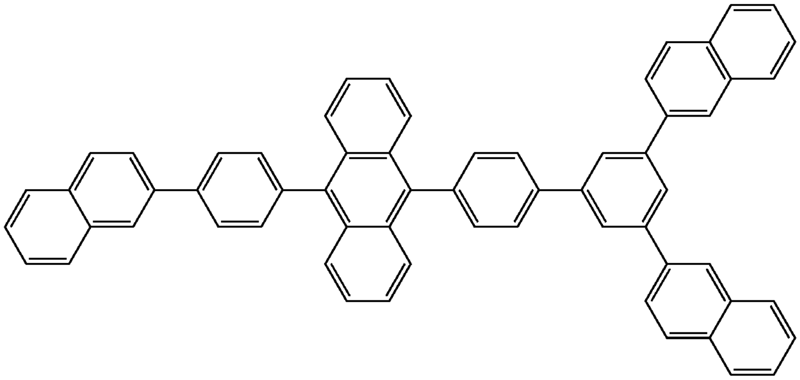
[Chemical Formula 119]
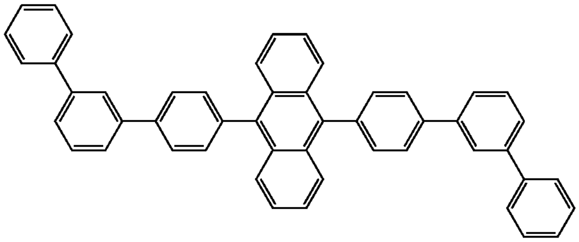
[Chemical Formula 120]
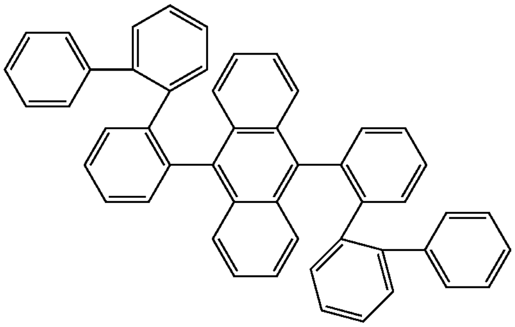
[Chemical Formula 121]
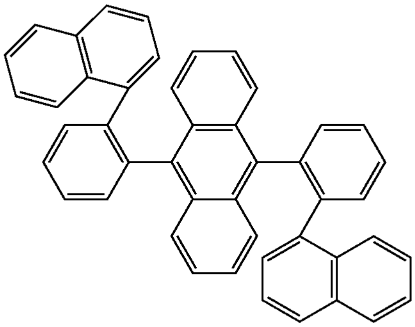
[Chemical Formula 122]
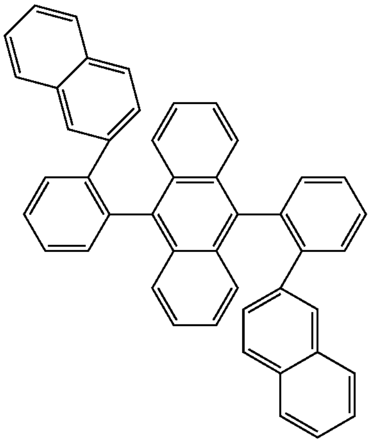

-continued
[Chemical Formula 123]
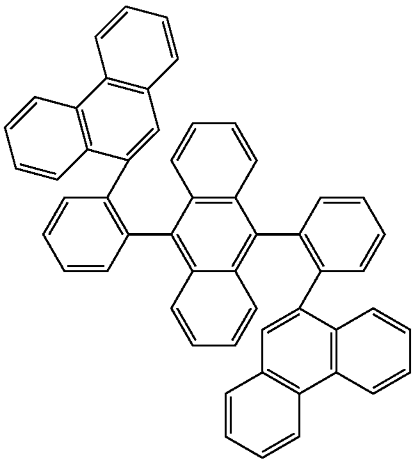
[Chemical Formula 124]
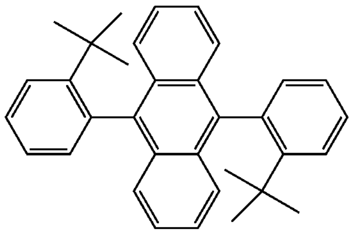
[Chemical Formula 125]
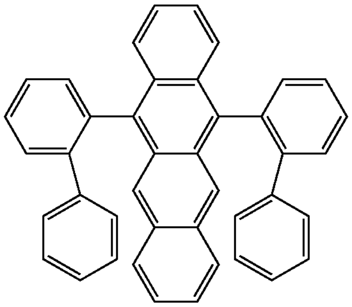
[Chemical Formula 126]
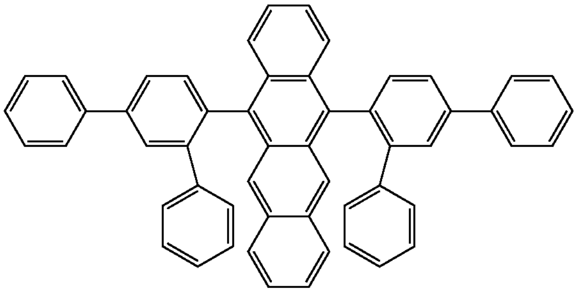
[Chemical Formula 127]
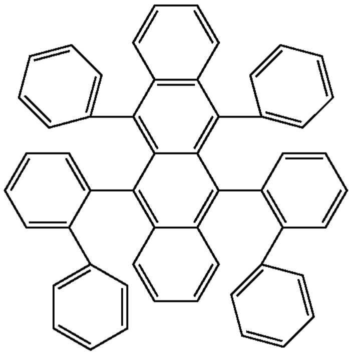
[Chemical Formula 128]
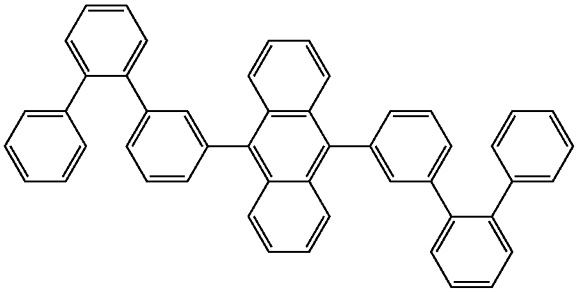
[Chemical Formula 129]
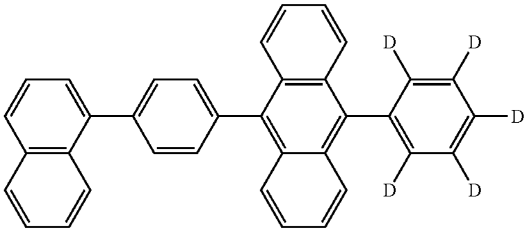
[Chemical Formula 130]
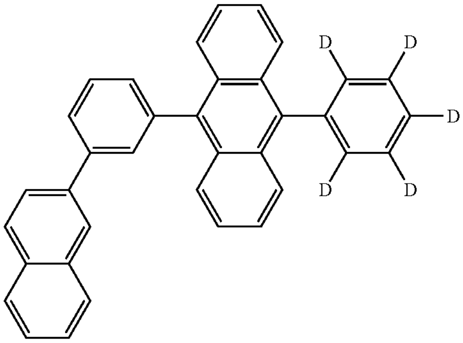

-continued
[Chemical Formula 131]
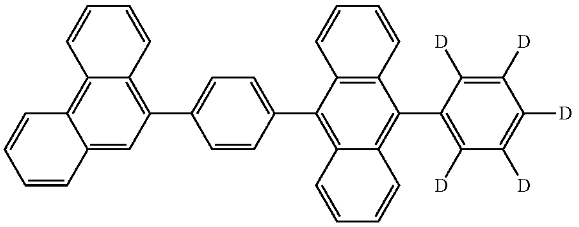
[Chemical Formula 132]
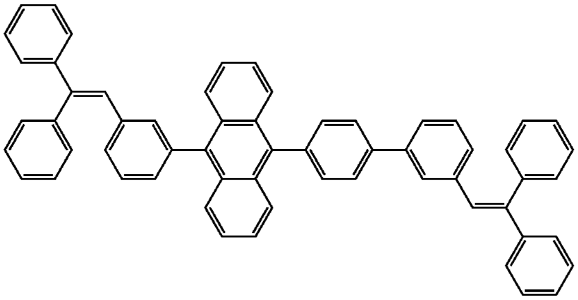
[Chemical Formula 133]
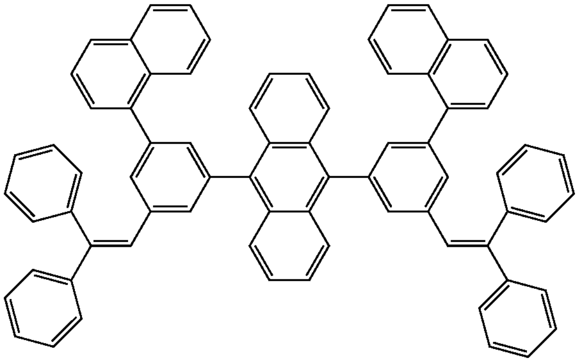
[Chemical Formula 134]
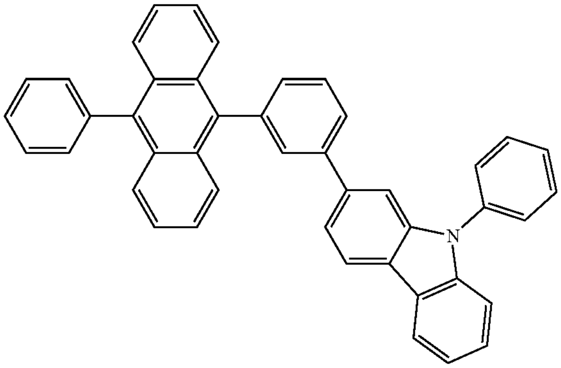
[Chemical Formula 135]
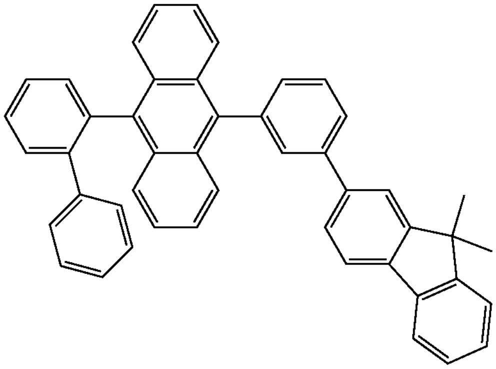
[Chemical Formula 136]
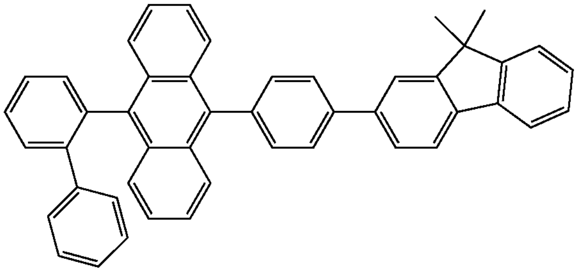
[Chemical Formula 137]
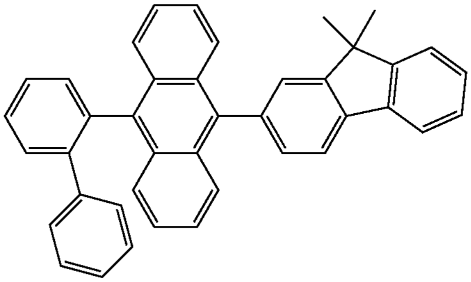
[Chemical Formula 138]
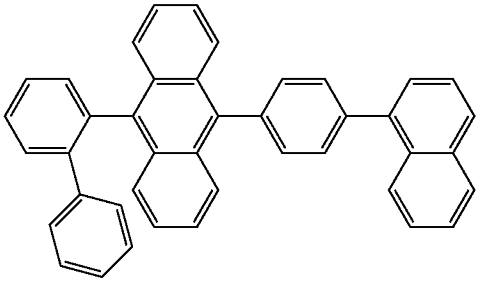

-continued
[Chemical Formula 139]
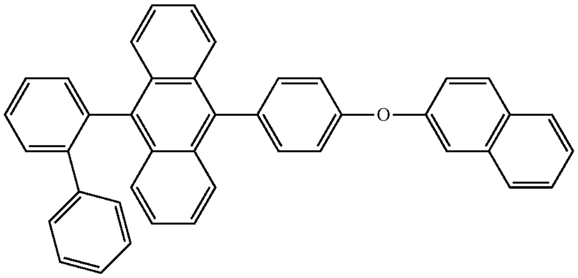
[Chemical Formula 140]
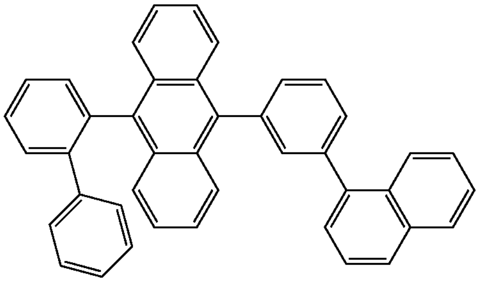
[Chemical Formula 141]
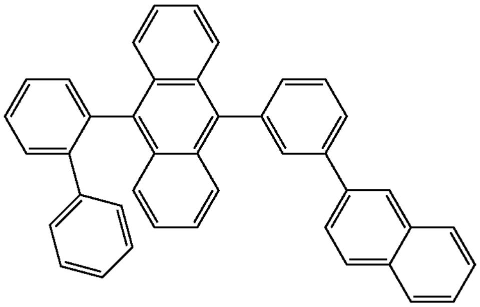
[Chemical Formula 142]
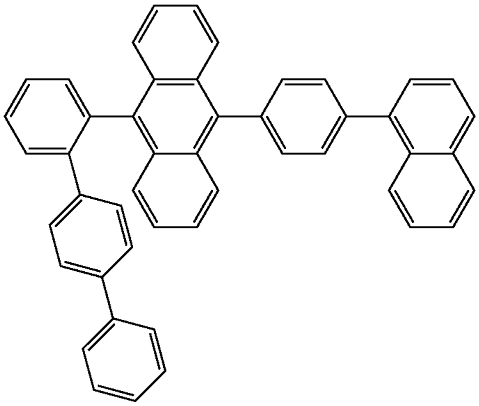
[Chemical Formula 143]
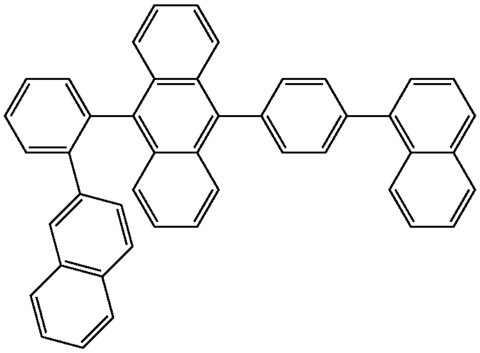
[Chemical Formula 144]
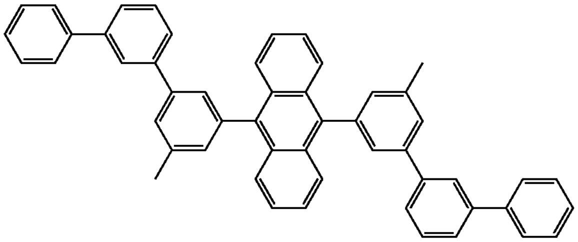
[Chemical Formula 145]
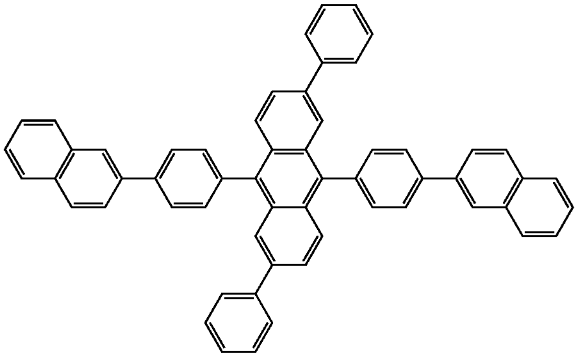
[Chemical Formula 146]
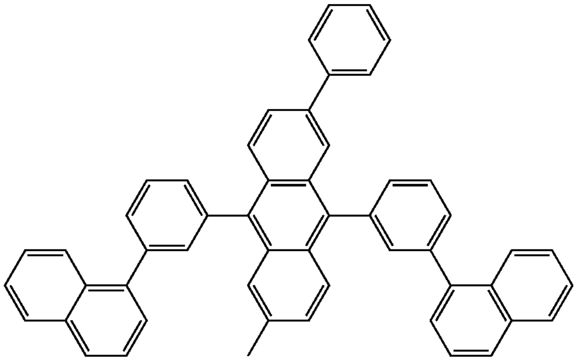

-continued
[Chemical Formula 147]
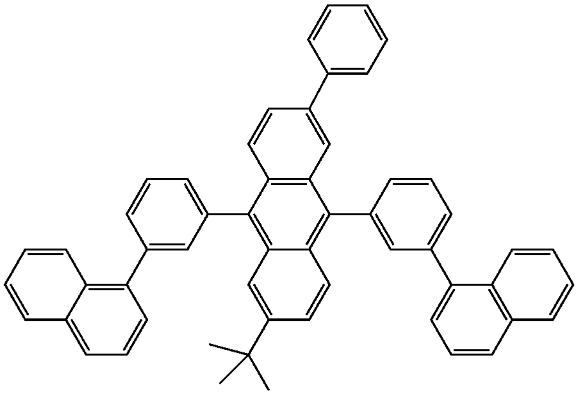
[Chemical Formula 148]
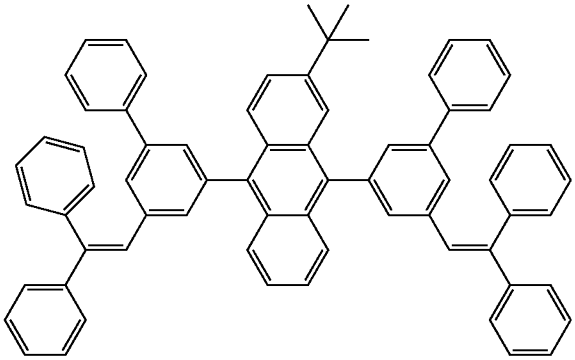
[Chemical Formula 149]
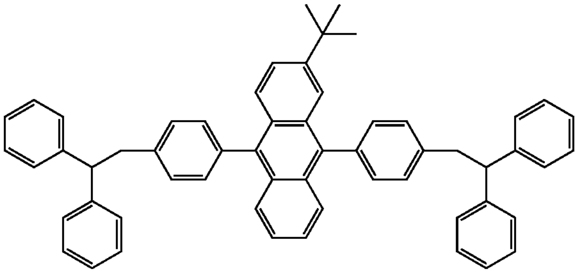
[Chemical Formula 150]
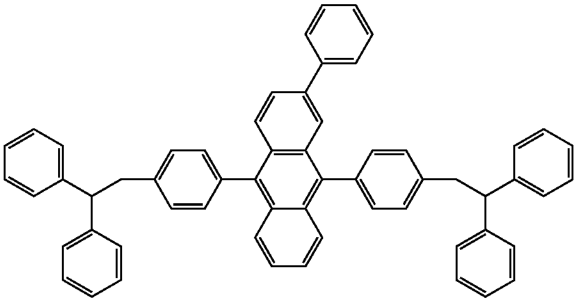
[Chemical Formula 151]
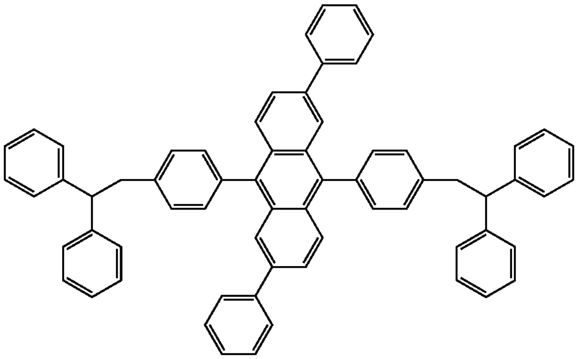
[Chemical Formula 152]
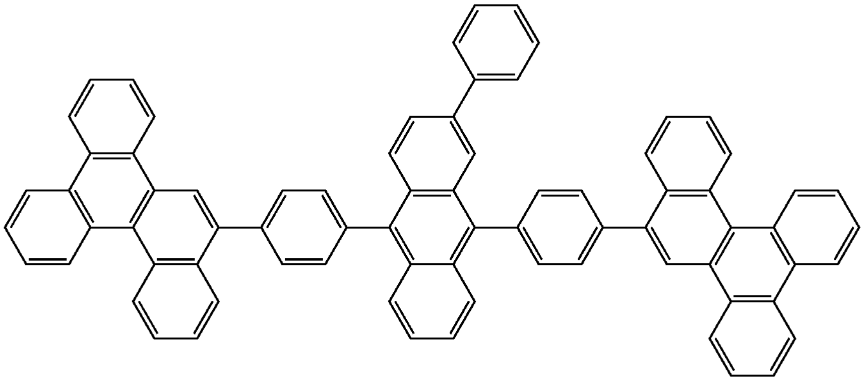

-continued
[Chemical Formula 153]
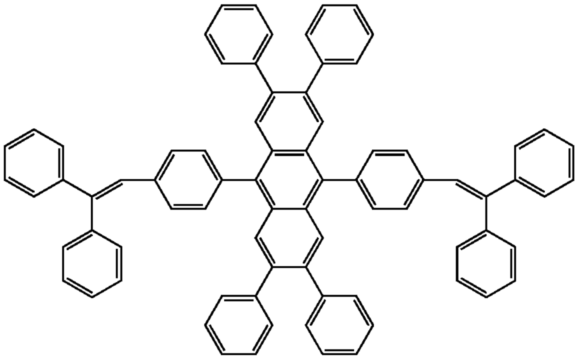
[Chemical Formula 154]
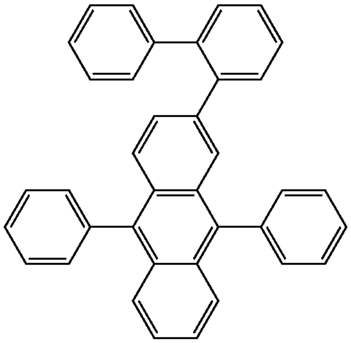
[Chemical Formula 155]
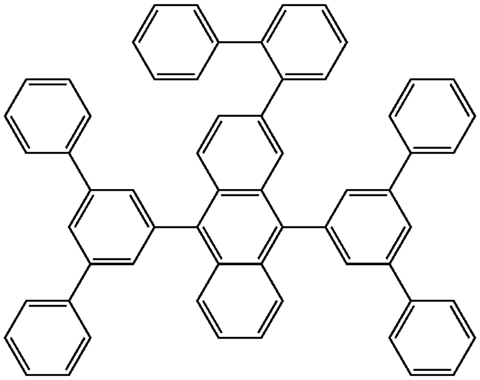
[Chemical Formula 156]
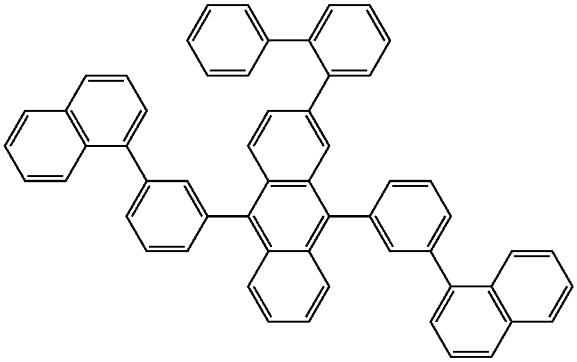
[Chemical Formula 157]
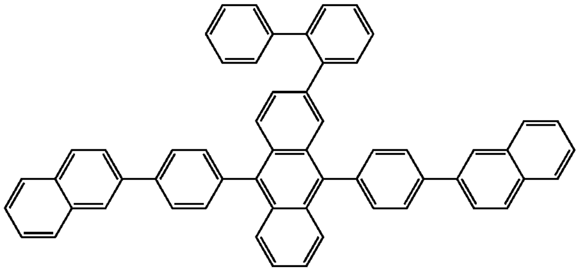
[Chemical Formula 158]
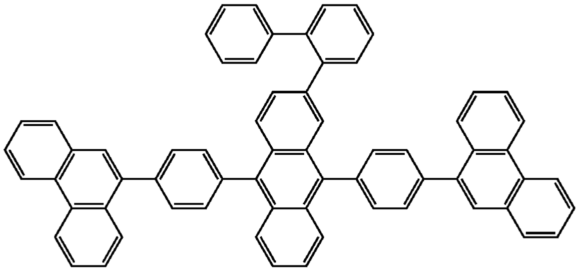
[Chemical Formula 159]
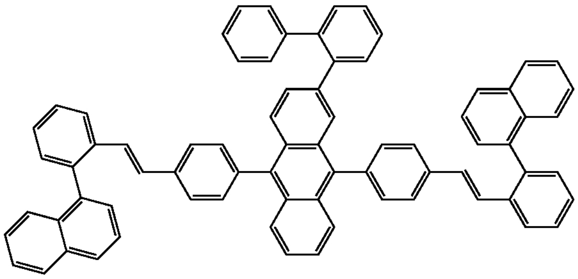

-continued
[Chemical Formula 160]
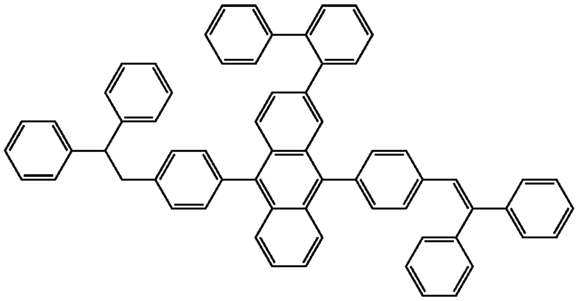
[Chemical Formula 161]
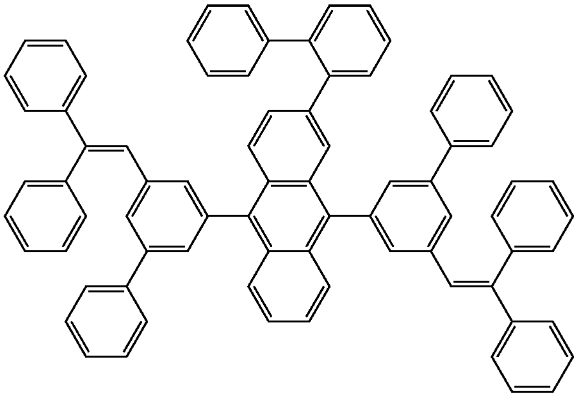
[Chemical Formula 162]
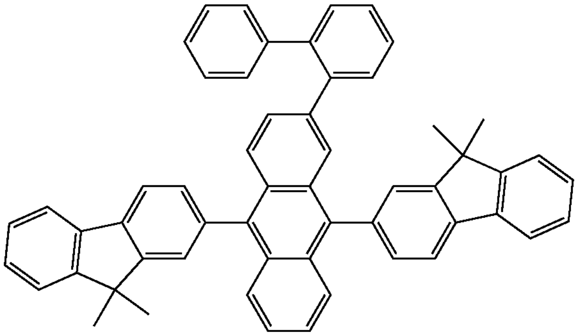
[Chemical Formula 163]
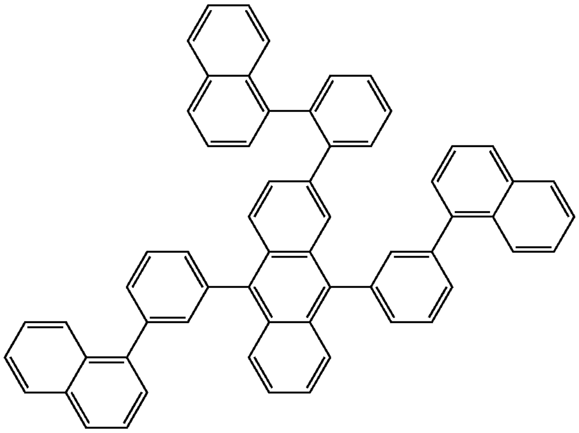
[Chemical Formula 164]
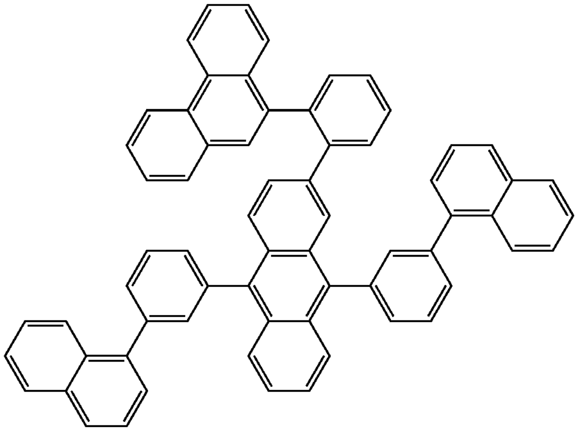
[Chemical Formula 165]
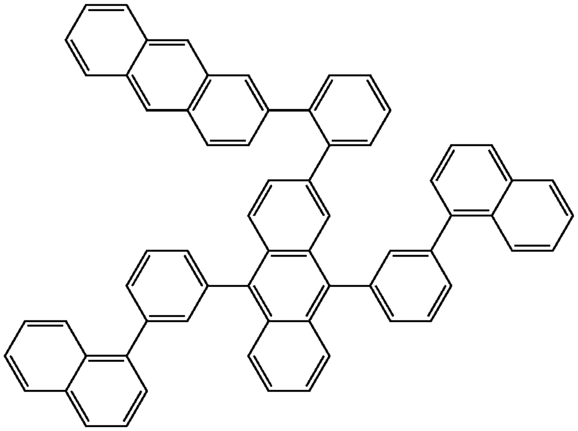

-continued
[Chemical Formula 166]
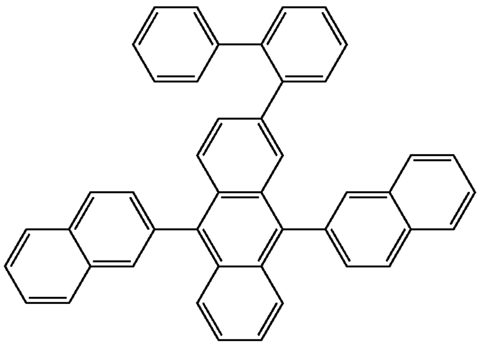
[Chemical Formula 167]
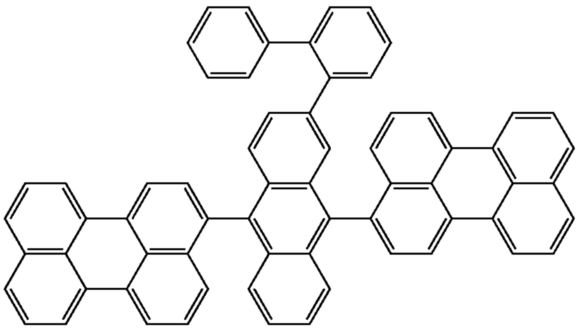
[Chemical Formula 168]
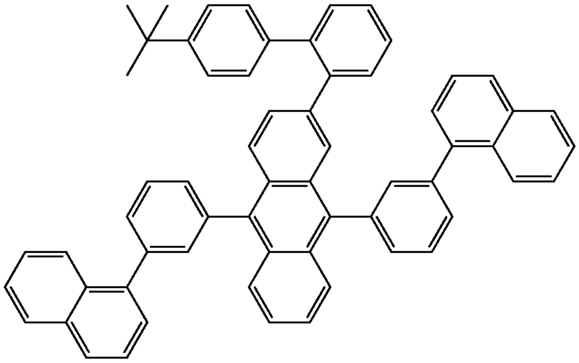
[Chemical Formula 169]
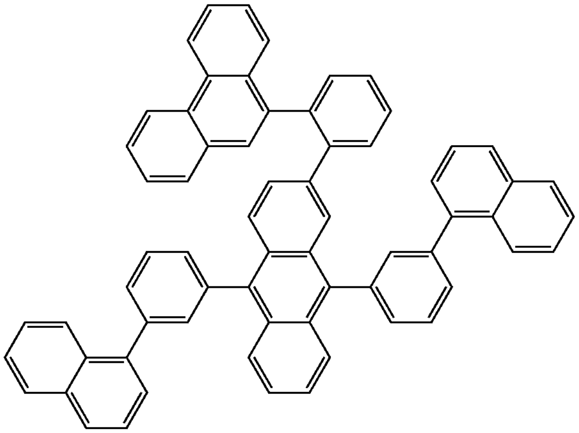
[Chemical Formula 170]
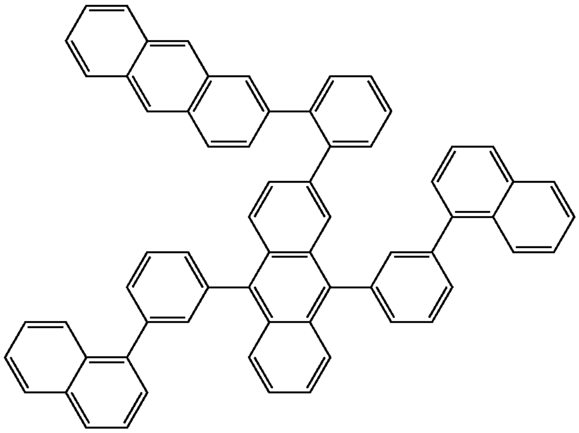
[Chemical Formula 171]
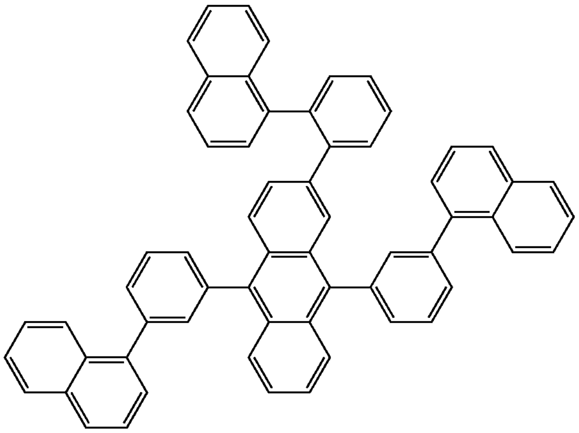

-continued
[Chemical Formula 172]
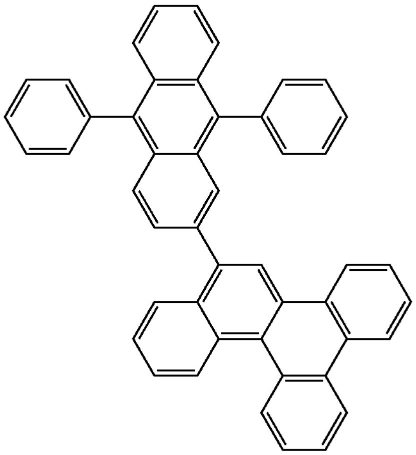
[Chemical Formula 173]
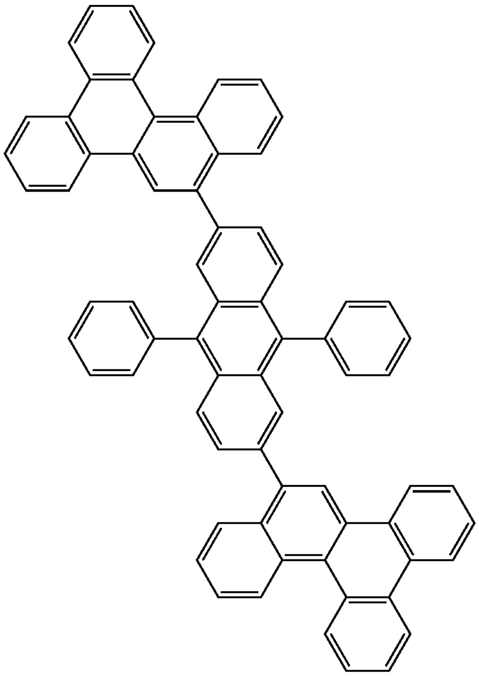
[Chemical Formula 174]
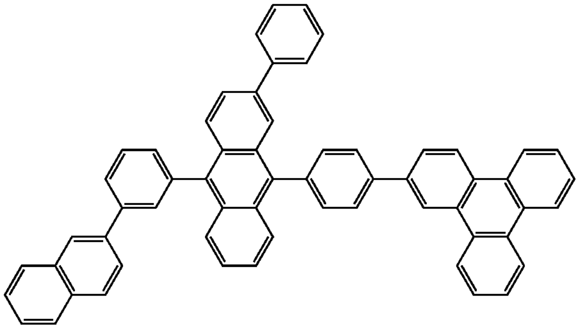
[Chemical Formula 175]
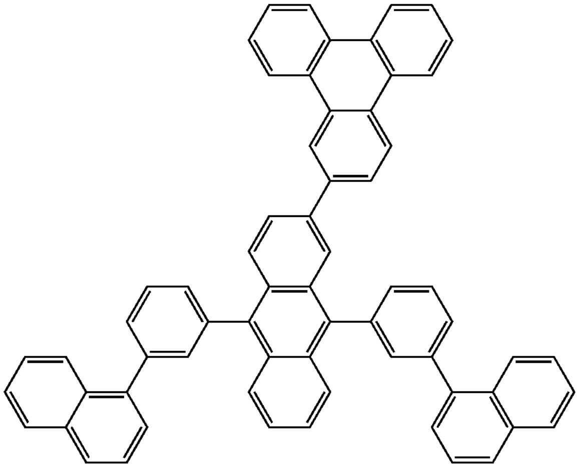
[Chemical Formula 176]
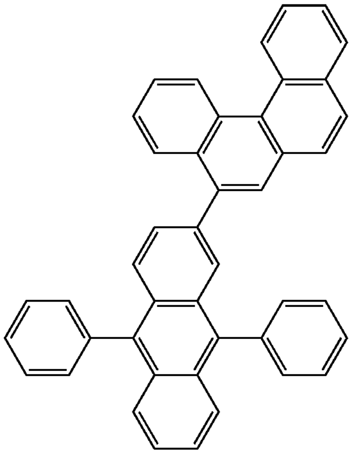
[Chemical Formula 177]
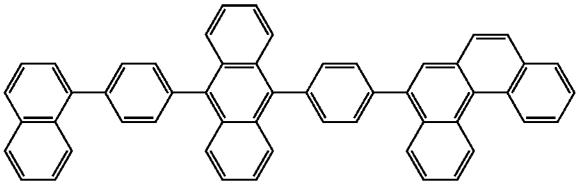

-continued
[Chemical Formula 178]
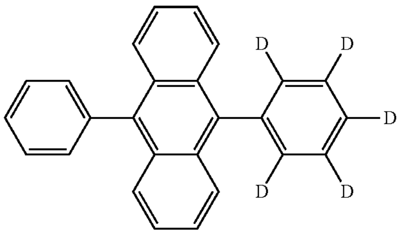
[Chemical Formula 179]
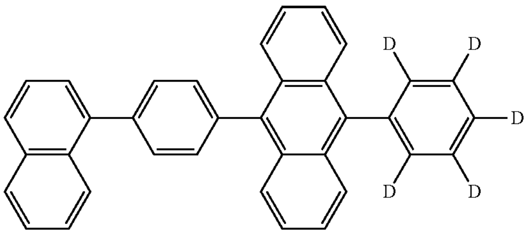
[Chemical Formula 180]
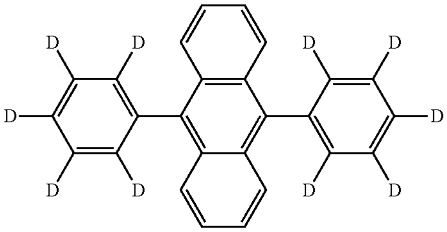
[Chemical Formula 181]
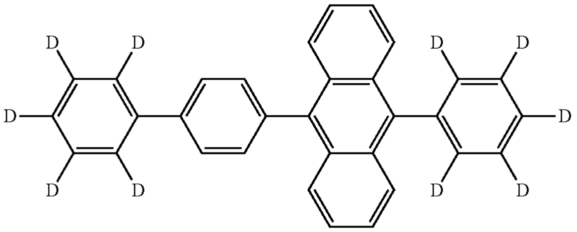
[Chemical Formula 182]
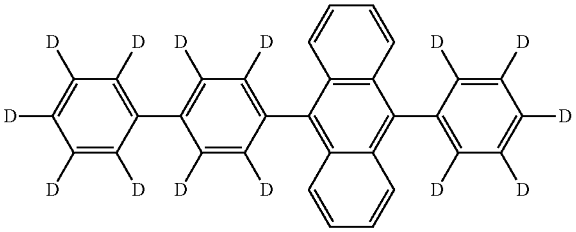
[Chemical Formula 183]
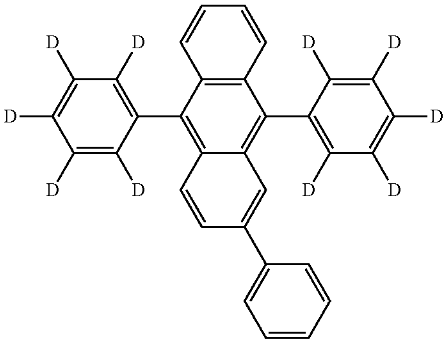
[Chemical Formula 184]
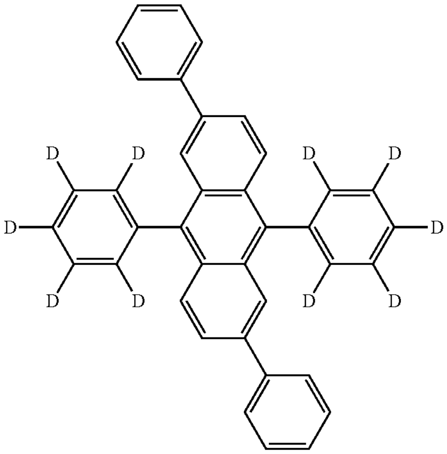

-continued
[Chemical Formula 185]
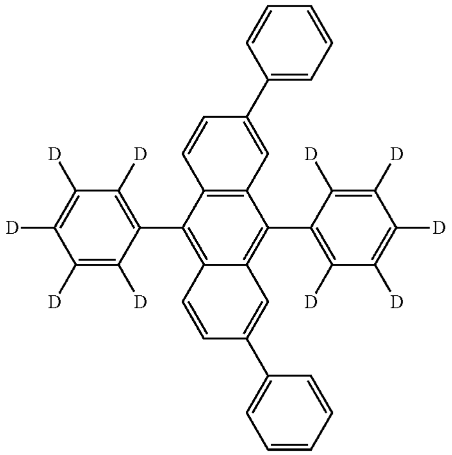
[Chemical Formula 186]
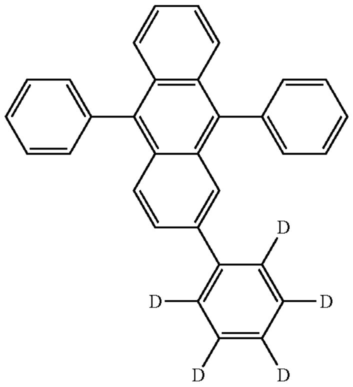
[Chemical Formula 187]
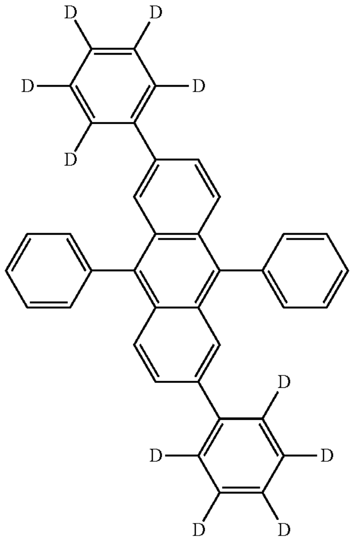
[Chemical Formula 188]
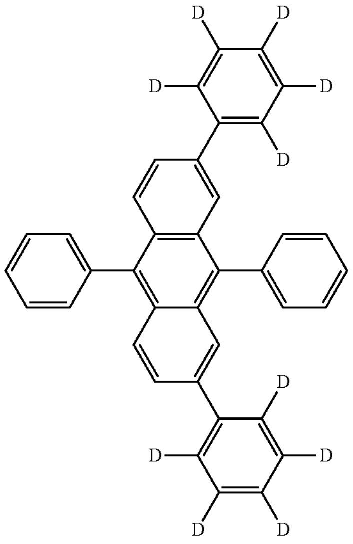
[Chemical Formula 189]
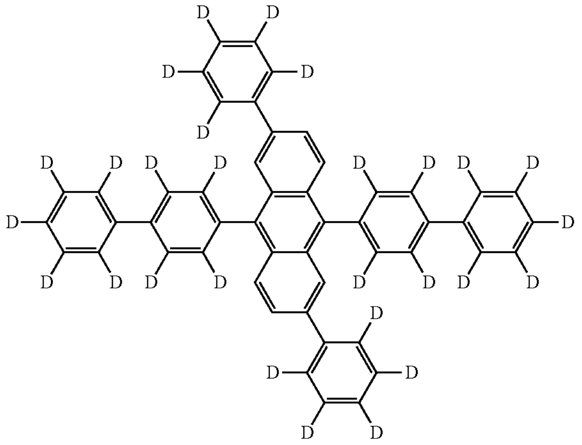
[Chemical Formula 190]
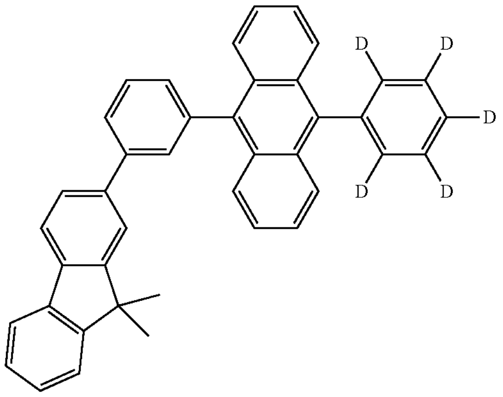

-continued
[Chemical Formula 191]
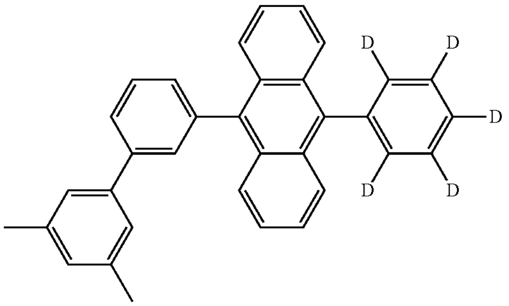
[Chemical Formula 192]
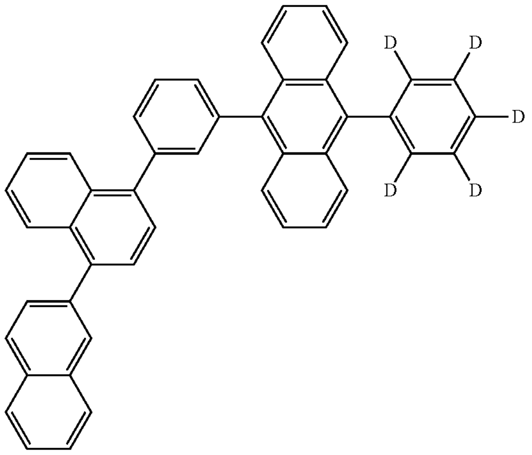
[Chemical Formula 193]
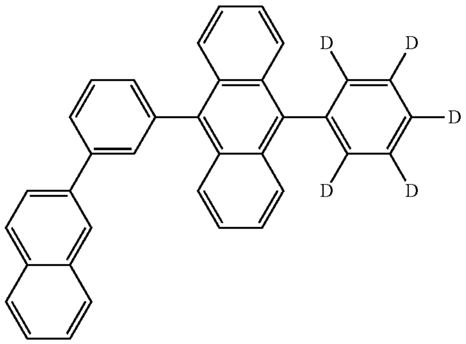
[Chemical Formula 194]
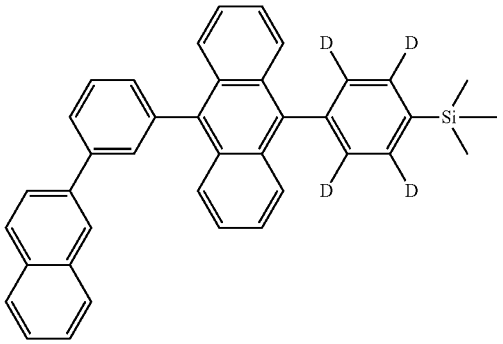
[Chemical Formula 195]
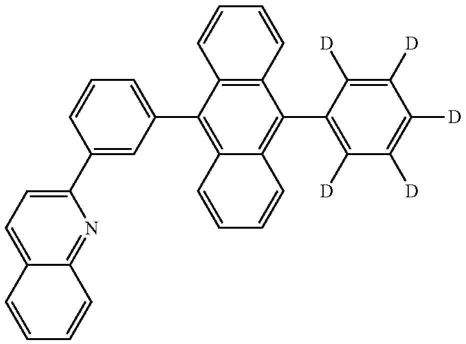
[Chemical Formula 196]
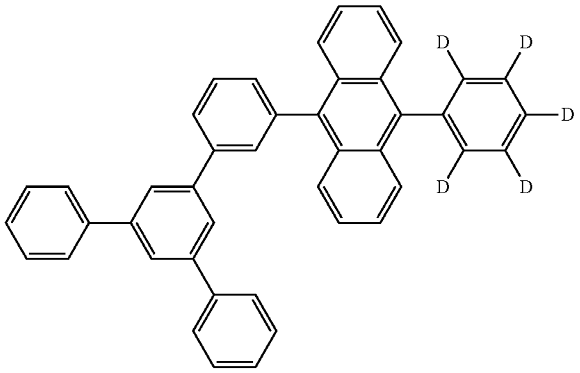
[Chemical Formula 197]
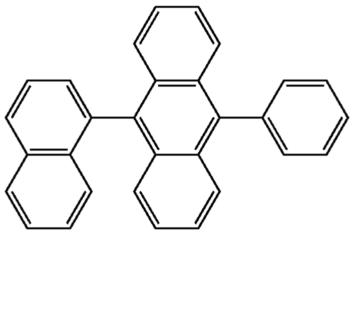
[Chemical Formula 198]
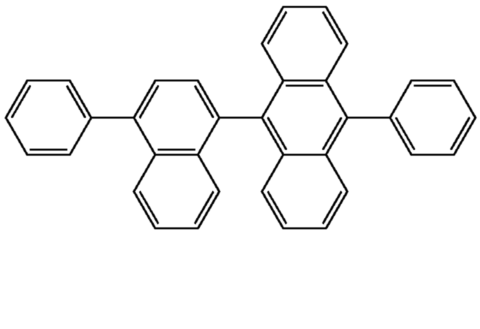

-continued
[Chemical Formula 199]
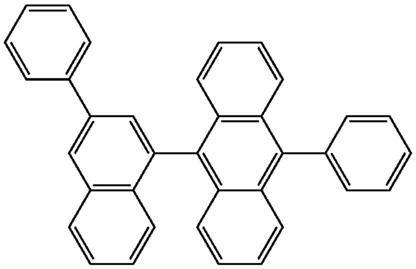
[Chemical Formula 200]
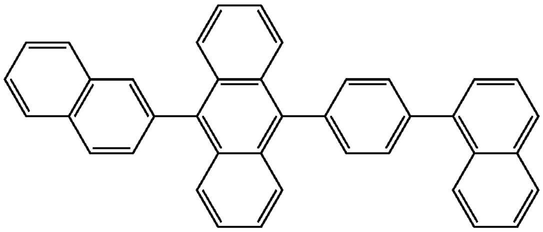
[Chemical Formula 201]
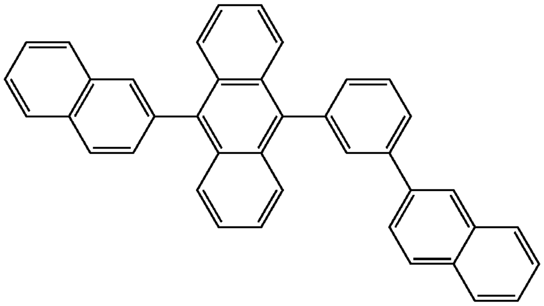
[Chemical Formula 202]
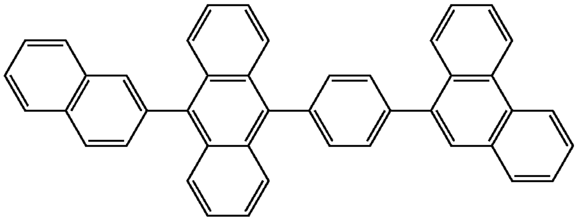
[Chemical Formula 203]
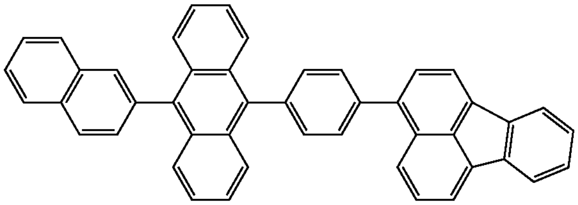
[Chemical Formula 204]
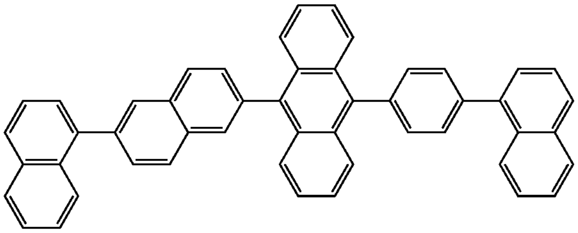
[Chemical Formula 205]
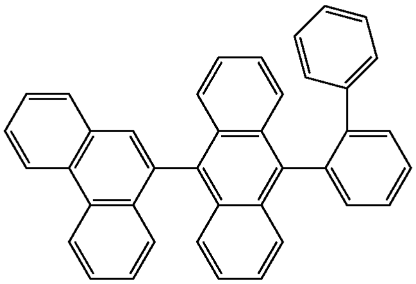
[Chemical Formula 206]
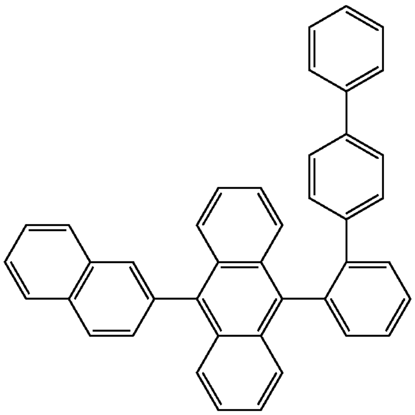

-continued
[Chemical Formula 207]
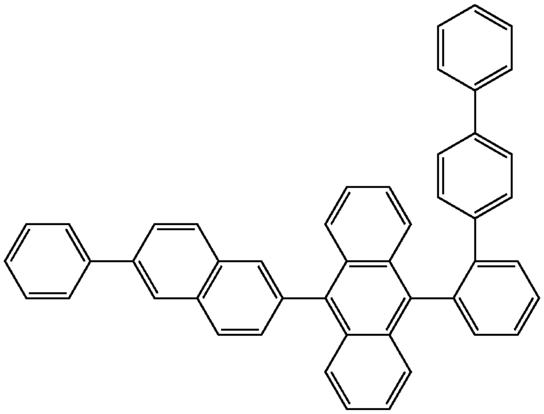
[Chemical Formula 208]
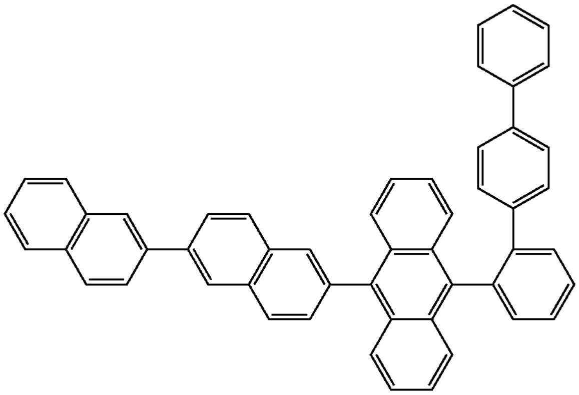
[Chemical Formula 209]
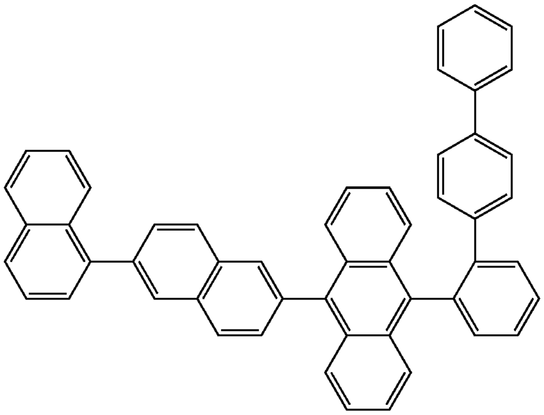
[Chemical Formula 210]
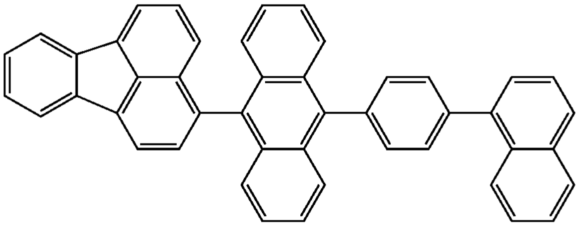
[Chemical Formula 211]
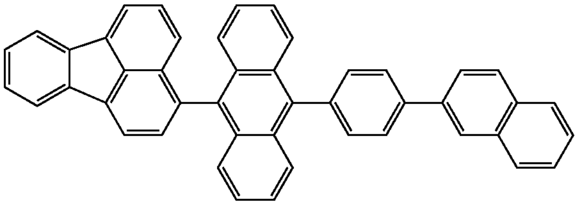
[Chemical Formula 212]
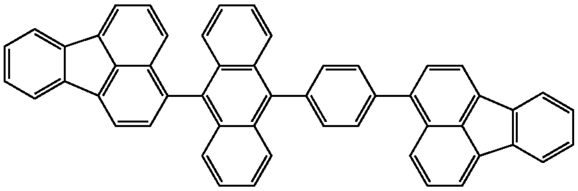
[Chemical Formula 213]
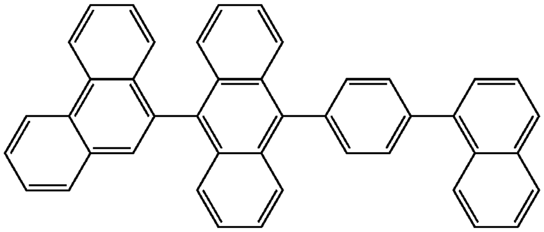
[Chemical Formula 214]
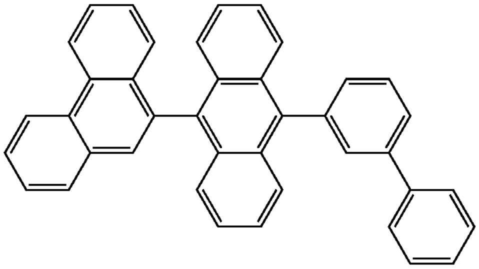

-continued
[Chemical Formula 215]
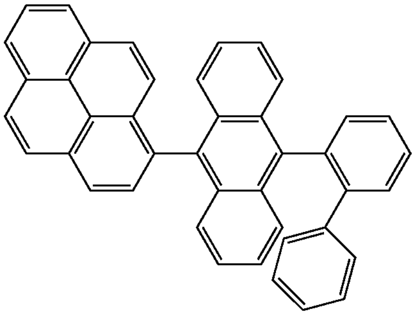
[Chemical Formula 216]
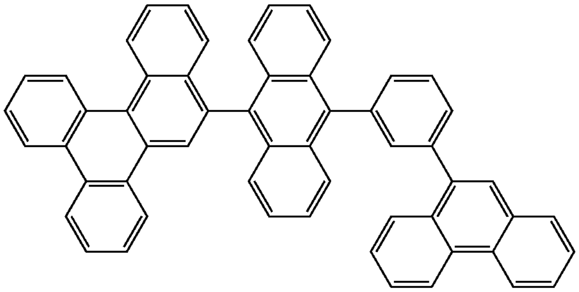
[Chemical Formula 217]
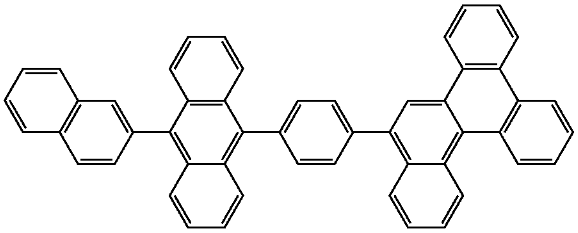
[Chemical Formula 218]
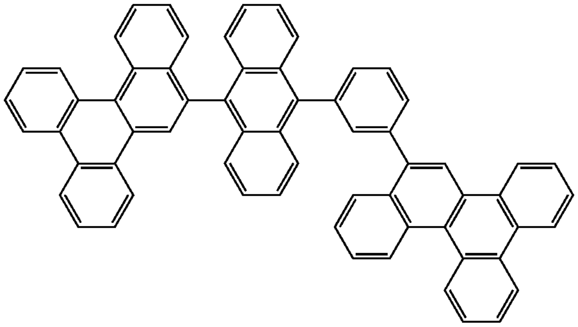
[Chemical Formula 219]
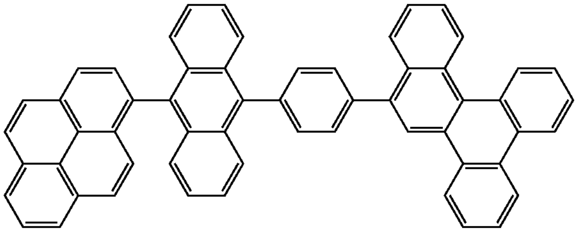
[Chemical Formula 220]
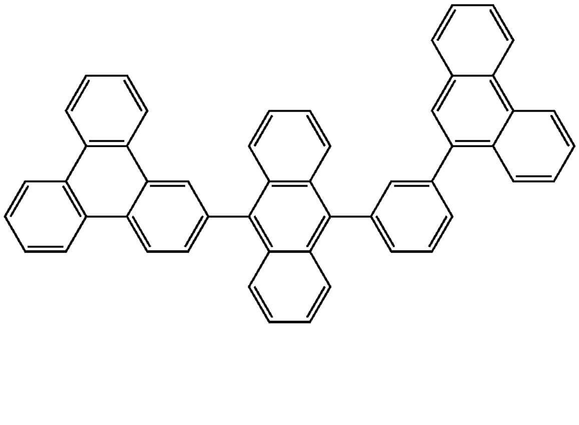
[Chemical Formula 221]
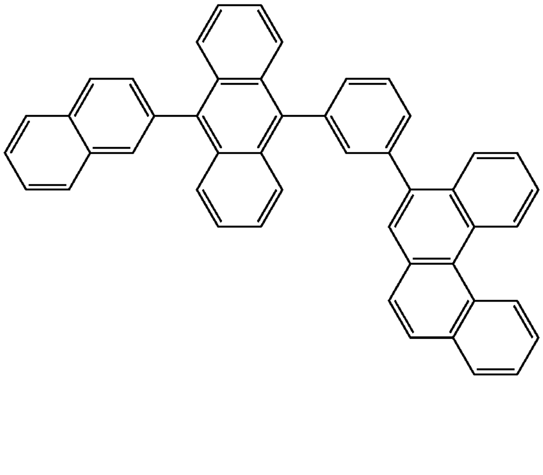

-continued
[Chemical Formula 222]
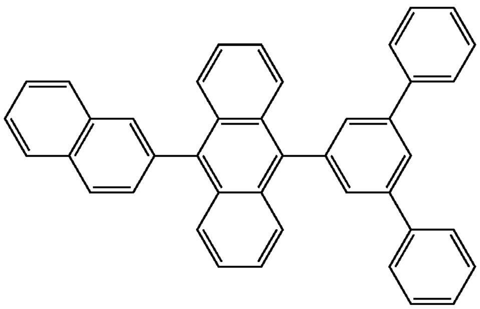
[Chemical Formula 223]
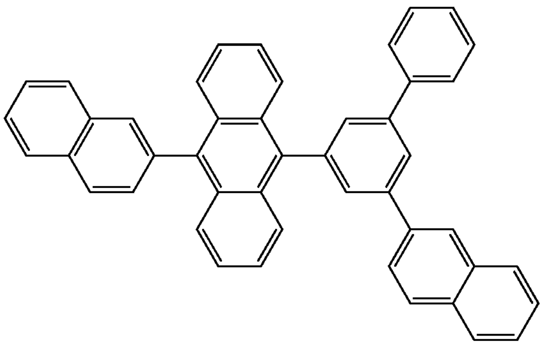
[Chemical Formula 224]
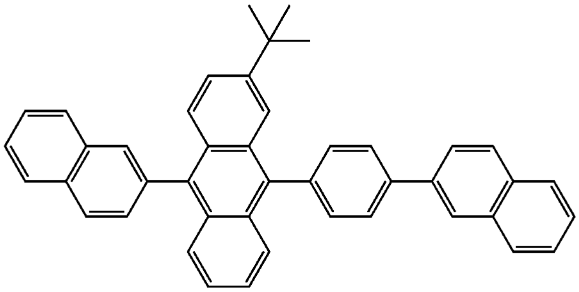
[Chemical Formula 225]
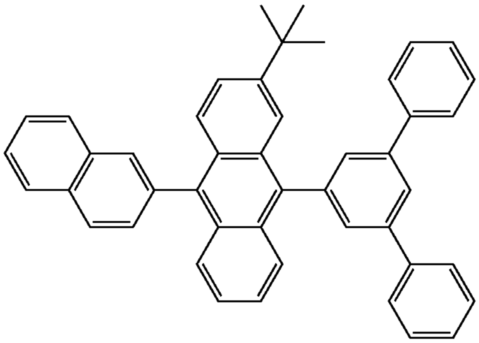
[Chemical Formula 226]
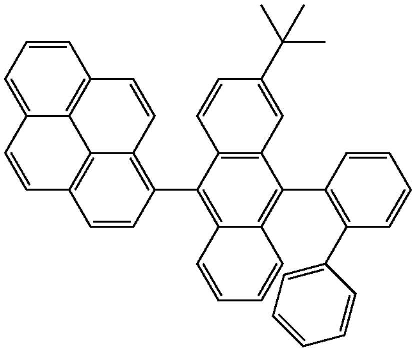
[Chemical Formula 227]
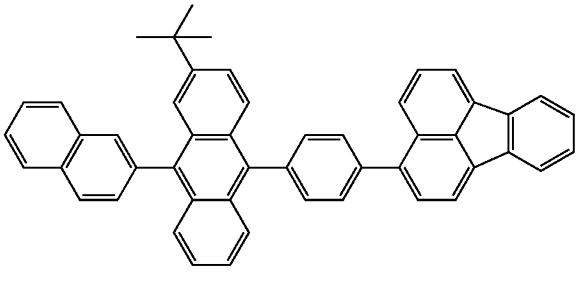
[Chemical Formula 228]
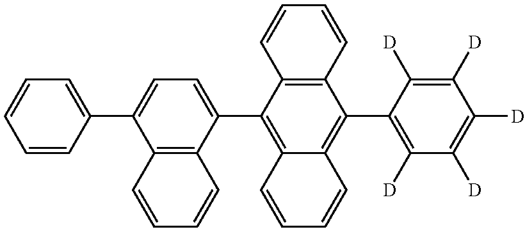
[Chemical Formula 229]
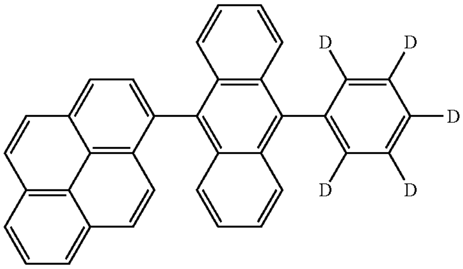

-continued
[Chemical Formula 230]
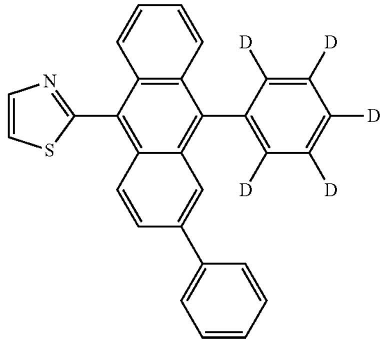
[Chemical Formula 231]
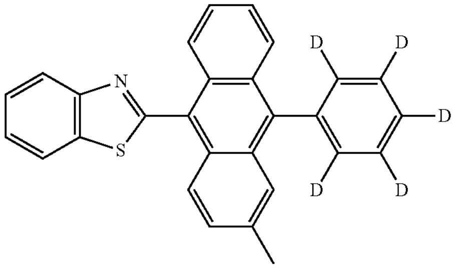
[Chemical Formula 232]
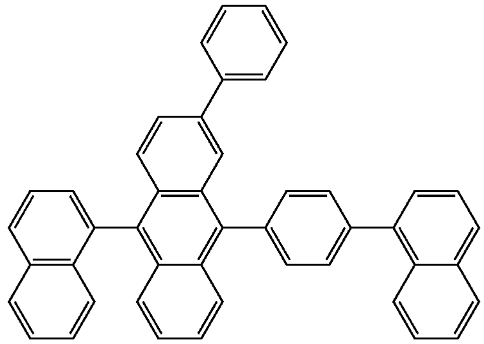
[Chemical Formula 233]
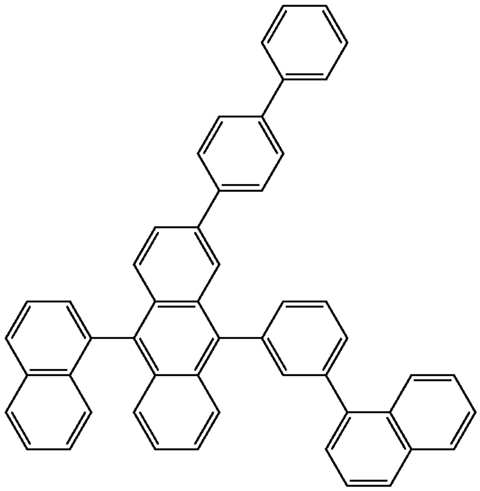
[Chemical Formula 234]
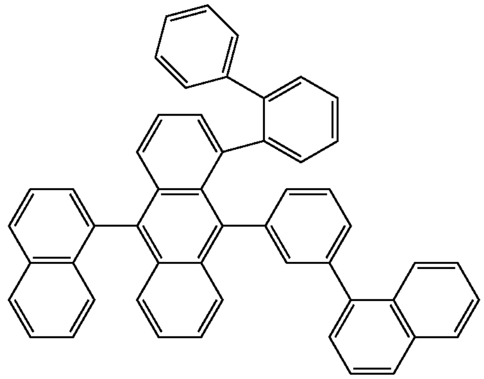
[Chemical Formula 235]
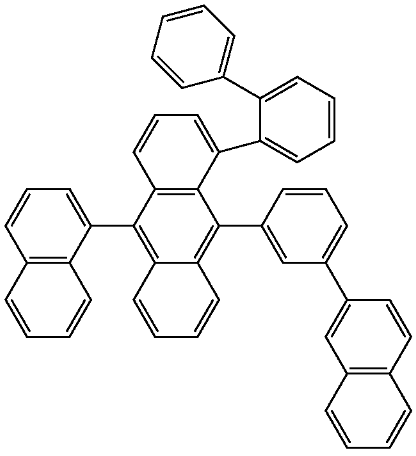

-continued
[Chemical Formula 236]
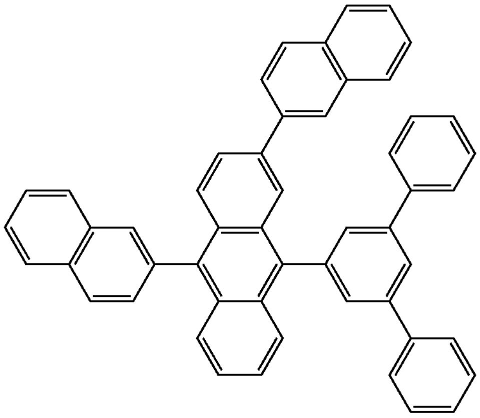
[Chemical Formula 237]
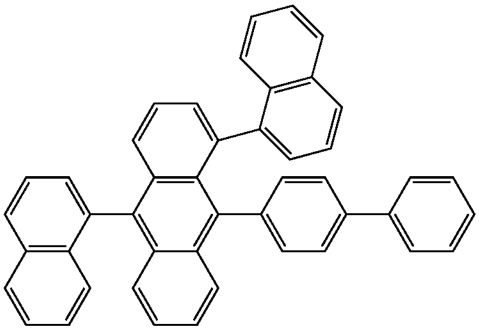
[Chemical Formula 238]
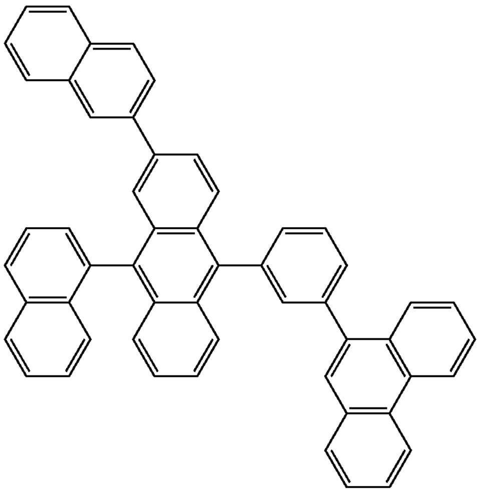
[Chemical Formula 239]
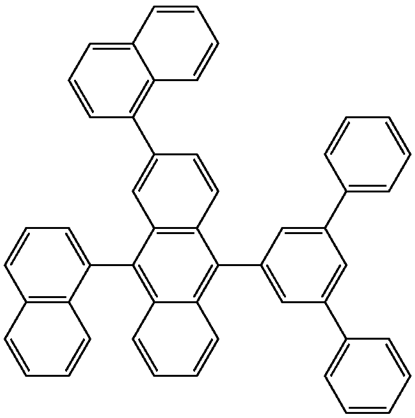
[Chemical Formula 240]
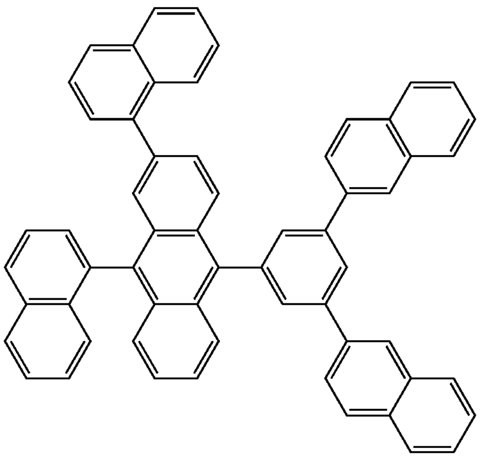
[Chemical Formula 241]
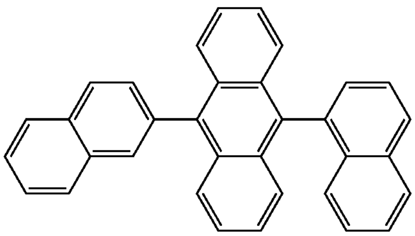

-continued
[Chemical Formula 242]
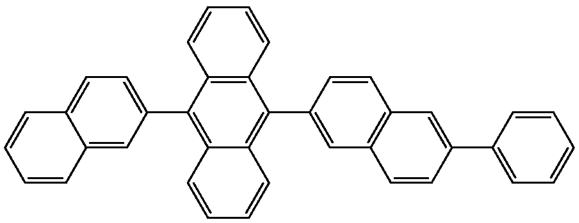
[Chemical Formula 243]
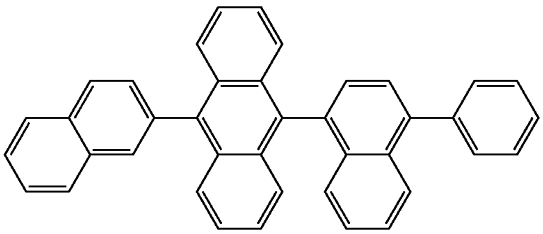
[Chemical Formula 244]
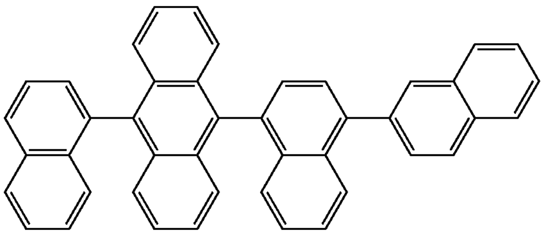
[Chemical Formula 245]
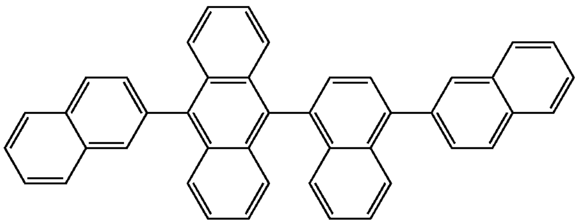
[Chemical Formula 246]
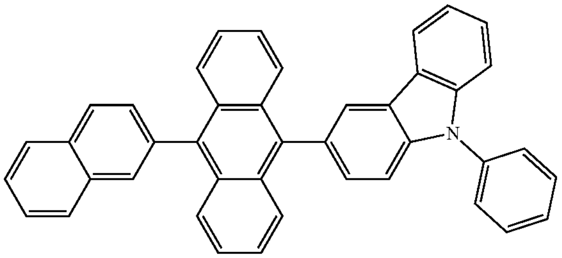
[Chemical Formula 247]
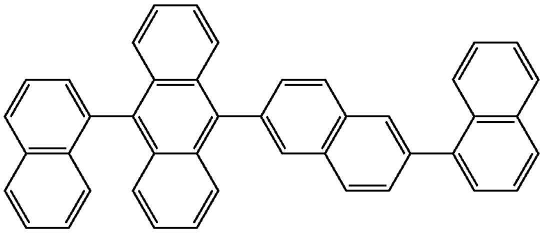
[Chemical Formula 248]
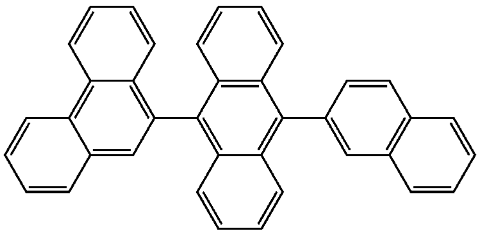
[Chemical Formula 249]
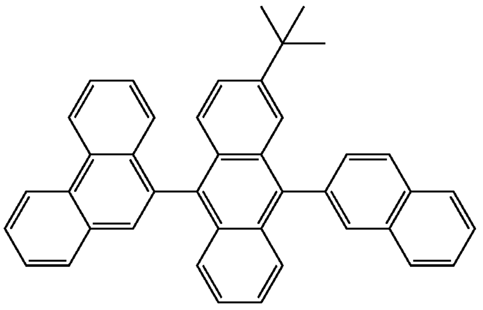
[Chemical Formula 250]
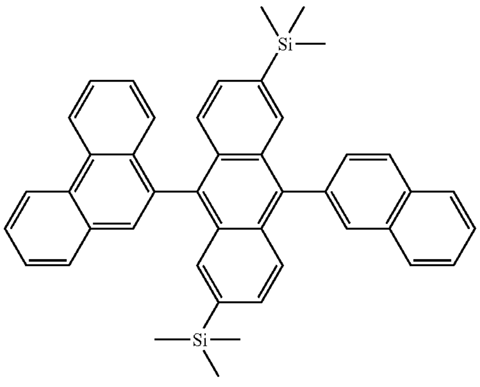
[Chemical Formula 251]
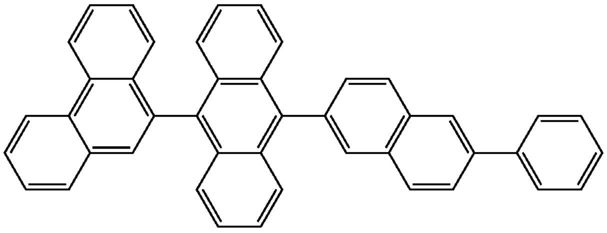

-continued
[Chemical Formula 252]
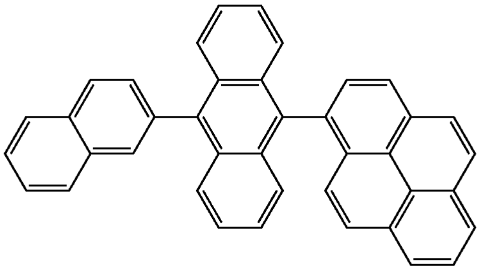
[Chemical Formula 253]
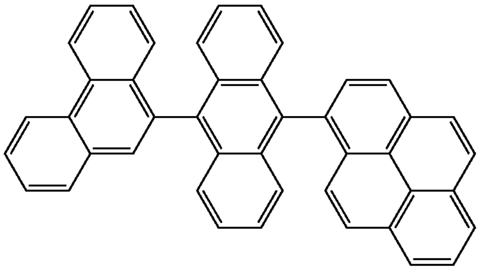
[Chemical Formula 254]
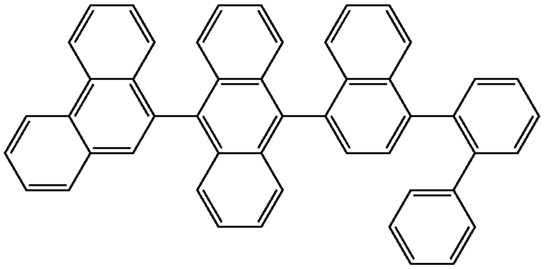
[Chemical Formula 255]
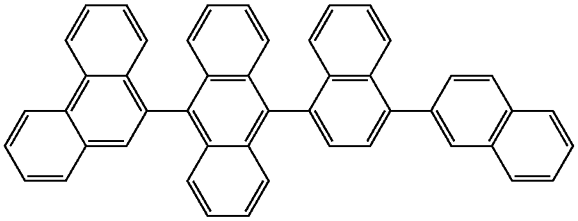
[Chemical Formula 256]
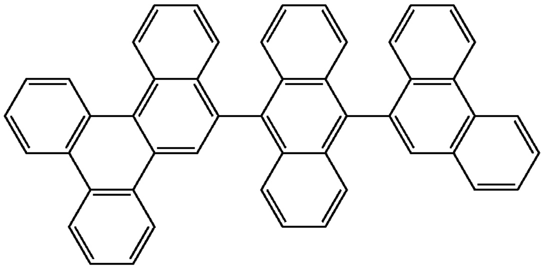
[Chemical Formula 257]
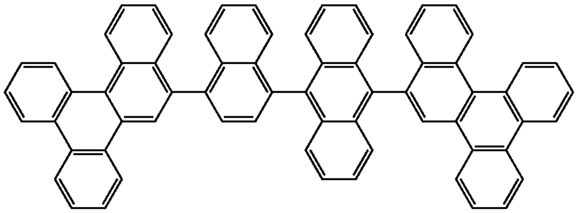
[Chemical Formula 258]
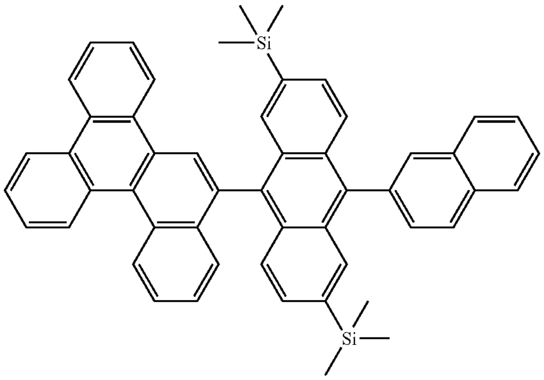
[Chemical Formula 259]
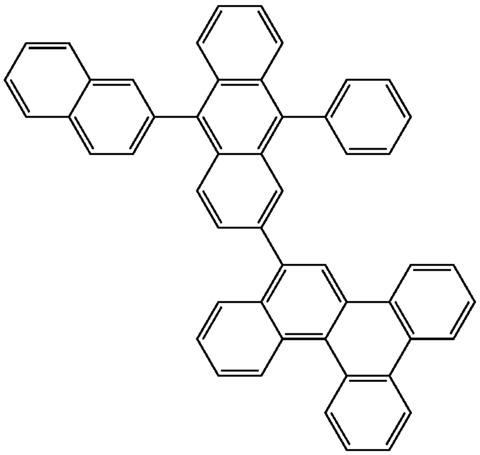
[Chemical Formula 260]
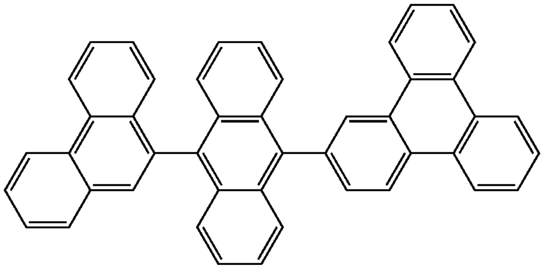
[Chemical Formula 261]
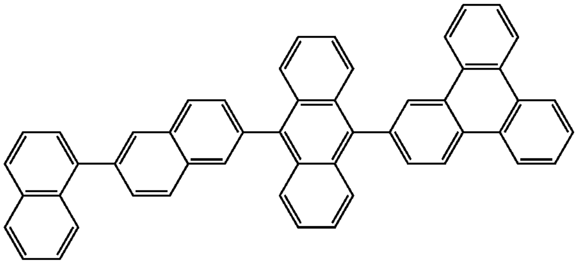

-continued
[Chemical Formula 262]
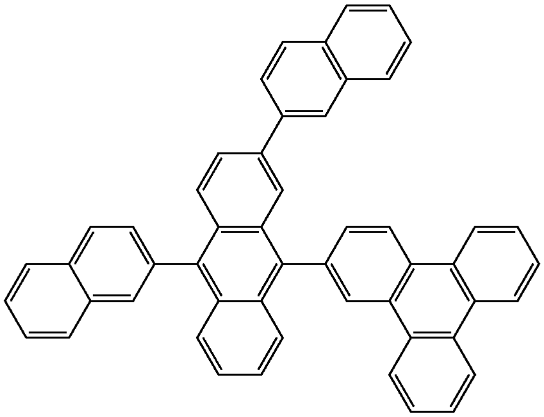
[Chemical Formula 263]
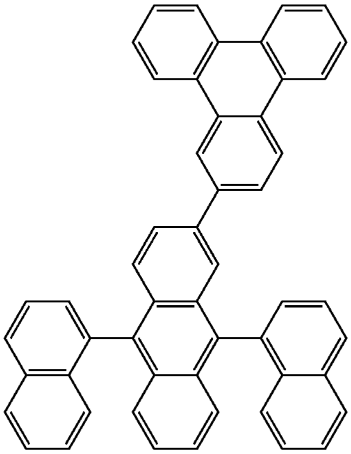
[Chemical Formula 264]
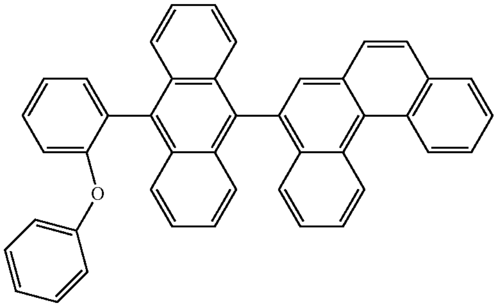
[Chemical Formula 265]
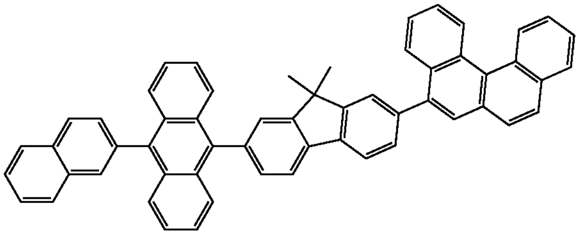
[Chemical Formula 266]
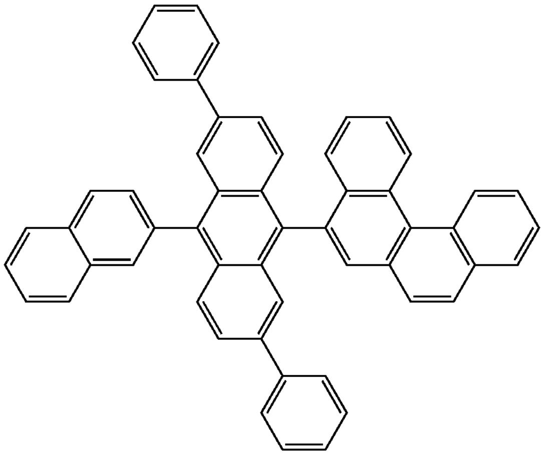
[Chemical Formula 267]
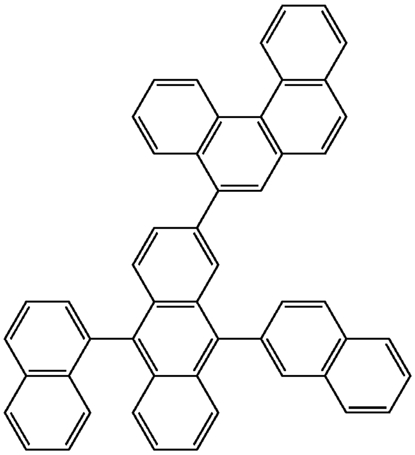

-continued
[Chemical Formula 268]
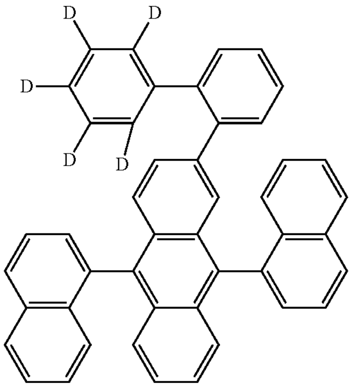
[Chemical Formula 269]
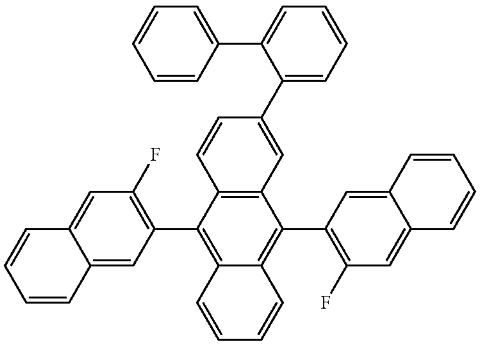
[Chemical Formula 270]
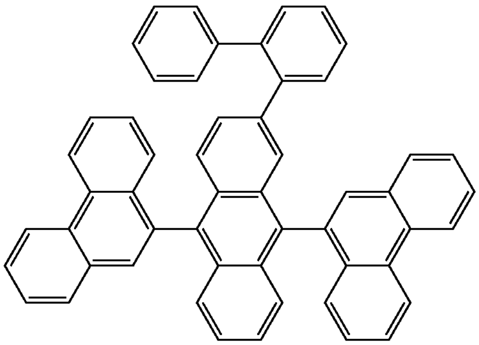
[Chemical Formula 271]
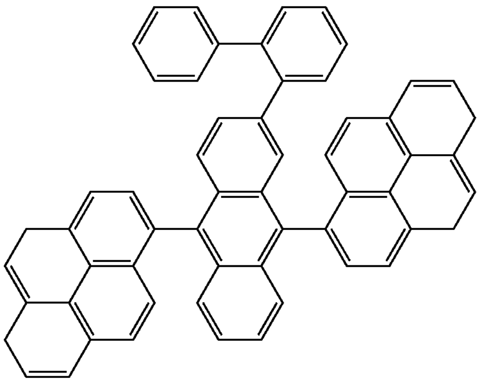
[Chemical Formula 272]
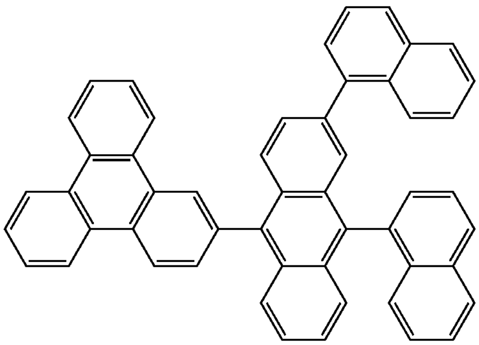
[Chemical Formula 273]
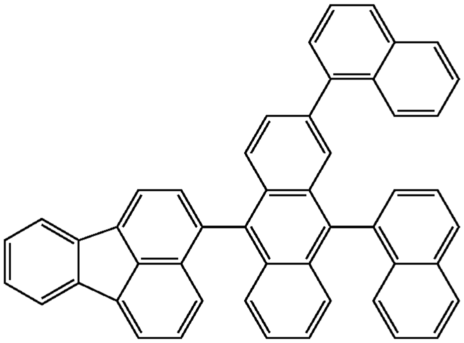
[Chemical Formula 274]
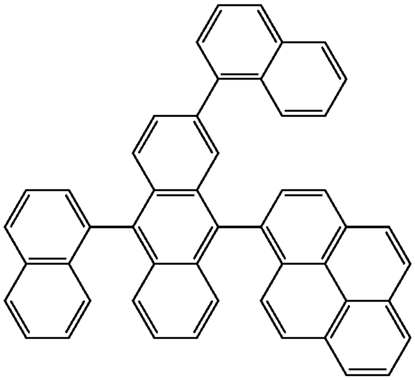

-continued
[Chemical Formula 275]
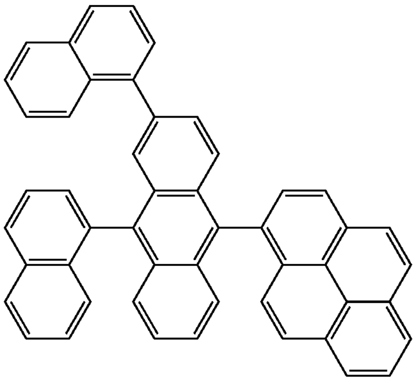
[Chemical Formula 276]
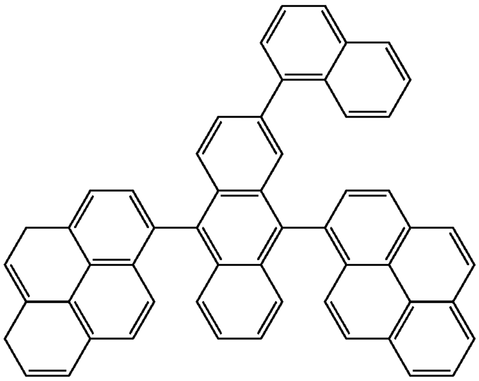
[Chemical Formula 277]
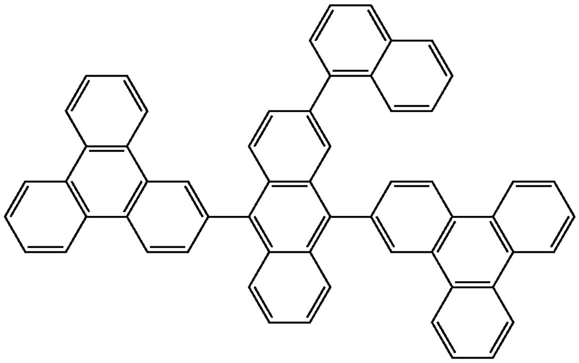
[Chemical Formula 278]
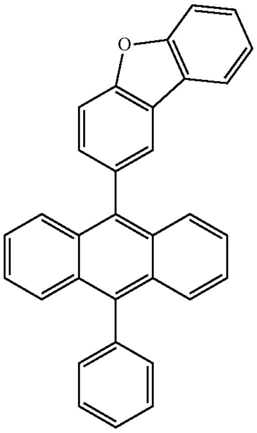
[Chemical Formula 279]
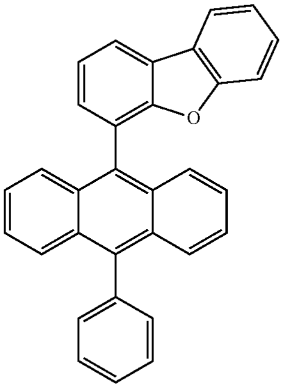
[Chemical Formula 280]
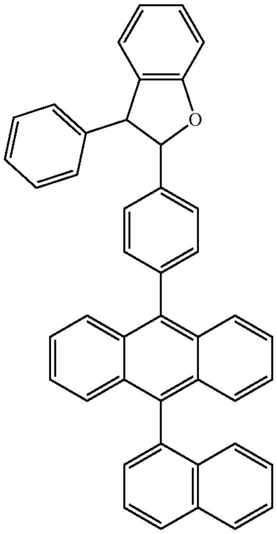

-continued
[Chemical Formula 281]
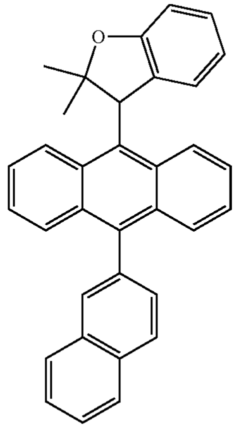
[Chemical Formula 282]
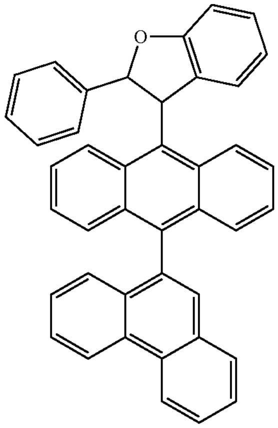
[Chemical Formula 283]
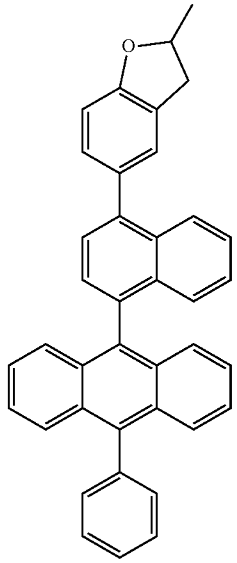
[Chemical Formula 284]
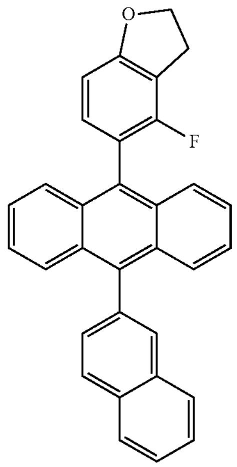
[Chemical Formula 285]
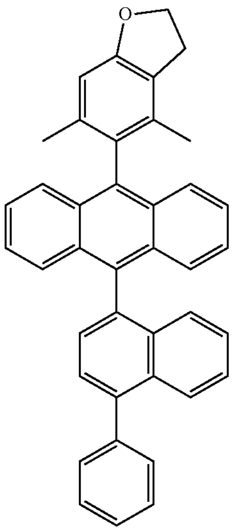

-continued
[Chemical Formula 286]
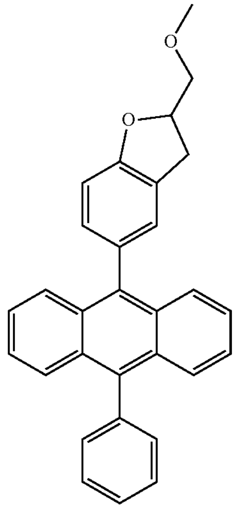
[Chemical Formula 287]
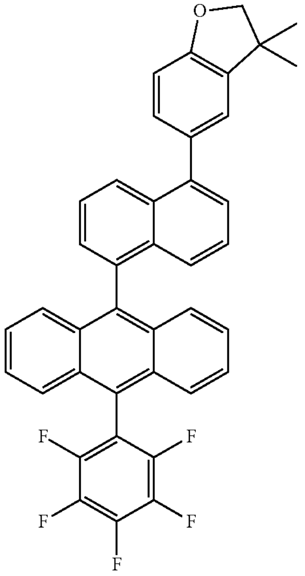
[Chemical Formula 288]
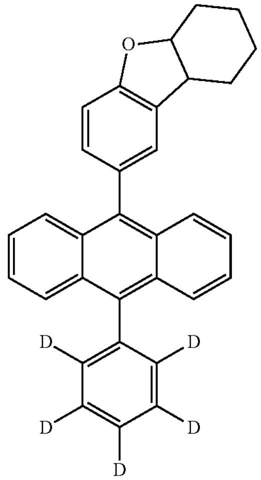
[Chemical Formula 289]
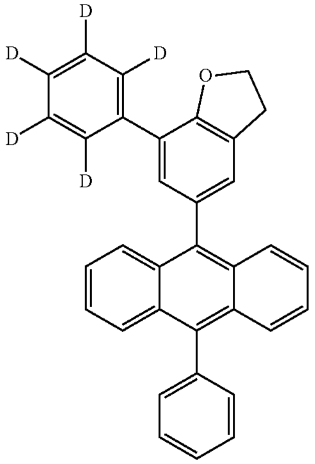
[Chemical Formula 290]
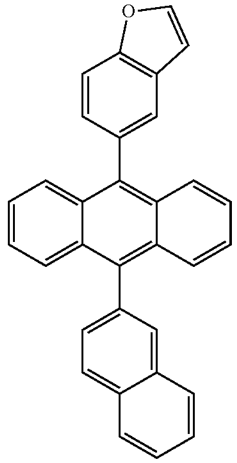
[Chemical Formula 291]
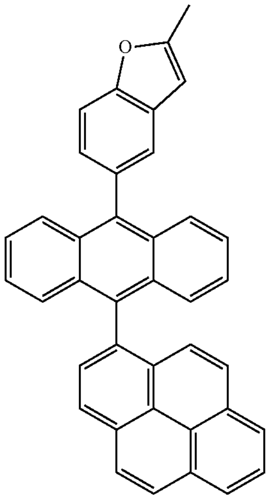

-continued
[Chemical Formula 292]
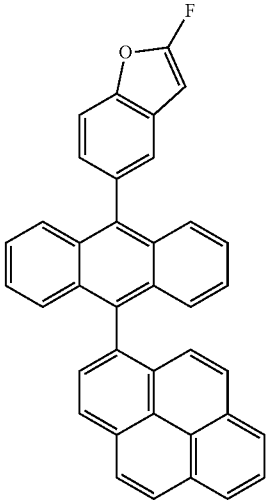
[Chemical Formula 294]
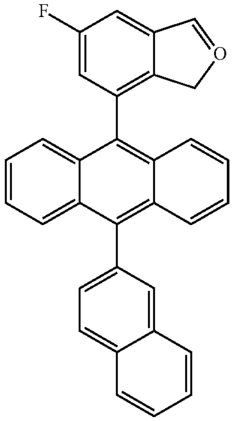
[Chemical Formula 296]
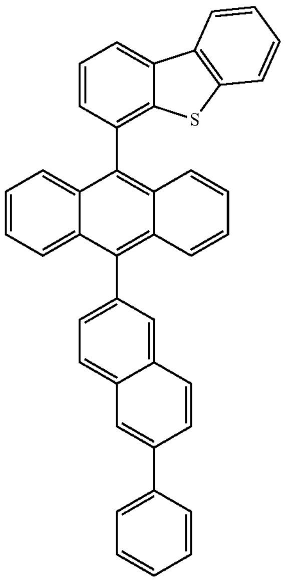
[Chemical Formula 293]
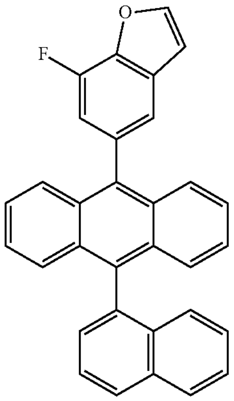
[Chemical Formula 295]
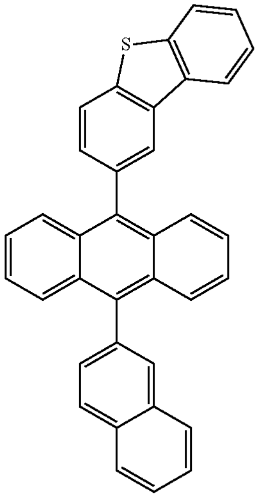
[Chemical Formula C]
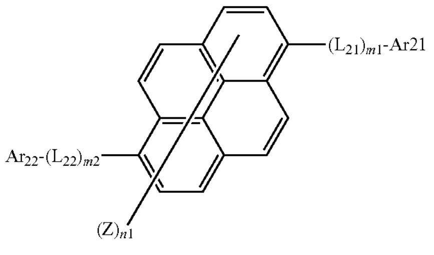

linkers $L_{21}$ and $L_{22}$, which are same or different, may each be independently selected from among a single bond, a substituted or unsubstituted arylene of 6 to 30, and a substituted or unsubstituted heteroarylene of 2 to 30 carbon atoms, m1 and m2, which are same or different, may each be independently an integer of 1 to 2, wherein when m1 and m2 are each 2, the corresponding $L_{21}$ may be same or different and the corresponding $L_{22}$ may be same or different;

$Ar_{21}$ and $Ar_{22}$, which are same or different, may each be independently at least one selected from among a substituted or unsubstituted aryl of 6 to 50 carbon atoms, a substituted or unsubstituted heteroaryl of 2 to 50 carbon atoms, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted heterocycloalkyl of 2 to 30 carbon atoms, a substituted or unsubstituted aliphatic/aromatic composite ring of 3 to 50 carbon atoms, a substituted or unsubstituted amine of 0 to 30 carbon atoms, a substituted or unsubstituted silyl of 0 to 30 carbon atoms, a substituted or unsubstituted germanium of 0 to 30 carbon atoms;

Z is any one selected from among hydrogen atom, a deuterium atom, a substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 2 to 30 carbon atoms, a substituted or unsubstituted heteroaryl of 2 to 50 carbon atoms, a substituted or unsubstituted aliphatic/aromatic composite ring of 3 to 50 carbon atoms, a substituted or unsubstituted amine of 0 to 30 carbon atoms, a substituted or unsubstituted silyl of 0 to 30 carbon atoms, a substituted or unsubstituted germanium of 0 to 30 carbon atoms, a cyano, a nitro, and a halogen; and n1 is an integer of 0 to 8 wherein when n1 is 2 or greater, the corresponding Z's may be same or different, and when Z, $Ar_{21}$-$(L_{21})$m1- or $Ar_{21}$-$(L_{22})$m2- is not bonded thereto, the pyrene ring moiety has a hydrogen atom or a deuterium atom on the carbon atom thereof.

In greater detail, examples of the host compound represented by Chemical Formula C include [Chemical Formula 301] to [Chemical Formula 372]:

[Chemical Formula 301]

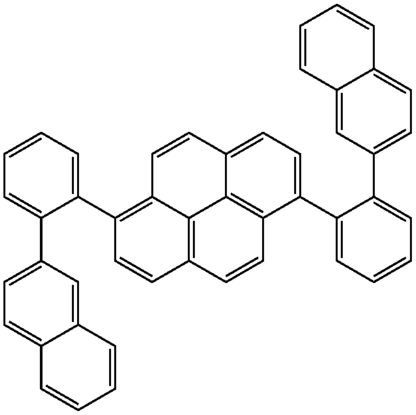

-continued

[Chemical Formula 302]

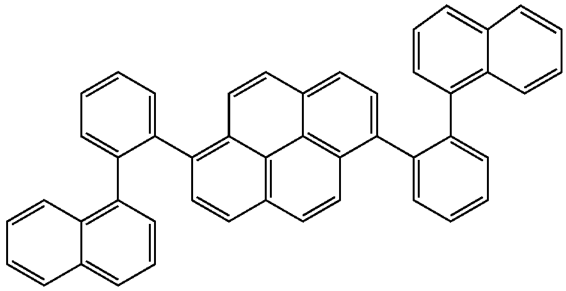

[Chemical Formula 303]

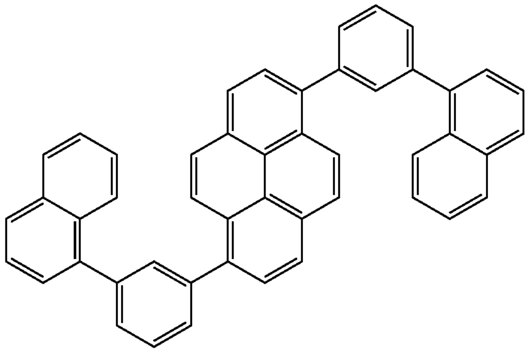

[Chemical Formula 304]

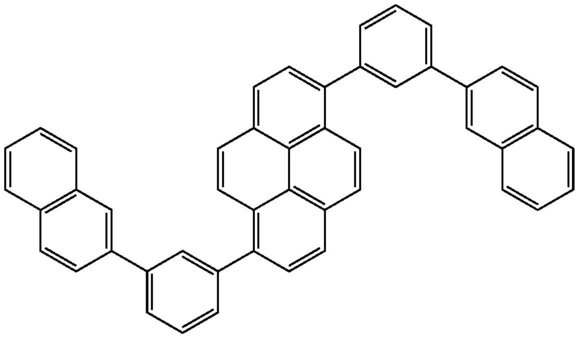

[Chemical Formula 305]

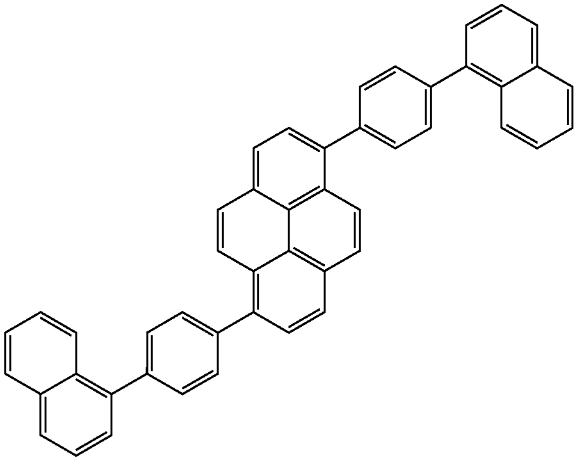

-continued
[Chemical Formula 306]
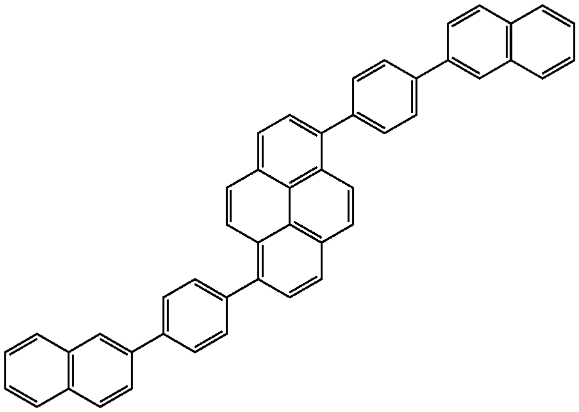
[Chemical Formula 307]
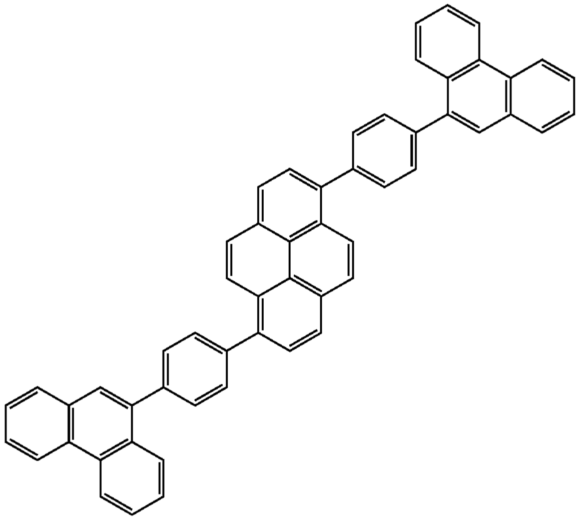
[Chemical Formula 308]
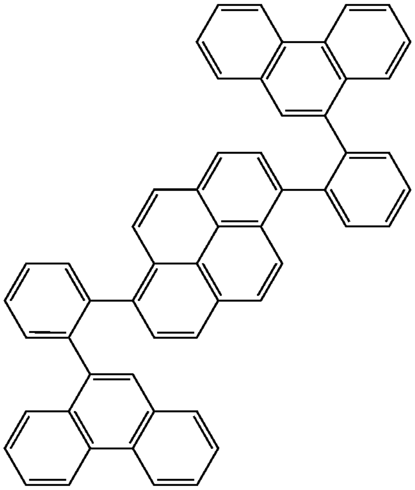
-continued
[Chemical Formula 9]
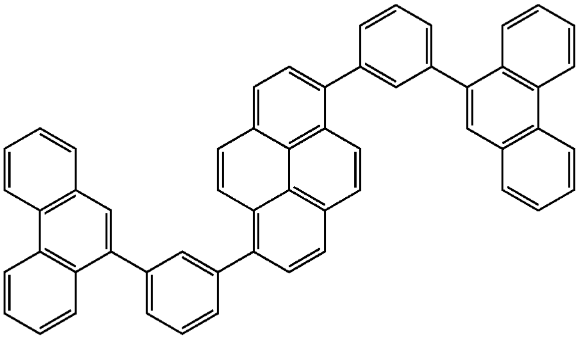
[Chemical Formula 10]
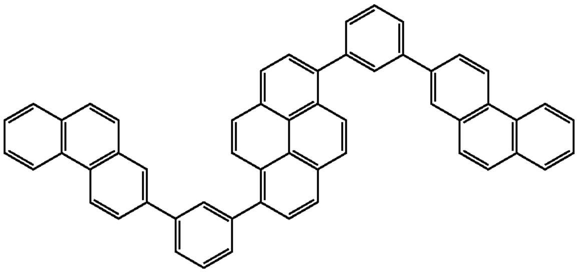
[Chemical Formula 11]
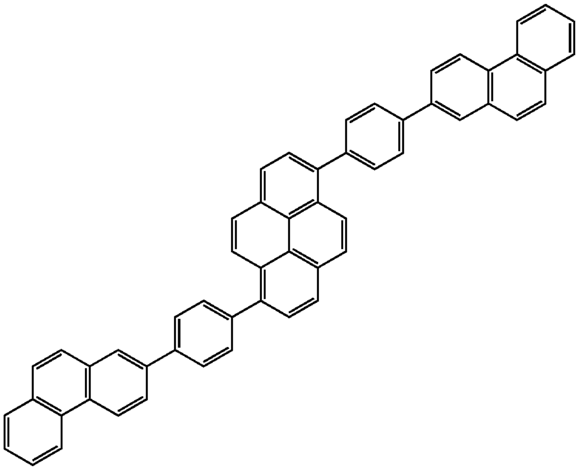

-continued
[Chemical Formula 12]
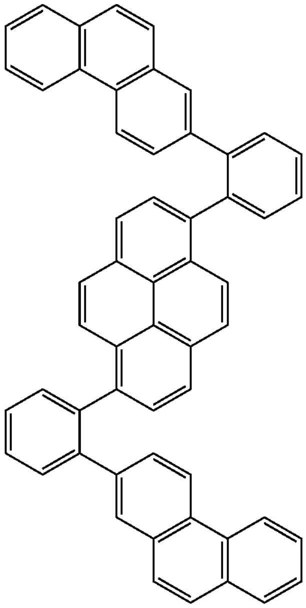
[Chemical Formula 13]
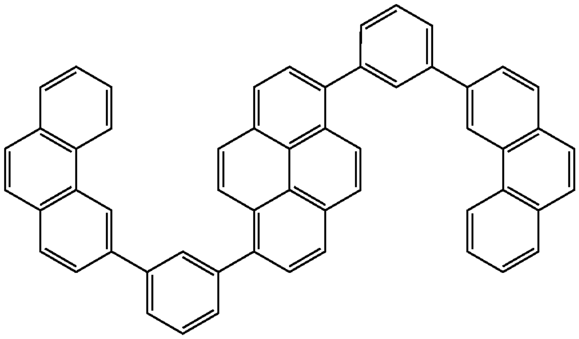
[Chemical Formula 14]
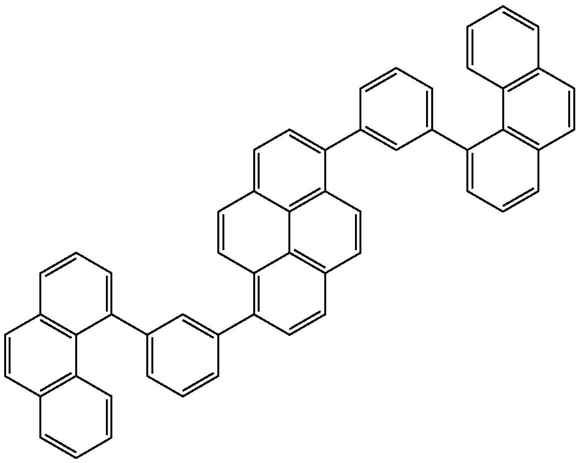
-continued
[Chemical Formula 315]
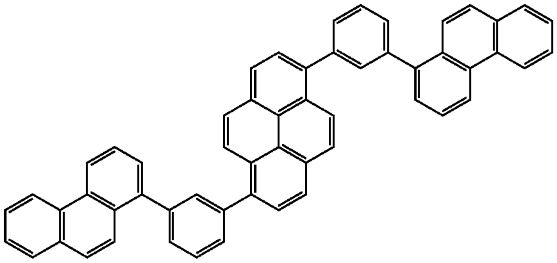
[Chemical Formula 316]
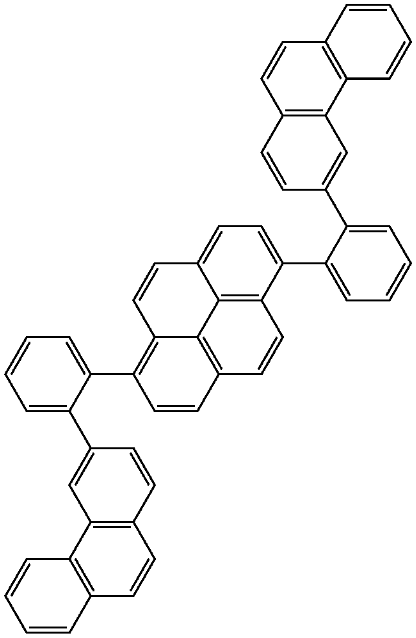
[Chemical Formula 317]
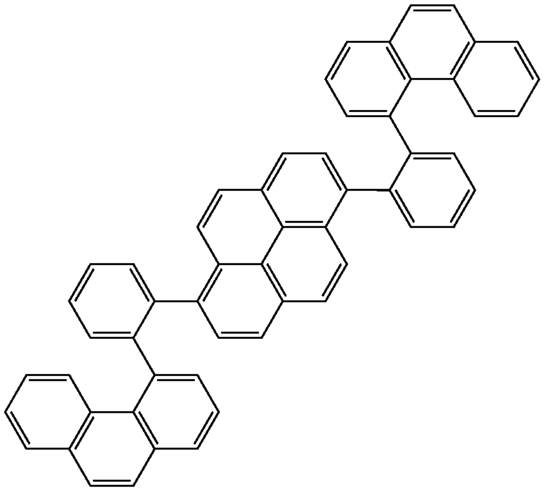

-continued
[Chemical Formula 318]
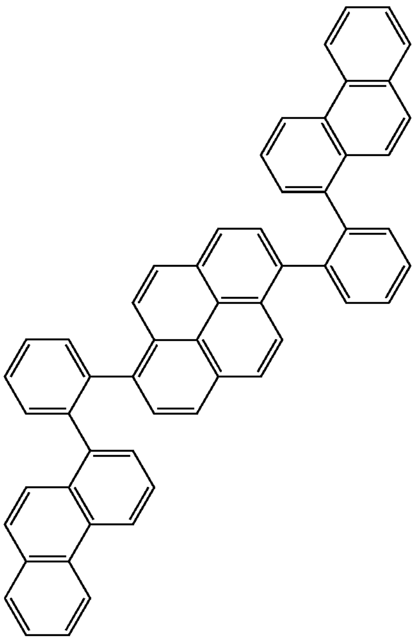
[Chemical Formula 319]
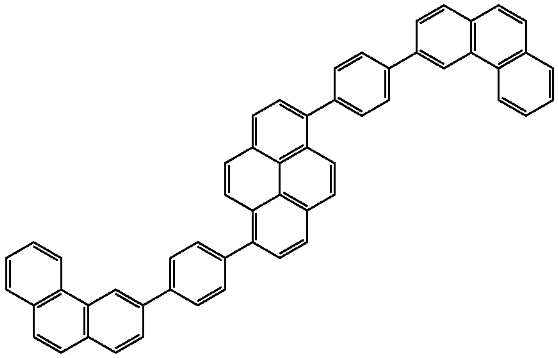
-continued
[Chemical Formula 320]
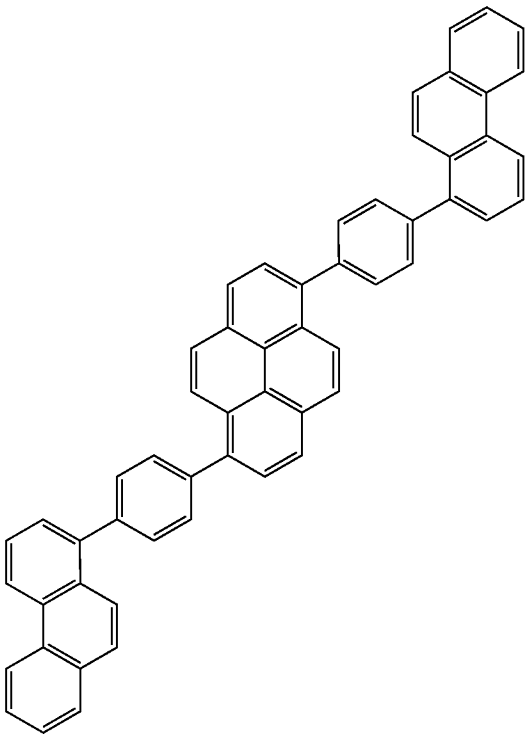
[Chemical Formula 321]
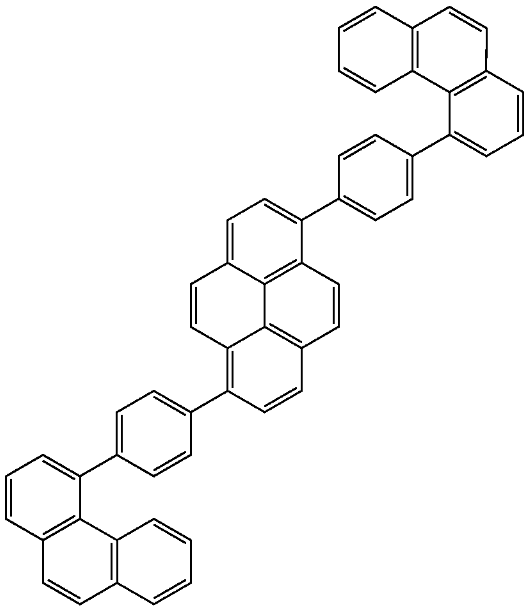

-continued
[Chemical Formula 322]
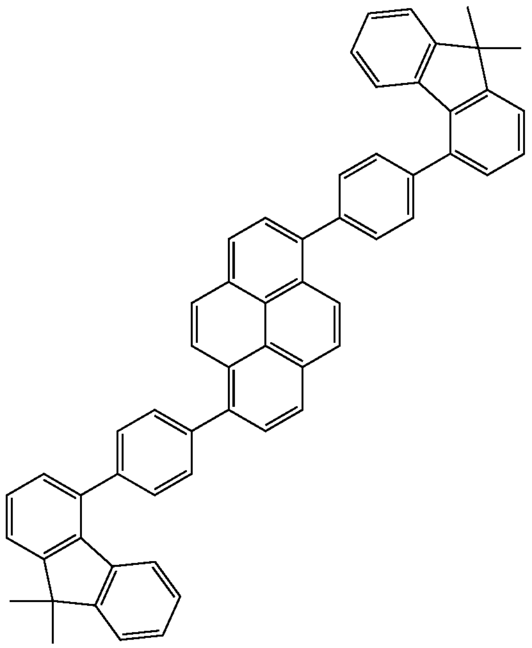
[Chemical Formula 323]
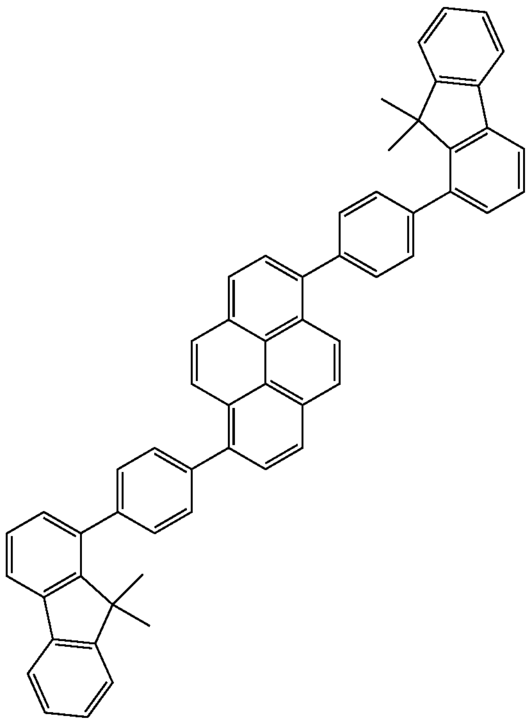
-continued
[Chemical Formula 324]
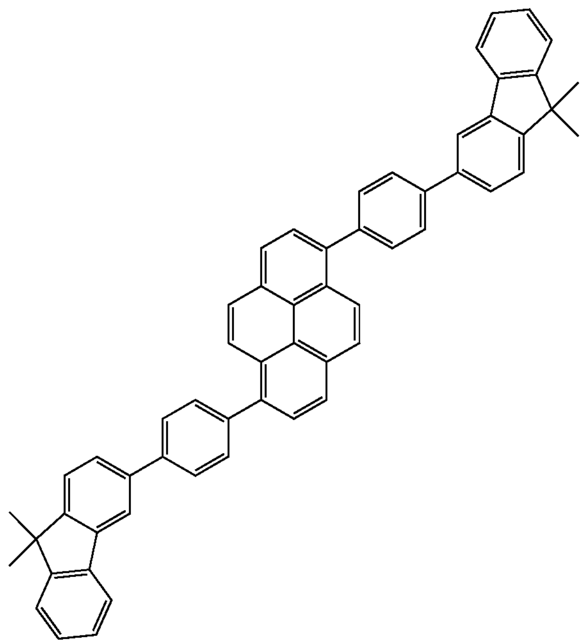
[Chemical Formula 325]
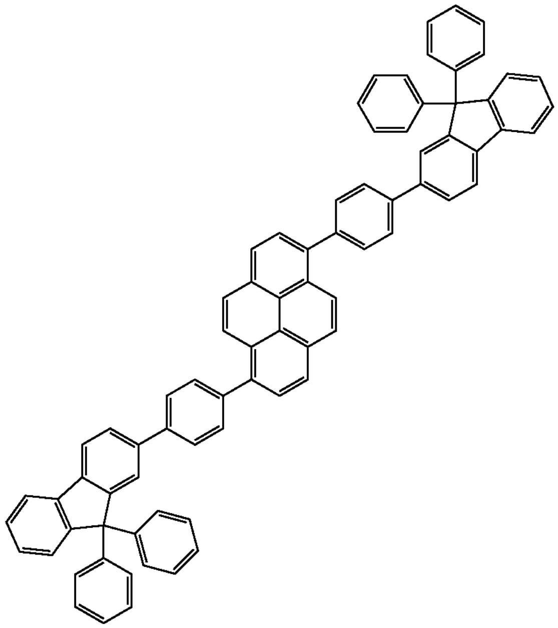

[Chemical Formula 326]
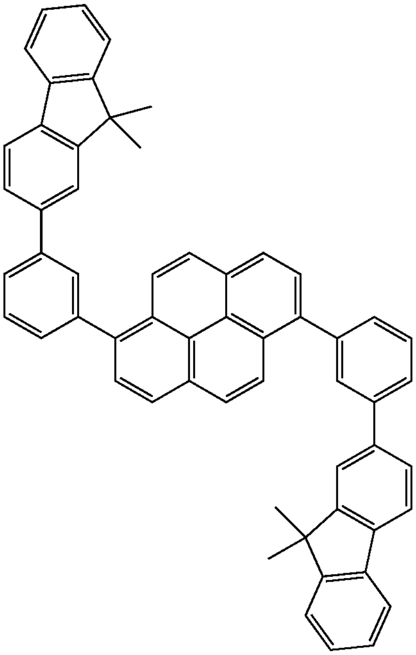
[Chemical Formula 327]
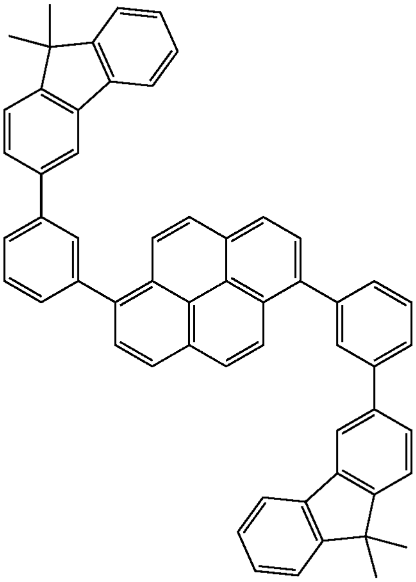
[Chemical Formula 328]
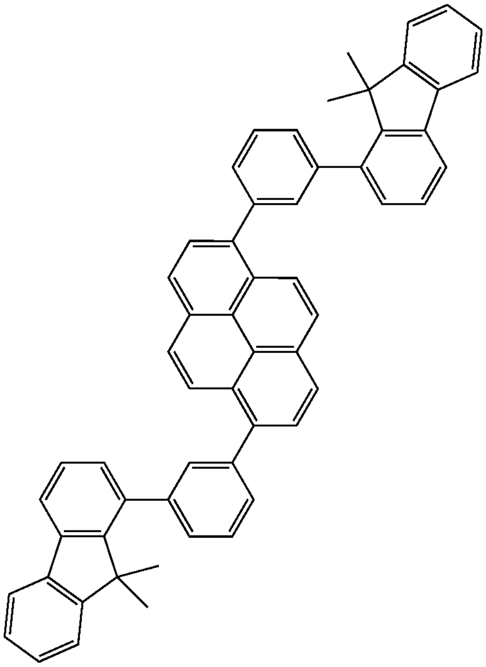
[Chemical Formula 329]
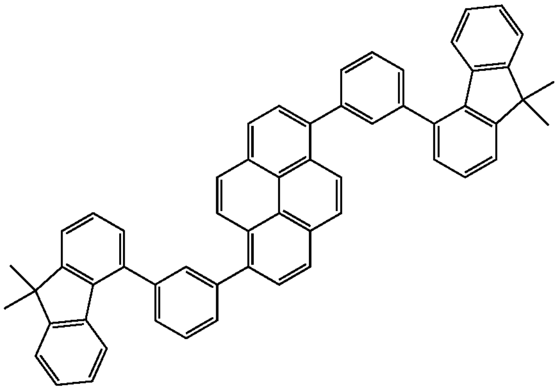
[Chemical Formula 330]
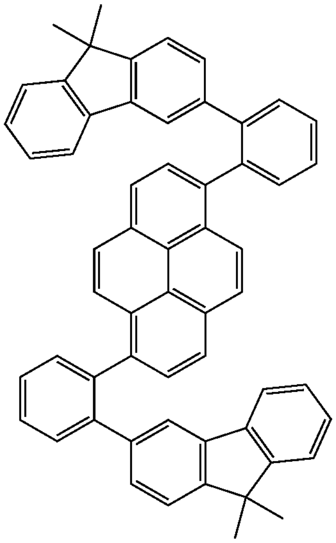

-continued
[Chemical Formula 331]
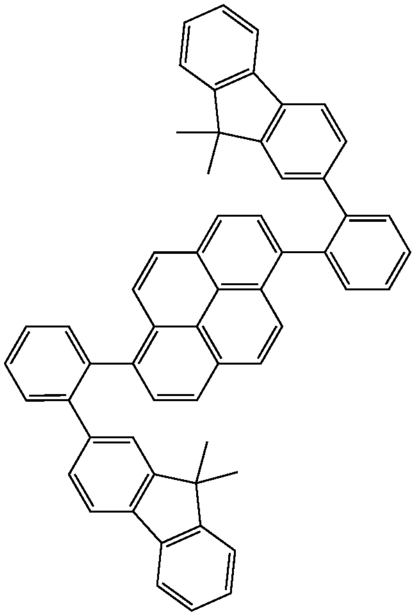
[Chemical Formula 332]
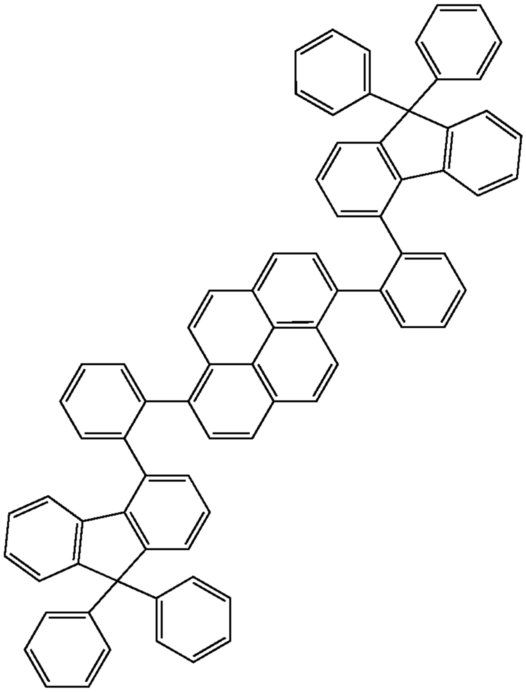
-continued
[Chemical Formula 333]
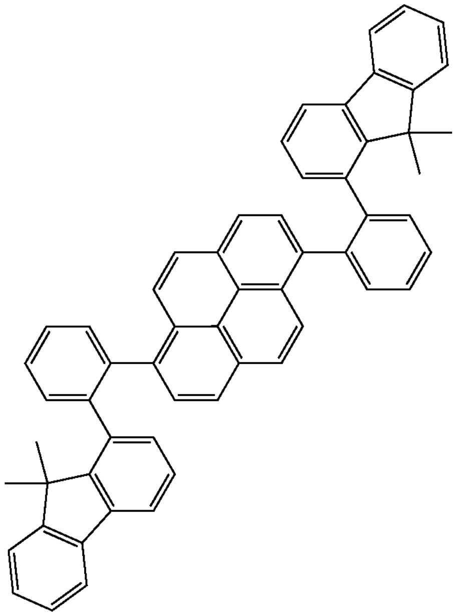
[Chemical Formula 334]
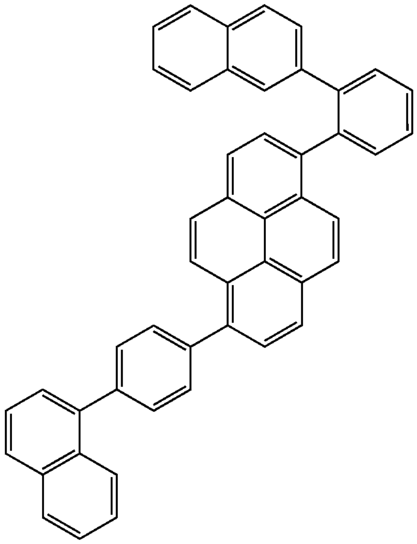

-continued
[Chemical Formula 335]
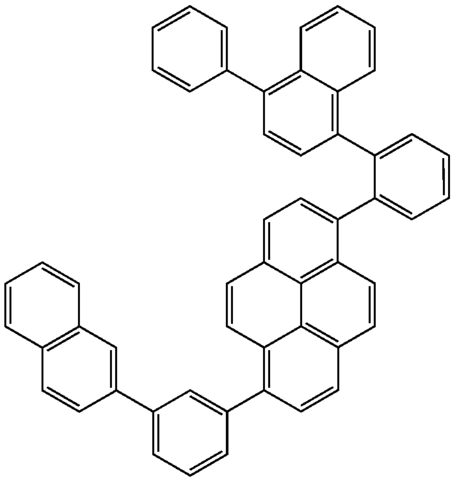
[Chemical Formula 336]
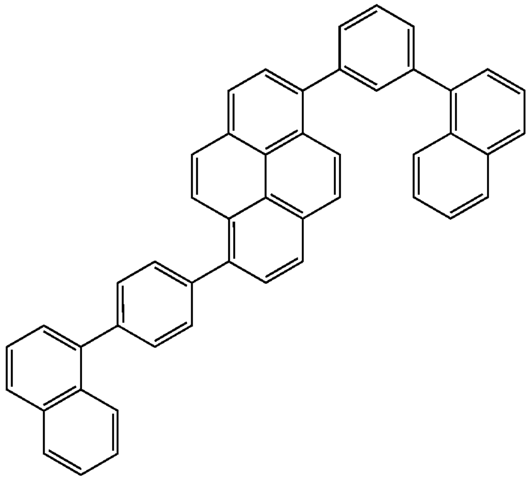
[Chemical Formula 337]
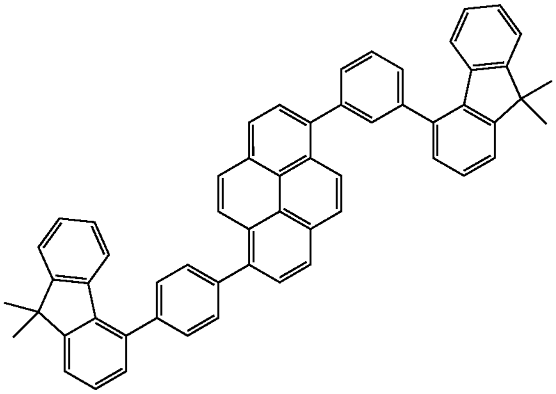
-continued
[Chemical Formula 338]
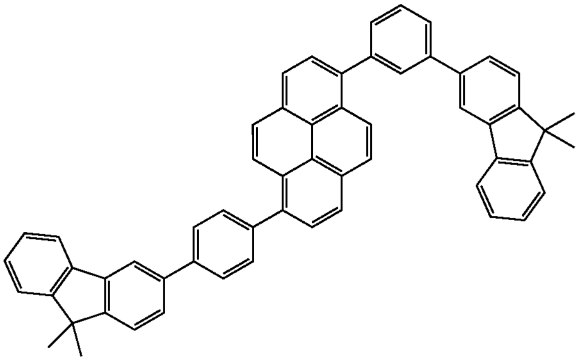
[Chemical Formula 339]
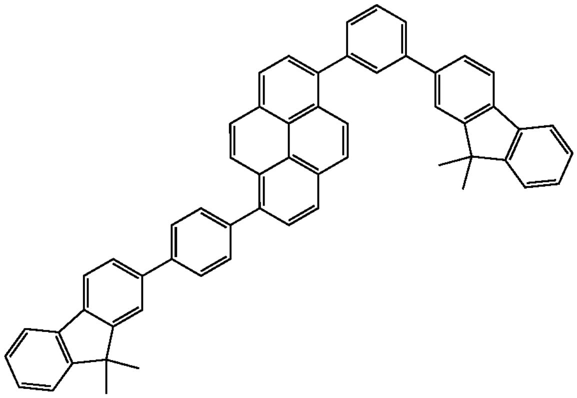
[Chemical Formula 340]
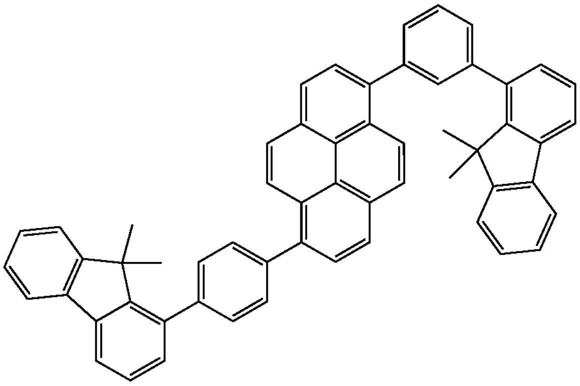
[Chemical Formula 341]
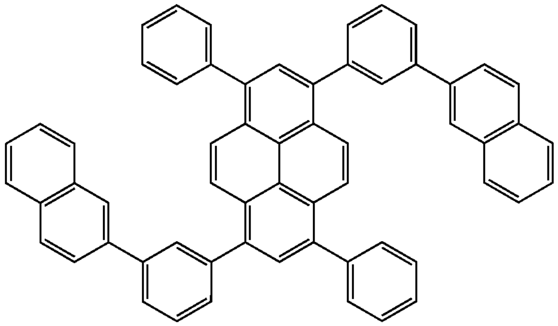

-continued
[Chemical Formula 342]
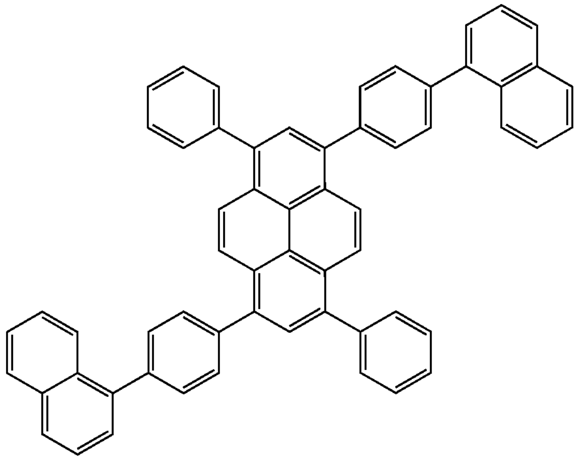
[Chemical Formula 343]
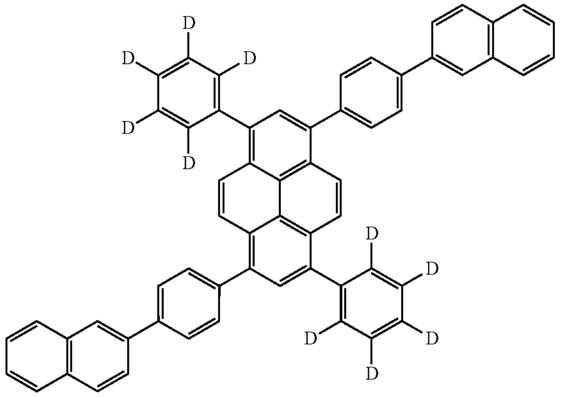
[Chemical Formula 344]
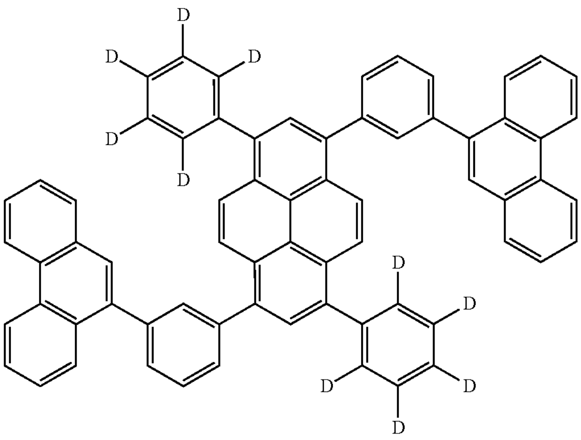
-continued
[Chemical Formula 345]
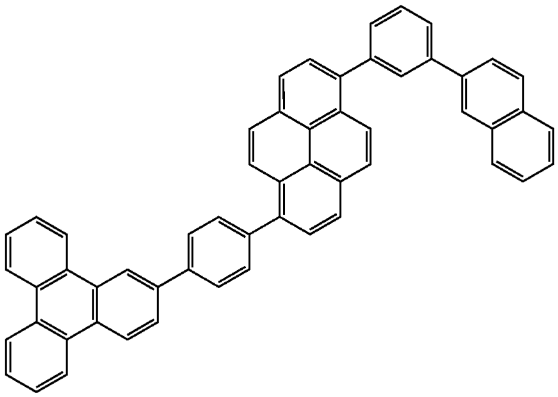
[Chemical Formula 346]
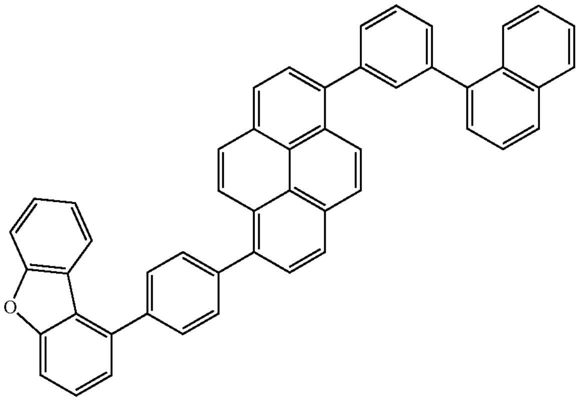
[Chemical Formula 347]
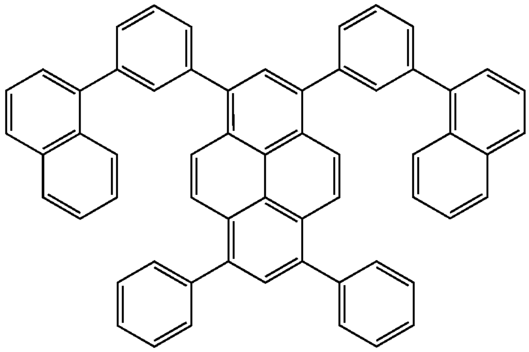

-continued
[Chemical Formula 348]
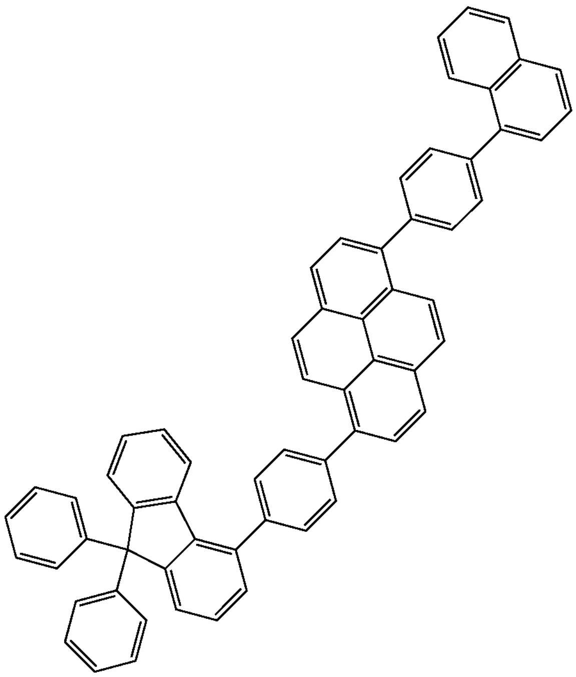
[Chemical Formula 349]
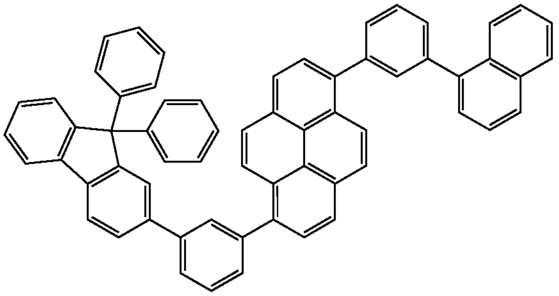
[Chemical Formula 350]
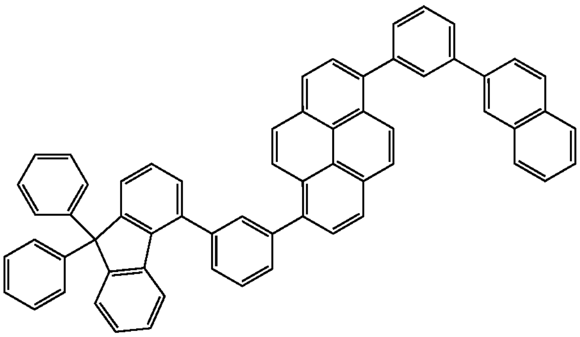
-continued
[Chemical Formula 351]
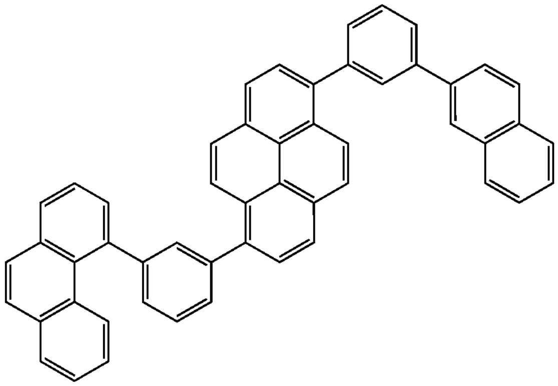
[Chemical Formula 352]
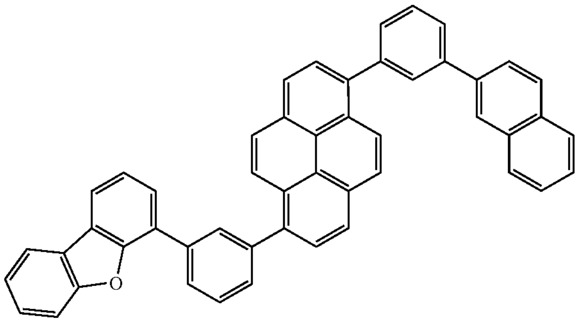
[Chemical Formula 353]
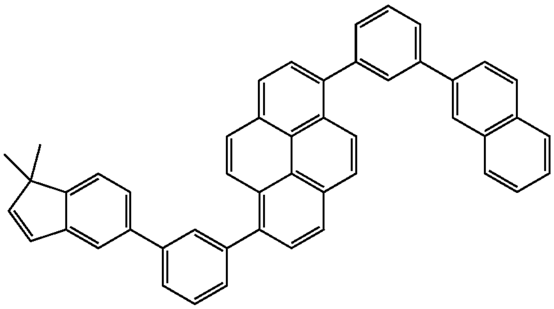
[Chemical Formula 354]
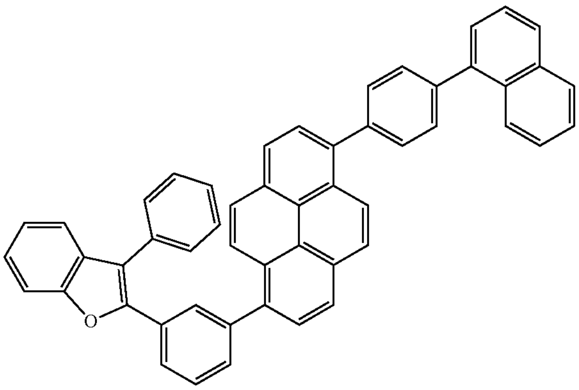

-continued
[Chemical Formula 355]
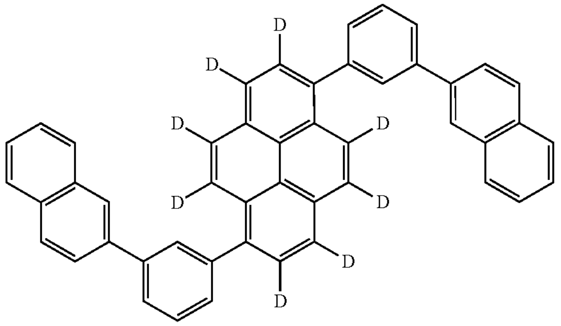
[Chemical Formula 356]
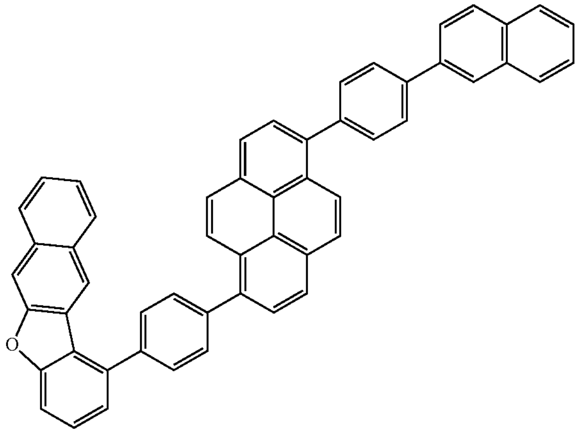
[Chemical Formula 357]
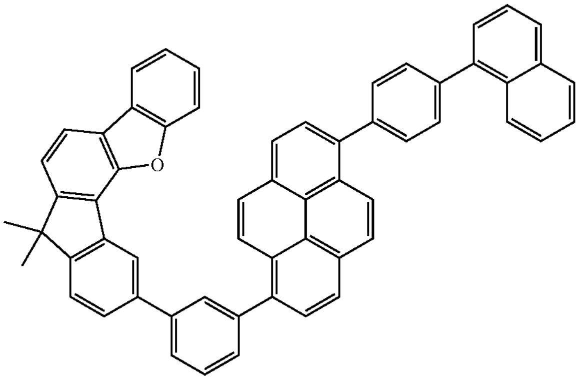
[Chemical Formula 358]
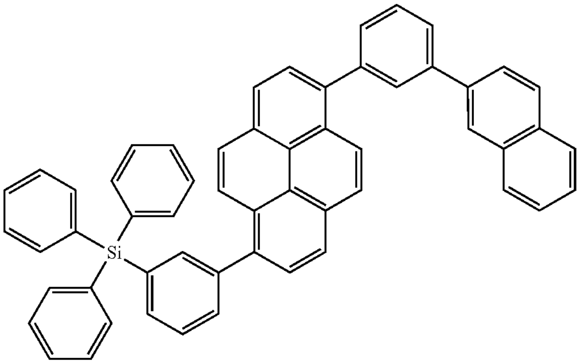
-continued
[Chemical Formula 359]
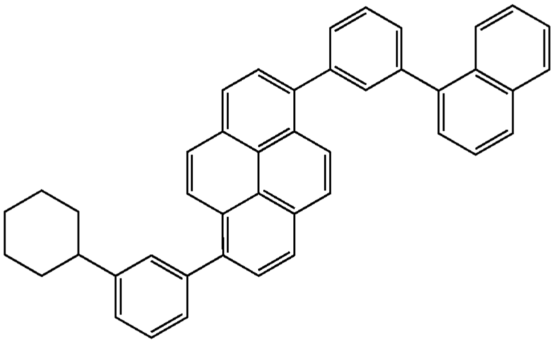
[Chemical Formula 360]
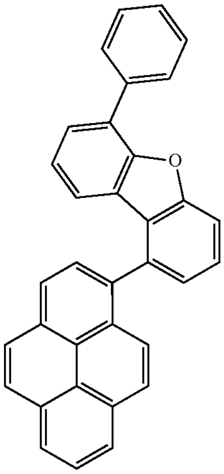
[Chemical Formula 361]
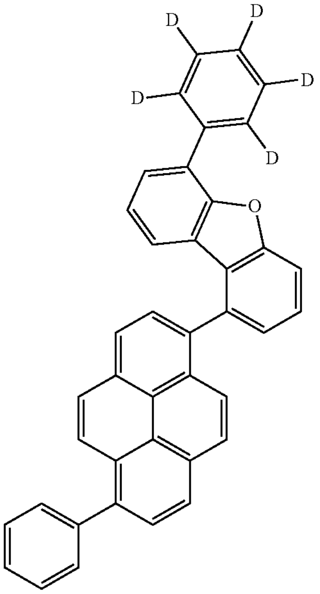

-continued
[Chemical Formula 362]
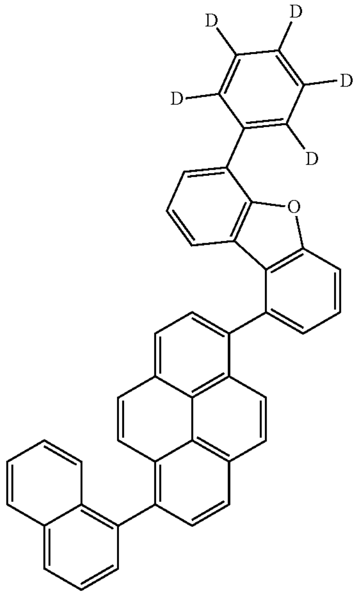
[Chemical Formula 363]
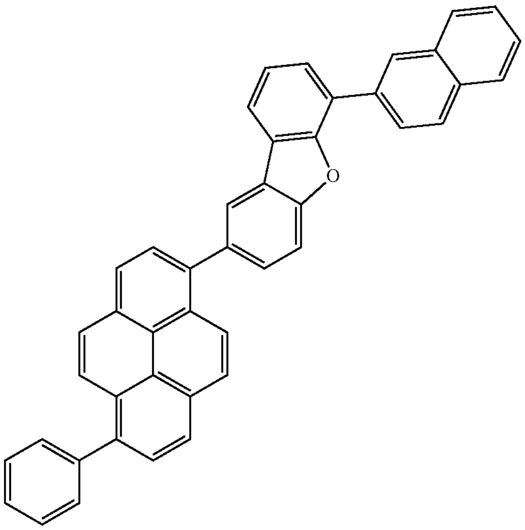
-continued
[Chemical Formula 364]
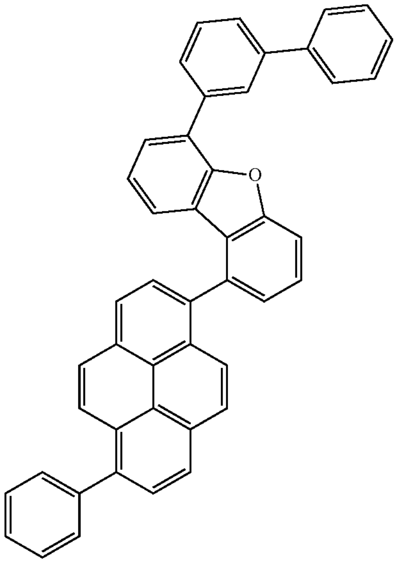
[Chemical Formula 365]
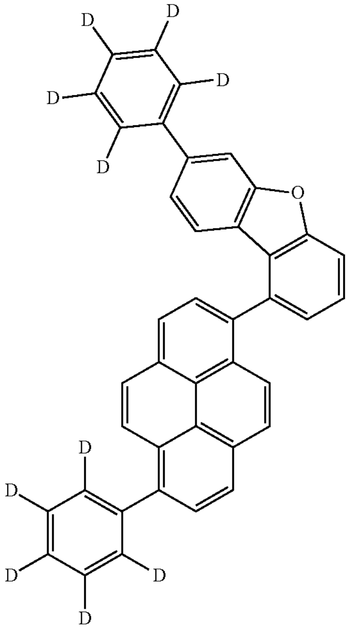

-continued
[Chemical Formula 366]
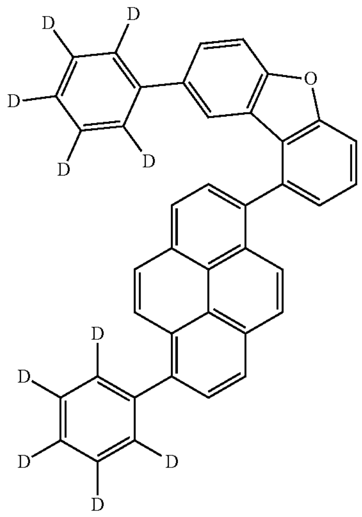
[Chemical Formula 367]
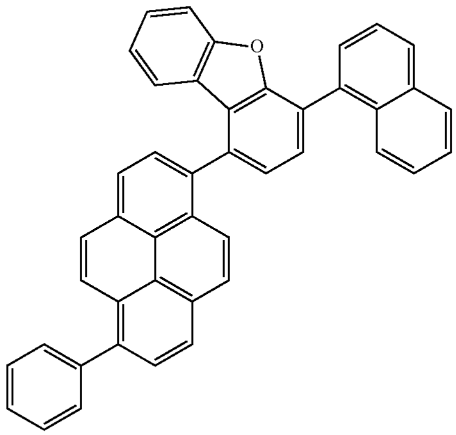
[Chemical Formula 368]
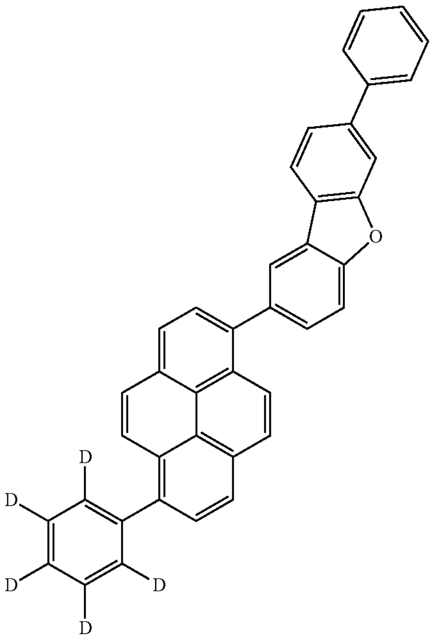
-continued
[Chemical Formula 369]
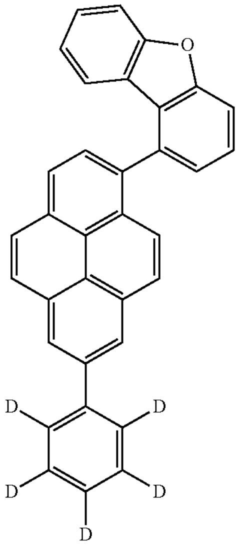
[Chemical Formula 370]
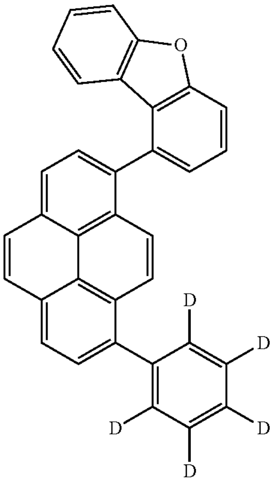
[Chemical Formula 371]
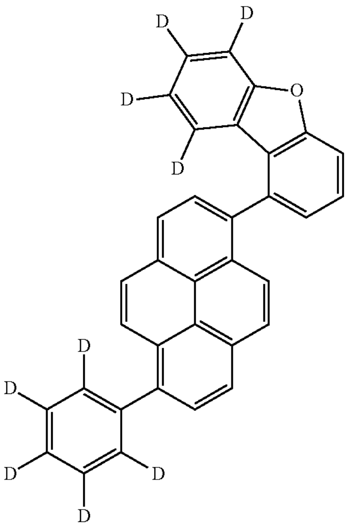

-continued

[Chemical Formula 372]

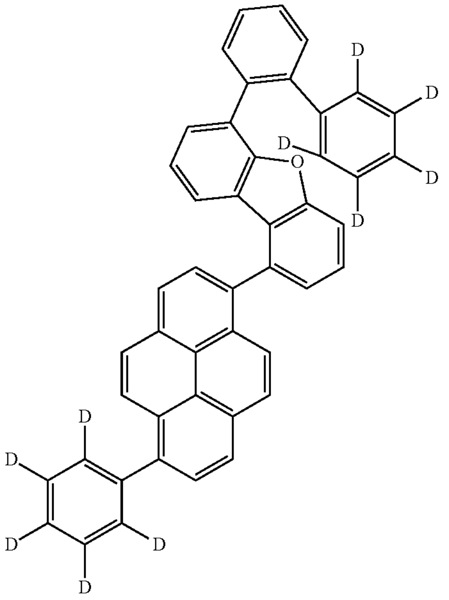

After being deposited on the light emission layer by deposition in a vacuum and spin coating, the electron transport layer 60 is covered with the electron injection layer 70. A cathode metal is deposited on the electron injection layer 70 by thermal vacuum deposition to form the cathode 80, thus obtaining an organic light-emitting diode.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinorate)aluminum ($Alq_3$), Liq, TAZ, BAlq, beryllium bis(benzoquinolin-10-olate) ($Bebq_2$), Compound 201, Compound 202, BCP, and oxadiazole derivatives such as PBD, BMD, and BND, but are not limited thereto:

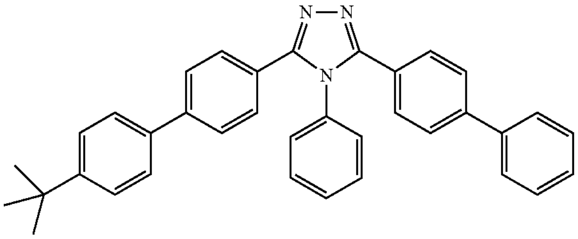

TAZ

-continued

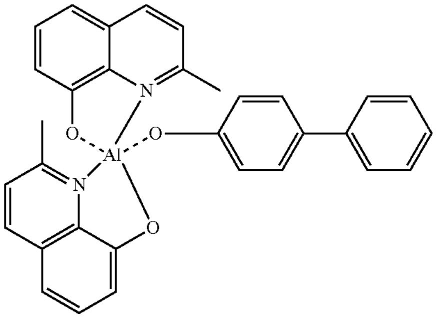

BAlq

<Compound 201>

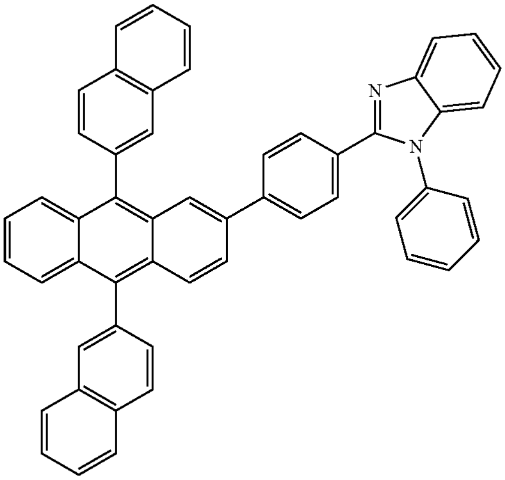

<Compound 202>

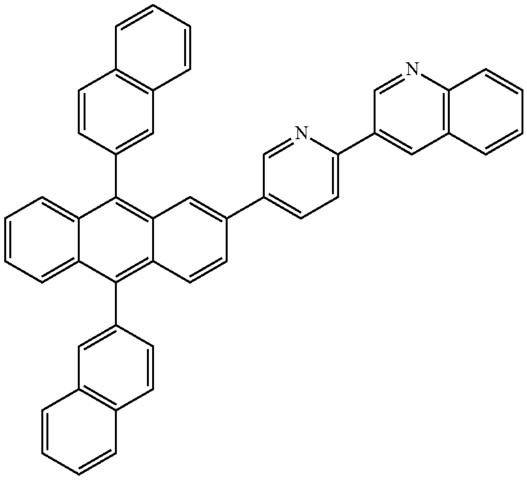

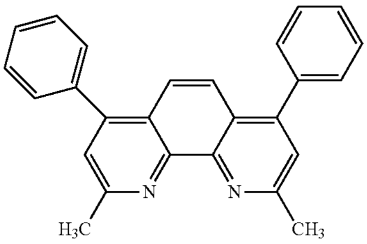

BCP

-continued

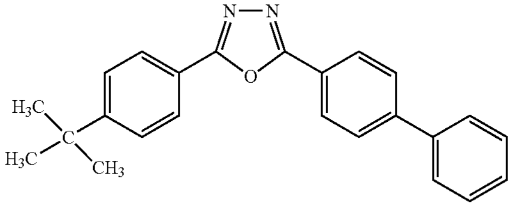

PBD

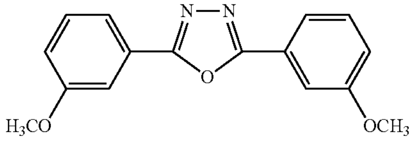

BMD

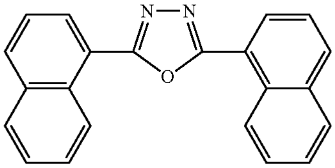

BND

In the organic light emitting diode of the present disclosure, an electron injection layer (EIL) that functions to facilitate electron injection from the cathode may be deposited on the electron transport layer. The material for the EIL is not particularly limited.

So long as it is conventionally used in the art, any material can be available for the electron injection layer without particular limitations. Examples include CsF, NaF, LiF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

Here, the cathode may be made of lithium (Li), magnesium (Mg), aluminum (Al), aluminum-lithium (Al—Li), calcium (Ca), magnesium-indium (Mg—In), or magnesium-silver (Mg—Ag). For a top-emitting OLED, a transparent cathode made of ITO or IZO may be employed.

In another embodiment, the light-emitting diode of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting device of the present disclosure may have a multilayer structure in which the additional blue, green, and/or red light-emitting layer may be made of a fluorescent or phosphorescent material.

Moreover, one or more layers selected from among a hole injection layer, a hole transport layer, a light emission layer, an electron transport layer, and an electron injection layer may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, monochrome or grayscale flexible illumination devices; vehicle display devices; and virtual or augmented reality display devices.

A better understanding of the present disclosure may be obtained through the following examples which are set forth to illustrate, but are not to be construed as limiting the present disclosure.

EXAMPLES

Synthesis Example 1

Synthesis of [Compound 13]

Synthesis Example 1-1

Synthesis of 1-a

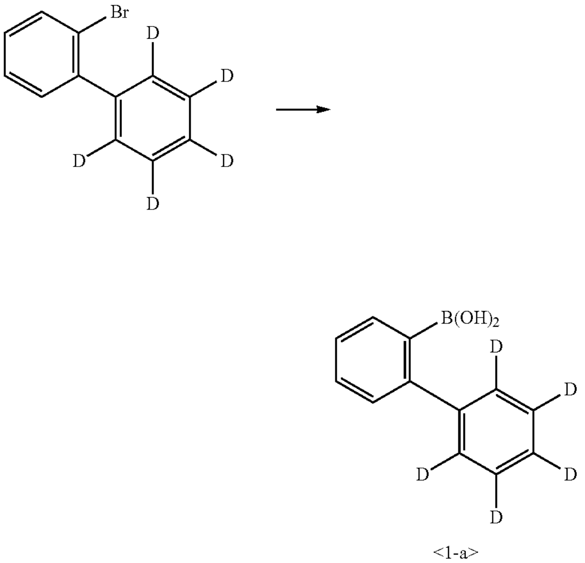 [SMILES: [2H]c1c([2H])c([2H])c(-c2ccccc2Br)c([2H])c1[2H] ; [2H]c1c([2H])c([2H])c(-c2ccccc2B(O)O)c([2H])c1[2H]]

<1-a>

In a 2-L reactor, a solution of 2-bromo-1,1'-biphenyl-2',3',4',5',6'-d5 (70 g) in tetrahydrofuran (700 mL) was cooled to −78° C. under a nitrogen atmosphere and n-butyl lithium (1.6 M, 213 mL) was dropwise added. The mixture was stirred for 1 hour, added with trimethyl borate (40 g), and stirred again at room temperature. After completion of the reaction, the reaction mixture was acidified with 2 N HCl. Extraction was conducted followed by subjecting the organic layer to separation and vacuum concentration. The concentrate was recrystallized in tetrahydrofuran to afford <1-a>. (45.2 g, 75%)

Synthesis Example 1-2

Synthesis of 1-b

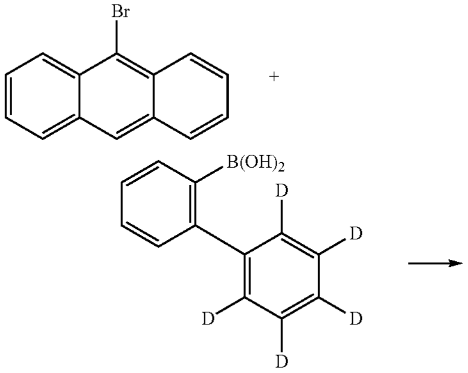

<1-a>

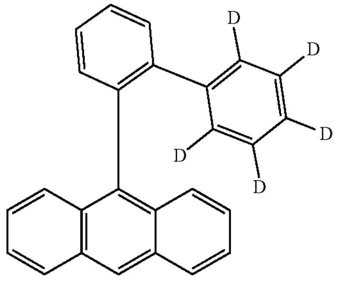

<1-b>

In a 1 L reactor, 9-bromoanthracene (51 g), <1-a> (43 g), potassium carbonate (54.8 g), palladium (II) acetate (0.9 g), SPhos (3.3 g), toluene (210 mL), ethanol (150 mL), and distilled water (150 mL) were stirred overnight under reflux. The reaction mixture was cooled to room temperature and subjected to extraction with ethyl acetate/distilled. The organic layer was concentrated and isolated by column chromatography to afford <1-b>. (55 g, 80%)

Synthesis Example 1-3

Synthesis of 1-c

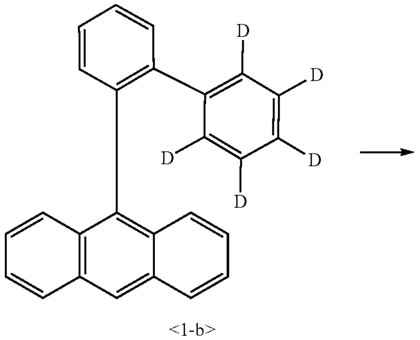

<1-b>

-continued

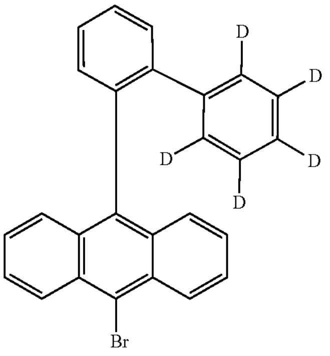

<1-c>

In a 2-L round-bottom flask, a solution of <1-b> (53 g) in N, N-dimethyl formamide (530 mL) was stirred at room temperature. A solution of N-bromosuccinimide (30.1 g) in N,N-dimethyl formamide (100 mL) was dropwise added to the reaction solution. After completion of the reaction was confirmed by thin layer chromatography, the reaction solution was added with distilled water (500 mL) and stirred. The solid thus formed was filtered. The filtrate was washed $H_2O$ and methanol and then dissolved in toluene. Following filtration through silica gel pad, recrystallization in methanol afforded <1-c>. (52.0 g, 80%)

Synthesis Example 1-4

Synthesis of [Compound 13]

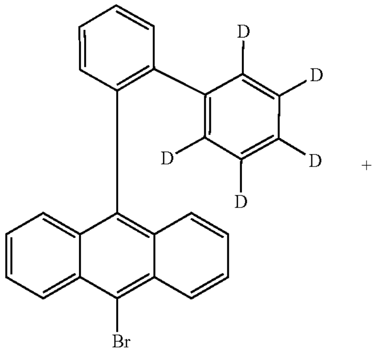

<1-c>

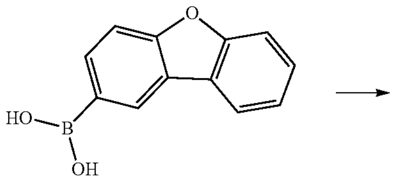

-continued

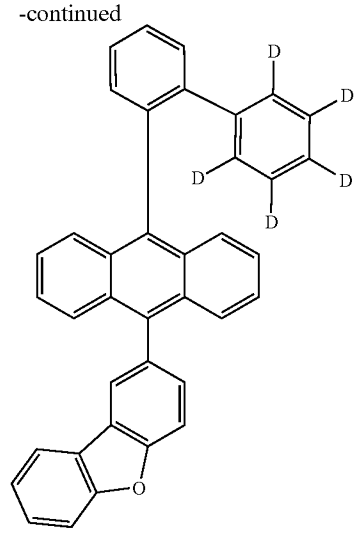

[Compound 13]

In a 500-mL reactor, <1-c> (25 g), (dibenzofuran-2-yl) boronic acid (14.7 g), palladium(II) acetate (0.27 g), potassium carbonate (12.51 g), and SPhos (0.99 g) were stirred together for 3 hours in toluene (100 mL), ethanol (75 mL), and distilled water (75 mL). After completion of the reaction was confirmed by thin layer chromatography, the temperature was decreased to room temperature. The solid thus formed was filtered and then isolated and purified by column chromatography. Recrystallization in toluene and acetone afforded [Compound 13]. (16.65 g, 55%)

MS (MALDI-TOF): m/z 501.21 [$M^+$]

Synthesis Example 2

Synthesis of [Compound 4]

Synthesis Example 2-1

Synthesis of 2-a

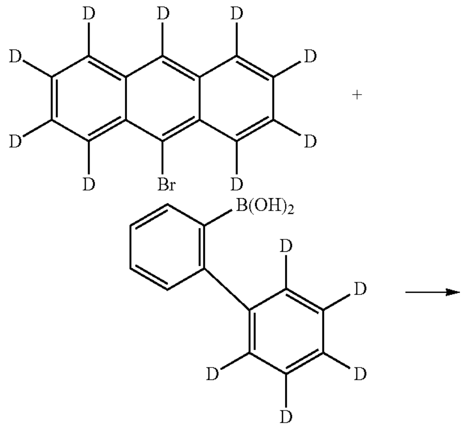

<1-a>

-continued

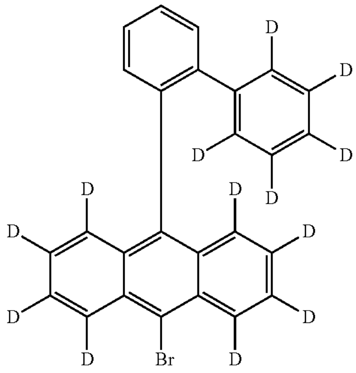

<2-a>

The same procedure as in Synthesis Example 1-2 was carried out, with the exception of using 9-bromoanthracene-1,2,3,4,5,6,7,8,10-$d_9$ instead of 9-bromoanthracene, to afford <2-a>. (yield 79%)

Synthesis Example 2-2

Synthesis of 2-b

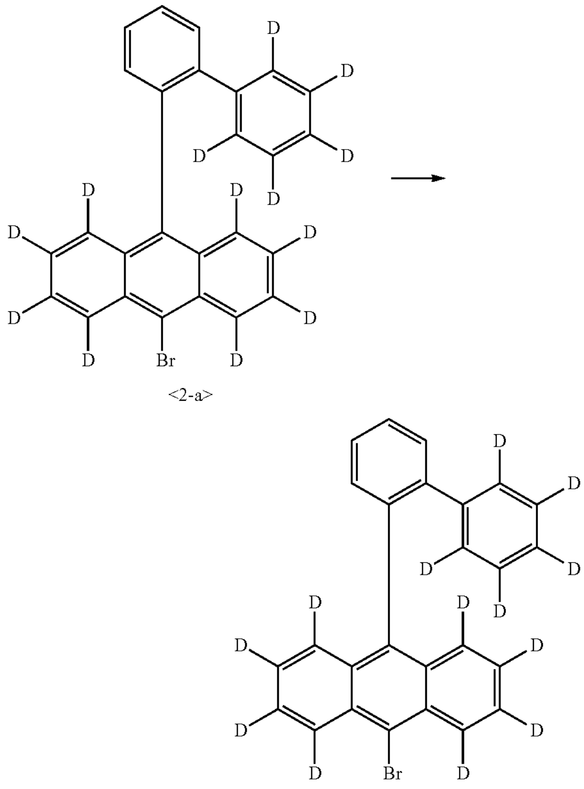

<2-a>

<2-b>

The same procedure as in Synthesis Example 1-3 was carried out, with the exception of using <2-a> instead of <1-b> to afford <2-b>. (yield 76.9%)

Synthesis Example 2-3

Synthesis of [Compound 4]

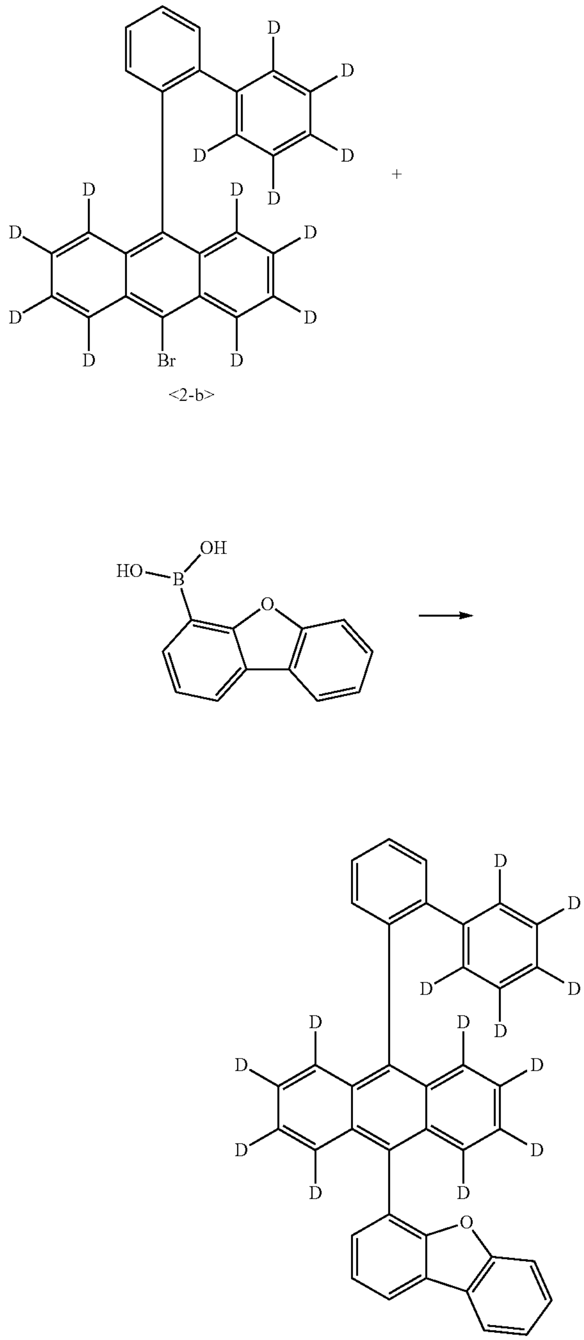

<2-b>

[Compound 4]

The same procedure as in Synthesis Example 1-4 was carried out, with the exception of using <2-b> and dibenzofuran-4-yl boronic acid, instead of <1-c> and dibenzofuran-2-yl boronic acid, respectively, to afford [Compound 4]. (yield 50%)

MS (MALDI-TOF): m/z 509.26 [$M^+$]

Synthesis Example 3

Synthesis of [Compound 7]

Synthesis Example 3-1

Synthesis of [Compound 7]

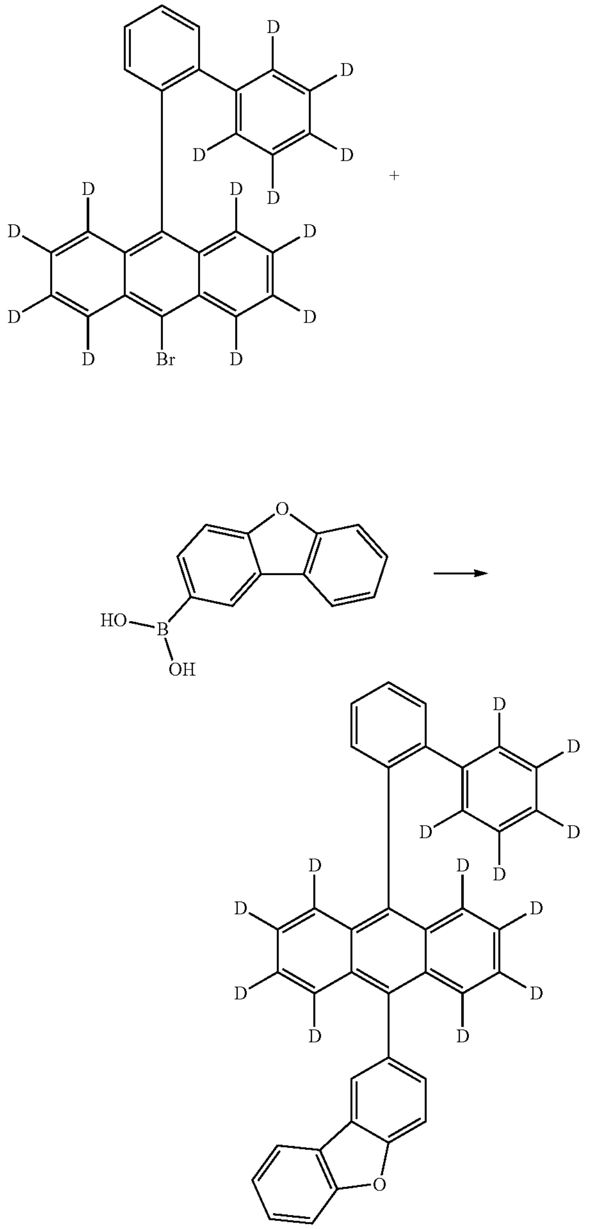

[Compound 7]

The same procedure as in Synthesis Example 2-3 was carried out, with the exception of using dibenzofuran-2-yl boronic acid, instead of dibenzofuran-4-yl boronic acid, to afford [Compound 7]. (yield 52%)

MS (MALDI-TOF): m/z 509.26 [$M^+$]

Synthesis Example 4

Synthesis of [Compound 14]

Synthesis Example 4-1

Synthesis of 4-a

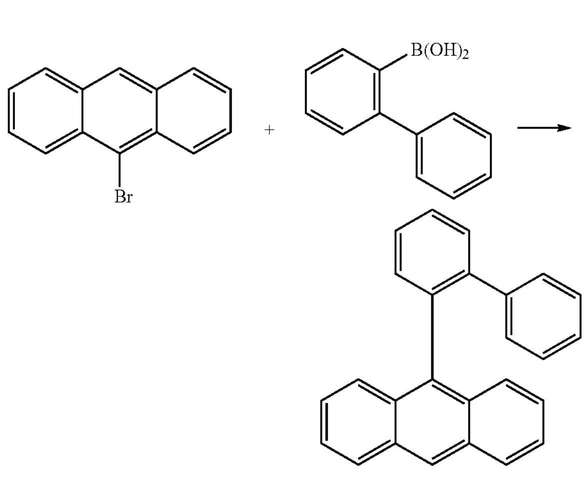

<4-a>

The same procedure as in Synthesis Example 1-2 was carried out, with the exception of using 2-biphenyl boronic acid, instead of <1-a>, to afford <4-a>. (yield 82%)

Synthesis Example 4-2

Synthesis of 4-b

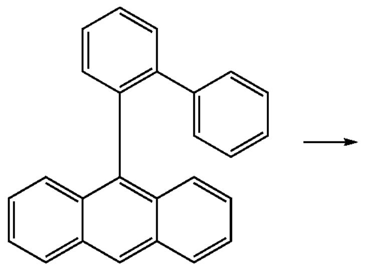

<4-a>

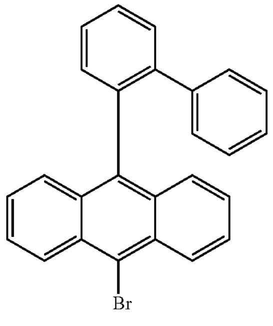

<4-b>

The same procedure as in Synthesis Example 1-3 was carried out, with the exception of using <4-a>, instead of <1-b>, to afford <4-b>. (yield 81.2%)

Synthesis Example 4-3

Synthesis of 4-c

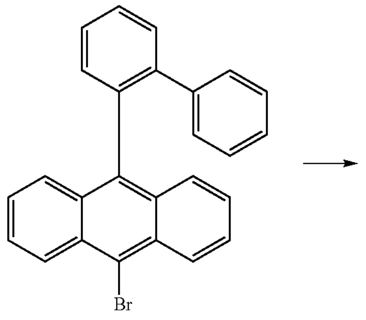

<4-b>

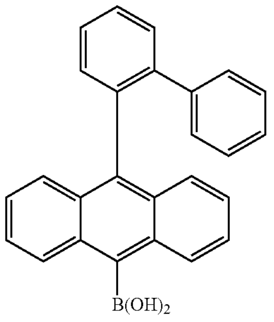

<4-c>

In a 1-L round-bottom flask, a solution of <4-b> (35 g) in tetrahydrofuran (350 mL) was cooled to −78° C. under a nitrogen atmosphere, and n-butyl lithium (1.6 M, 60 mL) was dropwise added. The mixture was stirred for 1 hour, added with trimethyl borate (10.8 g), and then stirred again at room temperature. After completion of the reaction, the reaction mixture was acidified with 2 N HCl and the organic layer was separated and concentrated. The concentrate was recrystallized in tetrahydrofuran to afford <4-c>. (25 g, 78%)

Synthesis Example 4-4

Synthesis of 4-d

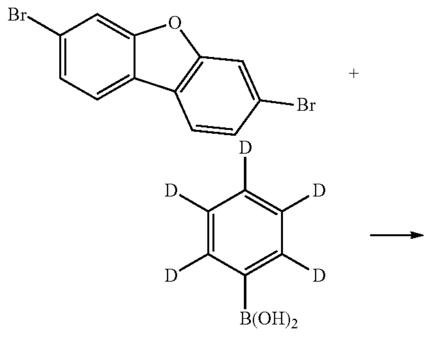

-continued

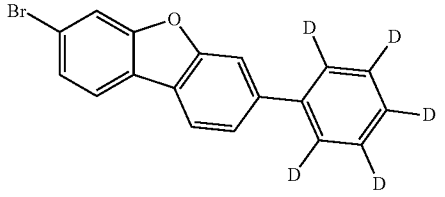

<4-d>

In a 1-L round-bottom flask, 3,6-dibromodibenzofuran (30 g), phenyl-d5-boronic acid (13.4 g), potassium carbonate (60 g), tetrakis(triphenylphosphine)palladium (2.1 g), toluene (360 mL), tetrahydrofuran (180 mL), and distilled water (120 mL) were stirred together overnight at an elevated temperature under reflux. After completion of the reaction was confirmed by thin layer chromatography, the temperature was decreased to room temperature. Following extraction with ethyl acetate and distilled water, the organic layer was concentrated at a reduced pressure. The concentrate was isolated and purified by column chromatography, followed by recrystallization in dichloromethane and acetone to afford <4-d>. (19 g, 63%)

Synthesis Example 4-5

Synthesis of [Compound 14]

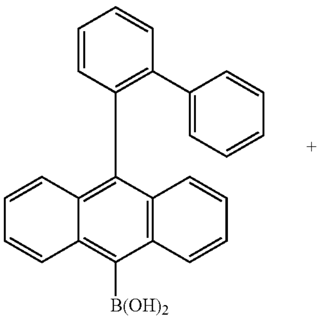

<4-c>

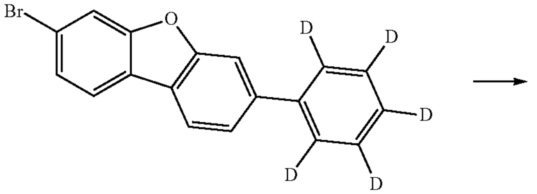

<4-d>

-continued

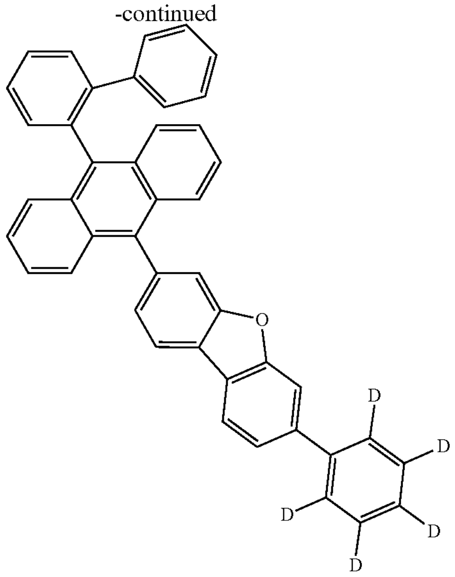

[Compound 14]

The same procedure as in Synthesis Example 1-4 was carried out, with the exception of using <4-d> and <4-c>, instead of <1-c> and dibenzofuran-2-yl boronic acid, respectively, to afford [Compound 14]. (yield 48%)

MS (MALDI-TOF): m/z 577.25 [$M^+$]

Synthesis Example 5

Synthesis of [Compound 17]

Synthesis Example 5-1

Synthesis of <5-a>

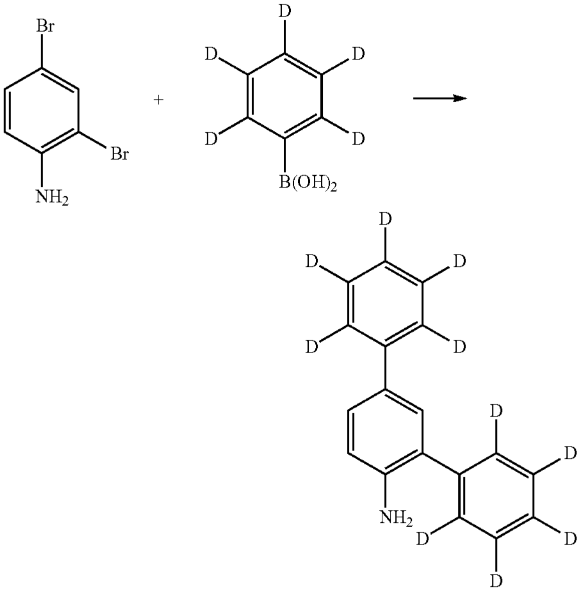

<5-a>

In a 1-L round-bottom flask, 2,4-dibromoaniline (54 g), phenyl-d5-boronic acid (65.6 g), potassium carbonate (89.2 g), tetrakis(triphenylphosphine)palladium (9.9 g), toluene (216 mL), 1,4-dioxane (216 mL), and distilled water (86 mL) were stirred together overnight at an elevated temperature under reflux. After completion of the reaction was confirmed by thin layer chromatography, the temperature was decreased to room temperature. Extraction with ethyl acetate and distilled water was followed by concentrating the organic layer in a vacuum. The concentrate was isolated and purified by column chromatography to afford <5-a>. (26.5 g, 48.2%)

Synthesis Example 5-2

Synthesis of <5-b>

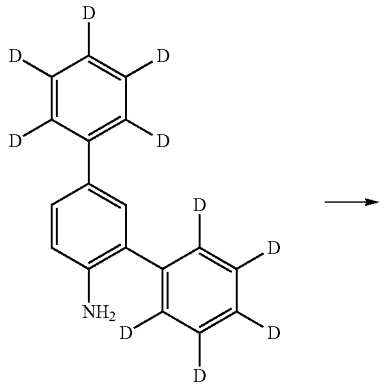

<5-a>

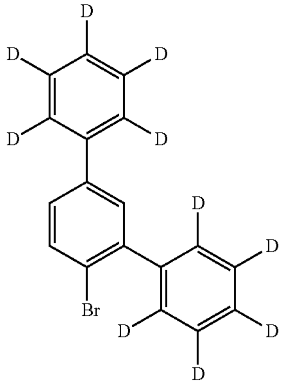

<5-b>

In a 3-L round-bottom flask, a solution of <5-a> (26.5 g) and p-toluene sulfonate monohydrate (53.6 g) in acetonitrile (477 mL) was stirred at room temperature for 30 minutes. A solution of sodium nitrite (14.3 g) in distilled water (100 mL) were dropwise added to the reaction solution. After being stirred at room temperature for 2 hours, the mixture was added at once with copper (I) bromide (37.2 g) and stirred. After completion of the reaction was confirmed by thin layer chromatography, distilled water (200 mL) was added and stirred, followed by extraction with dichloromethane. The organic layer was separated and concentrated in a vacuum. Isolation and purification by column chromatography afforded <5-b>. (24 g, 72.4%)

Synthesis Example 5-3

Synthesis of <5-c>

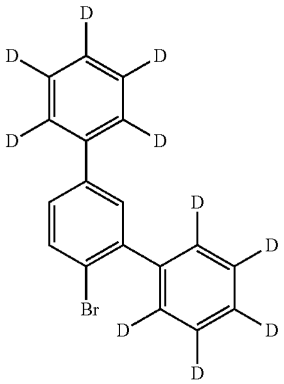

<5-b>

+

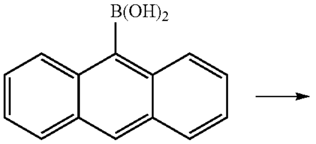

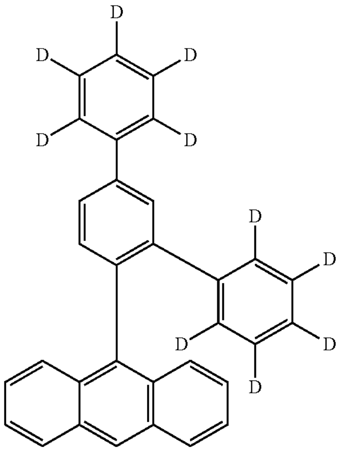

<5-c>

The same procedure as in Synthesis Example 1-2 was carried out, with the exception of using <5-b> and 9-anthracene boronic acid, instead of 9-bromoanthracene and <1-a>, respectively, to afford <5-c>. (yield 78.2%)

Synthesis Example 5-4
<5-d>
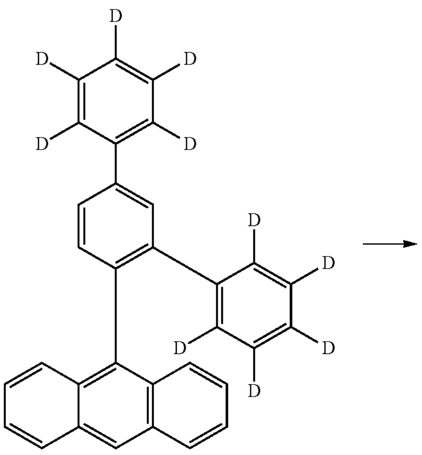
<5-c>
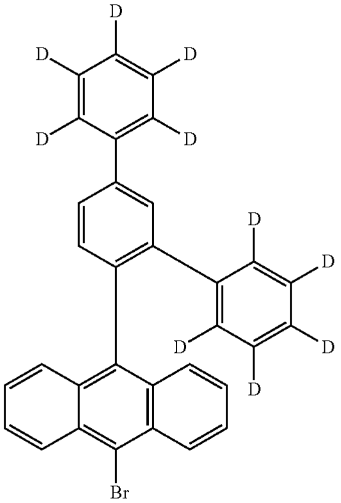
<5-d>
The same procedure as in Synthesis Example 1-3 was carried out, with the exception of using <5-c>, instead of <1-b>, to afford <5-d>. (yield 79.2%)
Synthesis Example 5-5
Synthesis of [Compound 17]
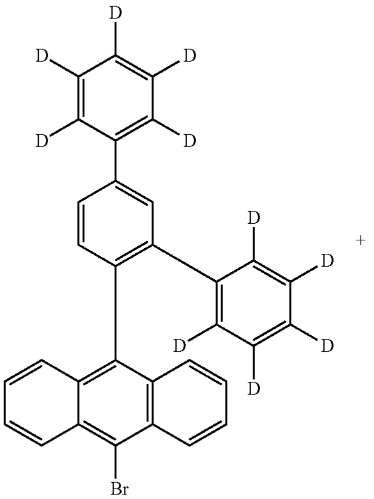
<5-d>
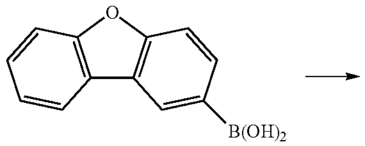
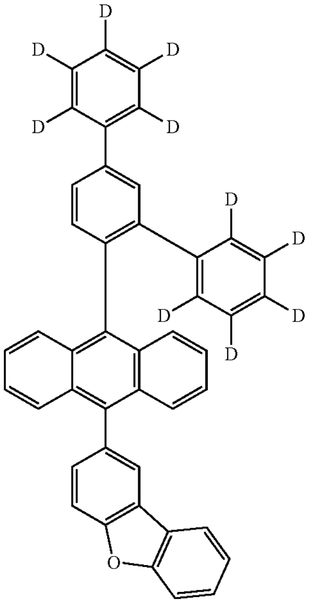
[Compound 17]
The same procedure as in Synthesis Example 1-4 was carried out, with the exception of using <5-d>, instead of <1-c>, to afford [Compound 17]. (yield 55%)
MS (MALDI-TOF): m/z 582.28 $[M^+]$

Synthesis Example 6

Synthesis of [Compound 21]

Synthesis Example 6-1

Synthesis of 6-a

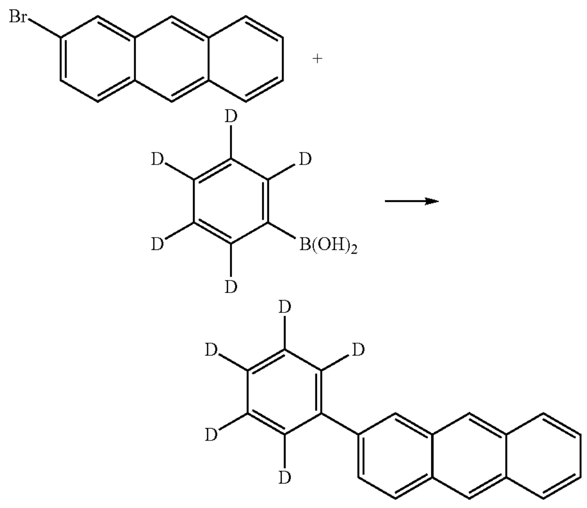

<6-a>

The same procedure as in Synthesis Example 1-2 was carried out, with the exception of using 2-bromoanthracene and phenyl-2',3',4',5',6'-d5 boronic acid, instead of 9-bromoanthracene and <1-a>, respectively, to afford <6-a>. (yield 79%)

Synthesis Example 6-2

Synthesis of 6-b

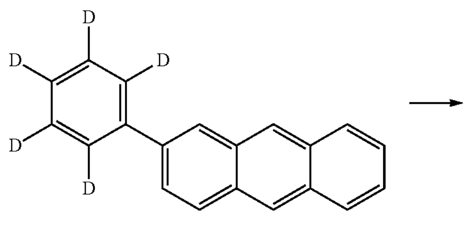

<6-a>

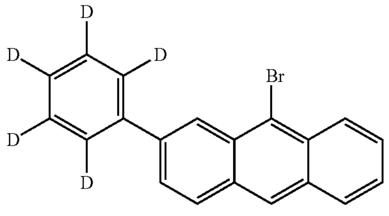

<6-b>

The same procedure as in Synthesis Example 1-3 was carried out, with the exception of using <6-a>, instead of <1-b>, to afford <6-b>. (yield 81.4%)

Synthesis Example 6-3

Synthesis of 6-c

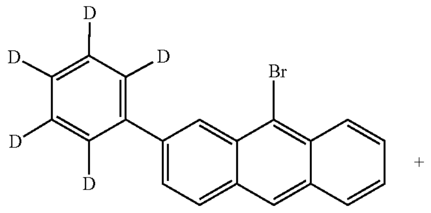

<6-b>

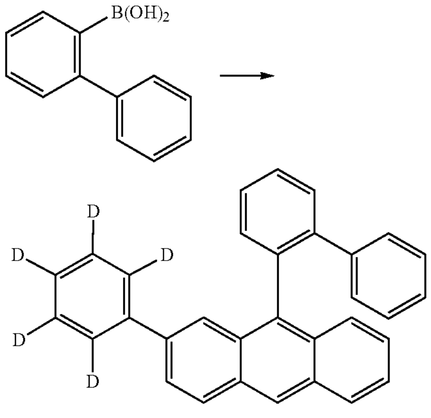

<6-c>

The same procedure as in Synthesis Example 4-1 was carried out, with the exception of using <6-b>, instead of 9-bromoanthracene, to afford <6-c>. (yield 64%)

Synthesis Example 6-4

Synthesis of 6-d

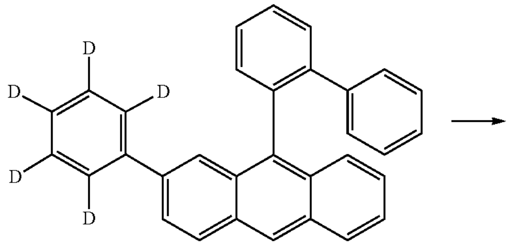

<6-c>

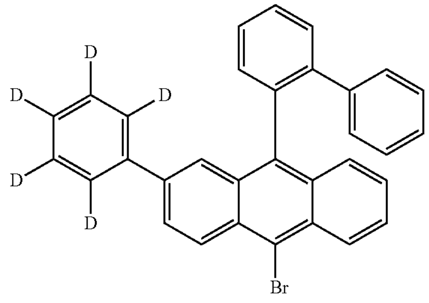

<6-d>

The same procedure as in Synthesis Example 1-3 was carried out, with the exception of using <6-c>, instead of <1-b>, to afford <6-d>. (yield 75.3%)

Synthesis Example 6-5

Synthesis of [Compound 21]

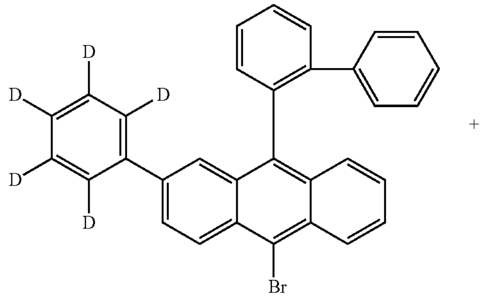

<6-d>

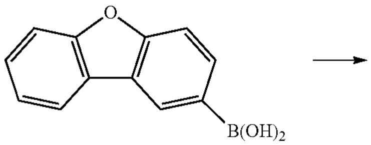

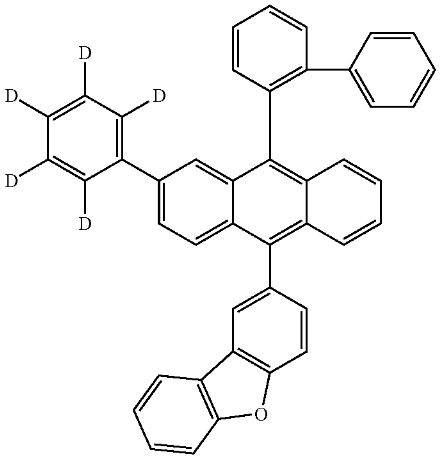

[Compound21]

The same procedure as in Synthesis Example 1-4 was carried out, with the exception of using <6-d>, instead of <1-c>, to afford [Compound 21]. (yield 61.2%)

MS (MALDI-TOF): m/z 577.25 [$M^+$]

Synthesis Example 7

Synthesis of [Compound 33]

Synthesis Example 7-1

Synthesis of 7-a

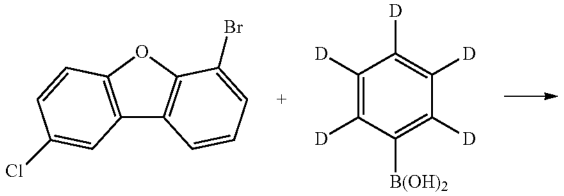

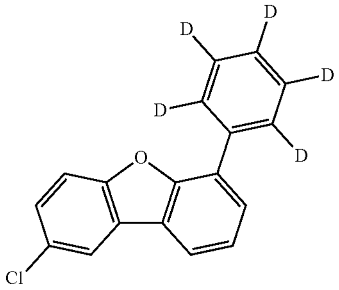

<7-a>

The same procedure as in Synthesis Example 4-4 was carried out, with the exception of using 2-chloro-5-bromodibenzofuran, instead of 3,6-dibromodibenzofuran, to afford <7-a>. (yield 70.5%)

Synthesis Example 7-2

Synthesis of 7-b

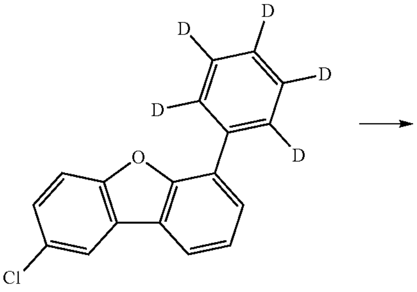

<7-a>

-continued

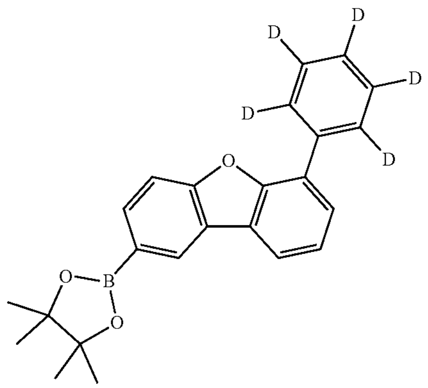

<7-b>

In a 500-mL round-bottom flask, <7-a> (23.1 g), bis (pinacolato)diboron (26.9 g), 1,1-bis(diphenylphosphino) ferrocene dichloropalladium (2 g), potassium acetate (24 g), diphenylphosphinoferrocene (0.5 g), and toluene (230 mL) were together stirred overnight under reflux. After completion of the reaction was confirmed by thin layer chromatography, the reaction mixture was filtered through a celite pad. The filtrate was isolated and purified by column chromatography and recrystallized in dichloromethane and heptane to afford <7-b>. (23.6 g, 77.3%)

Synthesis Example 7-3

Synthesis of [Compound 33]

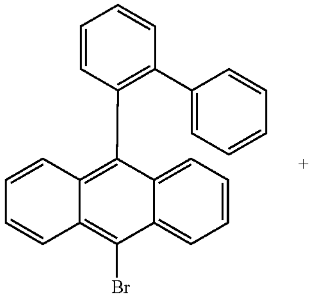

<4-b>

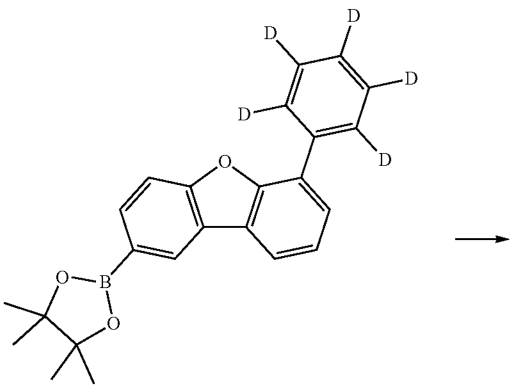

<7-b>

-continued

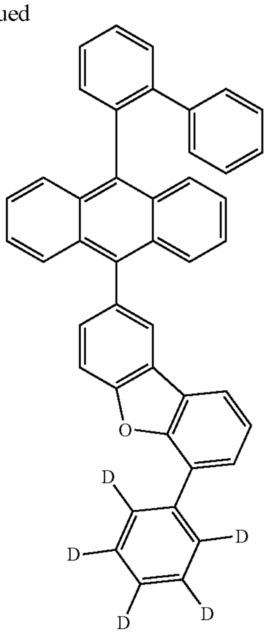

[Compound 33]

The same procedure as in Synthesis Example 2-3 was carried out, with the exception of using <4-b> and <7-b>, instead of <2-b> and dibenzofuran-4-yl boronic acid, to afford [Compound 33]. (yield 51.2%)

MS (MALDI-TOF): m/z 577.25 $[M^+]$

Synthesis Example 8

Synthesis of [Compound 3]

Synthesis Example 8-1

Synthesis of [Compound 3]

The same procedure as in Synthesis Example 1-4 was carried out, with the exception of using <4-b>, instead of <1-c>, to afford [Compound 3]. (yield 43%)

MS (MALDI-TOF): m/z 496.18 $[M^+]$

Example 1

Fabrication of Organic Light-Emitting Diode

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, a film for a hole injection layer was formed of a mixture of [HT] and 5 wt % of [Acceptor-1] (50 Å). Subsequently, a film for a hole transport layer was formed of [HT] (600 Å). Then, a light-emitting layer (200 Å) was formed of a combination of the host compound according to the present disclosure and the dopant compound [BD] (3 wt %), below. Then, a mixture of 1:1 of [Chemical Formula E-1] and [Chemical Formula E-2] was deposited to form an electron transport layer (250 Å) on which an electron injection layer of [Chemical Formula E-2] (10 Å) was formed and then covered with an Al layer (1000 Å) for a cathode. The organic light-emitting diode thus fabricated was measured at 10 $mA/cm^2$ for luminescence properties.

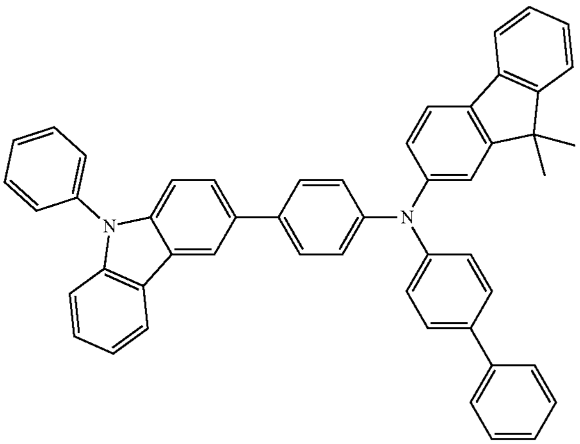

[HT]

[Acceptor-1]

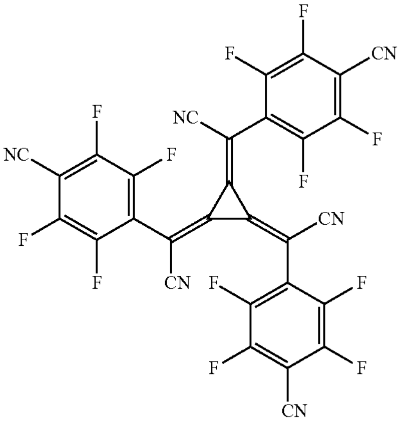

[BD]

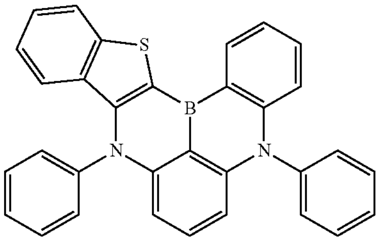

[Chemical Formula E-1]

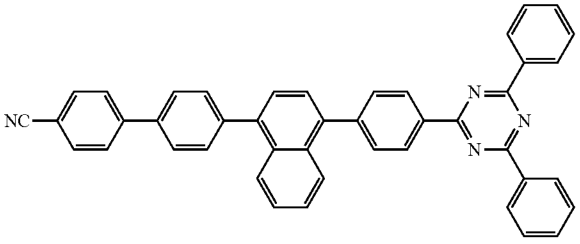

[Chemical Formula E-2]

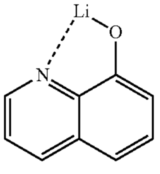

Comparatative Examples 1 and 2

Fabrication of Organic Light-Emitting Diodes

Organic light emitting diodes were fabricated in the same manner as in Example 1, with the exception of using [BH 1] and [BH 2] compounds instead of the host compound used in Example 1. The luminescence characteristics of the organic light-emitting diodes thus obtained were measured at 10 mA/cm$^2$, and the measurements are summarized in Table 1, below.

[BH 1]

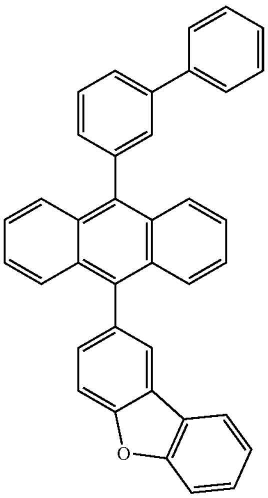

[BH 2]

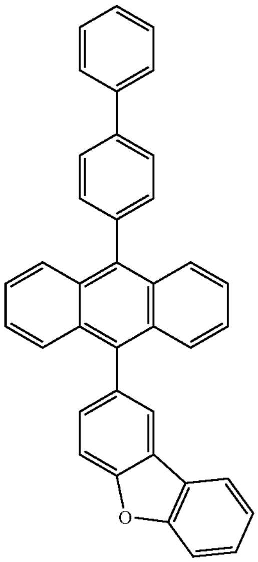

TABLE 1

| | Host | V | EQE | $LT_{97}$ |
|---|---|---|---|---|
| Example 1 | Compound 13 | 3.52 | 12.2 | 200 |
| Comparative Example 1 | [BH 1] | 3.65 | 12.0 | 80 |
| Comparative Example 2 | [BH 2] | 3.55 | 11.8 | 30 |

Examples 2 to 8

Fabrication of Organic Light-Emitting Diodes

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, a film was formed of the electron acceptors [Acceptor-1] and [HT] at a deposition ratio of [Acceptor-1]:[HT]=2:98 (100 Å). A film was formed of [HT] for a hole transport layer (550 Å) and then of [Chemical Formula G] for an electron barrier layer (50 Å). A light-emitting layer (200 Å) was formed of a combination of the host compound according to the present disclosure and the dopant compound [BD 1] (1 wt %), below, followed by depositing [Chemical Formula H] to form a film for a hole barrier layer (50 Å). Thereafter, films were formed of a combination of 1:1 of [Chemical Formula E-2] and [Chemical Formula E-3] for an electron transport layer (250 Å), of [Chemical Formula E-2] for an electron injection layer (10 Å), and of Al for a cathode (1000 Å) in that order to fabricate an organic light-emitting diode. The organic light-emitting diode thus obtained were measured at 10 mA/$cm^2$ for luminescence properties.

[Chemical Formula G]

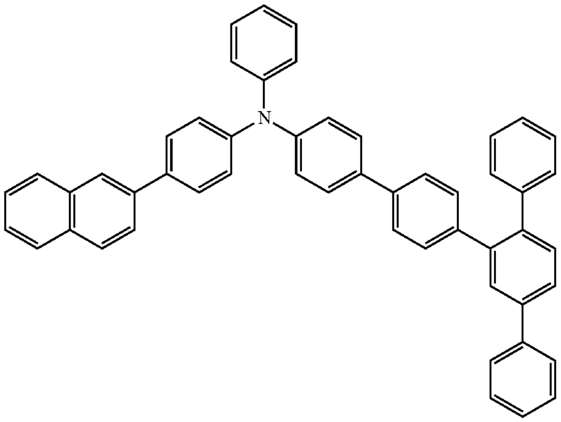

[Chemical Formula H]

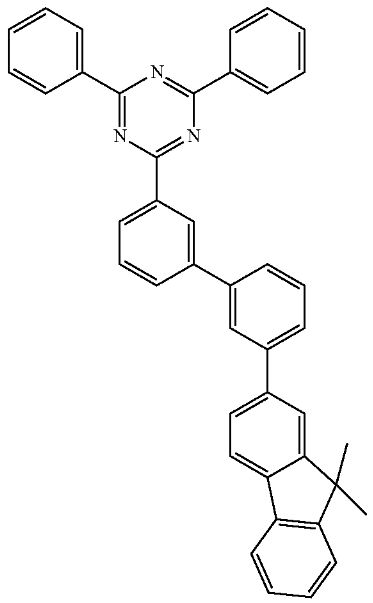

-continued

[Chemical Formula E-3]

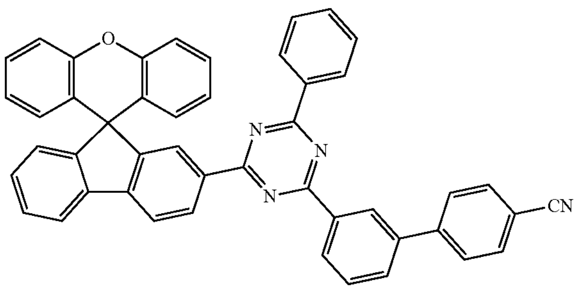

[Acceptor-1]

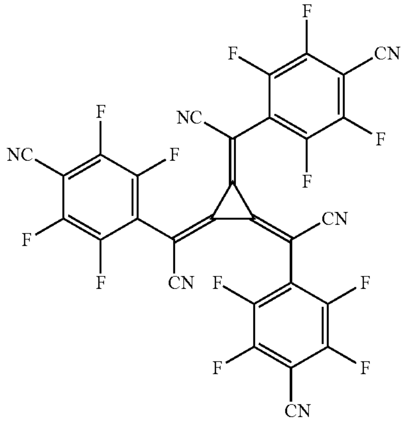

[BD 1]

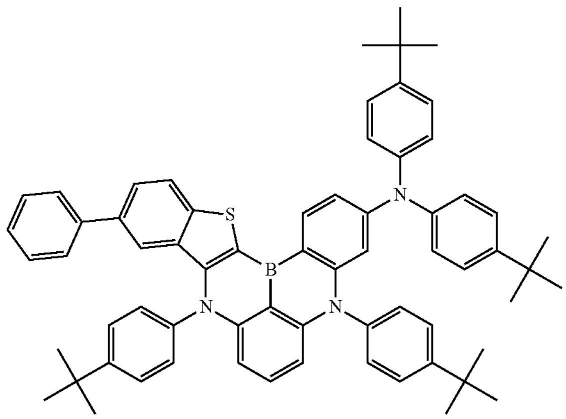

Comparative Examples 3 to 4

Fabrication of Organic Light-Emitting Diodes

Organic light emitting diodes were fabricated in the same manner as in Examples 2 to, with the exception of using [BH 1] and [BH 2] compounds instead of the host compound used in the Examples. The luminescence characteristics of the organic light-emitting diodes thus obtained were measured at 10 mA/$cm^2$.

TABLE 2

| | Host | $LT_{97}$ |
|---|---|---|
| Example 2 | Compound 4 | 120 |
| Example 3 | Compound 7 | 260 |
| Example 4 | Compound 13 | 230 |

TABLE 2-continued

| | Host | $LT_{97}$ |
|---|---|---|
| Example 5 | Compound 14 | 150 |
| Example 6 | Compound 17 | 180 |
| Example 7 | Compound 21 | 126 |
| Example 8 | Compound 33 | 137 |
| Comparative Example 3 | [BH 1] | 100 |
| Comparative Example 4 | [BH 2] | 60 |

As is understood from data of Tables 1 and 2, the compounds according to the present disclosure allowed longer lifespans, compared to anthracene compounds which are the same structure as Chemical Formula A, but do not bear deuterium atoms or the substituents, thereby finding high applicability to organic light-emitting diodes.

What is claimed is:

1. An organic light-emitting diode comprising: a first electrode; a second electrode facing the first electrode; and an organic layer between the first electrode and the second electrode, wherein the organic layer includes a light emission layer containing a host and a dopant, the host comprising at least one of anthracene compounds represented by Chemical Formula A and the dopant comprising at least one of compounds represented by Chemical Formula B-1 or Chemical Formula B-2:

[Chemical Formula A]

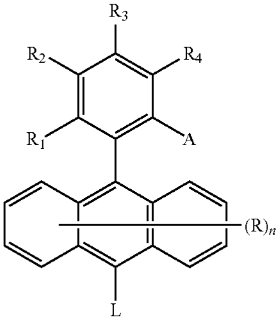

[Structure Formula 1]

L =

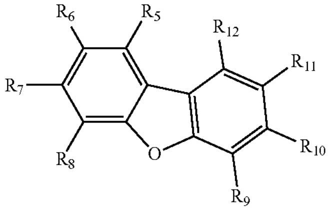

wherein,

A is any one selected from among a substituted or unsubstituted aryl of 6 to 50 carbon atoms, a substituted or unsubstituted heteroaryl of 2 to 50 carbon atoms, and a substituted or unsubstituted aliphatic/aromatic composite ring of 3 to 50 carbon atoms, $R_1$ is a hydrogen atom or a deuterium atom, R, and $R_2$ to $R_{12}$, which are same or different, are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 3 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 50 carbon atoms, a substituted or unsubstituted akylthioxy of 1 to 30 carbon atoms, a substituted or unsubstituted arylthioxy of 6 to 50 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 50 carbon atoms, a cyano, a nitro, and a halogen, wherein a linkage can be made between adjacent two of the substituents R and $R_2$ to $R_{12}$ to form an additional mono- or polycyclic aliphatic or aromatic ring, n is an integer of 1 to 8, wherein when n is 2 or greater, the R's are same or different, one of $R_5$ to $R_{12}$ in Structural Formula 1 is a single bond to a carbon member of the anthracene moiety of Chemical Formula A, at least one substituent in Chemical Formula A is substituted by or bears a deuterium atom, the host in the light emission layer is a mixture of the anthracene compound represented by Chemical Formula A and at least one different host compound, or is formed as the anthracene compound represented by Chemical Formula A and a different host compound are separately deposited, and

[Chemical Formula B-1]

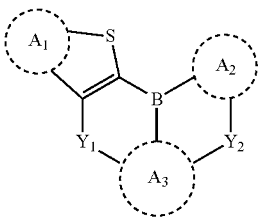

[Chemical Formula B-2]

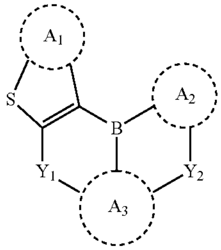

wherein, $A_1$ to $A_3$, which are same or different, are each independently any one selected from among a substituted or unsubstituted aromatic hydrocarbon ring of 6 to 50 carbon atoms, a substituted or unsubstituted heteroaromatic ring of 2 to 50 carbon atoms, a substituted or unsubstituted aliphatic ring of 3 to 30 carbon atoms, and a substituted or unsubstituted aliphatic/aromatic composite ring of 3 to 30 carbon atoms, wherein a linkage can be formed between adjacent two of substituents on the rings $A_1$ to $A_3$ to form an additional mono- or polycyclic aliphatic or aromatic ring, $Y_1$ and $Y_2$, which are same or different, are each independently any one selected from among $NR_{21}$, $CR_{22}R_{23}$, O, S, Se, and $SiR_{24}R_{25}$, $R_{21}$ to $R_{25}$, which are same or different, are each independently any one selected from among a hydrogen atom, a deuterium atom, substituted or unsubstituted alkyl of 1 to 30 carbon atoms, a substituted or unsubstituted alkenyl of 2 to 30 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 6 to 30 carbon atoms, a substituted or unsubstituted amine of 0 to 30 carbon atoms, a substituted or unsubstituted silyl of 0 to 30 carbon atoms, a substituted or unsubstituted aliphatic/aromatic composite ring of 3 to 30 carbon atoms, a nitro, a cyano, and a halogen, $R_{21}$ to $R_{25}$ can each be connected to at least one selected from among the rings $A_1$ to $A_3$ to form an additional mono-or polycyclic aliphatic or aromatic ring, and a bond can be made between $R_{22}$ and $R_{23}$ and between $R_{24}$ and $R_{25}$ to form additional respective mono- or polycyclic aliphatic or aromatic rings, wherein the term "substituted" in the expression "substituted or unsubstituted" used for compounds of Chemical Formulas A, B-1, and B-2 means having at least one substituent selected from the group consisting of a deuterium atom, a cyano, a halogen, a hydroxy, a nitro, an alkyl of 1 to 24 carbon atoms, an halogenated alkyl of 1 to 24 carbon atoms, a cycloalkyl of 3 to 30 carbon atoms, an alkenyl of 2 to 24 carbon atoms, an alkynyl of 2 to 24 carbon atoms, a heteroalkyl of 1 to 24 carbon atoms, an aryl of 6 to 30 carbon atoms, an arylalkyl of 7 to 30 carbon atoms, an alkylarylof 7 to 30 carbon atoms, a heteroaryl of 2 to 30 carbon atoms, a heteroarylalkyl of 2 to 30 carbon atoms, an amine of 0 to 24 carbon atoms, a silyl of 0 to 24 carbon atoms, an aryloxy of 6 to 30 carbon atoms, and an aliphatic/aromatic composite ring of 3 to 30 carbon atoms.

2. The organic light emitting diode of claim 1, wherein the substituent A in Chemical Formula A is a deuterium-substituted or unsubstituted an aryl of 6 to 30 carbon atoms.

3. The organic light emitting diode of claim 2, wherein the substituent A in Chemical Formula A is any one selected from among a deuterium-substituted or unsubstituted phenyl, a deuterium-substituted or unsubstituted biphenyl, a deuterium-substituted or unsubstituted terphenyl, a deuterium-substituted or unsubstituted naphthyl, and a deuterium-substituted or unsubstituted phenanthrenyl.

4. The organic light emitting diode of claim 1, wherein at least one of the substituents R's in Chemical Formula A is a deuterium atom.

5. The organic light emitting diode of claim 1, wherein at least one of $R_2$ to $R_4$ in Chemical Formula A is selected from among a hydrogen atom, a deuterium atom, and a substituted or unsubstituted an aryl of 6 to 30 carbon atoms.

6. The organic light emitting diode of claim 1, wherein among the substituents $R_5$ to $R_{12}$ in Structural Formula 1 of Chemical Formula A, at least one of the substituents other than one that forms a single bond to the anthracene ring is an aryl group having 6 to 30 carbon atoms, the aryl group being optionally substituted with one or more deuterium atoms or unsubstituted.

7. The organic light emitting diode of claim 1, wherein the anthracene compound represented by Chemical Formula A has a degree of deuteration of 20% or higher.

8. The organic light emitting diode of claim 7, wherein the anthracene compound represented by Chemical Formula A has a degree of deuteration of 35% or higher.

9. The organic light emitting diode of claim 1, wherein the anthracene compound represented by Chemical Formula A is any one selected from among [Compound 1] to [Compound 60]:

[Compound 1]

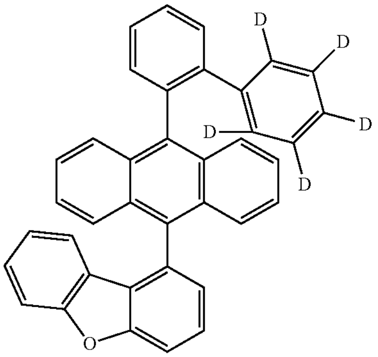

[Compound 2]

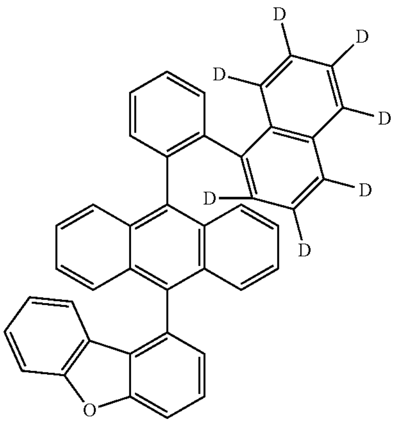

[Compound 3]

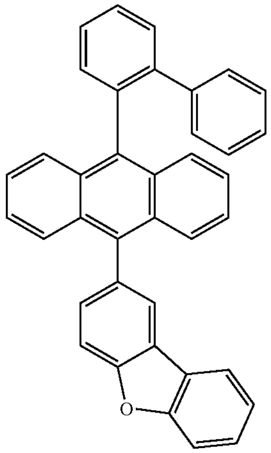

-continued
[Compound 4]
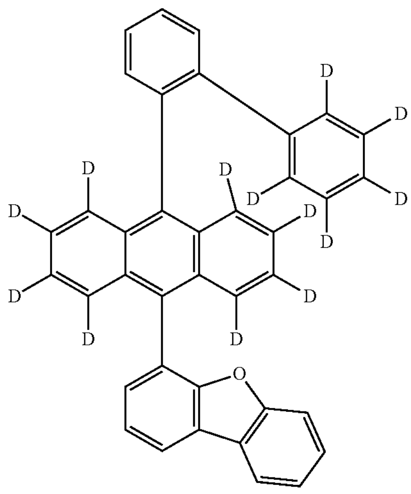
[Compound 7]
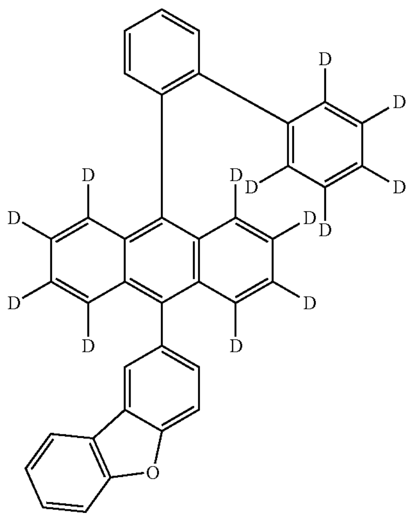
[Compound 5]
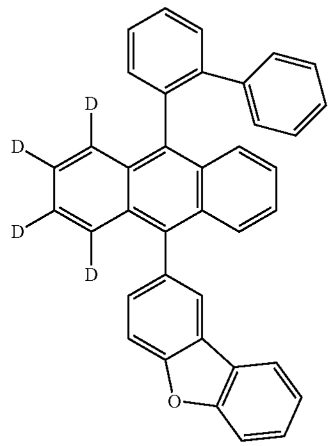
[Compound 8]
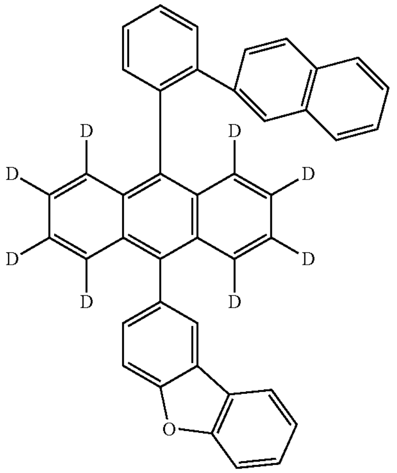
[Compound 6]
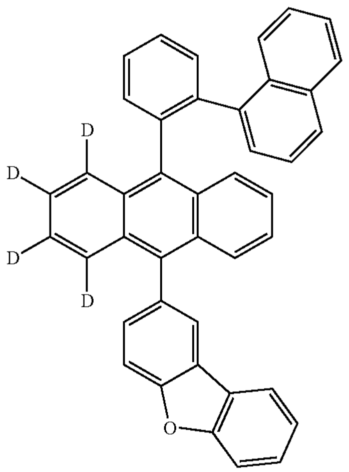
[Compound 9]
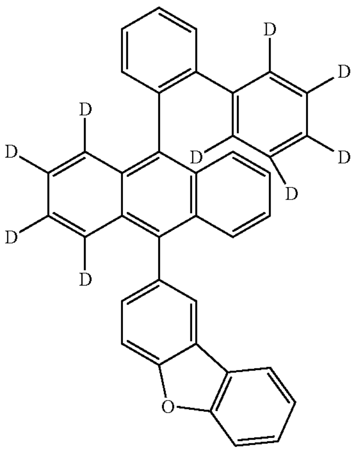

-continued
[Compound 10]
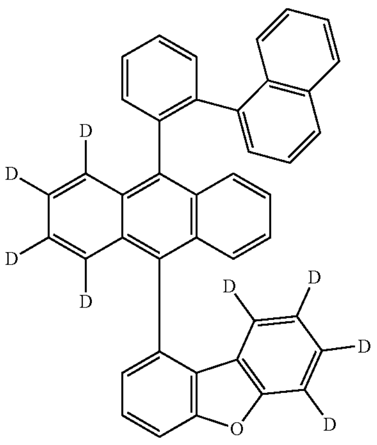
[Compound 11]
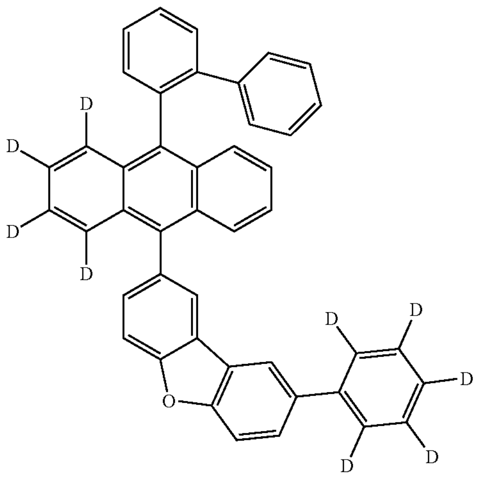
[Compound 12]
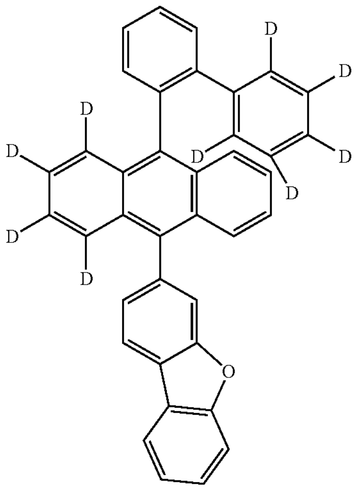
-continued
[Compound 13]
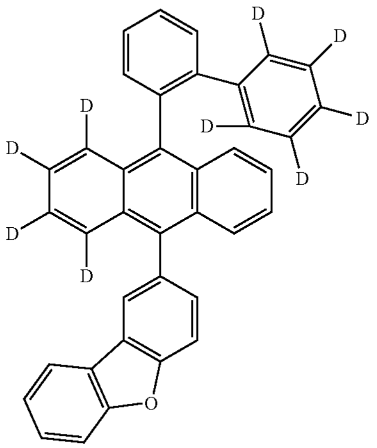
[Compound 14]
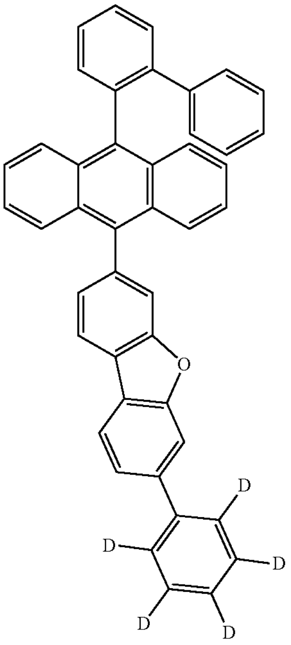
[Compound 15]
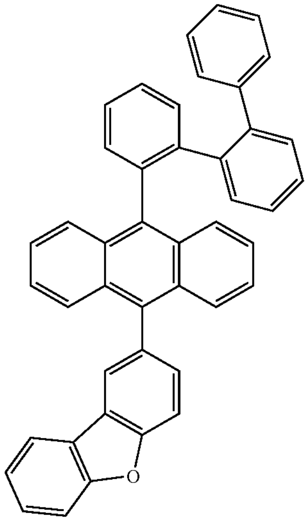

-continued
[Compound 16]
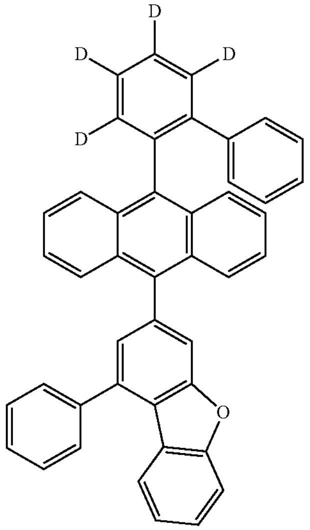
[Compound 17]
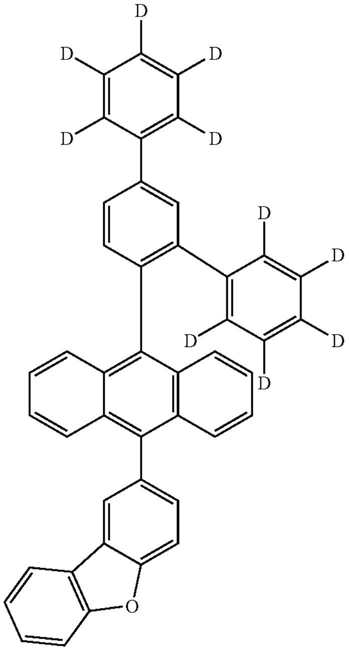
-continued
[Compound 18]
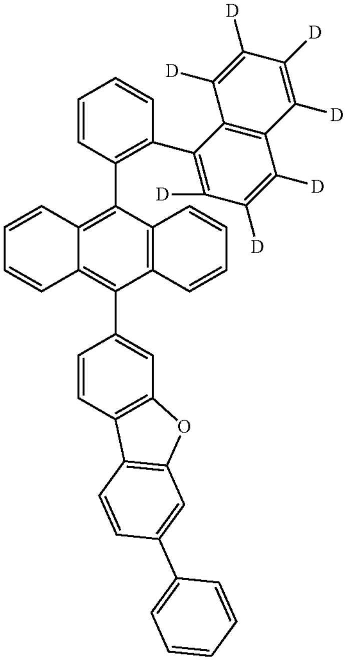
[Compound 19]
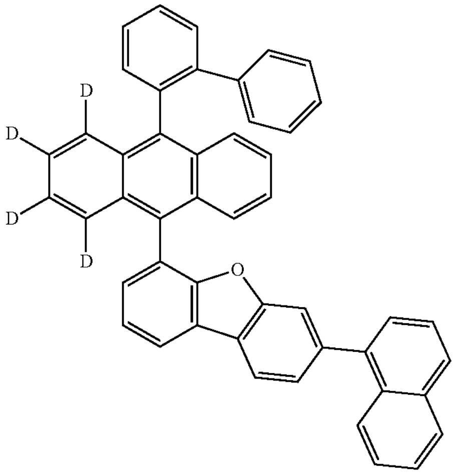
[Compound 20]
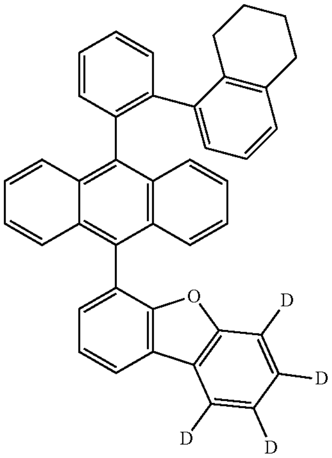

-continued
[Compound 21]
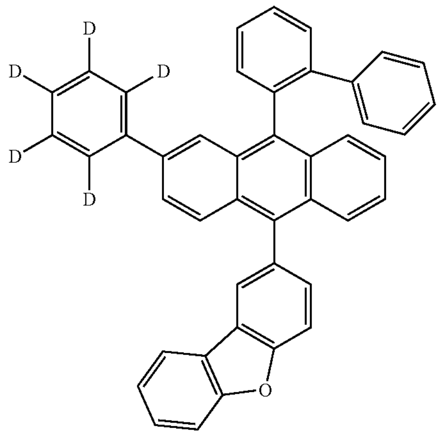
[Compound 22]
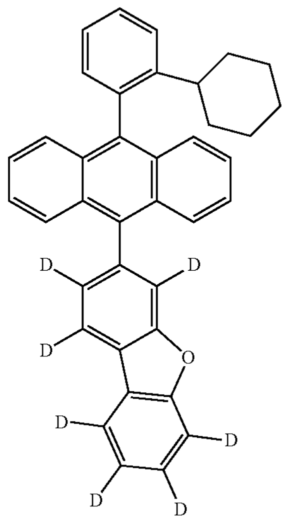
[Compound 23]
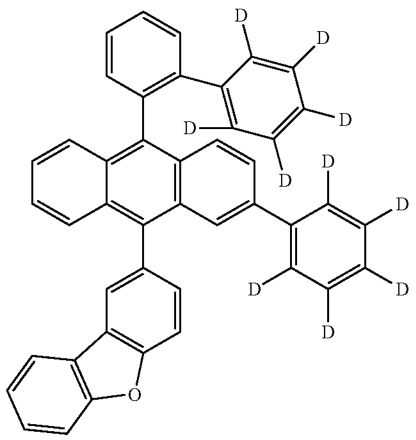
-continued
[Compund 24]
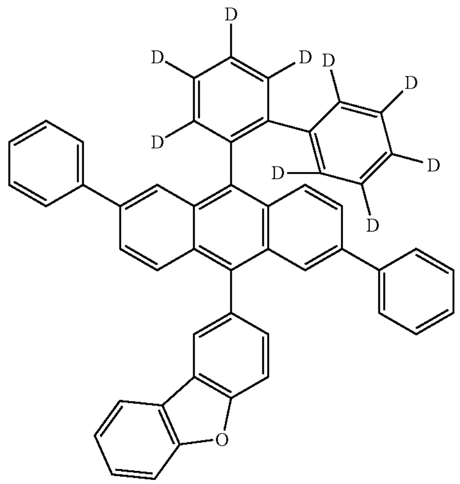
[Compound 25]
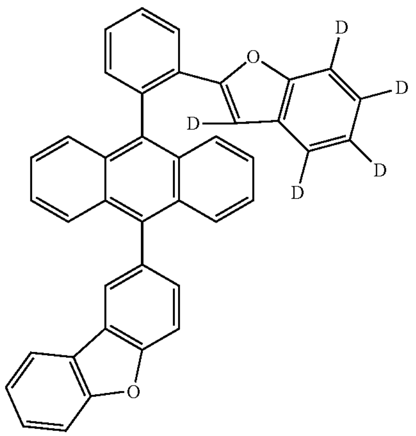
[Compound 26]
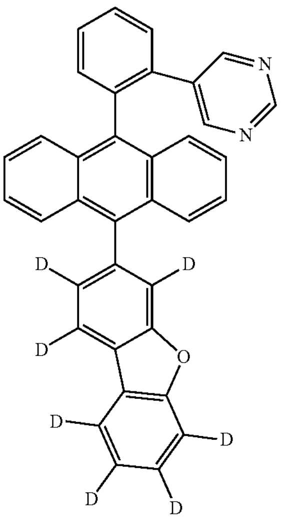

-continued
[Compund 27]
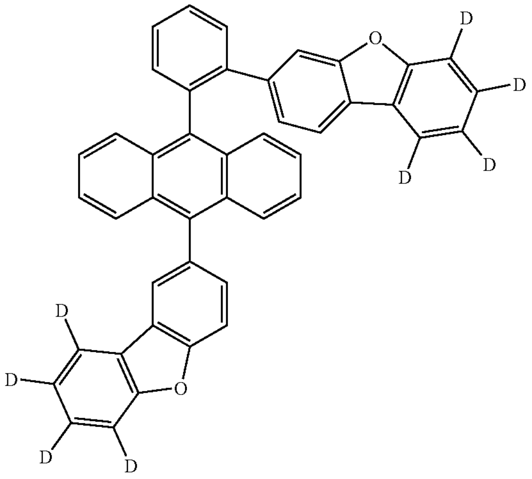
[Compound 28]
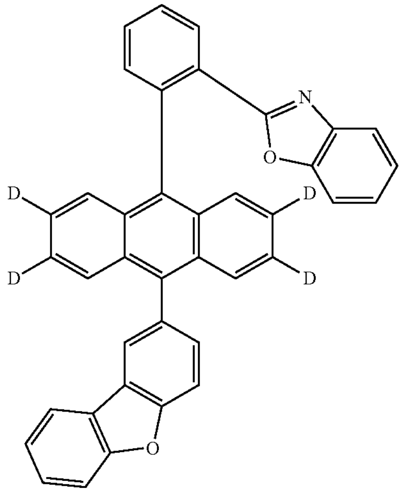
[Compound 29]
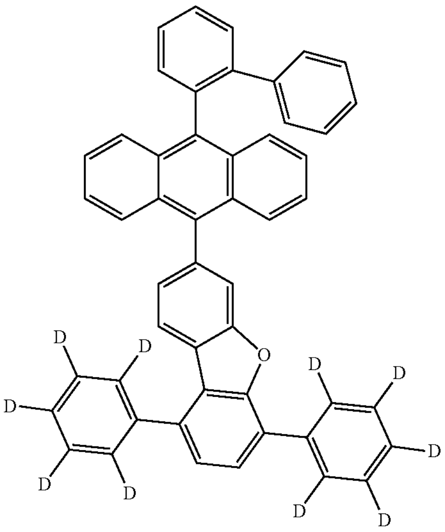
-continued
[Compound 30]
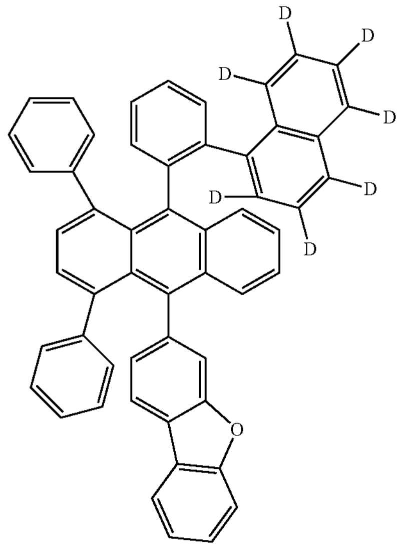
[Compound 31]
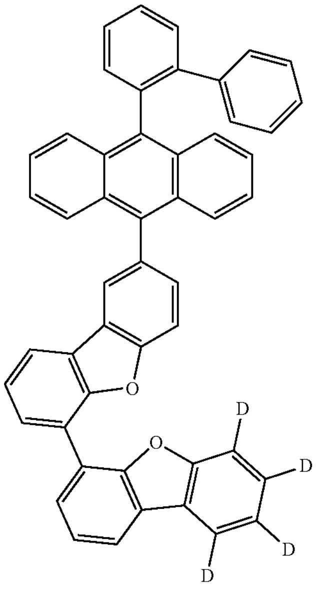
[Compound 32]
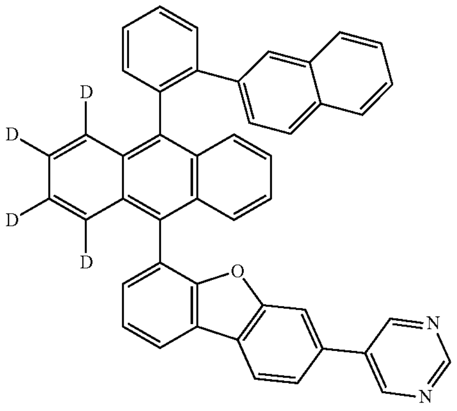

-continued
[Compound 33]
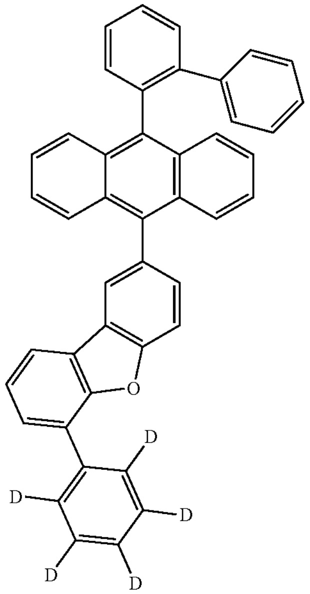
[Compound 34]
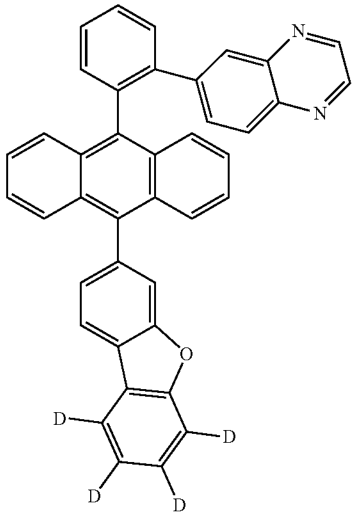
[Compound 35]
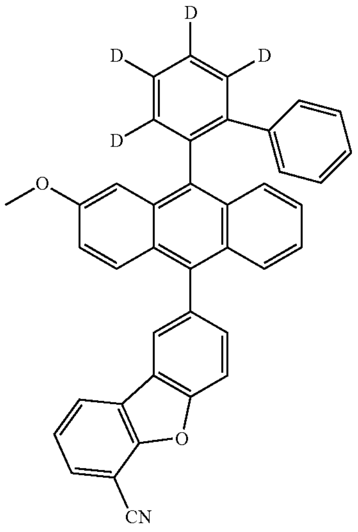
-continued
[Compound 36]
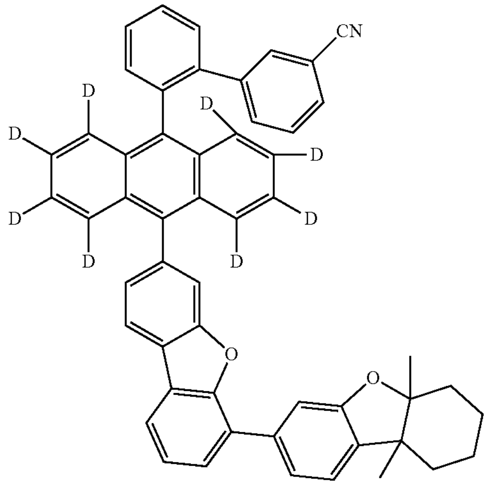
[Compound 37]
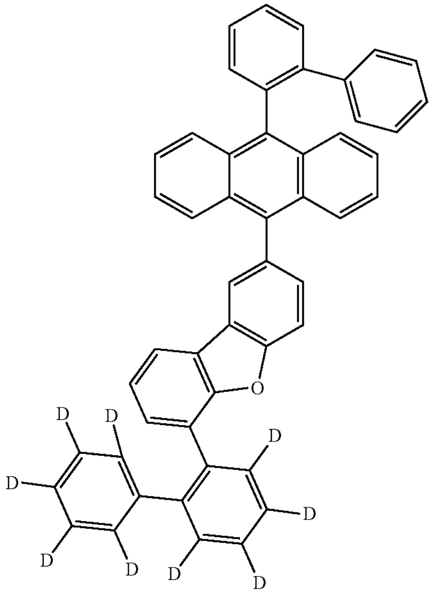

-continued
[Compound 38]
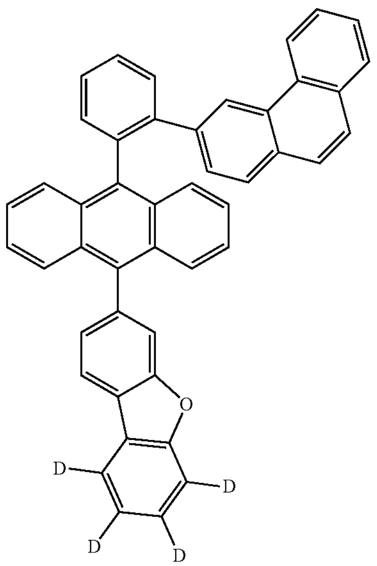
[Compound 39]
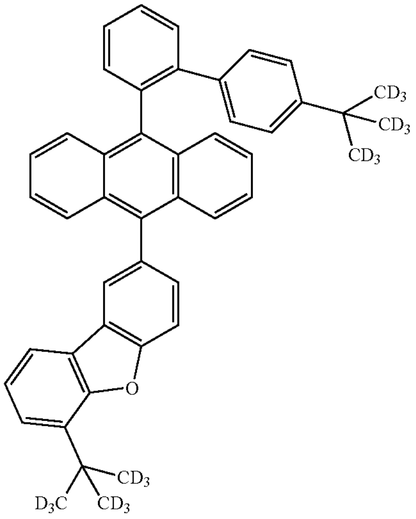
[Compound 40]
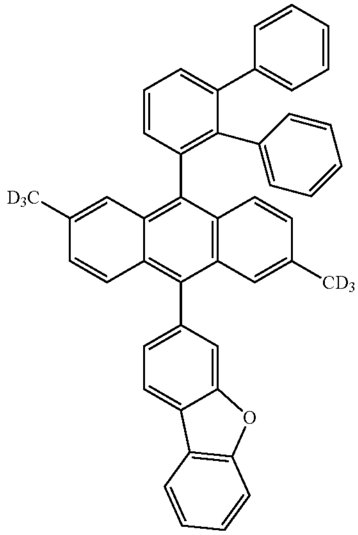
-continued
[Compound 41]
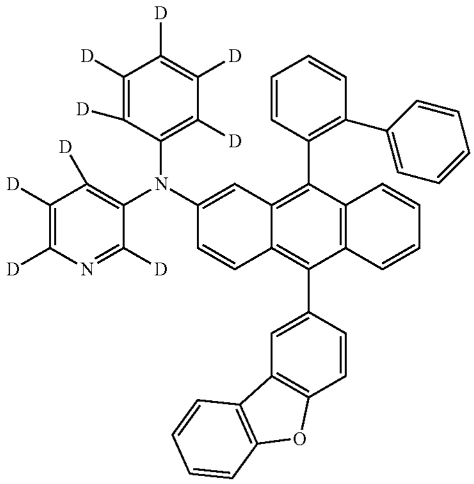
[Compound 42]
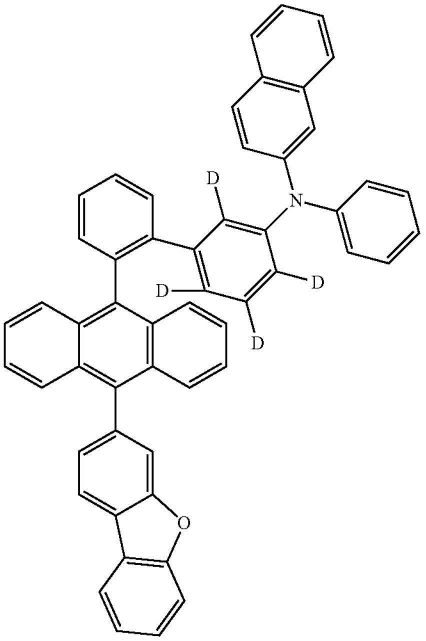
[Compound 43]
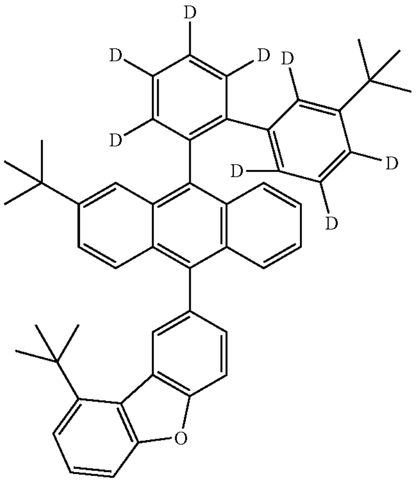

-continued
[Compound 44]
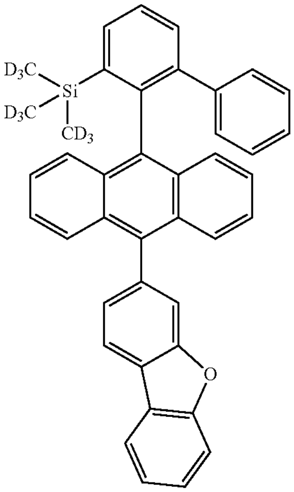
[Compound 45]
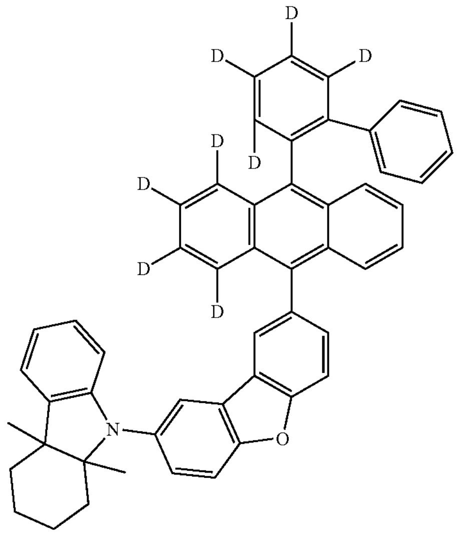
[Compound 46]
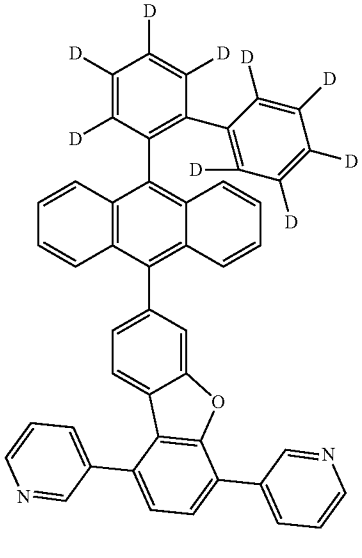
-continued
[Compound 47]
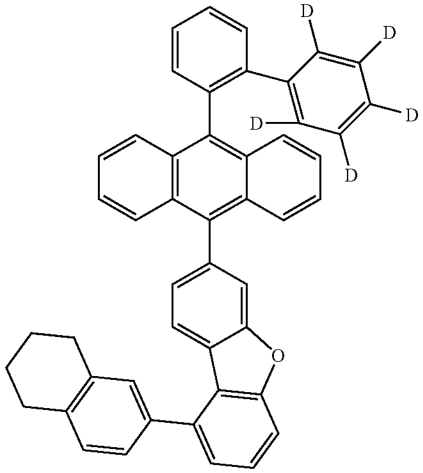
[Compound 48]
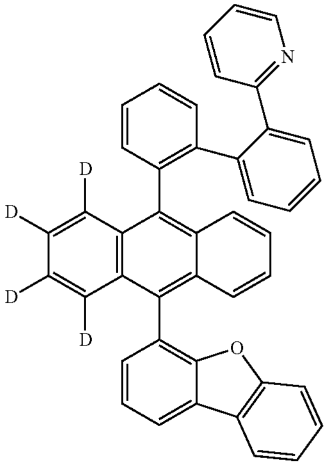
[Compound 49]
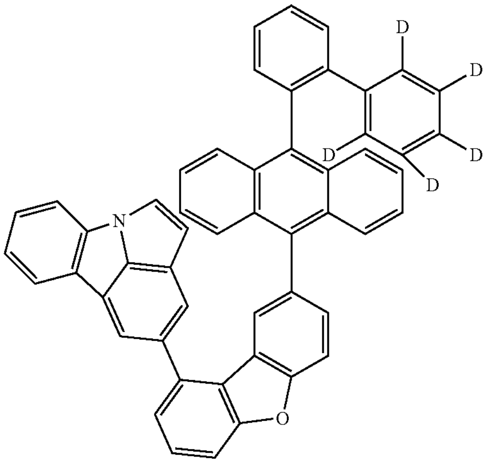

-continued
[Compound 50]
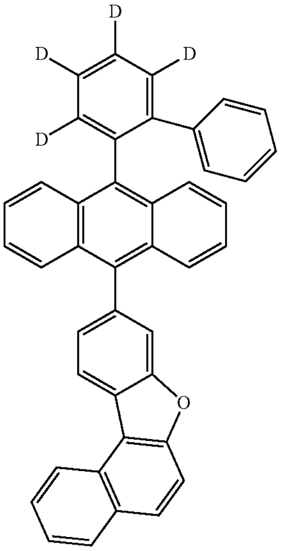
[Compound 51]
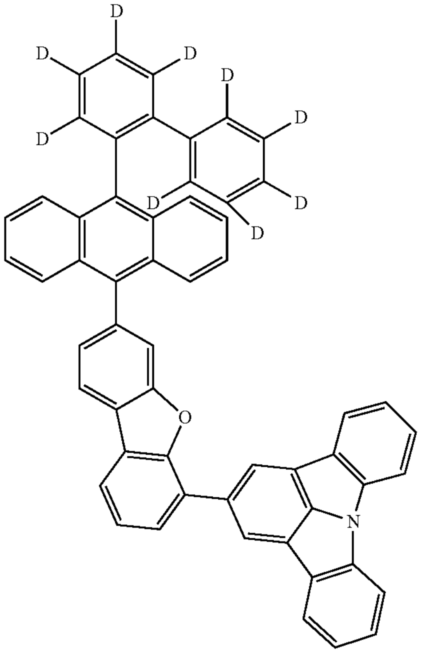
-continued
[Compound 52]
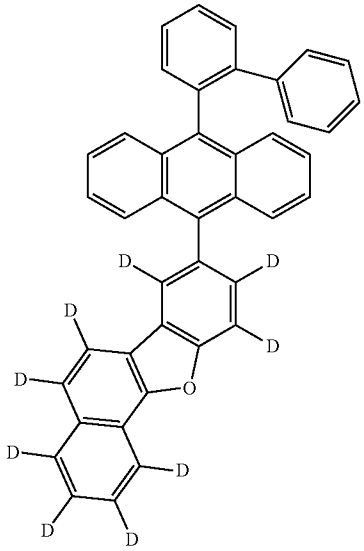
[Compound 53]
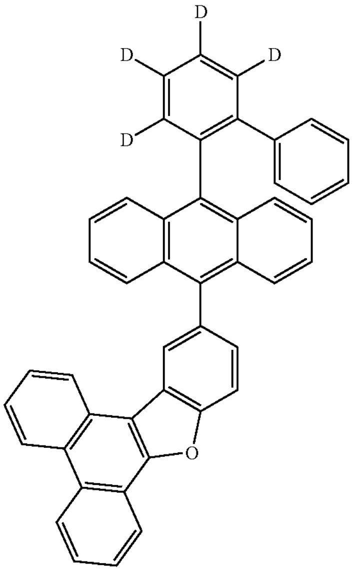
[Compound 54]
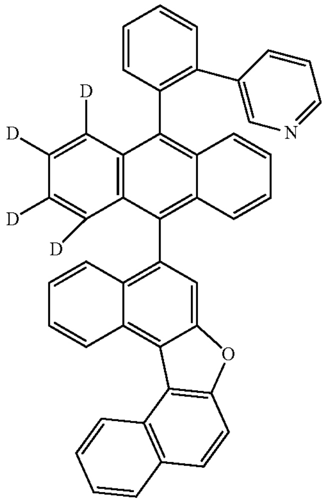

-continued
[Compound 55]
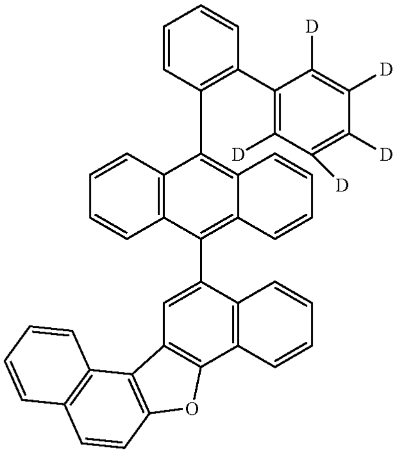
[Compound 56]
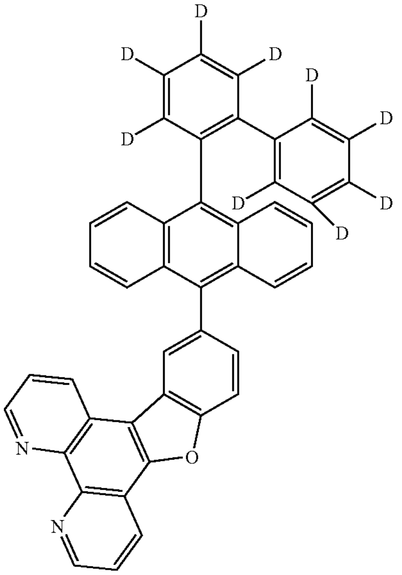
[Compound 57]
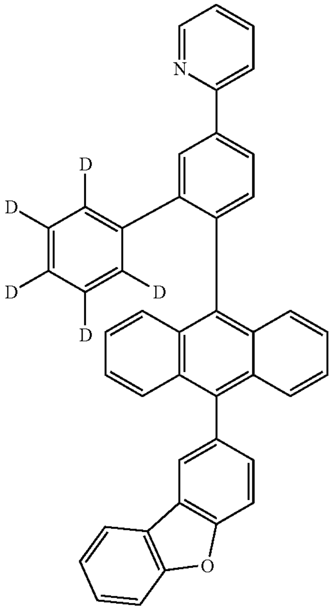
-continued
[Compound 58]
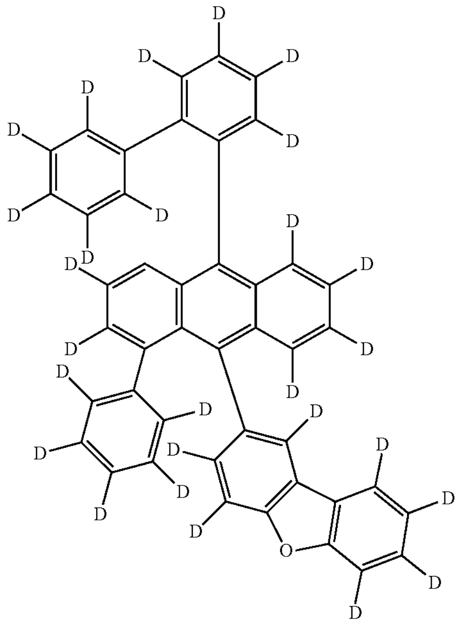
[Compound 59]
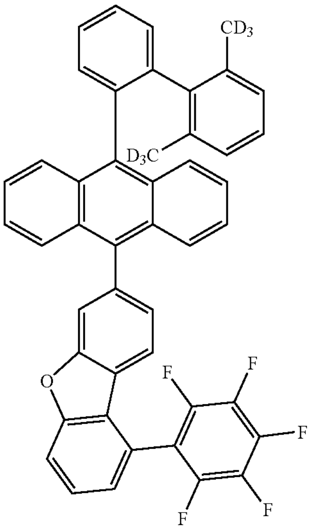

-continued

[Compound 60]

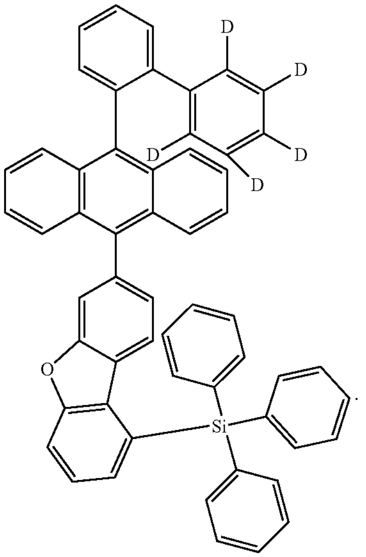

10. The organic light emitting diode of claim 1, wherein $A_1$ to $A_3$ in Chemical Formulas B-1 and B-2 are same or different and each independently a substituted or unsubstituted aromatic hydrocarbon ring of 6 to 30.

11. The organic light emitting diode of claim 1, wherein at least one of $Y_1$ and $Y_2$ in Chemical Formulas B-1 and B-2 is $NR_{21}$ wherein $R_{21}$ is as defined in claim 1.

12. The organic light emitting diode of claim 11, wherein $R_{21}$ in Chemical Formulas B-1 and B-2 is a substituted or unsubstituted an aryl of 6 to 30 carbon atoms.

13. The organic light emitting diode of claim 1, wherein the compound represented by Chemical Formula B-1 or B-2 is any one selected from among [Chemical Formula 1] to [Chemical Formula 84], below:

[Chemical Formula 1]

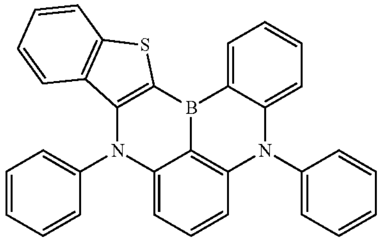

[Chemical Formula 2]

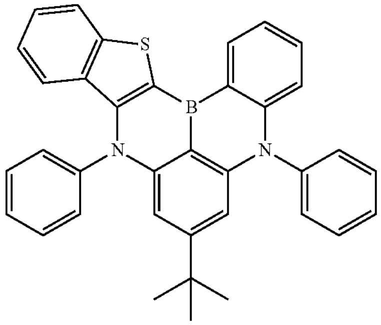

-continued

[Chemical Formula 3]

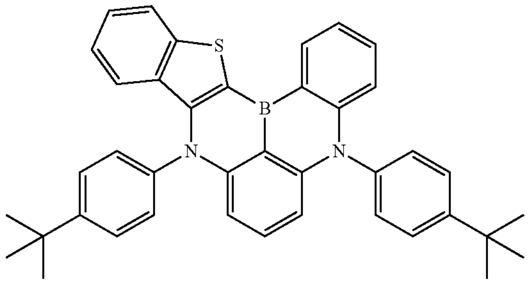

[Chemical Formula 4]

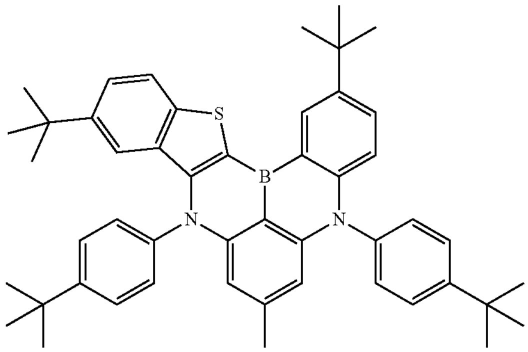

[Chemical Formula 5]

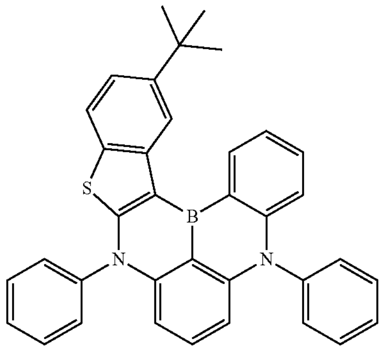

[Chemical Formula 6]

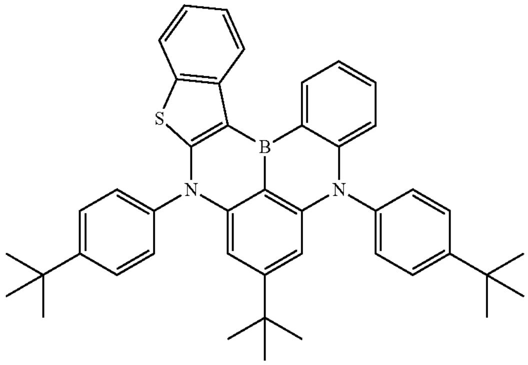

-continued
[Chemical Formula 7]
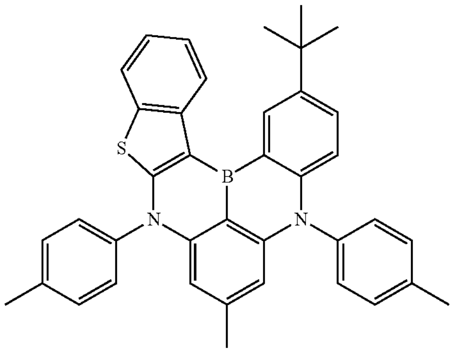
[Chemical Formula 8]
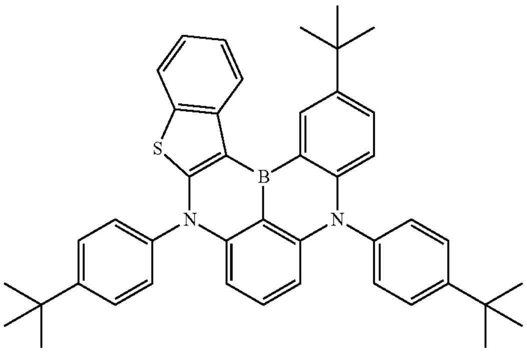
[Chemical Formula 9]
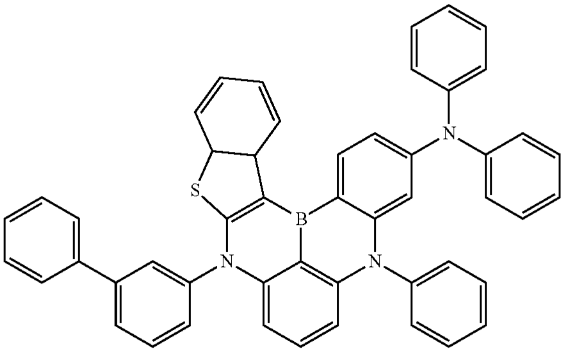
[Chemical Formula 10]
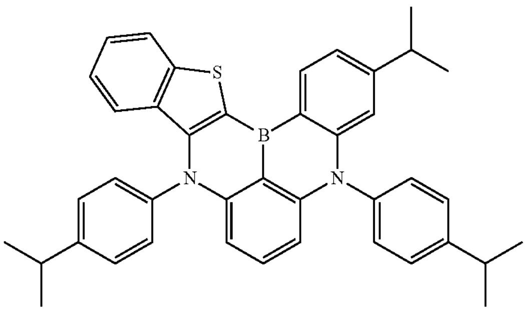
-continued
[Chemical Formula 11]
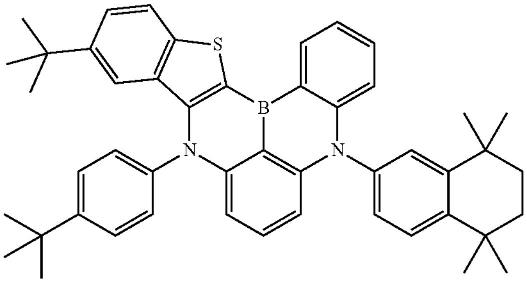
[Chemical Formula 12]
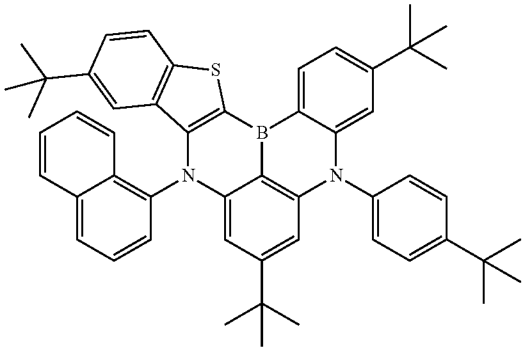
[Chemical Formula 13]
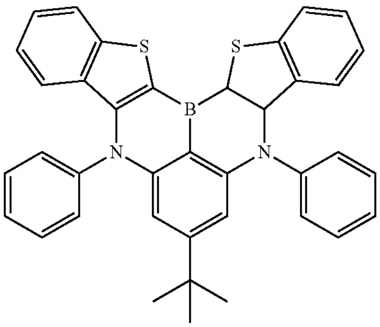
[Chemical Formula 14]
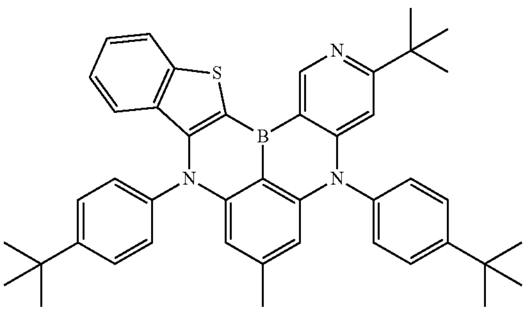

-continued
[Chemical Formula 15]
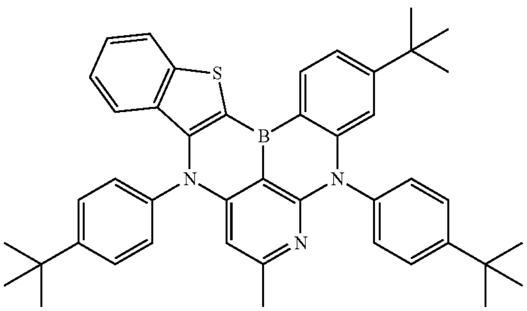
[Chemical Formula 16]
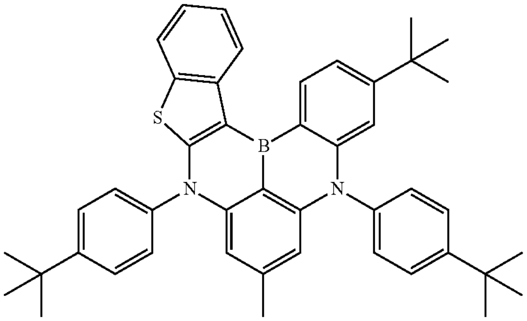
[Chemical Formula 17]
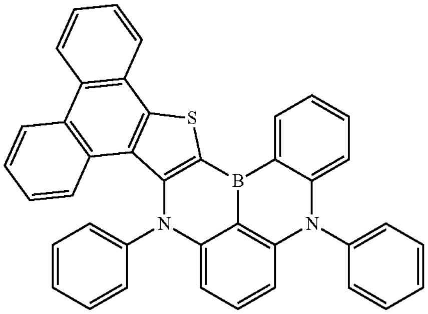
[Chemical Formula 18]
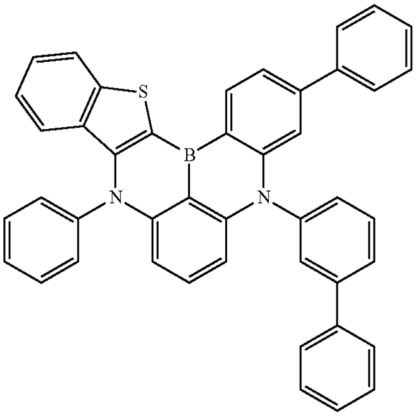
-continued
[Chemical Formula 19]
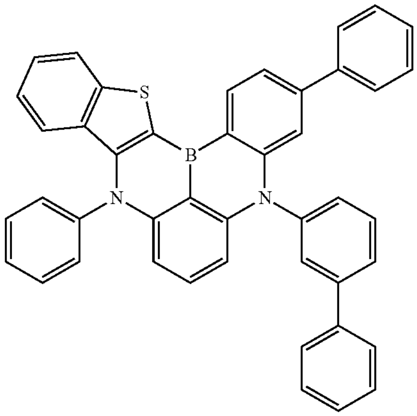
[Chemical Formula 20]
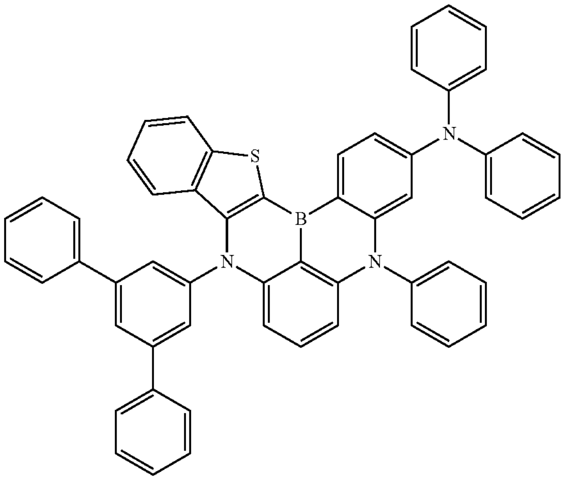
[Chemical Formula 21]
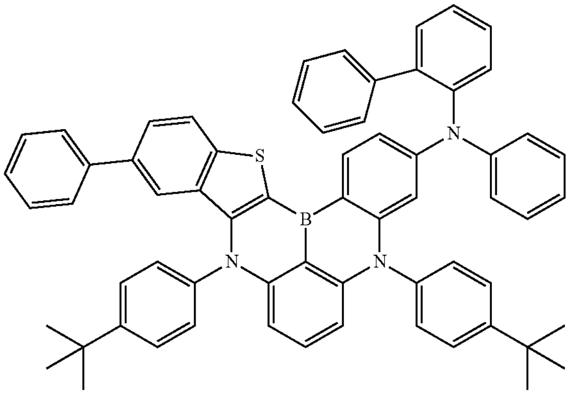

[Chemical Formula 22]
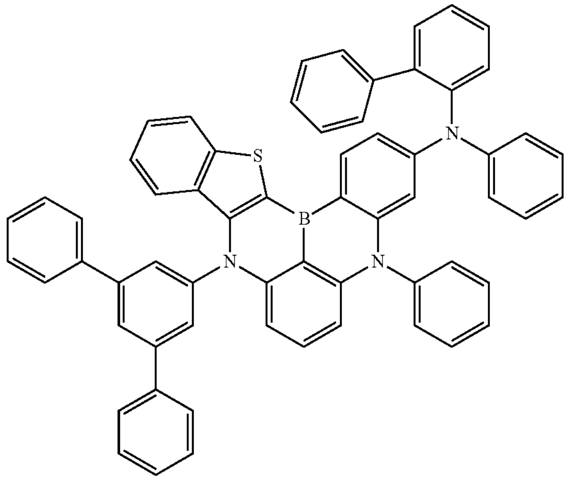
[Chemical Formula 23]
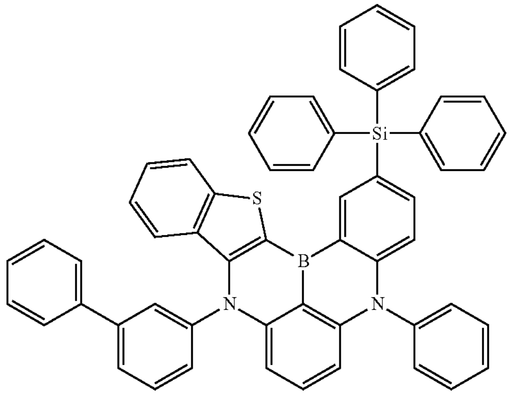
[Chemical Formula 24]
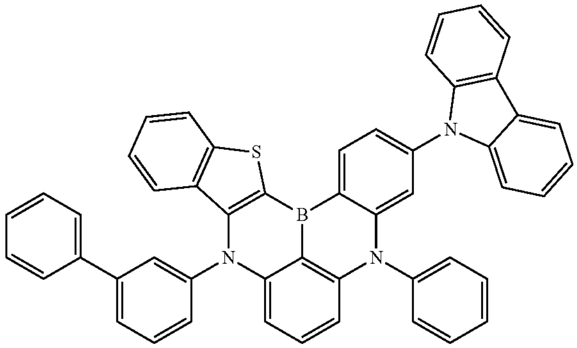
[Chemical Formula 25]
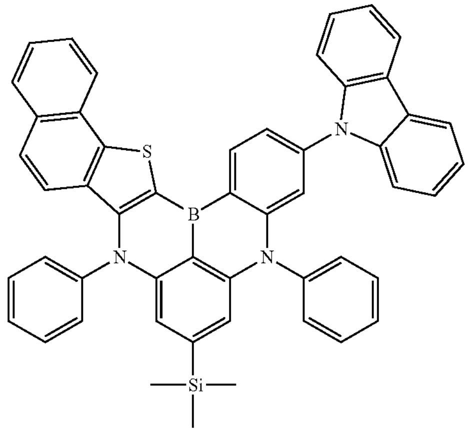
[Chemical Formula 26]
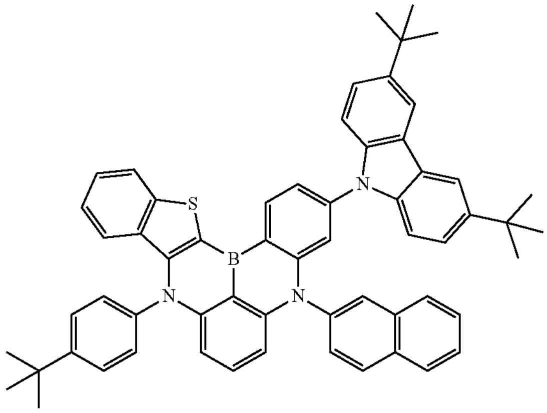
[Chemical Formula 27]
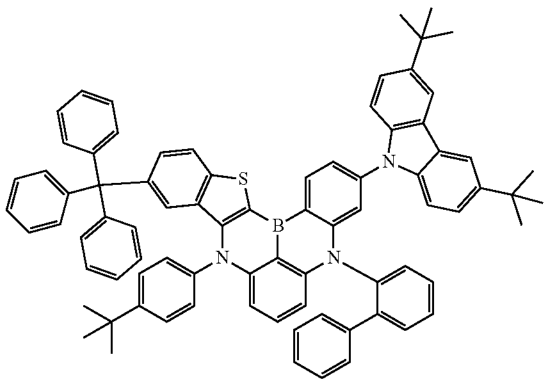

[Chemical Formula 28]
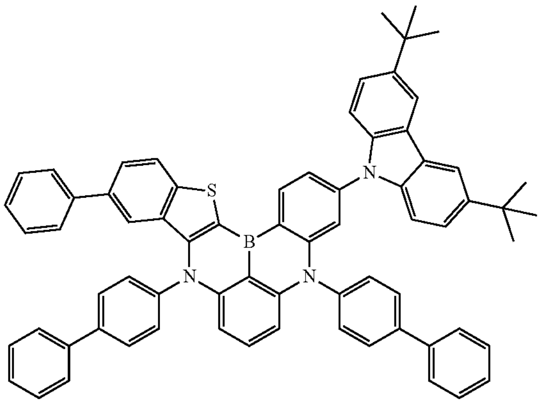
[Chemical Formula 29]
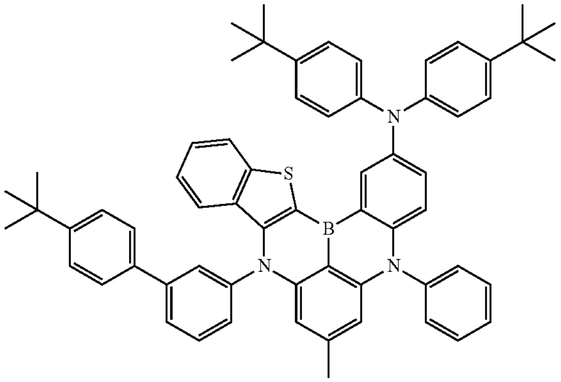
[Chemical Formula 30]
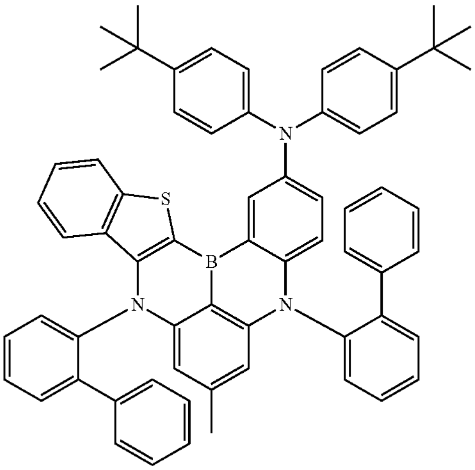
[Chemical Formula 31]
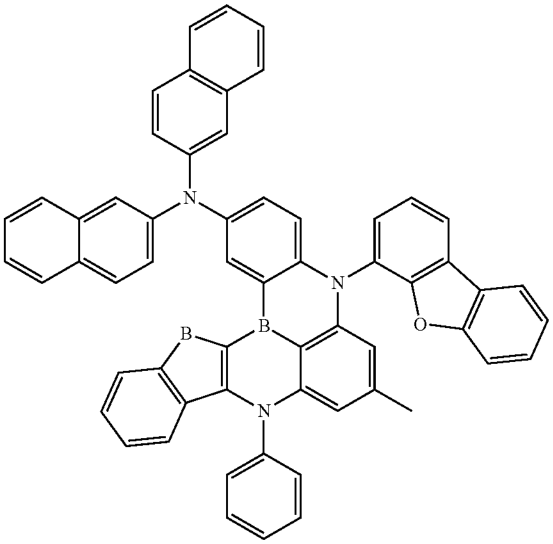
[Chemical Formula 32]
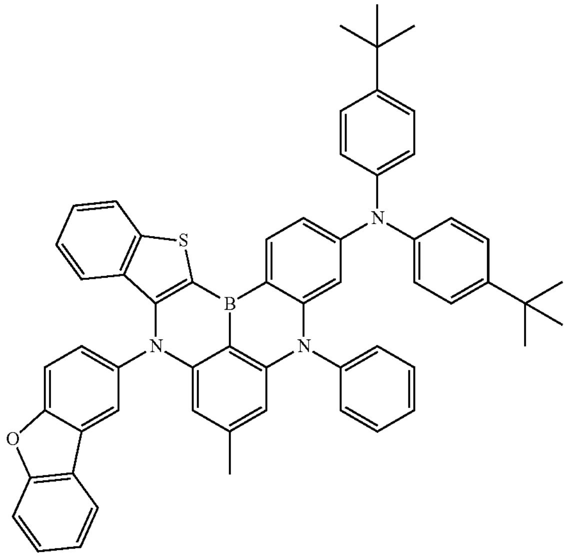
[Chemical Formula 33]
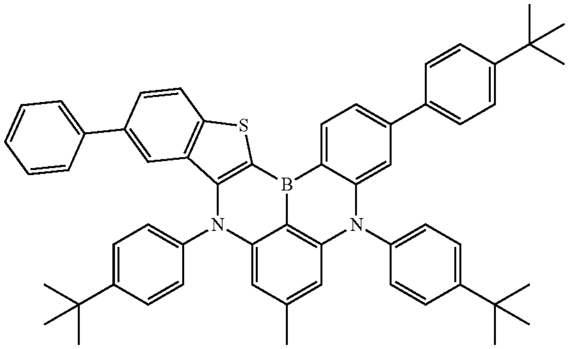

-continued
[Chemical Formula 34]
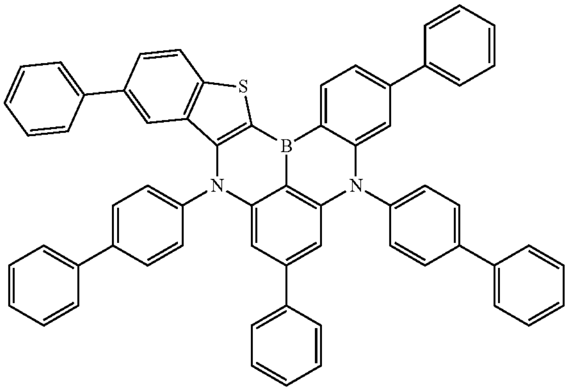
[Chemical Formula 35]
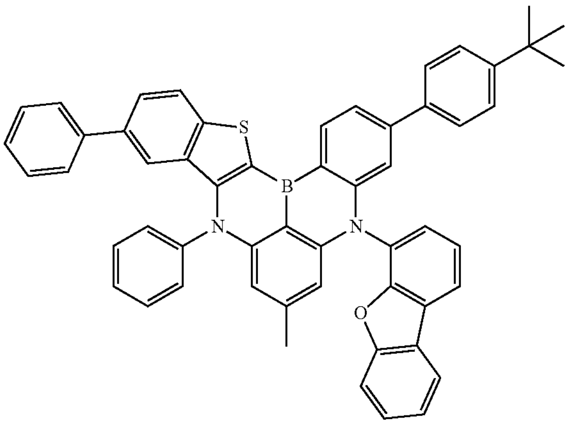
[Chemical Formula 36]
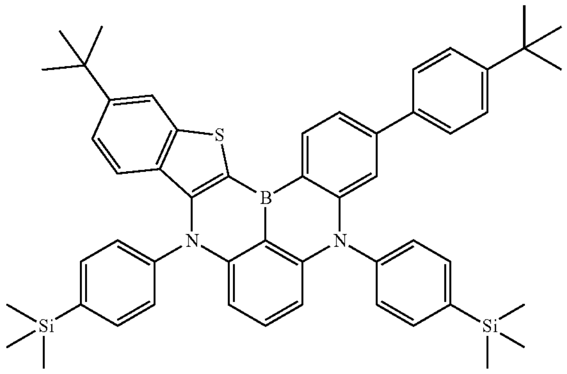
-continued
[Chemical Formula 37]
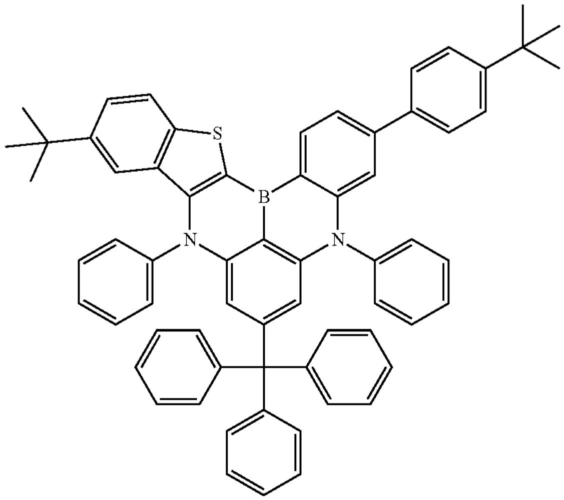
[Chemical Formula 38]
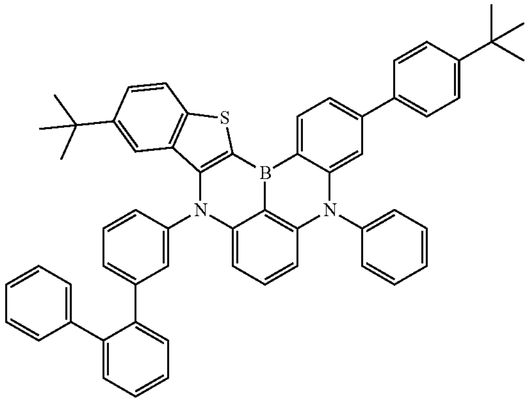
[Chemical Formula 39]
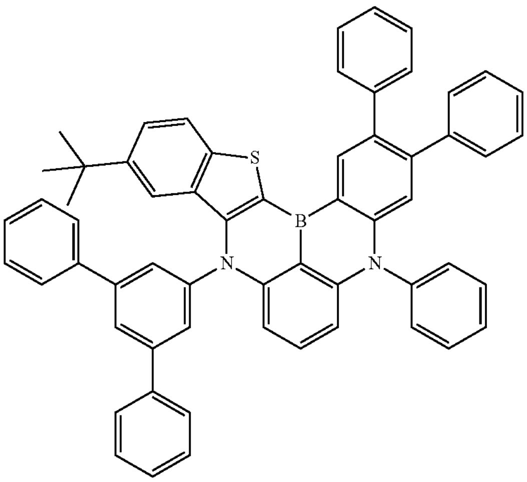

[Chemical Formula 40]
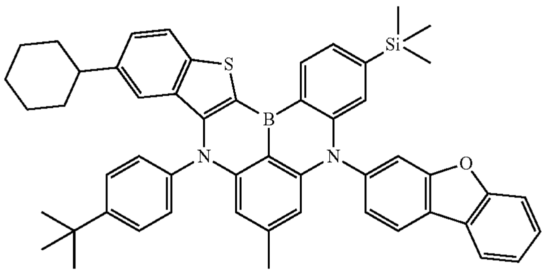
[Chemical Formula 41]
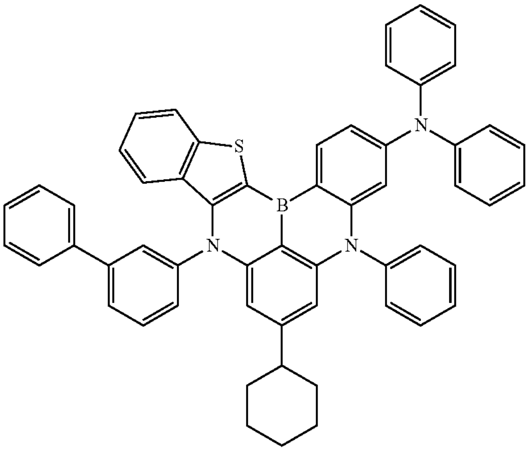
[Chemical Formula 42]
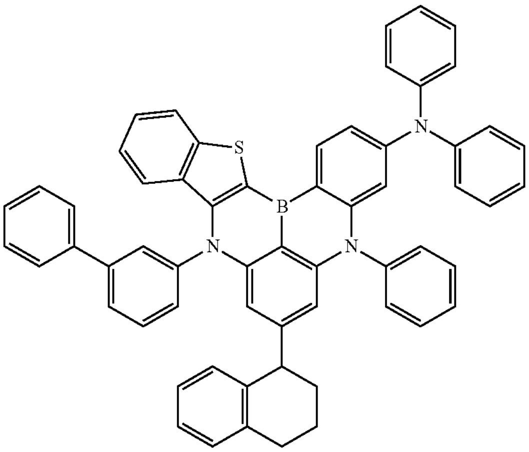
[Chemical Formula 43]
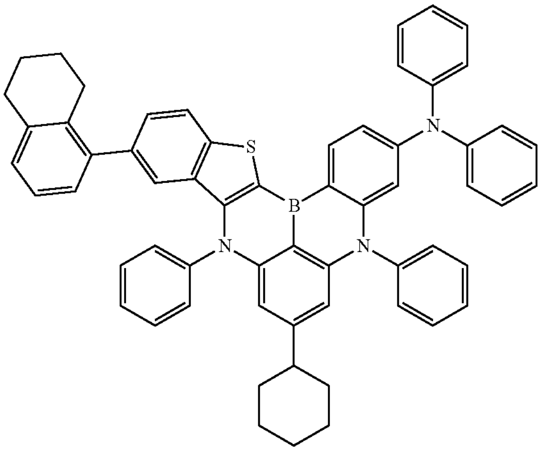
[Chemical Formula 44]
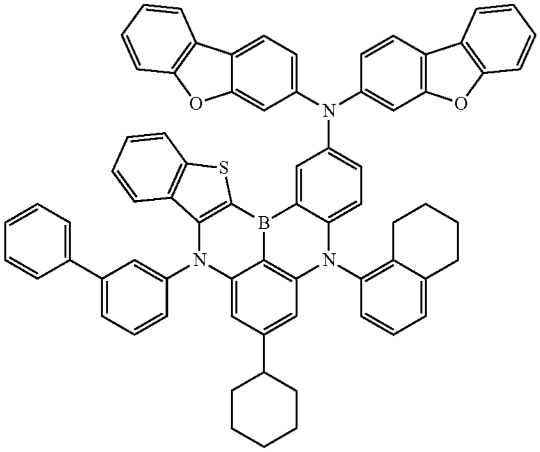
[Chemical Formula 45]
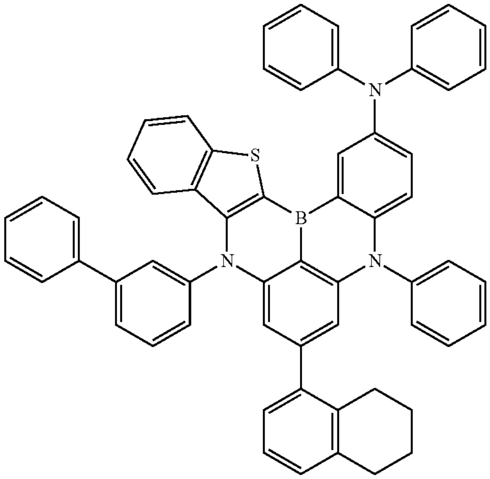

-continued
[Chemical Formula 46]
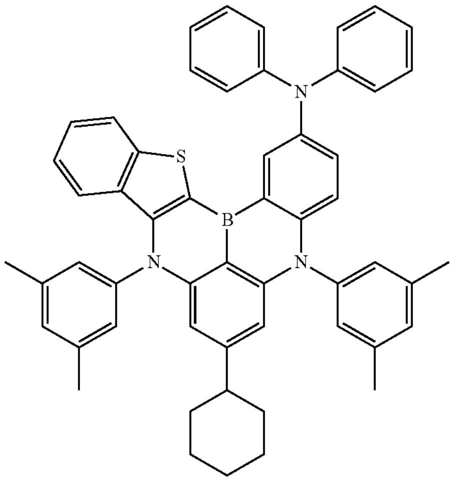
[Chemical Formula 47]
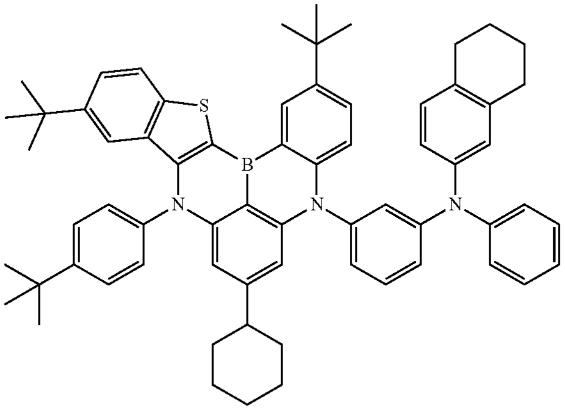
[Chemical Formula 48]
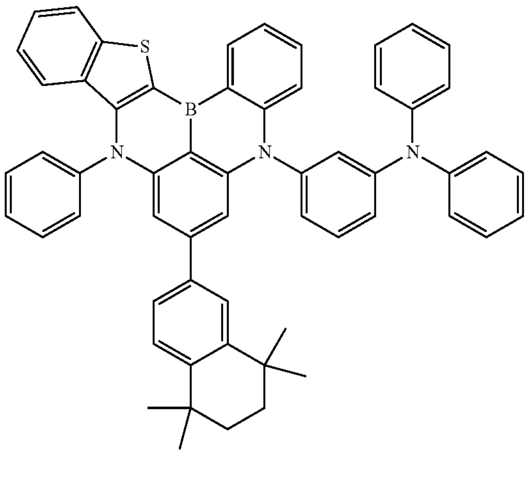
-continued
[Chemical Formula 49]
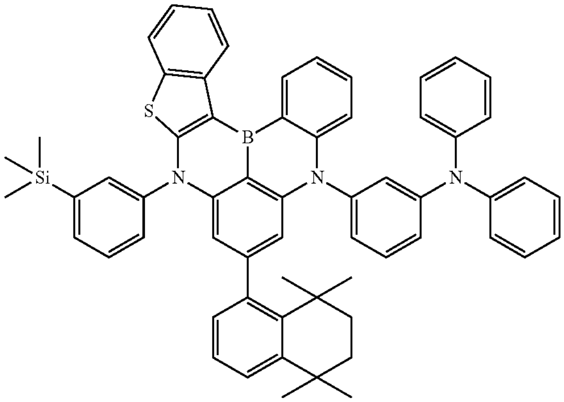
[Chemical Formula 50]
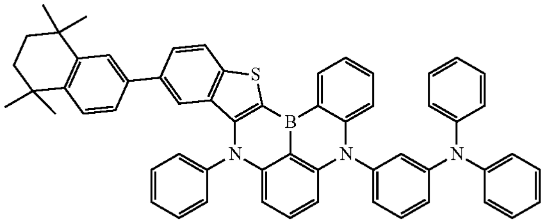
[Chemical Formula 51]
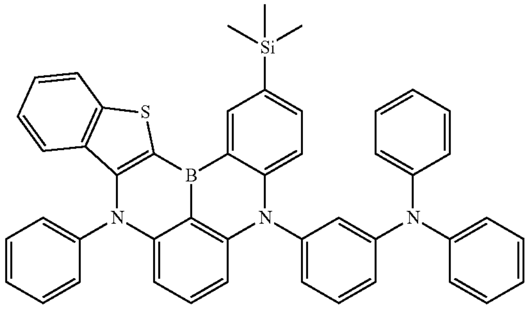
[Chemical Formula 52]
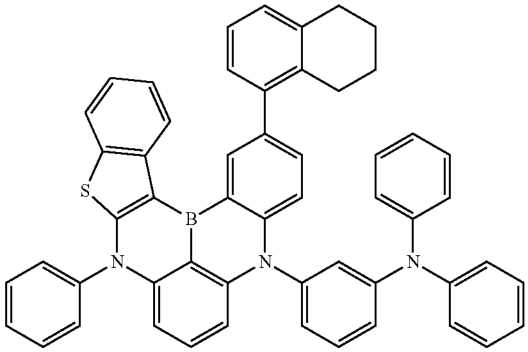

-continued
[Chemical Formula 53]
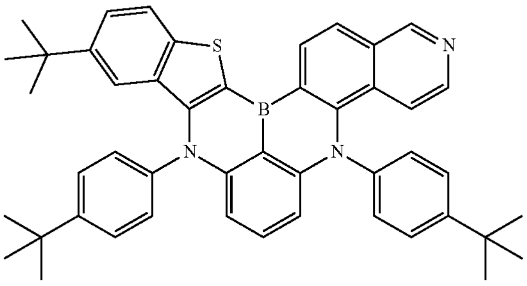
[Chemical Formula 54]
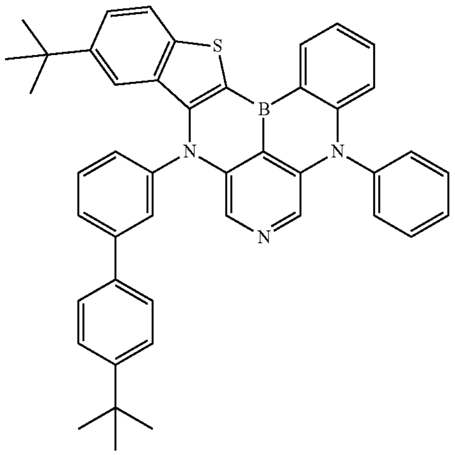
[Chemical Formula 55]
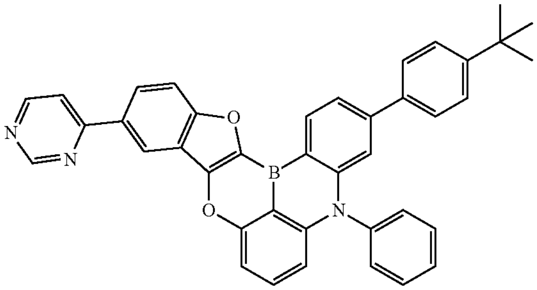
[Chemical Formula 56]
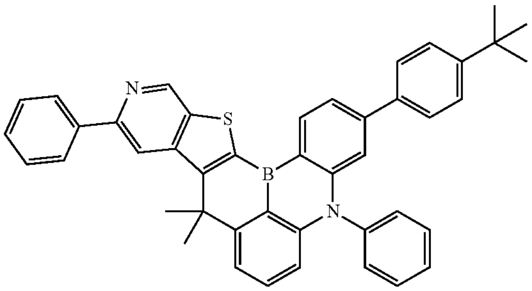
-continued
[Chemical Formula 57]
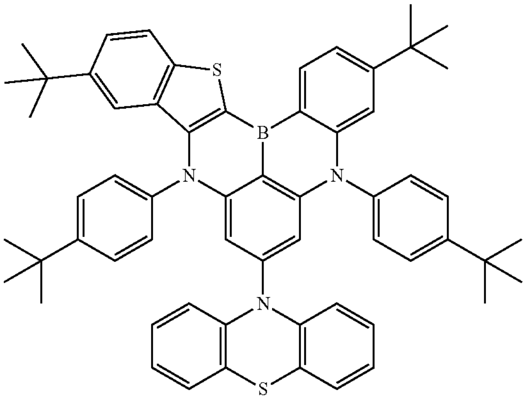
[Chemical Formula 58]
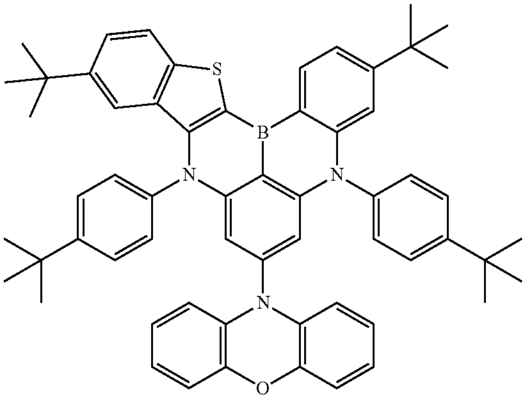
[Chemical Formula 59]
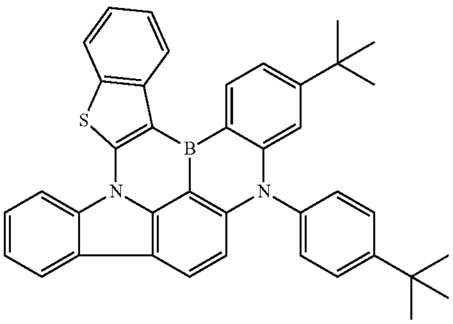
[Chemical Formula 60]
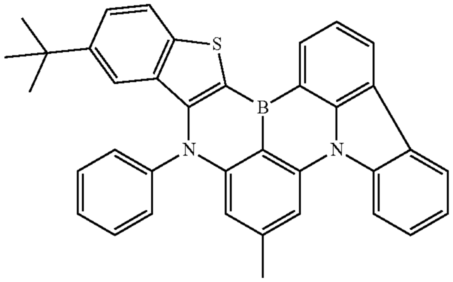

-continued
[Chemical Formula 61]
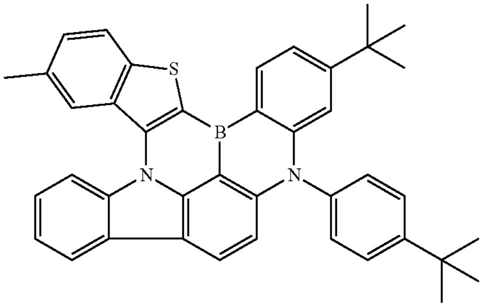
[Chemical Formula 62]
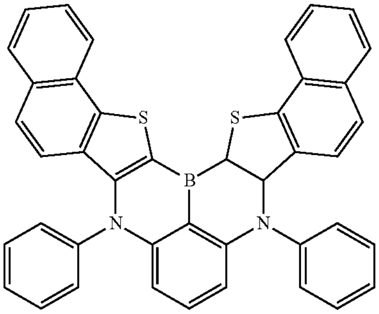
[Chemical Formula 63]
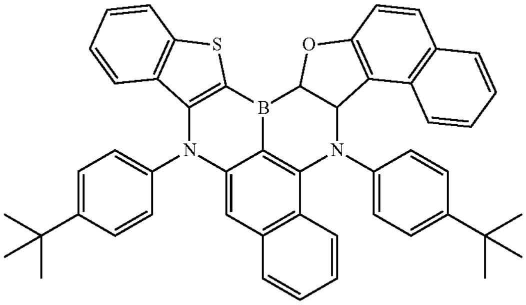
[Chemical Formula 64]
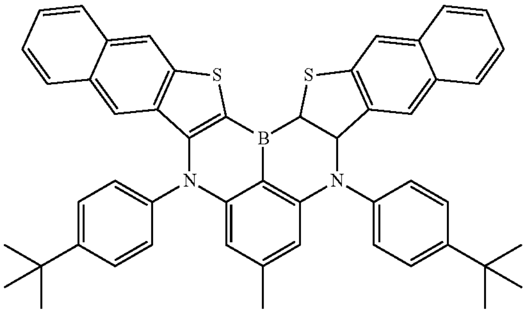
-continued
[Chemical Formula 65]
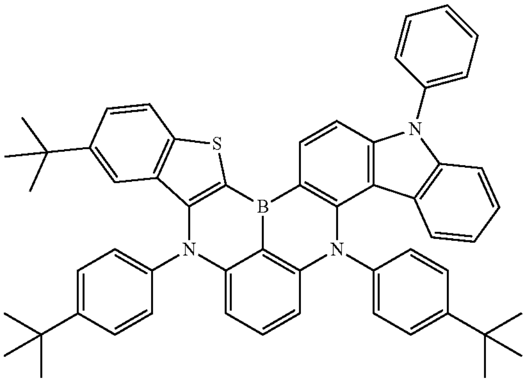
[Chemical Formula 66]
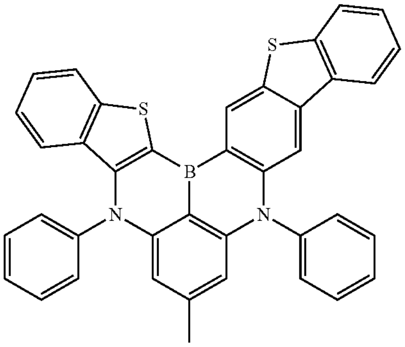
[Chemical Formula 67]
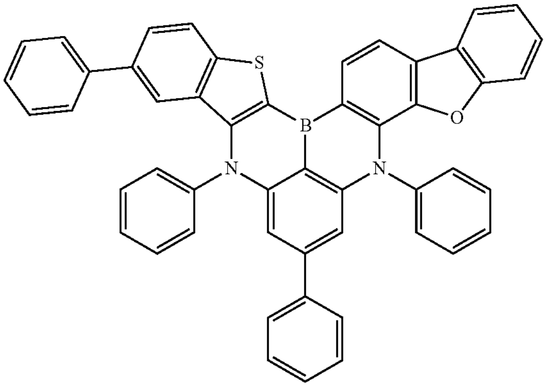
[Chemical Formula 68]
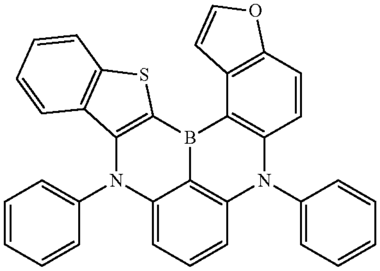

-continued
[Chemical Formula 69]
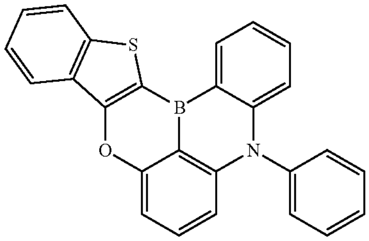
[Chemical Formula 70]
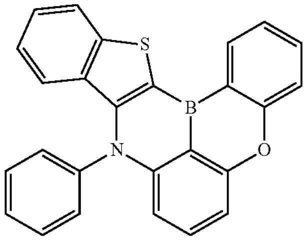
[Chemical Formula 71]
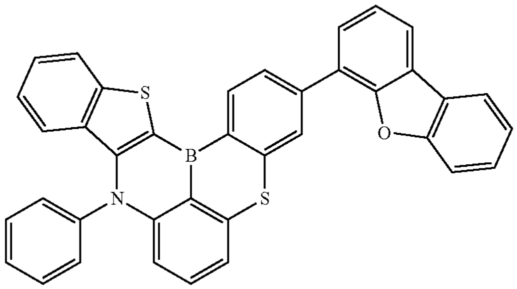
[Chemical Formula 72]
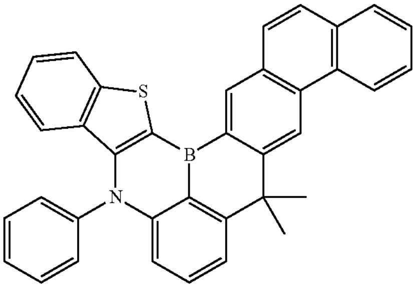
[Chemical Formula 73]
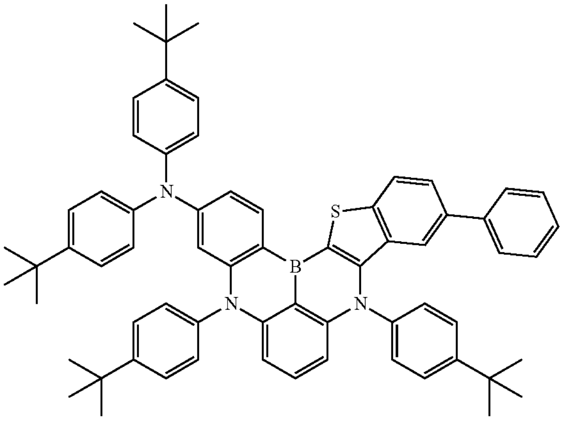
-continued
[Chemical Formula 74]
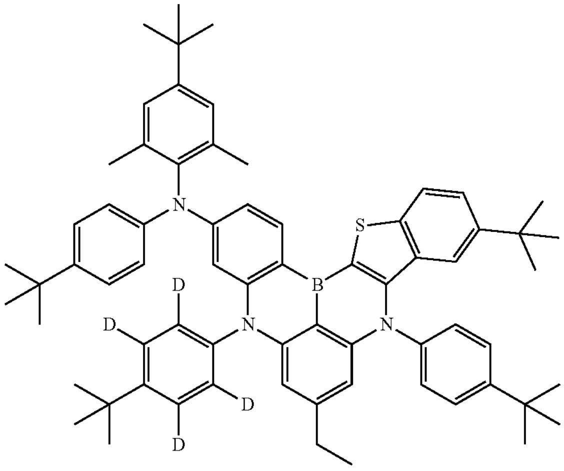
[Chemical Formula 75]
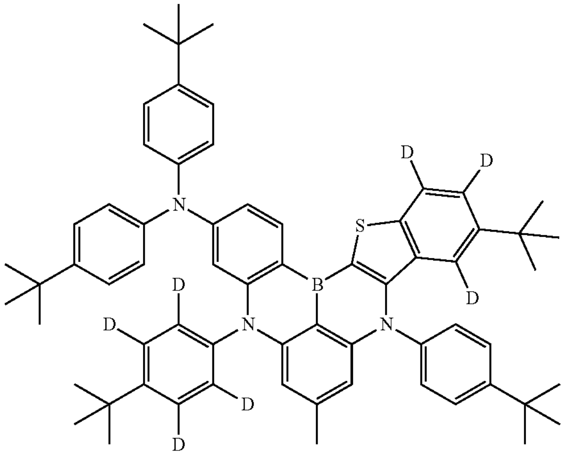
[Chemical Formula 76]
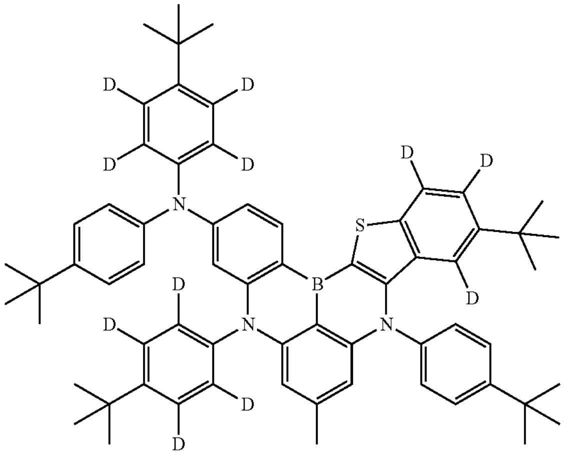

-continued
[Chemical Formula 77]
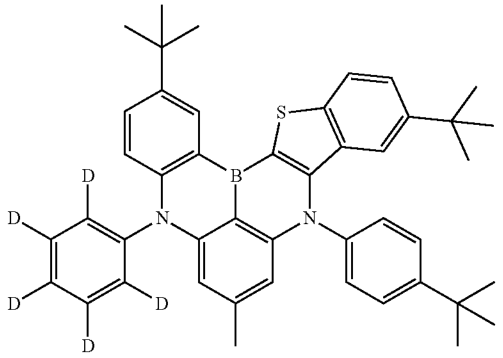
[Chemical Formula 78]
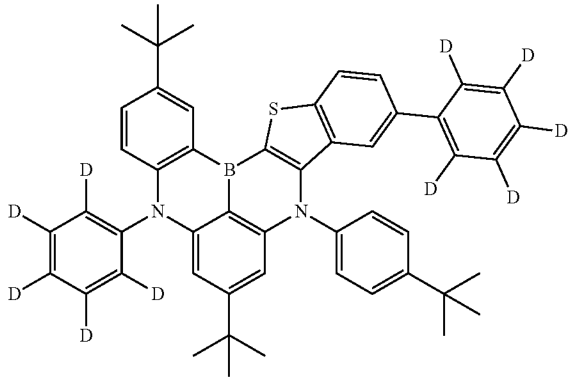
[Chemical Formula 79]
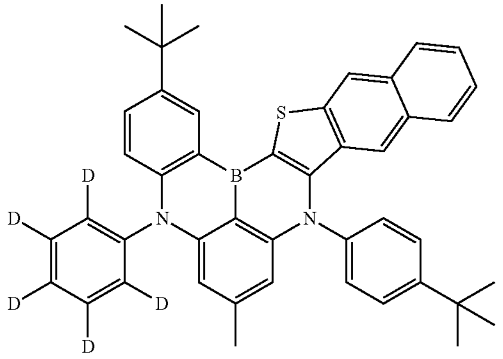
[Chemical Formula 80]
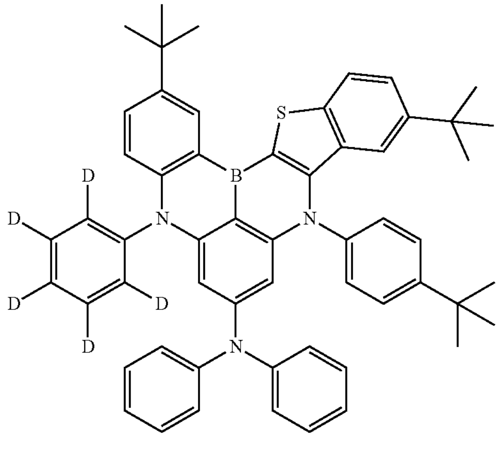
-continued
[Chemical Formula 81]
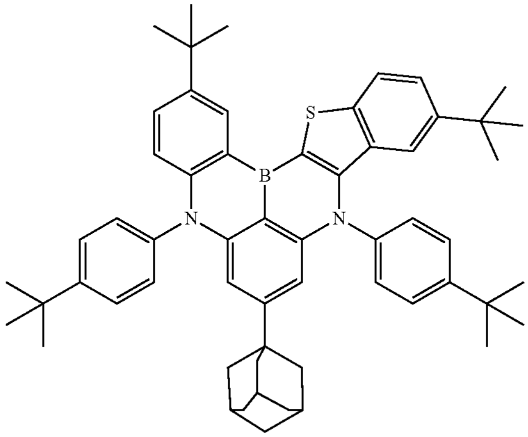
[Chemical Formula 82]
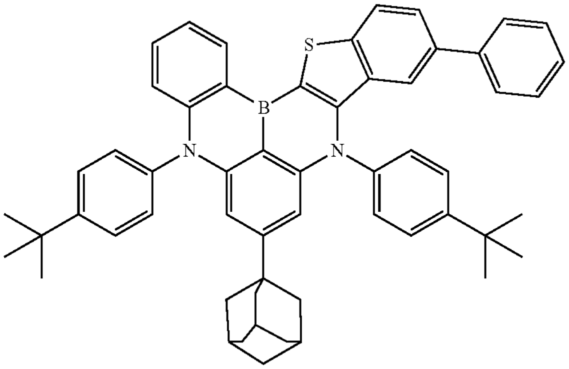
[Chemical Formula 83]
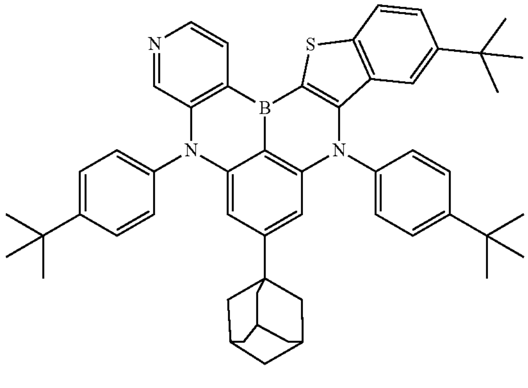

-continued

[Chemical Formula 84]

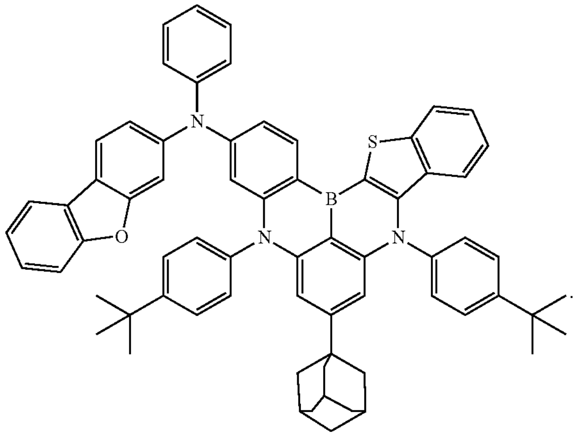

14. The organic light emitting diode of claim 1, wherein the organic layer comprises at least one of a hole injection layer, a hole transport layer, a functional layer capable of both hole injection and hole transport, an electron transport layer, and an electron injection layer, in addition to the light emission layer.

15. The organic light emitting diode of claim 14, wherein at least one selected from among the layers is deposited using a single-molecule deposition process or a solution process.

16. The organic light emitting diode of claim 1, wherein the organic light emitting diode is used for a device selected from among a flat display device; a flexible display device; a monochrome or grayscale flat illumination; a monochrome or grayscale flexible illumination device; a vehicle display device; and a virtual or augmented reality display device.

* * * * *